United States Patent [19]

Kageyama et al.

[11] Patent Number: 5,625,757
[45] Date of Patent: Apr. 29, 1997

[54] PRINTING SYSTEM

[75] Inventors: Seiji Kageyama; Satoru Matsumoto, both of Yokohama; Makoto Kitagawa, Fujisawa; Takuya Shimakawa; Junichi Kazama, both of Yokohama; Tadashi Okada, Hadano, all of Japan

[73] Assignee: Hitachi, Ltd., Tokyo, Japan

[21] Appl. No.: 361,226

[22] Filed: Dec. 21, 1994

[30] Foreign Application Priority Data

Dec. 24, 1993 [JP] Japan .................................. 5-326808
Mar. 17, 1994 [JP] Japan .................................. 6-046283

[51] Int. Cl.⁶ ............................................. G06K 15/00
[52] U.S. Cl. ............................................. 395/113; 395/114
[58] Field of Search ............................. 395/101, 112, 395/113, 114, 800, 115, 116, 180–181, 182.02, 182.03, 184.01, 182.13, 182.14, 182.15, 182.16, 182.17, 182.18, 182.21, 182.22, 183.01, 183.06, 183.07, 183.2, 183.21, 185.01, 185.02; 355/203, 204, 205, 206, 207, 208, 209, 202; 358/406, 404, 408, 296, 444, 405, 437, 407; 347/142, 19

[56] References Cited

U.S. PATENT DOCUMENTS

| 5,113,494 | 5/1992 | Menendez et al. | 395/163 |
|---|---|---|---|
| 5,220,674 | 6/1993 | Morgan et al. | 395/110 |
| 5,287,434 | 2/1994 | Bain et al. | 395/101 |
| 5,323,393 | 6/1994 | Barrett et al. | 370/85.8 |
| 5,353,399 | 10/1994 | Kuwamoto et al. | 395/800 |
| 5,467,434 | 11/1995 | Hower, Jr. et al. | 395/114 |

FOREIGN PATENT DOCUMENTS

| 62-274331 | 10/1987 | Japan . |
|---|---|---|
| 63-75828 | 3/1988 | Japan . |
| 63-99644 | 5/1988 | Japan . |
| 63-250730 | 10/1988 | Japan . |
| 2-67168 | 3/1990 | Japan . |
| 2-60781 | 4/1990 | Japan . |
| 2-166511 | 7/1990 | Japan . |
| 3-29021 | 2/1991 | Japan . |
| 3-192463 | 8/1991 | Japan . |
| 3-224778 | 9/1991 | Japan . |
| 4-230514 | 9/1992 | Japan . |
| 4-245525 | 10/1992 | Japan . |
| 4-250522 | 10/1992 | Japan . |
| 4-227524 | 10/1992 | Japan . |
| 4-317118 | 12/1992 | Japan . |
| 5-138994 | 6/1993 | Japan . |
| 5-301429 | 12/1993 | Japan . |

OTHER PUBLICATIONS

*Network Printing Working Group, Request for Comments:* 1179, "Line Printer Daemon Protocol", L. Mclaughlin, III, Editor, The Wollongong Group, Aug. 1990.
*UNIX Network Programming,* "Line Printer Spoolers", Chapter 13, W.R. Stevens, Prentice Hall Software Series.
*Publiss 3.3, Publiss 1.1 Light,* Installation Guide & Option Installation Guide, PA-RISC/HP-UX edition, vol. 1, Nov. 29, 1993.
*HI-UX/WE2,* "Management Introduction and Maintenance Edition of the Technical Manual System", Hitachi, Manual No. 3000-9-106-20, Chapter 5.

Primary Examiner—Edward L. Coles, Sr.
Assistant Examiner—Dov Popovici
Attorney, Agent, or Firm—Antonelli, Terry, Stout & Kraus, LLP

[57] ABSTRACT

In a printing system including a plurality of terminal equipment, a plurality of printers which can be shared by the terminal equipment, one or more printer/spooler control servers each for receiving a print from the terminal equipment and for controlling the print by the printer, and a distributed printing management server, for various errors which occur in the printers, the contents of the errors are informed to the user and an error recovery process according to the error is realized. Thus, a use efficiency, performance, reliability, and serviceability as a printing system are improved.

11 Claims, 96 Drawing Sheets

FIG. 10(a)

| FUNCTION OF M NETWORK PRINTER CONTROL COMMAND | | NETWORK PRINTER CONTROL COMMAND | COMMAND CODE | BURYING COMMAND INTO COMMAND DATA UNIT MENTIONED ON THE LEFT SIDE | REMARKS |
|---|---|---|---|---|---|
| CLASSIFICATION | NAME | | | | |
| (a) PROGRAM DOWNLOAD | CONTROL WARE DOWNLOAD | C/W LOAD | 05h | NONE | DOWNLOAD PROGRAM OF PRINTER CONTROLLER |
| (b) FONT DOWNLOAD | FONT LOAD | FONT LOAD | 06h | NONE | LOAD FONT TO PRINTER CONTROLLER |
| (c) QUERY | QUERY READY STATUS | TEST UNIT READY | 00h | NONE | CHECK WHETHER PRINTER CONTROLLER CAN OPERATE OR NOT USED FLAG IS ON |
| | QUERY PRINTER TYPE | INQUIRY | 12h | | QUERY PRINTER TYPE |
| | QUERY PARAMETER | MODE SENSE | 1Ah | | QUERY PRC PARAMETER |
| | QUERY PRINTER CONTROLLER STATUS | REQUEST SENSE | 03h | | QUERY PRC STATUS |

FIG. 10(b)

| FUNCTION OF M NETWORK PRINTER CONTROL COMMAND | | NETWORK PRINTER CONTROL COMMAND | COMMAND CODE | BURYING COMMAND INTO COMMAND DATA UNIT MENTIONED ON THE LEFT SIDE | REMARKS |
|---|---|---|---|---|---|
| CLASSIFICATION | NAME | | | | |
| (d) SPECIFYING PDL | SPECIFYING PDL | | | | |
| (e) SETTING PRINTING CONDITIONS | SINGLE/DOUBLE SIDE PRINTING SPECIFYING | PRINT | 0Ah | EXIST ACCORDING TO PDL ETC. | SET PRINTING CONDITION |
| | DOUBLE SIDE PRINTING TERMINATION SPECIFYING | | | | |
| | PAPER-SUPPLY UNIT SPECIFYING | | | | |
| | PAPER-EJECT UNIT SPECIFYING | | | | |
| | PAPER SIZE SPECIFYING | | | | |
| | PRINT ORIENTATION (PORTRAIT/LANDSCAPE) SPECIFYING | | | | |
| | PAPER VERTICAL/HORIZONTAL DIRECTION SPECIFYING | | | | |
| | COPY-COUNT SPECIFYING | | | | |
| | PRINT-START PAGE NUMBER SPECIFYING | | | | |
| | RESET PAGE NUMBER CONSTRAINED/UNCONSTRAINED COMMAND SPECIFYING | | | | |
| | SET PRINTER MODE | MODE SELECT | 15h | NONE | SELECT PRINTER CONTROLLER PRINT MODE |
| | PRINT ALL BUFFER DATA | FLUSH BUFFER | 10h | NONE | PRINT OUT ALL DATA EXISTING IN BUFFER IN PRINTER CONTROLLER |
| | | FLUSH BUFFER2 | | | |
| (f) DRAWING | TEXT OUTPUT | PRINT | 0Ah | EXIST ACCRDING TO PDL | INSTRUCT DRAWING |
| | IMAGE OUTPUT | | | | |
| | GRAPHICS OUTPUT | | | | |
| (g) PRINT REQUEST | PRINT REQUEST | PRINT | 0Ah | DITTO | INSTRUCT PRINTING |

FIG. 10(c)

| FUNCTION OF NETWORK PRINTER CONTROL COMMAND | | NETWORK PRINTER CONTROL COMMAND | COMMAND CODE | BURYING COMMAND INTO COMMAND DATA UNIT MENTIONED ON THE LEFT SIDE | REMARKS |
|---|---|---|---|---|---|
| CLASSIFICATION | NAME | | | | |
| (h) URGENT REQUEST FROM WS TO PRC | SUSPEND | STOP PRINT HOLDING BIT 1 (SUSPEND) 0 (CANCEL) | 1Bh | | SUSPEND (HOLDING BIT 1) OR CANCEL (HOLDING BIT 0) PRINT PROCESS OF PRINTER CONTROLLER |
| | CANCEL | | | | |
| | RESUME | CONTINUE PRINT | 19h | NONE | RESUME PRINT PROCESS OF PRINTER CONTROLLER |
| (i) POLL FROM WS TO PRC | POLL | POLL | 01h | NONE | QUERY WHETHER REPORT ITEM EXISTS OR NOT TO PRINTER CONTROLLER |
| (j) END SESSION | END SESSION | END SESSION | 07h | NONE | INSTRUCT DISCONNECTION AND SOCKET RELEASE |
| | | END SESSION2 | 08h | NONE | INSTRUCT DISCONNECTION AND SOCKET RELEASE USED FLAG IS OFF |
| (k) SELF DIAGNOSIS | SELF DIAGNOSIS EXECUTING INSTRUCTION | SEND DIAGNOSTIC | 1Dh | NONE | INSTRUCT EXECUTION OF SELF DIAGNOSIS TO NETWORK PRINTER |
| | SELF DIAGNOSIS RESULT REPORTING INSTRUCTION | RECEIVE DIAGNOSTIC RESULT | 1Ch | NONE | REQUEST TO REPORT SELF DIAGNOSIS RESULTS |

| FUNCTION | MESSAGE NAME | FUNCTION OUTLINE | MESSAGE CODE (H) |
|---|---|---|---|
| | NPRSTTS | REPORT ERROR STATUS AND PAPER CASSETTE STATUS | 01 |

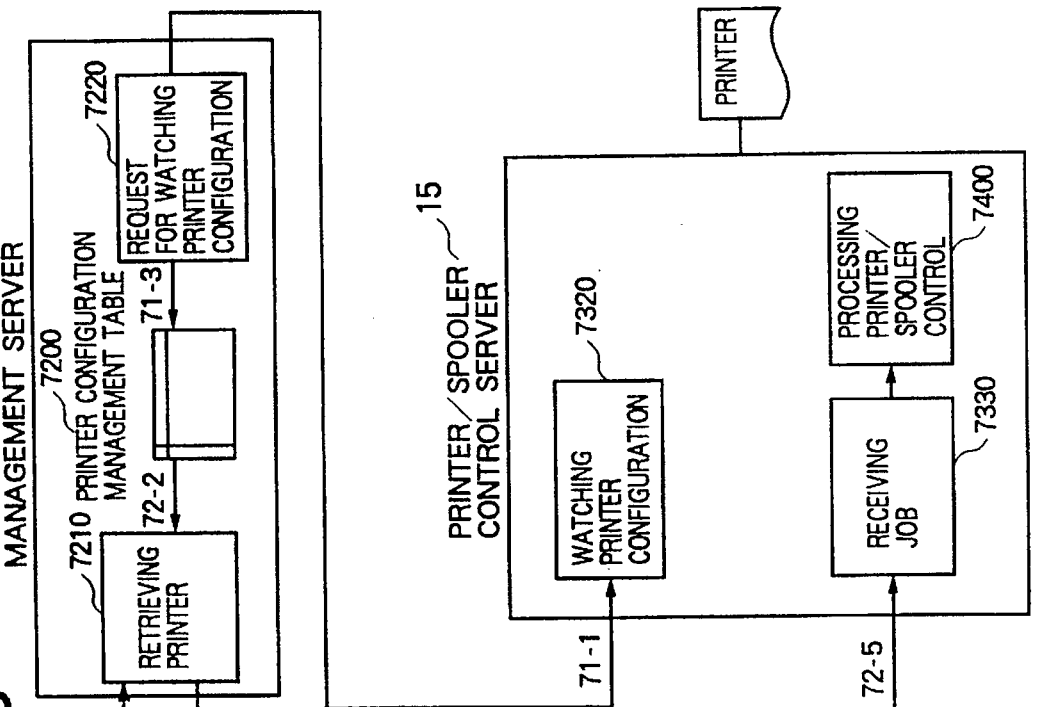
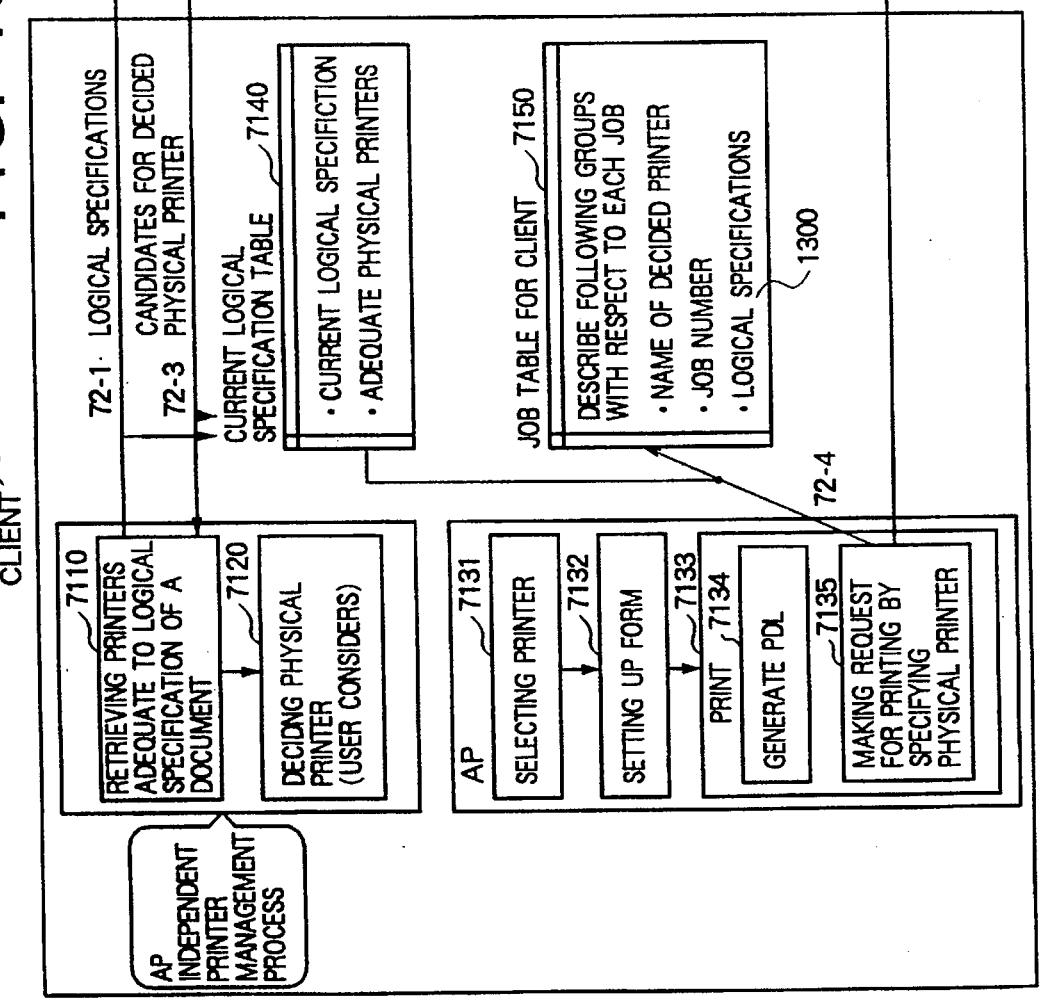
FIG. 13

FIG. 14A

WHOLE CONFIGURATION

PRINTER CONFIGURATION
MANAGEMENT TABLE FORMING — 1410
DATE

| PRINTER/SPOOLER CONTROL SERVER HOST NAME 1 | ALIVE FLAG | PRINTCAP FORMING DATE | PRINTER/SPOOLER CONTROL SERVER SPECIFICATIONS | PRINTER/SPOOLER CONTROL SERVER STATUSES | |
|---|---|---|---|---|---|
| ...1421 | ...1422 | ...1423 | ...1424 | ...1425 | ... |
| 1431 | 1432 | 1433 | 1434 | 1435 | |
| PRINTER/SPOOLER CONTROL SERVER HOST NAME i | ALIVE FLAG | PRINTCAP FORMING DATE | PRINTER/SPOOLER CONTROL SERVER SPECIFICATIONS | PRINTER/SPOOLER CONTROL SERVER STATUSES | ... |
| ... | ... | ... | ... | ... | |

1436 ①↑

| PHYSICAL PRINTER NAME ii | ALIVE FLAG | PRINTER CONNECTING METHOD | PLACE | PRINTER TYPE NO. | PRINTER STATUS | JOB AMOUNT | REMARKS |
|---|---|---|---|---|---|---|---|
| ...1451 | 1452 | 1453 | 1454 | 14550 | 1456 | 1457 | 1458 |

①↑ 1437

ALIVE FLAG AND PLACE

| 1452 ALIVE FLAG = | 0 ALIVE<br>1 STOP<br>2 FATAL ERROR |
|---|---|
| PLACE : OFFICE, BUILDING NAME, FLOOR, AREA, ETC.<br>1454 | |

FIG. 14D

PRINTER STATUS ~1456

| ERROR STATUS ~1456A | ERROR TYPE | ~1456A-1 |
|---|---|---|
| | ERROR CODE 1 | ~1456A-2 |
| | ERROR CODE 2 | ~1456A-3 |
| RESOURCE LOADING STATUS ~1456B | PDL LOADING STATUS | ~1456B-1 |
| | PAPER SUPPLY UNIT LOADING STATUS | ~1456B-2 |
| | PAPER EJECT UNIT LOADING STATUS | ~1456B-3 |
| | FONT LOADING STATUS | ~1456B-4 |
| | FORM LOADING STATUS | ~1456B-5 |
| RESOURCE SELECTION STATUS ~1456C | DOT DENSITY | ~1456C-1 |
| | SINGLE/DOUBLE SIDE | ~1456C-2 |
| | PDL | ~1456C-3 |
| | PAPER SIZE | ~1456C-4 |
| | PAPER SUPPLY UNIT NO. | ~1456C-5 |
| | PAPER SUPPLY UNIT TYPE | ~1456C-6 |
| | PAPER EJECT UNIT NO. | ~1456C-7 |
| | PORTRAIT/LANDSCAPE | ~1456C-8 |
| | FONT | ~1456C-9 |
| | FORM | ~1456C-A |
| | ZOOM-IN/OUT RATIO | ~1456C-B |

FIG. 15

| LEVEL | LOGICAL SPECIFICATIONS | PRINTERS ADEQUATE TO LOGICAL SPECIFICATIONS OF A DOCUMENT SELECTING ALGORITHM |
|---|---|---|
| LEVEL 1 | ① SORT OF PDL (LIPS, ESC/P, POSTSCRIPT, PC-PR201)<br>② PAPER SIZE<br>③ SINGLE/DUPLEX PRINTING<br>④ DOT DENSITY | ① SELECT AND RANK CANDIDATE PRINTERS ON THE BASIS OF LOGICAL SPECIFICATIONS OF DOCUMENTS AND PRINT SPEED<br>② CLIENT DISPLAYS PLACE INFORMATION AND USER USES IT WHEN SELECTING PRINTER |
| LEVEL 2 | ① FONT<br>② PLACE | ① IN ADDITION TO LOGICAL SPECIFICATIONS, DECIDE RANKS OF CANDIDATE PRINTERS IN CONSIDERATION OF DISTANCE FROM USER, WAITING TIME, AND PAPER LOADING STATUS |
| LEVEL 3 | ① COLOR (MONOCHROMATIC /MULTI-COLOR /FULL-COLOR)<br>② ZOOM-IN/OUT RATIO | ① CONVERT PDL OR COLOR WHEN PRINTERS WHICH SATISFY THE SORT OF PDL AND COLOR SPECIFICATIONS DO NOT EXIST<br>② SUGGEST REDUCTION PRINTING BY PRINTER WHICH CAN PERFORM THE REDUCTION PRINTING TO USER WHEN PRINTERS WHICH SATISFY THE PAPER SIZE DOESN'T EXIST |

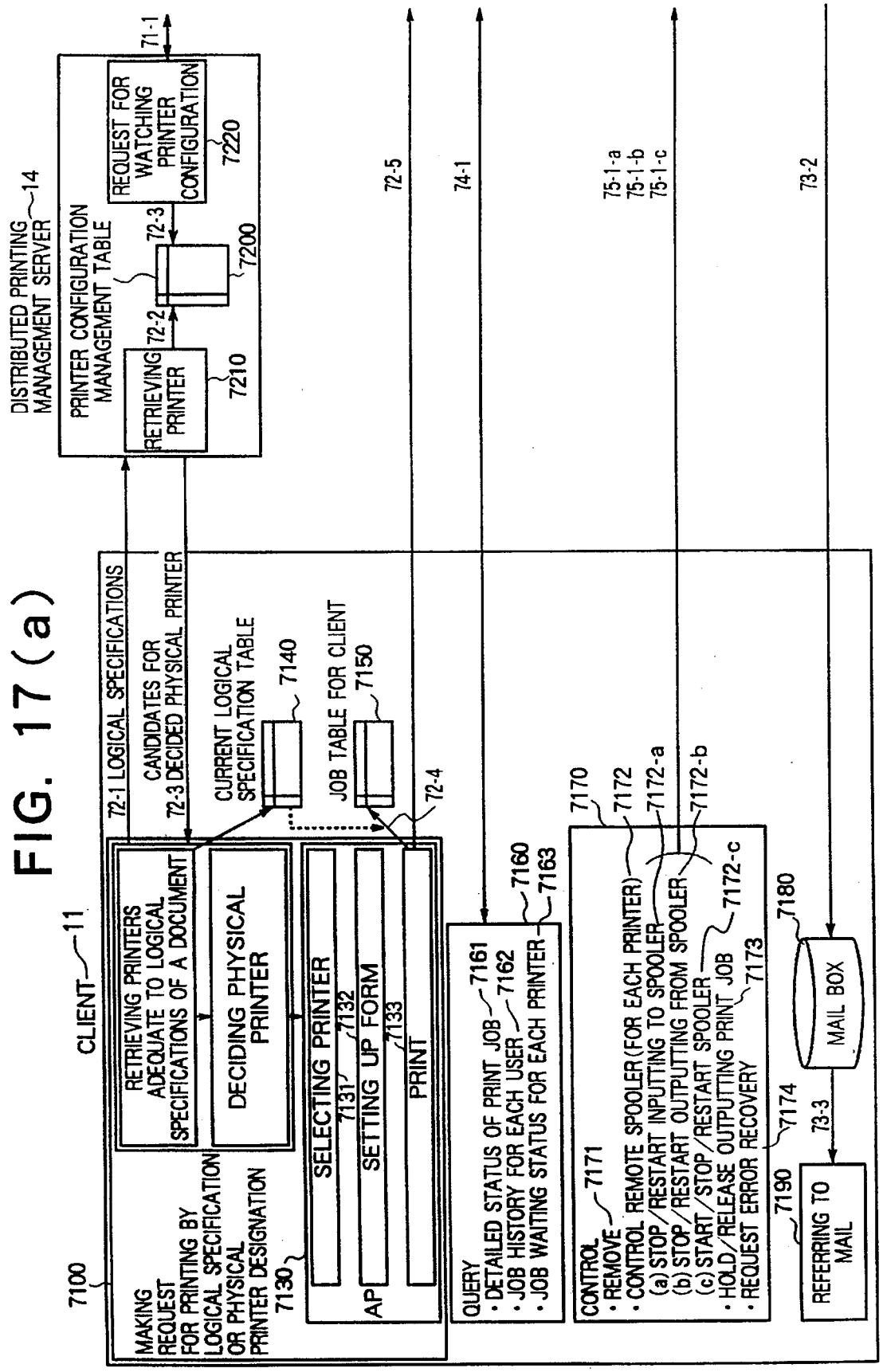

FIG. 18(a)

| ERROR CLASSIFICATION ~18000 | | ERROR PROCESSING ~18010 | | |
|---|---|---|---|---|
| | | ERROR DETECTING APPARATUS ~18011 | REPORT SPECIFICATION ~18012 | ERROR PROCESSING APPARATUS ~18013 | CONTENTS OF PROCESSINGS ~18014 |
| PRINTER ERROR ~18100 | ERROR TO BE IGNORED ~18110 | PRINTER ~18111 | NONE ~18112 | NONE ~18113 | IGNORE ~18114 |
| | ERROR TO BE AUTOMATICALLY RECOVERED BY PRINTER ~18120 / REPRINT UNNECESSARY ~18130 | DITTO ~18121 | NONE ~18122 | PRINTER ~18123 | RECOVERY BY ERROR PROCESSING BUILT IN THE PRINTER ~18124 |
| | RRROR NECESSARY FOR USER TO TAKE A PROCEDURE ~1813A | DITTO ~18131 | PRINTER→ PRINTER/SPOOLER CONTROL SERVER→ CLIENT ~18132 | PRINTER, PRINTER/SPOOLER CONTROL SERVER→ CLIENT ~18133 | ① REPORT (PRINTER→PRINTER/SPOOLER CONTROL SERVER→CLIENT) ② IF NECESSARY, USER PROCESSES ~18134 |
| | REPRINT NECESSARY ~18140 | DITTO ~18141 | DITTO ~18142 | DITTO ~18143 | ① REPORT (PRINTER→PRINTER/SPOOLER CONTROL SERVER→CLIENT) ② IF NECESSARY, USER PROCESSES ③ RECOVERY REQUEST FROM CLIENT ④ IF NECESSARY RETRANSFER FROM PRINTER/SPOOLER CONTROL SERVER ⑤ PRINTER REPRINT ~18144 |
| | FATAL ERROR ~18150 | DITTO ~18151 | DITTO ~18152 | PRINTER, PRINT/SPOOLER CONTROL SERVER DISTRIBUTED PRINTING MANAGEMENT SERVER, CLIENT ~18153 | PRINT, USING ALTERNATIVE PRINTER ~18154 |

FIG. 18(b)

| ERROR CLASSIFICATION 18000 | | ERROR DETECTING APPARATUS 18011 | REPORT SPECIFICATION 18012 | ERROR PROCESSING APPARATUS 18013 | CONTENTS OF PROCESSINGS 18014 |
|---|---|---|---|---|---|
| 18210 | 18211 | | | ERROR PROCESSING 18010 | |
| PRINTER /SPOOLER CONTROL SERVER ERROR 18200 | ERROR TO BE IGNORED 18210 | PRINTER/SPOOLER CONTROL SERVER 18211 | NONE 18212 | NONE 18213 | IGNORE 18214 |
| | ERROR TO BE AUTOMATICALLY IGNORED 18220 | DITTO 18221 | DITTO 18222 | PRINTER/SPOOLER CONTROL SERVER 18223 | RECOVERY BY ERROR PROCESSING BUILT IN THE PRINTER/SPOOLER CONTROL SERVER 18224 |
| | FATAL ERROR 18230 | DISTRIBUTED PRINTING MANAGEMENT SERVER OR CLIENT 18231 | PRINTER/SPOOLER CONTROL SERVER → DISTRIBUTED PRINTING MANAGEMENT SERVER AND CLIENT 18232 | PRINTER/SPOOLER CONTROL SERVER, DISTRIBUTED PRINTING MANAGEMENT SERVER, ETC. 18233 | PRINT, USING ALTERNATIVE PRINTER/SPOOLER CONTROL SERVER 18234 |
| DISTRIBUTED PRINTING MANAGEMENT SERVER ERROR 18300 | ERROR TO BE IGNORED 18310 | DISTRIBUTED PRINTING MANAGEMENT SERVER 18311 | NONE 18312 | NONE 18313 | IGNORE 18314 |
| | ERROR TO BE AUTOMATICALLY IGNORED 18320 | DITTO 18321 | DITTO 18322 | DISTRIBUTED PRINTING MANAGEMENT SERVER 18323 | RECOVERY BY ERROR PROCESSING BUILT IN DISTRIBUTED PRINTING MANAGEMENT SERVER 18324 |
| | FATAL ERROR 18330 | PRINTER/SPOOLER CONTROL SERVER AND CLIENT 18331 | NONE 18332 | PRINTER/SPOOLER CONTROL SERVER, ETC. 18333 | PRINT, USING ALTERNATIVE DISTRIBUTED MANAGEMENT SERVER 18334 |

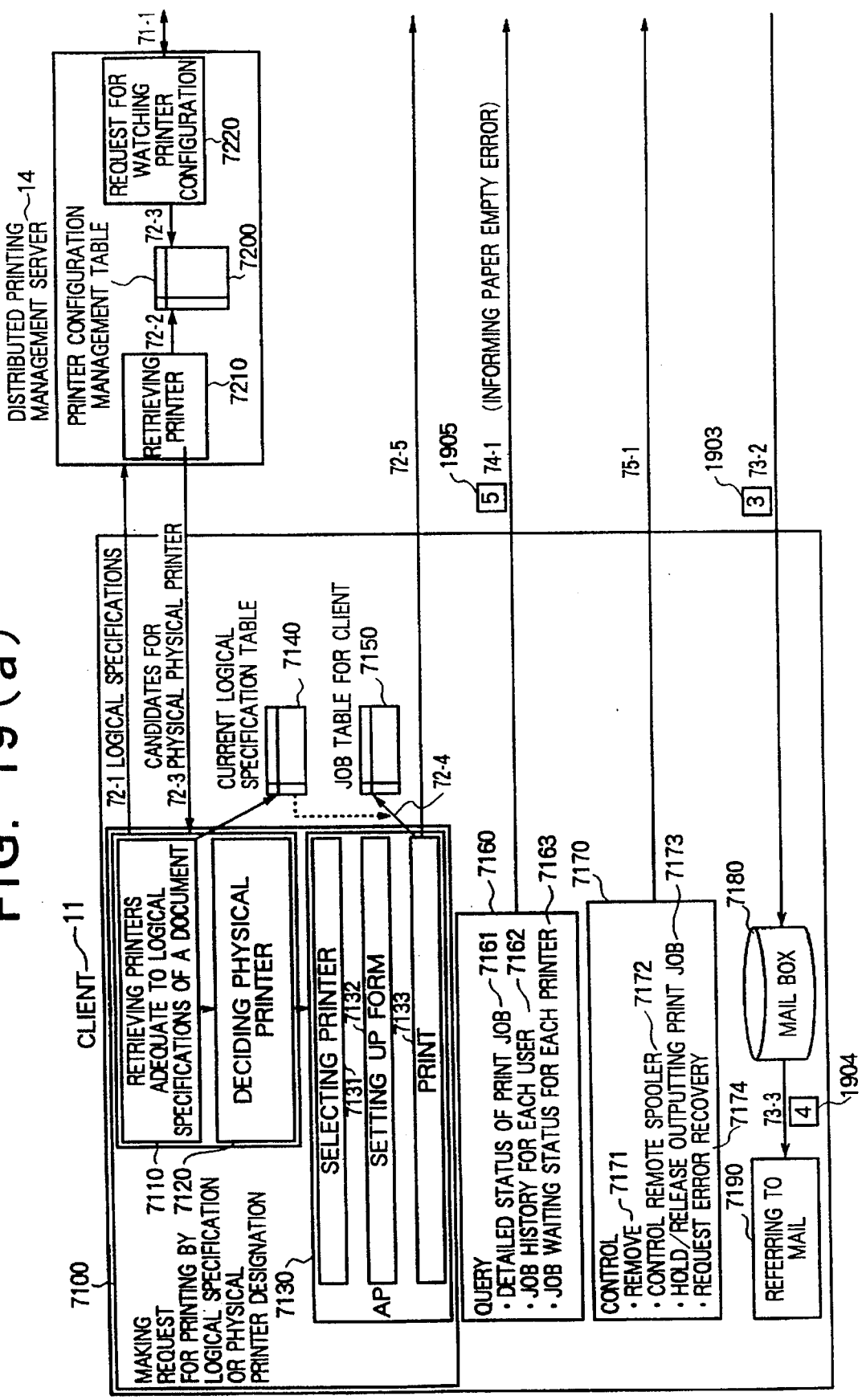

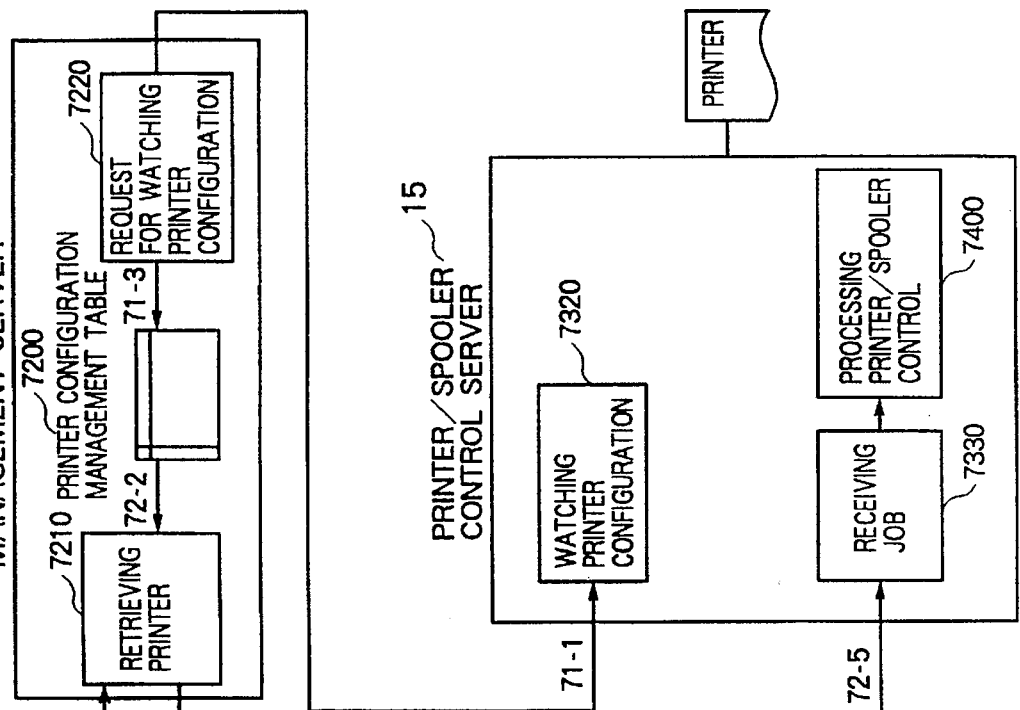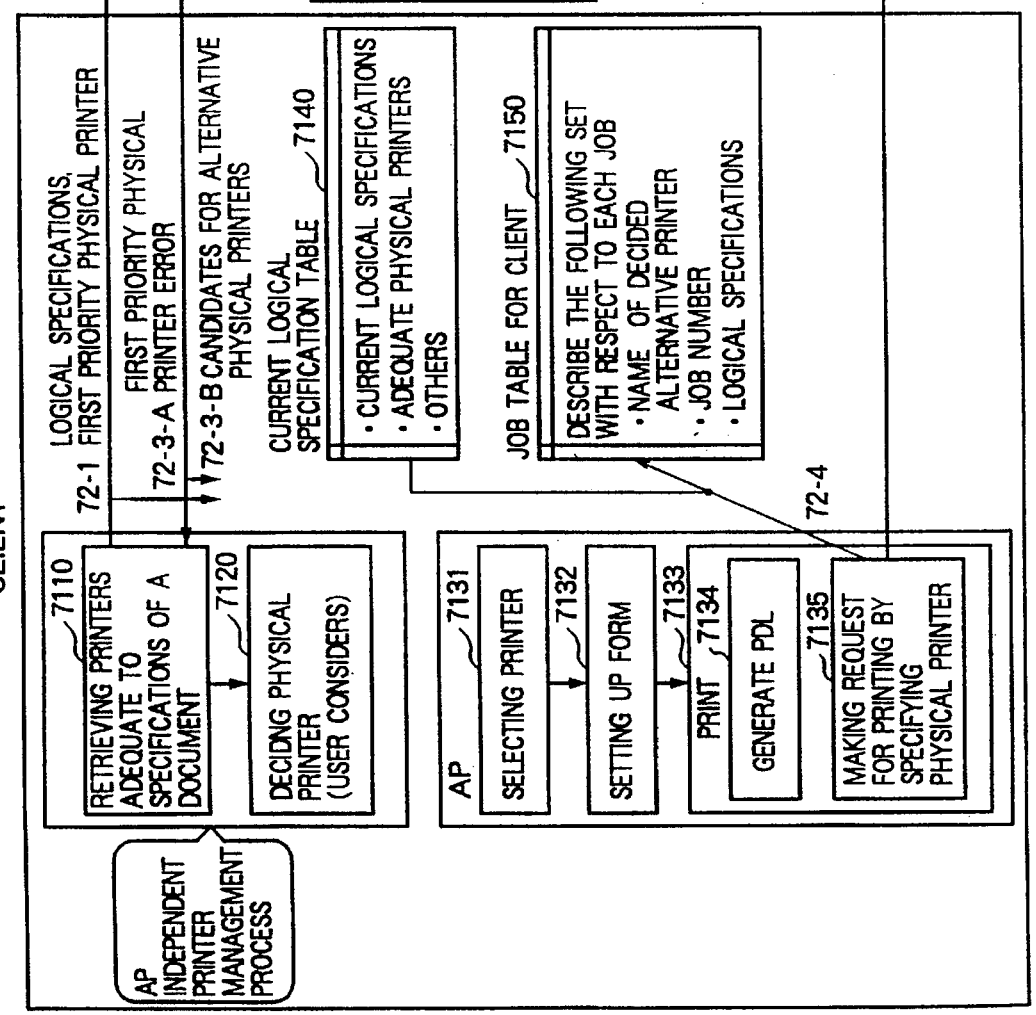
FIG. 25

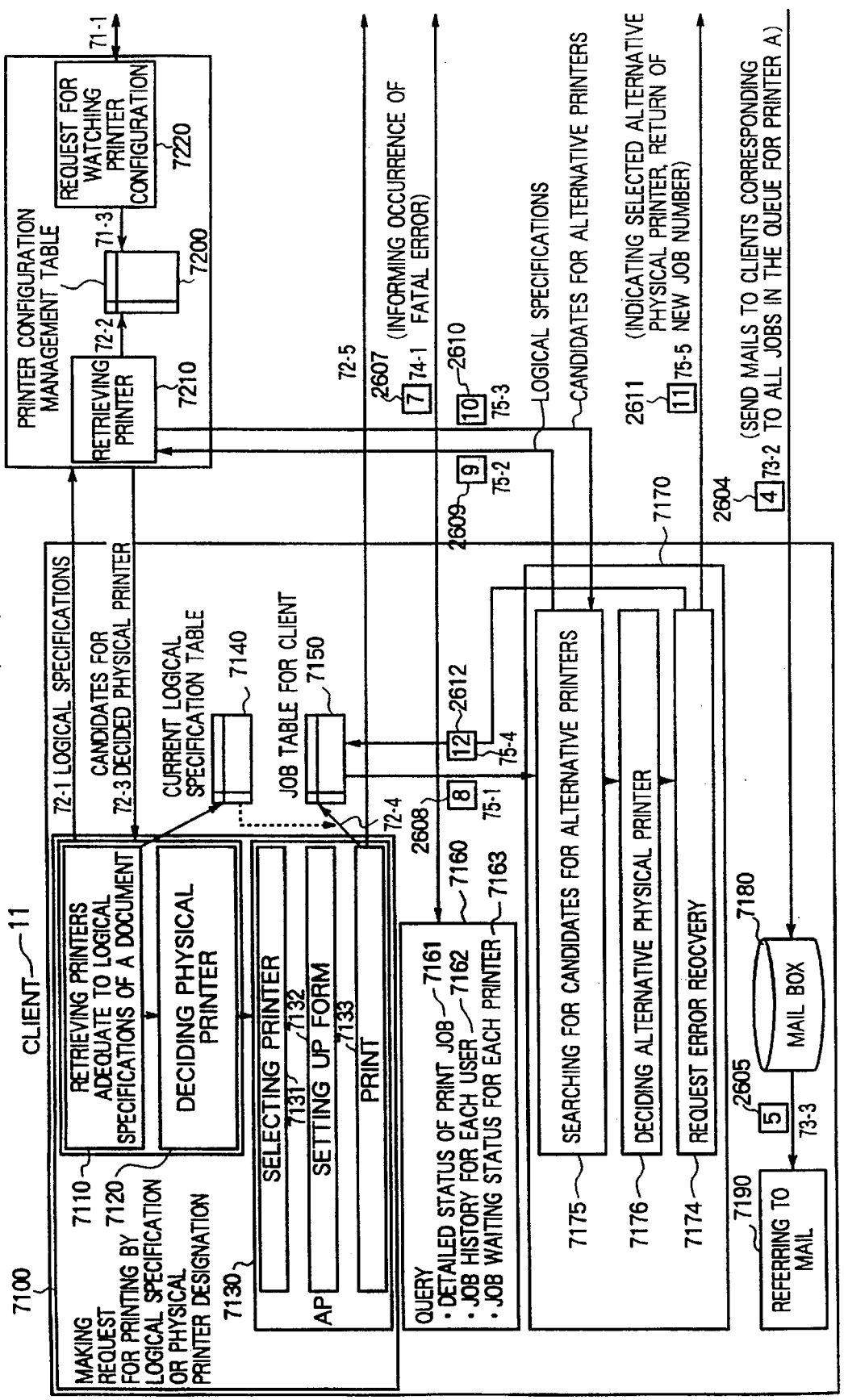

FIG. 29

| CLASSIFICATION BUS | | PRINTING PROTOCOL | COMMUNICATION PROTOCOL | SERVICES WHICH ARE PROVIDED | I/F TO GET PRINT JOB DATA FROM APPLICATION PROGRAM |
|---|---|---|---|---|---|
| INTER CLIENT-PRINT SERVER | ① 2851 | DISTRIBUTED PRINTING PROTOCOL | TCP/IP | ADVANCED PRINT SERVICE | MAKING REQUEST FOR PRINTING BY PHYSICAL PRINTER DESIGNATION OR PRINTER DRIVER I/F |
| | ② 2852 | DISTRIBUTED PRINTING PROTOCOL | SPX/IPX | ADVANCED PRINT SERVICE | [WHEN MS-DOS] PRINTER DRIVER [WHEN WINDOWS] NETWORK DRIVER (NOTE 1) IN THE WINDOWS |
| | ③ 2853 | NetWare | SPX/IPX | NetWare | DITTO |
| INTER PRINT SERVER -PRINTER | ④ 2854 | LOGICAL INTERFACE OF SCSI | PHYSICAL INTERFACE OF SCSI | RELIABLE PRINTER CONTROL | |
| | ⑤ 2855 | REMOTE PRINTER CONTROL PROTOCOL | TCP/IP | RELIABLE PRINTER CONTROL | |

(NOTE 1) THE WINDOWS NETWORK DRIVER TRANSFERS PDL FILE TO SPOOLER ON PRINT SERVER

FIG. 34

| FUNCTION | COMMAND NAME | USER | | REMARKS |
|---|---|---|---|---|
| | | GENERAL USER | SYSTEM MANAGER | |
| RETRIEVE PRINTERS ADEQUATE TO LOGICAL SPECIFICATIONS OF A DOCUMENT | usr_lgc | ○ | ○ | |
| MAKING REQUEST FOR PRINTING OF LOGICAL SPECIFICATION LEBEL | usr_lpr | ○ | | (NOTE 1) |
| QUERY OF PRINT JOB GENERAL STATUS | usr_lpq | ○ | | |
| DELETE PRINT JOB | usr_lprm | ○ | | |
| CONTROL OF OUTPUTTING JOB (CONTROL OF SPOOLER) | usr_lpc | ○ | ○ | COMMANDS SHOWN IN (NOTE 2) CAN BE INSTRUCTED AS SUBCOMMANDS ALIAS, CONTROL OF SPOOLER |
| OUTPUT ACCOUNT INFORMATION | usr_pac | ○ | ○ | |
| QUERY OF PRINT JOB DETAILED STATUS | usr_jobq | ○ | ○ | |
| HOLD/RELEASE PRINT JOB OUTPUT | usr_hold | ○ | ○ | |
| REQUEST OF ERROR RECOVERY | usr_rcvry | ○ | ○ | (NOTE 3) |
| SEARCH FOR CANDIDATES FOR ALTERNATIVE PRINTERS | usr_altprn_disp | | ○ | |
| REFER TO HISTORY OF PRINT JOBS OF EACH INDIVIDUAL USER | usr_jobhst | ○ | ○ | |
| DISPLAY PRINTER CONFIGURATIONS | usr_prnconf_disp | ○ | ○ | |
| QUERY ABOUT PRINTER SPECIFICATIONS | usr_prnspc_qry | ○ | ○ | |

FIG. 35 (a)

| FUNCTION | FUNCTION NAME | SENDING HOST | RECEPTION HOST | REMARKS |
|---|---|---|---|---|
| RETRIEVE PRINTERS ADEQUATE TO LOGICAL SPECIFICATIONS OF A DOCUMENT | cl_lgc | CLIENT | DISTRIBUTED PRINTING MANAGEMENT SERVER | RETURN ADEQUATE PRINTERS AND ADEQUATE SERVERS AS A RESPONSE; ALIAS,GIVE PRINT SPECIFICATIONS OF DOCUMENT |
| TRANSFER PRINT JOB | cl_lpr | CLIENT | PRINT SERVER | EXPAND PARAMETERS AND REQUEST PRINTED BY LOGICAL PRINT SPECIFICATIONS |
| QUERY OF PRINT JOB GENERAL STATUS | cl_lpq | CLIENT | PRINT SERVER | |
| DELETE PRINT JOB | cl_lprm | CLIENT | PRINT SERVER | |
| CONTROL OF OUTPUTTING JOB (CONTROL OF SPOOLER) | cl_lpc | CLIENT | PRINT SERVER | COMMANDS SHOWN IN (NOTE 1) CAN BE INSTRUCTED AS SUBCOMMANDS. ALIAS, CONTROL OF SPOOLER |
| OUTPUT ACCOUNT INFORMATION | cl_pac | CLIENT | PRINT SERVER | |
| QUERY OF PRINT JOB DETAILED STATUS | cl_jobq | CLIENT | PRINT SERVER | |
| HOLD/RELEASE PRINT JOB OUTPUT | cl_hold | CLIENT | PRINT SERVER | |
| SEARCH FOR CANDIDATES FOR ALTERNATIVE PRINTERS | cl_altprn _qry | CLIENT | DISTRIBUTED PRINTING MANAGEMENT SERVER | |
| REQUEST OF ERROR RECOVERY | cl_rcvry | CLIENT | PRINT SERVER | (NOTE 2) |

FIG. 35 (b)

| FUNCTION | FUNCTION NAME | SENDING HOST | RECEPTION HOST | REMARKS |
|---|---|---|---|---|
| REFER TO HISTORY OF PRINT JOBS OF EACH INDIVIDUAL USER | cl_jobhst | CLIENT | PRINT SERVER | |
| QUERY OF PRINTER CONFIGURATION | cl_prnconf_qry | CLIENT | DISTRIBUTED PRINTING MANAGEMENT SERVER | |
| QUERY ABOUT PRINTER SPECIFICATION | cl_prnspe_qry | CLIENT | DISTRIBUTED PRINTING MANAGEMENT SERVER | |

(NOTE 1) "ABORT, CLEAN, DISABLE, DOWN, ENABLE, RESTART, START, STOP, TOPQ, UP" CAN BE INSTRUCTED AS SUBCOMMANDS.

(NOTE 2) THE REPRINT START PAGE AND THE PERMISSION OR INHIBITION OF THE USER OF THE ALTERNATIVE PRINTER CAN BE DESIGNATED BY PARAMETERS.

(NOTE 3) AS AN I/F FOR CLIENT, "lpr, lpq, lprm, lpc" ARE ALSO SUPPORTED AS A STANDARD FUNCTION CORRESPONDING TO THE OTHER COMPANIES.

(NOTE 4) THE SYSTEM PROGRAM USES ALL OF THE ABOVE COMMANDS.

FIG. 36

| FUCTION | FUNCTION NAME | SENDING HOST | RECEPTION HOST | REMARKS |
|---|---|---|---|---|
| QUERY OF PRINTER SPECIFICATIONS (NOTE 1) | dm_prchrq | DISTRIBUTED PRINTING MANAGEMENT SERVER | PRINTER/SPOOLER CONTROL SERVER | SEND THE COMMANDS WRITTEN ON THE LEFT AT THE TIME OF INITIALIZATION |
| QUERY OF ALIVE STATUS OF PRINT SERVER AND PRINTER (NOTE 2) | dm_prsactq | DISTRIBUTED PRINTING MANAGEMENT SERVER | PRINTER/SPOOLER CONTROL SERVER | PERIODICALLY SEND THE COMMANDS WRITTEN ON THE LEFT SIDE |
| TRANSMIT PRINTER STATUS (NOTE 3) | dm_prstssnd | PRINTER/SPOOLER CONTROL SERVER | DISTRIBUTED PRINTING MANAGEMENT SERVER | ASYNCHRONOUS REPORT |
| TRANSMIT MESSAGE | dm_msgbrd | DISTRIBUTED PRINTING MANAGEMENT SERVER | CLIENT, PRINT SERVER | |
| QUERY PRINTER STATUS | dm_prstsq | DISTRIBUTED PRINTING MANAGEMENT SERVER | PRINTER/SPOOLER CONTROL SERVER | |

(NOTE 1) THE FIXED INFORMATION SUCH AS SPECIFICATIONS AND THE LIKE ARE INQUIRED. SINCE THE PLACE IS REGISTERED AT THE TIME OF REGISTRATION TO THE DISTRIBUTED PRINTING MANAGEMENT SERVER, THE QUERY ABOUT PLACE IS UNNECESSARY.

(NOTE 2) THE ALIVE FLAGS OF ALL PRINT SERVERS AND THE ALIVE FLAGS OF THE PRINTERS CONNECTED TO EACH PRINTER/SPOOLER CONTROL SERVER ARE INQUIRED.

(NOTE 3) A STATUS CHANGE OF THE PRINTER/SPOOLER CONTROL SERVER AND A STATUS CHANGE OF EACH PRINTER CONNECTED TO THE SERVER ARE ASYNCHRONOUSLY REPORTED FROM THE PRINT SERVER.

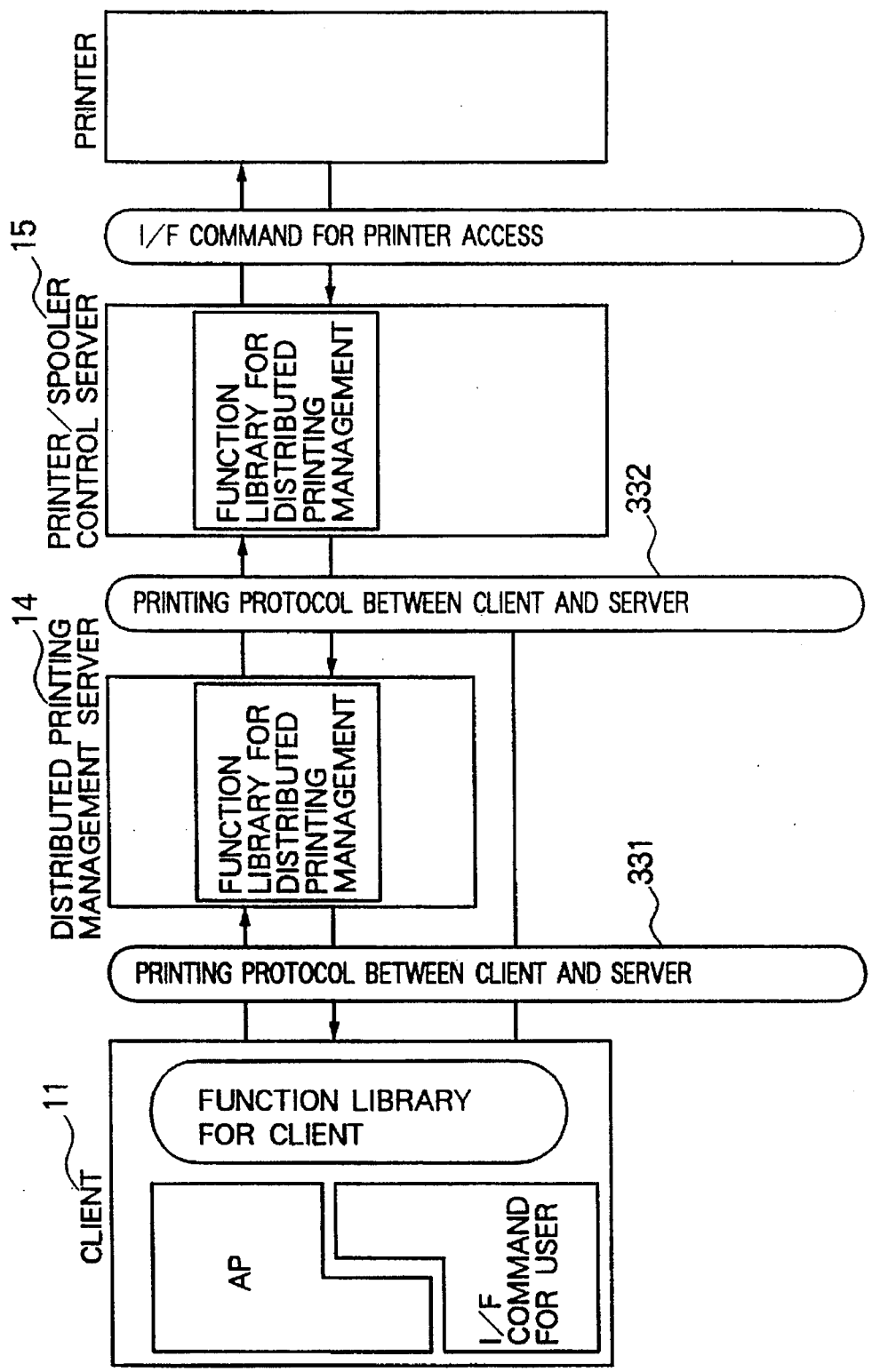

FIG.39A

PDL LOADING STATUS

| PDL NUMBER | ~3911 |
|---|---|
| PDL NAME 1 | ~39121 |
| ⋮ | |
| PDL NAME n | ~3912n |

FIG.39B

LOADING STATUS OF PAPER SUPPLY UNIT

| STATUS OF PAPER SUPPLY UNIT 1 | PRESENSE OR ABSENCE OF PAPER | ~39211 |
| | CASSETTE SHAPE | ~39212 |
| | PAPER SIZE | ~39213 |
| 3921 ⋮ | | |
| 392n STATUS OF PAPER SUPPLY UNIT n | ⋮ (THE SAME AS THAT IN CASE OF PAPER SUPPLY UNIT 1) | |

FIG.39C

LOADING STATUS OF PAPER EJECT UNIT

| STATUS OF PAPER EJECT UNIT 1 | PRESENCE OR ABSENCE OF PAPER |
|---|---|
| ⋮ | 3931 |
| STATUS OF PAPER EJECT UNIT n | PRESENCE OR ABSENCE OF PAPER |
| | 393n |

FIG.39D

FONT LOADING STATUS

| FONT NUMBER | ~3941 |
|---|---|
| FONT NAME 1 | ~39421 |
|    FONT TYPE | ~394211 |
|    STORAGE PLACE | ~394212 |
| ⋮ | |
| FONT NAME n | ~3942n |
|    (THE SAME AS THAT IN CASE OF FONT NAME 1) | |

FIG.39E

FORM LOADING STATUS

| REGISTERED FORM NUMBER (VARIABLE) | ~3951 |
|---|---|
| FORM NAME 1 | ~39521 |
|    FORM TYPE 1 | ~395211 |
|    VOLATILE/NONVOLATILE | ~395212 |
| ⋮ | |
| FORM NAME n | ~3952n |
|    (THE SAME AS THAT IN CASE OF FONT NAME 1) | |

FIG. 40A

WHOLE CONFIGURATION

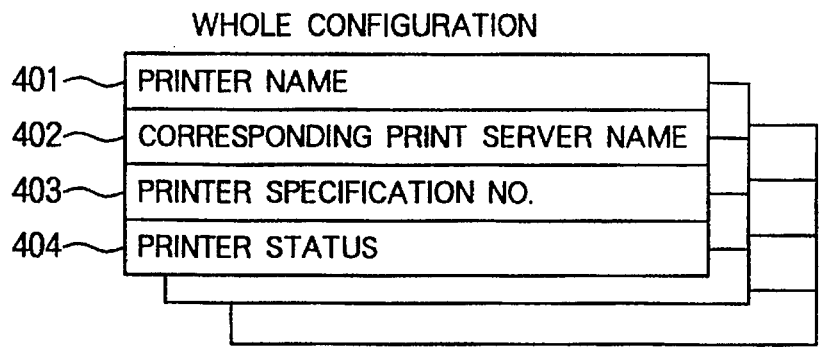

- 401 — PRINTER NAME
- 402 — CORRESPONDING PRINT SERVER NAME
- 403 — PRINTER SPECIFICATION NO.
- 404 — PRINTER STATUS

FIG. 40B

PRINTER STATUS

| | | |
|---|---|---|
| ERROR STATUS<br>1456A | ERROR TYPE | 1456A-1 |
| | ERROR CODE 1 | 1456A-2 |
| | ERROR CODE 2 | 1456A-3 |
| RESOURCE<br>LOADING<br>STATUS<br>1456B | PDL LOADING STATUS | 1456B-1 |
| | PAPER SUPPLY UNIT LOADING STATUS | 1456B-2 |
| | PAPER EJECT UNIT LOADING STATUS | 1456B-3 |
| | FONT LOADING STATUS | 1456B-4 |
| | FORM LOADING STATUS | 1456B-5 |
| RESOURCE<br>SELECTION<br>STATUS<br>1456C | DOT DENSITY | 1456C-1 |
| | SINGLE/DOUBLE SIDE | 1456C-2 |
| | PDL | 1456C-3 |
| | PAPER SIZE | 1456C-4 |
| | PAPER SUPPLY UNIT NUMBER | 1456C-5 |
| | PAPER SUPPLY UNIT TYPE | 1456C-6 |
| | PAPER EJECT UNIT NUMBER | 1456C-7 |
| | PORTRAIT/LANDSCAPE | 1456C-8 |
| | FONT | 1456C-9 |
| | FORM | 1456C-A |
| | ZOOM-IN/OUT RATIO | 1456C-B |

FIG. 41

| | |
|---|---|
| 41-1 | RECORD SIZE |
| 41-2 | JOB NO. |
| 41-3 | USER NAME |
| 41-4 | HOST NAME |
| 41-5 | PRINTER NAME |
| 41-6 | JOB REGISTERATION TIME |
| 41-7 | PRINT START TIME |
| 41-8 | NEW/OLD OF SERVICE |
| 41-9 | JOB STATUS |
| 41-10 | ERROR TYPE |
| 41-11 | ERROR CODE 1 |
| 41-12 | ERROR CODE 2 |
| 41-13 | REQUESTED PAPER SIZE CODE |
| 41-14 | SERIAL NO. OF ERROR OCCURRED PAGE |
| 41-15 | PRINTING FILE NUMBER |
| 41-16 | PRINTING FILE NAMES |

FIG. 42

| | |
|---|---|
| 42-1 | RECORD SIZE |
| 42-2 | JOB NUMBER |
| 42-3 | USER NAME |
| 42-4 | HOST NAME |
| 42-5 | PRINTER NAME |
| 42-6 | ALTERNATIVE PRINTER NAME |
| 42-7 | JOB REGISTRATION TIME |
| 42-8 | PRINT START TIME |
| 42-9 | PRINT END TIME |
| 42-10 | PRINT RESULT |
| 42-11 | NUMBER OF RETRY TIMES |
| 42-12 | PRINTING FILE NUMBER |
| 42-13 | PRINTING FILE NAMES |

| SORT OF PDL | — 431 |
| PORTRAIT/LANDSCAPE | — 432 |
| PAPER SIZE | — 433 |
| SINGLE/DOUBLE SIDE | — 434 |
| DOT DENSITY | — 435 |
| ZOOM-IN/OUT RATIO | — 436 |
| NUMBER OF ADEQUATE PRINTERS | — 437 |
| ADEQUATE PRINTER NAME 1 | — 4371 |
| ⋮ | |
| ADEQUATE PRINTER NAME n | — 437n |

FIG.46A

CONFIGURATION

| TARGET HOST NAME |
|---|
| TARGET HOST NAME |
| ⋮ |
| TARGET HOST NAME |

FIG.46B

CASE OF PRINTING SYSTEM OF FIG. 45

| cl_host 1 |
|---|
| cl_host 2 |
| cl_host 3 |
| prs_host 1 |
| prs_host 2 |

FIG. 47

```
PRINTER 1 : ¥
    : lp  = : ¥
    : sd  = /usr/spool/PRINTER 1 : ¥
    : rm  = prs_host 1 : ¥
    : rp  = PRINTER 1 :

PRINTER 4 : ¥
    : lp  = : ¥
    : sd  = /usr/spool/PRINTER 4 : ¥
    : rm  = prs_host 1 : ¥
    : rp  = PRINTER 4 :

PRINTER 3 : ¥
    : lp  = : ¥
    : sd  = /usr/spool/PRINTER 3 : ¥
    : rm  = prs_host 2 : ¥
    : rp  = PRINTER 3 :

PRINTER 5 : ¥
    : lp  = : ¥
    : sd  = /usr/spool/PRINTER 5 : ¥
    : rm  = prs-host 2 : ¥
    : rp  = PRINTER 5 :
```

FIG. 48

```
PRINTER 1 : ¥
   : lp  = /dev/srv_pr : ¥
   : sd  = /usr/spool/PRINTER 1 : ¥
   : if  = /usr/lib/fil_spr :

PRINTER 4 : ¥
   : lp  = /dev/net_pr : ¥
   : sd  = /usr/spool/PRINTER 4 : ¥
   : if  = /usr/lib/fil_npr :

PRINTER 3 : ¥
   : lp  = : ¥
   : sd  = /usr/spool/PRINTER 3 : ¥
   : rm  = prs_host 2 : ¥
   : rp  = PRINTER 3 :

PRINTER 5 : ¥
   : lp  = : ¥
   : sd  = /usr/spool/PRINTER 5 : ¥
   : rm  = prs_host 2 : ¥
   : rp  = PRINTER 5 :
```

FIG. 49

```
PRINTER 1 : ¥
    : lp  = : ¥
    : sd  = /usr/spool/PRINTER 1 : ¥
    : rm  = prs_host 1 : ¥
    : rp  = PRINTER 1 :

PRINTER 4 : ¥
    : lp  = : ¥
    : sd  = /usr/spool/PRINTER 4 : ¥
    : rm  = prs_host 1 : ¥
    : rp  = PRINTER 4 :

PRINTER 3 : ¥
    : lp  = /dev/srv_pr : ¥
    : sd  = /usr/spool/PRINTER 3 : ¥
    : if  = /usr/lib/fil_spr :

PRINTER 5 : ¥
    : lp  = /dev/net_pr : ¥
    : sd  = /usr/spool/PRINTER 5 : ¥
    : if  = /usr/lib/fil_npr :
```

FIG. 53

| METHOD | COMMUNICATION AMOUNT | PROGRAM AMOUNT | ADOPTION |
|---|---|---|---|
| METHOD 1 | SMALL | SMALL | ○ |
| METHOD 2 | LARGE | LARGE (NOTE 1) | × |

(NOTE 1) NEED TO LOAD CONVERSION PROGRAM FROM PRINTER CONFIGURATION MANAGEMENT TABLE TO CONNECTION PRINTER DESCRIPTION TABLE ON EACH HOST.

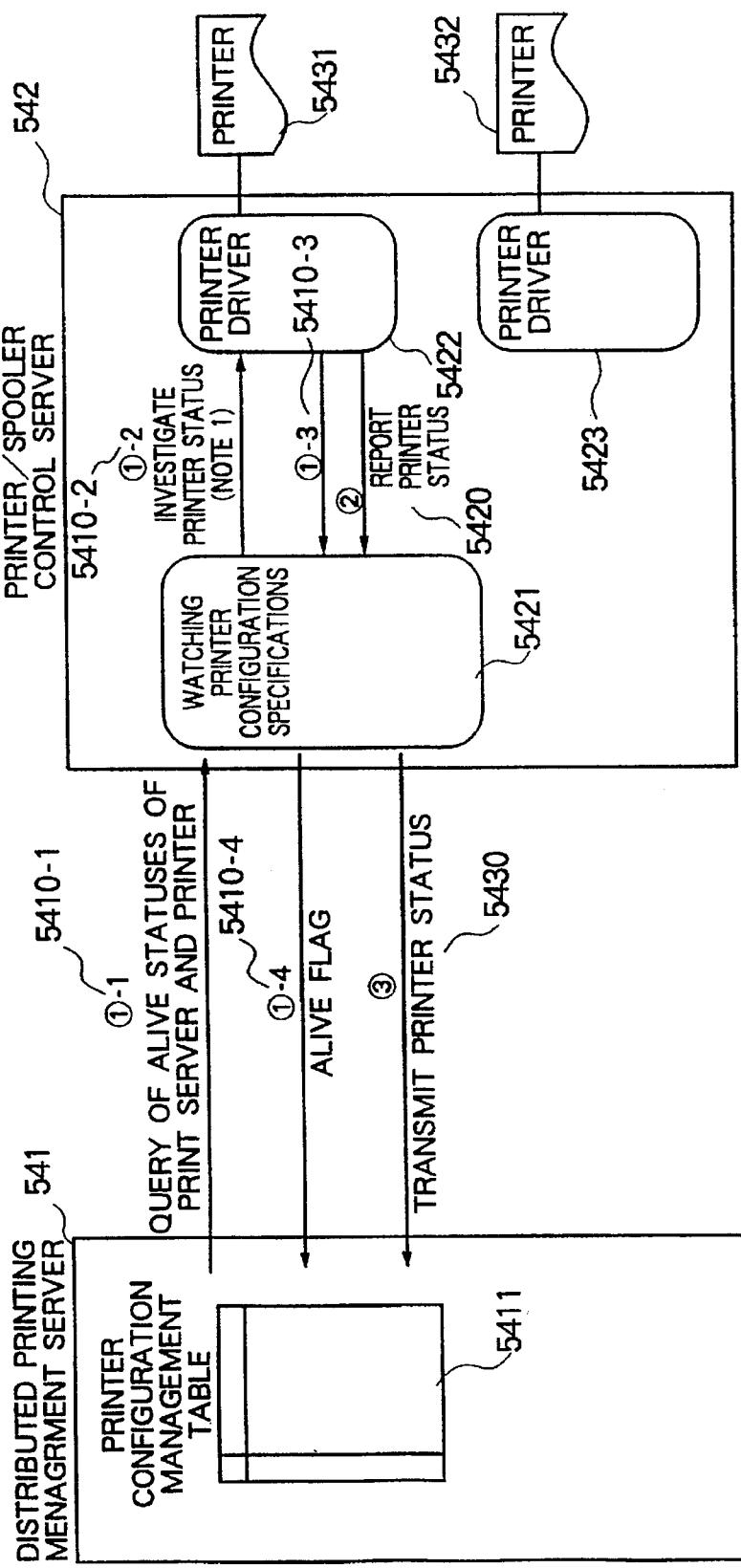

FIG. 55

| RETRIEVING PLACE OF PRINTERS ADEQUATE TO SPECIFICATIONS | COMMUNICATION AMOUNT BETWEEN CLIENT AND DISTRIBUTED PRINTING MANAGEMENT SERVER | PRINTER RETRIEVAL PROGRAM AMOUNT | PROCESSING AMOUNT OF DISTRIBUTED PRINTING MANAGEMENT SERVER | USER I/F |
|---|---|---|---|---|
| DISTRIBUTED PRINTING MANAGEMENT SERVER | SMALL | SMALL | MIDDLE | ○ |
| CLIENT | MIDDLE | LARGE (AMOUNT CORRESPONDING TO CLIENTS IS NECESSARY) | SMALL | ○ |

FIG. 60
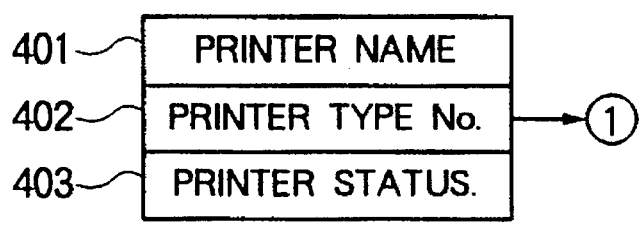
FIG. 61
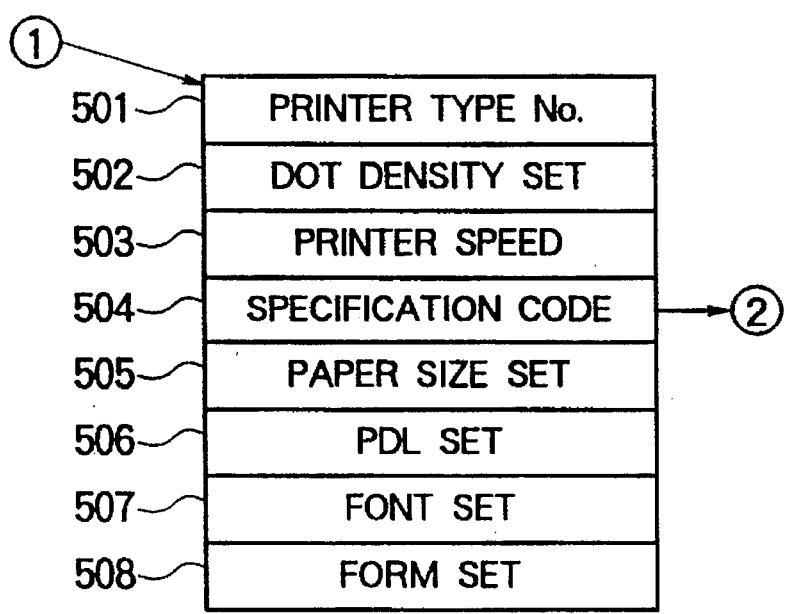
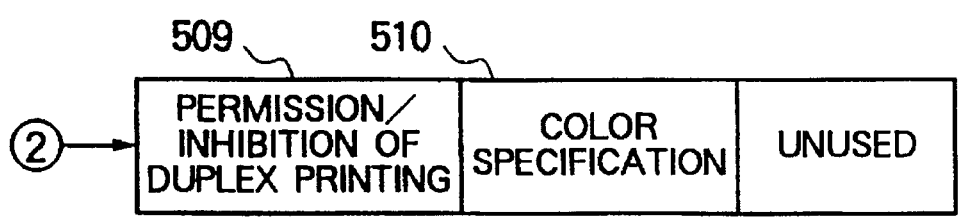

FIG. 62
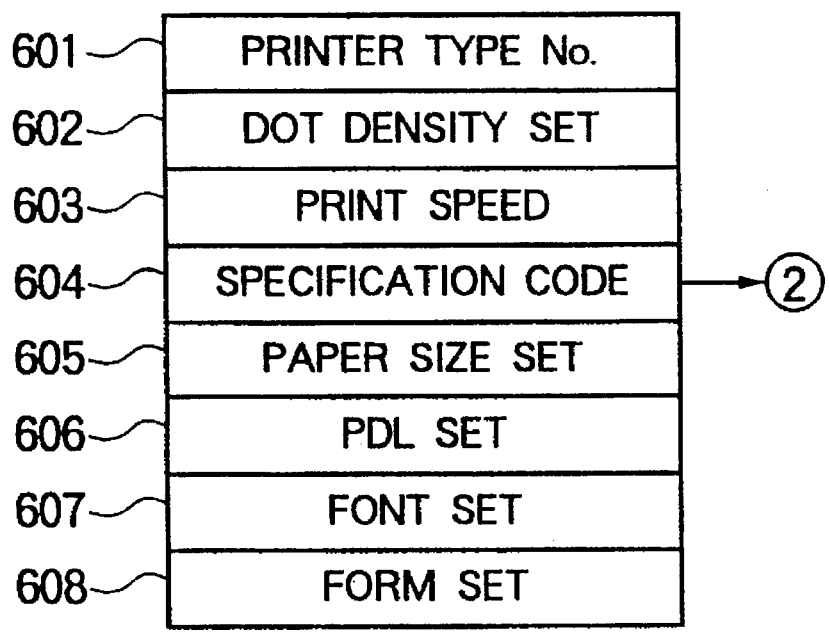
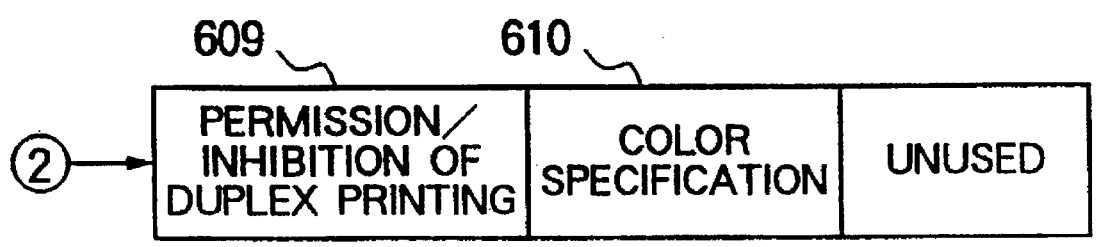

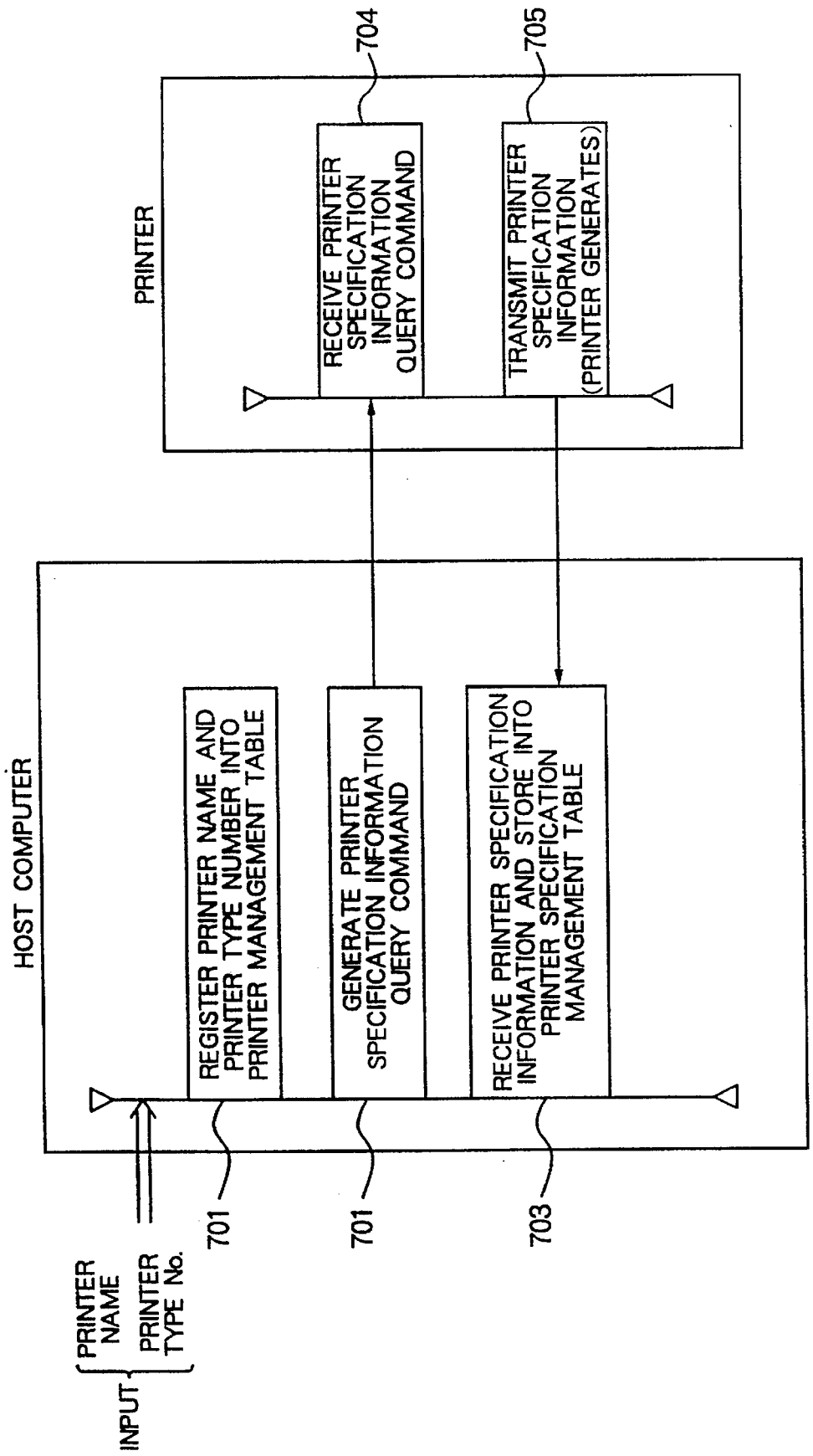

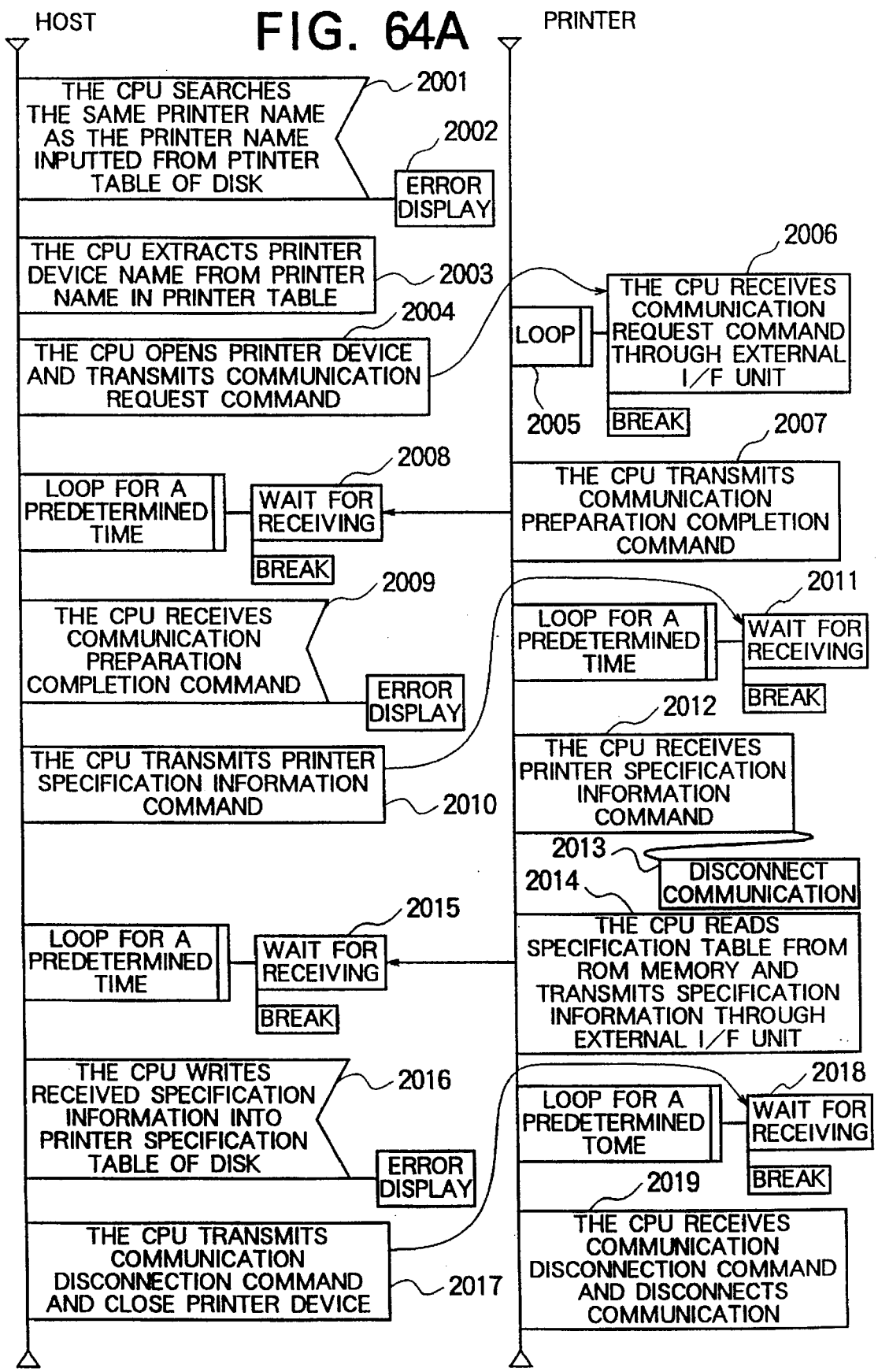

FIG. 64B

SPECIFICATION OF
INPUT COMMAND

| SET PRIN | SP | PRINTETR NAME | SP | PRINTER TYPE NO. |
|---|---|---|---|---|

NAMES WHICH ARE INPUTTED FROM KEYBOARD
SP : SPACE

FIG. 64C

PRINTER TABLE

| PRINTER A | PRINTER DEVICE X |
|---|---|
| PRINTER B | PRINTER DEVICE Y |
| ⋮ | ⋮ |

FILE OF TEXT FORMAT WHICH CAN BE EDITED
BY USING EDITOR AND EXISTS IN HOST COMPUTER

FIG. 66

| NAME OF PRINT SERVER 1 | | STATUS OF PRINT SERVR 1 |
|---|---|---|
| PRINTER NAME 11 | PRINTER TYPE No.11 | PRINTEER STUTUS 11 |
| PRINTER NAME 12 | PRINTER TYPE No.12 | PRINTEER STUTUS 12 |
| ⋮ | ⋮ | ⋮ |
| PRINTER NAME 1p | PRINTER TYPE No.1p | PRINTEER STUTUS 1p |
| NAME OF PRINT SERVER 2 | | STATUS OF PRINT SERVR 2 |
| PRINTER NAME 21 | PRINTER TYPE No.21 | PRINTEER STUTUS 21 |
| PRINTER NAME 22 | PRINTER TYPE No.22 | PRINTEER STUTUS 22 |
| ⋮ | ⋮ | ⋮ |
| PRINTER NAME 2q | PRINTER TYPE No.2q | PRINTEER STUTUS 2q |
| ⋮ | | |
| NAME OF PRINT SERVER i | | STATUS OF PRINT SERVR i |
| PRINTER NAME i1 | PRINTER TYPE No.i1 | PRINTEER STUTUS i1 |
| PRINTER NAME i2 | PRINTER TYPE No.i2 | PRINTEER STUTUS i2 |
| ⋮ | ⋮ | ⋮ |
| PRINTER NAME ir | PRINTER TYPE No.ir | PRINTEER STUTUS ir |
| ⋮ | | |
| NAME OF PRINT SERVER n | | STATUS OF PRINT SERVR n |
| PRINTER NAME n1 | PRINTER TYPE No.n1 | PRINTEER STUTUS n1 |
| PRINTER NAME n2 | PRINTER TYPE No.n2 | PRINTEER STUTUS n2 |
| ⋮ | ⋮ | ⋮ |
| PRINTER NAME nr | PRINTER TYPE No.nr | PRINTEER STUTUS nr |

FIG. 78

| TYPE 1 | TYPE 2 | TYPE 3 |
|---|---|---|
| PRINTER TYPE No.11 | PRINTER TYPE No.21 | PRINTER TYPE No.31 |
| PRINTER TYPE No.12 | PRINTER TYPE No.22 | PRINTER TYPE No.32 |
| ⋮ | ⋮ | ⋮ |

PRINTING SYSTEM

CROSS-REFERENCE TO RELATED APPLICATIONS

This application relates to U.S. Ser. No. 07/936,659 filed Apr. 28, 1992, and U.S. Ser. No. 08/266,699 filed Jun. 28, 1994, the contents of both of which are incorporated herein by reference.

BACKGROUND OF THE INVENTION

In recent years, the LAN (Local Area Network) and WAN (Wide Area Network) are spreading in the fields of workstation and personal computer. In association with such a widespread, a print server such that a plurality of workstations, personal computers, or word processors (hereinafter, they are generally referred to as clients or terminal apparatuses) can share a printer is becoming important in order to reduce the purchasing costs and installation area.

As shown in FIG. 2, for instance, a conventional printing system includes: a client 1 (11), a client 2 (12), and a client 3 (13); a printer 1 (17) and a printer 3 (19) which can be shared by those clients; and a printer/spooler control server 1 (15) and a printer/spooler control server 2 (16) for sharing and controlling those printers.

The printing is executed in the foregoing construction by the following procedure.

(1) The clients 11 to 13 transmit document data indicative of the printing contents of documents to the printer/spooler control server 15 through a network 10 in order to request the printer/spooler control server 15 to print. The document data comprises a printing command train for describing the printing contents of characters, figures, and images with respect to each page of the documents.

(2) The print server 15 which received the document data from the clients 11 to 13 executes the following processes.

(a) First, the print server 15 once stores the document data to a file called a spooler in the print server 15.

(b) The print server 15 reads out the stored document data and transmits to the printer 1 (17) and instructs the printing.

(c) The printer 1 (17) processes the received document data and executes the printing to a paper.

The foregoing conventional techniques have been disclosed in, for example, JP-A-62-274331, JP-A-63-75828, JP-A-63-99644, JP-A-63-250730, JP-A-4-230514, JP-A-4-245525, and JP-A-4-250522.

However, since a report from the printer to the print server and a report from the print server to the client are inadequate, there is a problem such that in the case where an error occurs in the printer, the user needs to go to the location of the printer and to examine the detailed error contents of the printer and a burden on the user is large. Particularly, in the case where a paper jam error occurs in the printer, since a reporting function of fault information from the printer to the client is insufficient, the user of the client cannot know a process to the printer and needs to go to the location of the printer and to examine the above necessary procedure and to execute a procedure such as removal of the jammed paper or the like.

After the procedure such as removal of the jammed paper or the like was finished, the user of the client needs to restart an application program on the client and to reprint. It takes a time until the error recovery. Even when an attention is paid to only the reprint, print data constructing a print job is retransmitted from its head from the print server to the printer and is reprinted from the head of the job by the printer, so that there is also a problem such that a vain overlapped reprint occurs and a recovery time is long. Similarly, in the case where a paper empty error occurs in the printer, the user of the client cannot grasp the detailed error contents such as a size of papers to be supplied or the like from the client.

As printer specifications which are used in the printing system, (a) a dot density, (b) a print speed, (c) permission or inhibition of a double side printing or color printing, (d) a size of paper which can be used, (e) a sort of PDL (Page Description Language) which can be used, (f) a sort of font which can be used, and the like are known. There are also various printer specifications. There is a tendency such that the user selectively uses at least a few specifications in accordance with the application field such as word processing, DTP (Desk-Top Publishing), slip output, or the like.

The user of each client, therefore, selects by himself the printer according to the specifications of a document to be printed while adequately considering a set of printers which can be used from the relevant client and the specifications of all of the printers which can be used and instructs the target printer to print such a document. Consequently, a burden on the user to accurately grasp the specifications of those printers is very large. There is also a problem such that if the user erroneously grasped the printer specifications, some printer error occurs in the printer which was erroneously selected.

According to the present printing system, the correspondence relation between the printer and the printer/spooler control server to control it cannot be known from an outside appearance. Therefore, there are problems such that when the client requests a certain printer to print, it is difficult to grasp which printer/spooler control server is better to be requested to print, a plurality of printers and print servers cannot be effectively used, and a use efficiency and a reliability are low.

One of the causes of such problems is that the management of the printers of various specifications on the network is insufficient. A method of obtaining the printer specifications by a host computer such as a print server or the like and its problems will now be described.

Hitherto, as for a system for obtaining the printer specifications by the host computer in the printing system, for instance, a system such that a host computer recognizes specification information of printers by printer ID codes has been disclosed as shown in JP-A-2-67168. According to such a system, the printer has the printer ID code in its memory device and the host computer possesses the printer specification information of all of the printers which can be connected to the memory device. The host computer forms the printer specification information by the following procedure.

(1) The printer ID code is received from the printer.

(2) The host computer recognizes the printer specification information corresponding to the received printer ID code.

A technique such that a plurality of printers are connected to a host computer and the switching of printer sort information is performed by a hardware switch has been disclosed in JP-A-5-138994.

According to the above conventional technique disclosed in JP-A-2-67168, there has been described a technique such that a printer sort code is transmitted in response to a request of the host computer to which the printer is connected, and the host computer recognizes the received printer sort code, thereby recognizing the name of maker of the printer corresponding to the printer sort code, code system, name of apparatus, and the like.

SUMMARY OF THE INVENTION

In the above conventional technique, however, nothing is considered with respect to a use efficiency of the memory device of the host computer. This is because a provider of the printer control program for the host computer must previously make the printer specification information to recognize the printers. Therefore, it is necessary that all of the printer specification information having a possibility such that the printers are connected is stored in the memory device of the host computer and there is a problem such that a memory capacity for such a purpose increases. There is also a problem such that it is often actually difficult to previously grasp all of such printer specification information.

In many cases, only partial limited information can be previously set as printer specification information. In the above conventional technique, therefore, only the partial limited information such as name of maker, code system, sort of apparatus, and the like is merely used. The host computer, accordingly, don't store the other detailed printer specification information such as paper size, font, and the like which are supported by the printer. There is a problem such that although the user grasps the detailed printer specification information, he cannot use it.

In case of using a printer having new printer specifications, there is a problem such that the specification information has to be registered in the host computer one by one and it is troublesome.

According to the technique disclosed in JP-A-5-138994, a plurality of printers are connected to one host computer and the printer sort information of the printers which are used is switched by using a hardware switch on the printer side.

Even in such a conventional technique, however, since all of the printer specification information having a possibility such that the printers are connected needs to be stored in the memory device of the host computer, it is similar to the conventional technique disclosed in JP-A-2-67168 mentioned above with respect to a point that there is a problem such that the memory capacity for such a purpose increases.

Further, even in the case where a plurality of host computers are connected by a network, there is also a problem such that the printer specification information in the network cannot unconditionally be managed.

In addition to the problems mentioned so far, the printing system has the following subjects.

Although the printers (hereinafter, called network printers) connected to a network such as LAN, WAN, or the like can be directly connected to arbitrary places of the network, since the print server doesn't integrally control the network printers, it cannot execute a report of an error occurring in the network printer and a process for such an error.

In a printing system of an open environment in which various sorts of machines mixedly exist as clients and print servers, when the sorts of the clients and print servers differ, there is a problem such that the client of the sort different from that of the print server can obtain only insufficient printing services.

It is an object of the invention to provide a printing system which can solve the problems of the conventional techniques mentioned above by handling detailed printer information of printers in a printing system.

The invention uses the following means in order to solve the above subjects. In the following description, the apparatus which has been called a print server hitherto is referred to as a printer/spooler control server and the terminology of "print server" is used in a wide meaning including a distributed printing management server, which will be explained hereinlater, in addition to the printer/spooler control server.

The present printing system is constructed by a plurality of terminal equipment, a plurality of printers which can share a terminal equipment, one or more printer/spooler control servers to accept the printing from the terminal equipment and to control the printing by the printers, and a distributed printing management server, wherein the terminal apparatus includes a query unit of a detailed print job status and a print control unit to perform an error recovery instruction or the like are provided for the terminal equipment, an error recovery unit is provided for the printer/spooler control server, and a printer configuration management table to manage the specifications and statuses of all of the printers and printer/spooler control servers on the network is provided for the distributed printing management server.

The printing system will be more specifically explained.

In a printing system which comprises a plurality of terminal equipment, one or more printer/spooler control servers, and one or more printers which are controlled by any one of the printer/spooler control servers and can be shared by the terminal equipment and in which the terminal equipment instructs the printer/spooler control server for printing print data called a print job by the above either one of the printers, the first printing system of the present invention is characterized in that:

printer error detecting means, printer error watching means, and printer error recovery waiting/release control means are provided for the printer/spooler control server;

error recovery request means to the printer/spooler control server is provided for the terminal equipment; and when the occurrence of a printer error is detected by the printer error detecting means, the printer/spooler control server shifts the printer/spooler control server into a printer error recovery waiting state by using the printer error recovery waiting/release control means and, after that, starts the printer error watching means, and in the case where both of (1) the detection of the release of the printer error by the printer error watching means and (2) the detection of the error recovery request from the terminal equipment to the printer/spooler control server are satisfied, the printer error recovery waiting state of the printer/spooler control server is released and the printing by the printer/spooler control server is restarted. A reporting unit of the detailed printer status in the printer reports the occurrence of the error in the network printer to a receiving unit of the detailed printer status in the printer/spooler control server.

Namely, the printer/spooler control server restarts the printing in accordance with the error recovery request from the terminal equipment and a situation such that the printer/spooler control server and printer autonomously restart the error recovery while there is no request from the terminal equipment as in the conventional apparatus doesn't occur.

Therefore, the reliability of the error process in the printing system can be improved. Further, in the present printing system, in addition to the error recovery request from the terminal equipment, only when the printer/spooler control server detects the release of the printer error, the printer/spooler control server starts the reprinting. Consequently, the occurrence of a situation such that in spite of the fact that the error still remains in the printer, the printing is restarted and an error again occurs can be prevented. Further, since the present printing system notifies the detailed information of the error, the user can efficiently execute an error process. Accordingly, the functions, use efficiency, reliability, availability, and serviceability of the printing system can be further improved.

According to another aspect, the second printing system according to the present invention is characterized in that, in the above first printing system, after the printer/spooler control server was released from the foregoing printer error recovery waiting state, a cancellation request to the printer and a retransmission of the print job are executed and the printer executes the reprinting on the basis of it.

Namely, the present printing system can execute the error recovery by using the print jobs stored and preserved in the spooler in the printer/spooler control server. There is no need for the user to restart an application program from the terminal equipment and to newly request the printing by the printer/spooler control server as in the conventional apparatus.

The present printing system, therefore, can reduce a recovery time.

According to still another aspect, the third printing system according to the invention is characterized in that, in the foregoing first printing system:

when the printer error detecting means detects the occurrence of an error with reprinting such as a paper jam or the like with regard to a certain print job, the printer/spooler control server receives an error occurred page serial number as a serial number from the print job head to the error occurred page from the printer;

the terminal equipment receives the kind of error such as a paper jam or the like and the error occurred page serial number as detailed error contents with respect to the print job from the printer/spooler control server; and in the error recovery request from the terminal equipment to the printer/spooler control server, a reprint start page of the print job can be instructed as either one of the print job head, the specified page, and the error occurred page detected by the printer.

Namely, since the reprint start page from the terminal equipment to the printer/spooler control server can be instructed as either one of the print job head, the specified page, and the error occurred page detected by the printer, the start of the reprinting after the error recovery can be finely requested by the user. Therefore, the functions, use efficiency, reliability, availability, and serviceability of the printing system can be improved.

According to further another aspect, the fourth printing system according to the invention is characterized in that, in the foregoing first printing system:

in the case where the printer error detecting means detects the occurrence of an error with reprinting such as a page jam or the like with respect to a certain print job, the terminal equipment receives the kind of error such as a paper jam or the like as detailed error contents regarding the print job from the printer/spooler control server; and in the error recovery request from the terminal equipment to the printer/spooler control server, the reprint start page of the print job can be instructed as either one of the print job head, the specified page, and the error occurred page detected by the printer.

Namely, according to the present printing system, in a printing system in which printers of arbitrary two or more types among a printer of the type 1 such that a retransmission of a print job from the printer/spooler control server to the printer is necessary and a page extracting edition to the print job after the reprint start page is executed by the printer, a printer of the type 2 such that the retransmission of the print job from the printer/spooler control server to the printer is necessary and the page extracting edition to the print job after the reprint start page is not executed by the printer but the page extracting edition is performed by the print server, and a printer of the type 3 such that the retransmission of the print job from the printer/spooler control server to the printer is unnecessary and the printing of only the pages after the indicated reprint start page can be executed by using the refuged print data mixedly exist, the printer/spooler control server can perform the optimum reprinting in accordance with the printer type. Therefore, the functions, use efficiency, reliability, availability, and serviceability of the printing system can be further improved.

According to further another aspect, the fifth printing system according to the invention is characterized in that, in the foregoing second printing system:

when the printer/spooler control server retransmits the print job, the print job is edited to a new print job comprising print data after the reprint start page and the new print job to be edited is retransmitted. Such an edition is called a page extracting edition hereinafter.

That is, in the reprinting at the time of the error recovery, the printer can execute the printing regarding only the pages after the reprint start page. Therefore, the vain overlap reprinting which has occurred hitherto when the print job is reprinted from the head can be prevented.

According to further aspect, the sixth printing system according to the invention is characterized in that, in the foregoing second printing system:

the printer/spooler control server transmits the reprint start page and the original print job itself which starts from the head page to the printer; and the printer receives the foregoing transmission contents and reprints with respect to only the pages after the reprint start page. Although the page extracting edition has been performed by the printer/spooler control server in the fifth printing system, it is executed by the printer in the sixth printing system.

Namely, the present printing system doesn't need to perform the edition of the print job. Therefore, the reprint at the time of the error recovery by the printer/spooler control server can be further simplified than the case of the fifth printing system.

According to further another aspect, the seventh printing system according to the invention is characterized in that, in the foregoing first printing system:

after the printer/spooler control server was released from the printer error recovery waiting state, it indicates the reprint start page to the printer; and the printer reprints the print job with respect to only the pages after the indicated reprint start page by using the refuged print data in the printer with regard to the print job.

Namely, according to the present printing system, since the printer/spooler control server doesn't need to retransmit the print job to the printer as in the fifth and sixth printing systems, the retransmitting time can be omitted. Therefore, the error recovery time can be further reduced than that in case of the fifth and sixth printing systems.

According to further another aspect, in a printing system according to the invention in which a plurality of terminal equipment, a plurality of printers which can be shared by the terminal equipment, and one or more printer/spooler control servers to control the printing by the printer are connected through a network, the eighth printing system of the present invention is characterized in that:

the system includes a distributed printing management server for managing all of the printers and printer/spooler control servers on the network;

the distributed printing management server watches the specifications and statuses of each printer/spooler control server and each printer and registers the results of the watching into a table called a printer/spooler control server configuration management table;

the terminal equipment generates document print specifications regarding a document and the printing in association with the designation of the first priority printer to the distributed printing management server;

the distributed printing management server which received the print request judges that the first priority printer has an error on the basis of the printer configuration management table, selects a set of the printer having the printer print specifications adequate to the document print specifications and the printer/spooler control server to control the printer, and notifies a fact that the first priority printer has the error and the selection result to the terminal equipment;

the terminal equipment which received the notification and the user of the terminal equipment select the printer adequate to the document print specifications on the basis of the notification;

the terminal instructs the selected printer/spooler control server to print by the selected printer; and the printer/spooler control server which received the instruction stores the print job into the spooler in accordance with the print instruction and outputs each print job in the spooler to the selected printer.

Namely, in the case where a fatal error occurs in the printer, the present printing system can reprint by using the alternative printer. Therefore, the functions, use efficiency, reliability, availability, and serviceability of the printing system can be further improved. In this instance, the error recovery can be executed by using the print job stored and preserved in the spooler in the printer/spooler control server, so that there is no need for the user to restart the application program from the terminal equipment and to newly instruct the printing by the printer/spooler control server as in the conventional apparatus. Therefore, the troublesomeness of the user can be reduced and the recovery time can be decreased.

According to further another aspect, in a printing system according to the invention comprising a plurality of terminal equipment, one or more printer/spooler control servers, and one or more printers which are controlled by either one of the printer/spooler control servers and can be shared by the terminal equipment, wherein the terminal equipment instructs the printer/spooler control server to print a print data called a print job by either one of the printers, the ninth printing system of the invention is characterized in that:

printer error detecting means and printer error recovery waiting/release control means are provided for the printer/spooler control server;

instructing means of an error recovery using an alternative printer to the printer/spooler control server is provided for the terminal equipment;

when the occurrence of a fatal error in the printer is detected by the printer error detecting means, the printer/spooler control server
(1) stops the inputting to the spooler and the outputting from the spooler corresponding to the fatal error occurred printer and
(2) shifts the printer/spooler control server to a printer error recovery waiting state by using printer error recovery waiting/release control means;

the terminal equipment requests the error recovery using the name of the alternative printer as an input parameter to the printer/spooler control server; and the printer/spooler control server shifts the print job to the spooler for the name of the alternative printer instructed by the terminal equipment in accordance with the error recovery request from the terminal equipment and, after that, the print job is printed by the alternative printer.

According to further another aspect, the tenth printing system according to the invention is characterized in that:

a distributed printing management server for managing a configuration of all of the printers on a network is added and alternative candidate printer detecting means is provided for the terminal equipment;

in the case where the terminal equipment knows the occurrence of a fatal error of the printer regarding a certain print job, the alternative candidate printer detecting means receives stored logical specifications regarding the print job and requests the distributed printing management server to search the printers adequate to the logical specifications;

the distributed printing management server returns the alternative candidate printers adequate to the inputted logical specifications to the terminal equipment; and the terminal equipment decides the alternative candidate printers on the basis of the returned alternative candidate printers.

According to the eleventh printing system of the invention, a receiving unit of a detailed printer status from the network printer and a printer error recovery requesting unit for stop, restart, cancellation, or the like to the network printer are provided for the printer/spooler control server, and an informing unit of the detailed printer status to the printer/spooler control server and a receiving & executing unit of a printer error recovery request from the printer/spooler control server are provided for the network printer.

The printing system is characterized in that a plurality of terminal equipment are added to the printing system and the plurality of terminal equipment instruct the printer/spooler control server to execute a printing request, query of the printing status, and print control with respect to the network printer, and in response to the instruction of the print control from the terminal equipment or the report of the error status from the network printer to the printer/spooler control server, the printer/spooler control server instructs the network printer to execute the printer error recovery.

Namely, the printer/spooler control server which received the report instructs the network printer to execute the printer error recovery such as stop/restart, cancellation, or the like by the error recovery requesting unit.

The network printer which received the instruction executes the stop/restart, cancellation, or the like by the receiving & executing unit of the printer error recovery request.

When an error occurs in the network printer, the printer error recovery control of the network printer can be executed by an instruction from the terminal equipment. Therefore, the reliability, availability, and serviceability of the system can be further improved.

According to further another aspect, the twelfth printing system according to the invention is characterized in that:

the system includes a distributed printing management server for managing all of the printers and printer/spooler control servers on the network;

the distributed printing management server watches the specifications and statuses of each printer/spooler control server and each printer and registers the watching results into a table called a printer configuration management table and the terminal equipment generates the printing with specifying of document print specifications regarding a document to the distributed printing management server;

the distributed printing management server which received the printing request selects a set of the printer having the printer print specifications adequate to the document print specifications and the printer/spooler control server to control the printer on the basis of the printer configuration management table and notifies the selection result to the terminal equipment;

The terminal equipment which received the notification instructs the selected printer/spooler control server to print by the selected printer; and the printer/spooler control server which received the instruction stores the print jobs into the spooler in accordance with the printing instruction and outputs each print job in the spooler to the selected printer.

Namely, in the present printing system, when there is a printing request accompanied with the designation of the document print specifications regarding the document, the printing system can select the printer adequate to the document print specifications, so that the troublesomeness to grasp each printer specifications by the user and to select the printer on the basis of them is eliminated and the use efficiency of the user can be improved.

By executing a first step such that the terminal equipment requests the distributed printing management server to perform the printing associated with the designation of the document print specifications regarding the document and the distributed printing management server selects a set of the printer having the printer print specifications adequate to the document print specifications and the printer/spooler control server to control the printer and responds the selection result to the terminal equipment, a second step such that the terminal equipment instructs the printer/spooler control server designated by such a response to print by the selected printer and the printer/spooler control server stores the print jobs as a spool file in accordance with the printing instruction, and a third step such that the printer/spooler control server properly outputs each print job in the spool file to the selected printer, the troublesomeness by the user in the printing system to grasp the printer specification and to select the printer on the basis of it can be eliminated, and the use efficiency of the user can be remarkably improved.

In addition to the adaptation of the print specifications, the distributed printing management server selects the adequate printer also by considering the distance between the terminal equipment which requested the printing and the target printers to be selected and/or the print waiting job amount of each target printer to be selected, thereby enabling the printer which is close to the user and can rapidly complete the printing to be selected. Therefore, the use efficiency of the user can be further improved and a print throughput as a whole system can be also improved.

In addition to the foregoing selecting conditions, the distributed printing management server selects the adequate printer and the adequate printer/spooler control server by also considering the error statuses of the target printer and target printer/spooler control server, thereby allowing the distributed printing management server to automatically select the printer and printer/spooler control server in normal states. Thus, the troublesomeness of the user to grasp the normal/abnormal state of the apparatus can be omitted and the reliability, availability, serviceability, and print throughput of the printing system can be further improved.

According to further another aspect, in a printing system in which the terminal equipment instructs the printer/spooler control server to print the print data called a print job by either one of the foregoing printers, the thirteenth printing system is characterized in that:

the printer/spooler control server manages a detailed status of each print job such as print waiting, during the printing, error occurrence, error detailed information, or the like; and the printer/spooler control server responds the detailed information of the print job to the terminal equipment in response to a query request of the print job detailed status from the terminal equipment to the printer/spooler control server.

That is, according to the present printing system, the user of each terminal equipment can know the detailed status of the print job which cannot be inquired from the terminal equipment hitherto. Therefore, the functions, use efficiency, reliability, availability, and serviceability of the printing system can be further improved.

According to further another aspect, in a printing system which comprises a plurality of terminal equipment, one or more printer/spooler control servers, and one or more printers which are controlled by either one of the printer/spooler control servers and can be shared by the terminal equipment and in which the terminal equipment instructs the printer/spooler control server to print the print data called a print job by either one of the printers, the fourteenth printing system according to the invention is characterized in that:

the printer/spooler control server manages the history of the print job with respect to each user; and the printer/spooler control server responds the history of the print job regarding the user to the terminal equipment in response to the query request of the history of the print job with regard to each user from the terminal equipment to the printer/spooler control server.

Namely, the user of each terminal equipment can know the history of the print job of each user which cannot be inquired from the terminal equipment hitherto. Therefore, the functions, use efficiency, reliability, and serviceability of the printing system can be further improved.

In order to eliminate the troublesomeness to register the printer specification information from the printer to the host computer connected to the printer, a configuration of the invention according to a printer obtaining system of the invention is such that, in the printing system in which the printer and the host computer are connected so that they can mutually communicate: the printer includes means for communicating with the host computer connected and means for storing the specification information of the printer; the host computer includes means for communicating with the printer connected, input means for specifying the printer connected, and means for storing the specification information of the printer connected; the printer stores the printer specification information in the means for storing the specification information of the printer; the host computer generates a printer specification information query command to the specified printer when there is an input to specify the printer; the printer which received the printer specification information query command transmits the printer specification information to the host computer connected; and the host computer which received the printer specification information stores the received printer specification information into the means for storing the specification information of the printer connected.

In order to enable one host computer to obtain the printer specification information of all of the printers connected to the network and to thereby enable to unitarily manage the detailed printer specification information of all of the printers on the network by one host computer, according to a configuration of the invention according to a printer obtaining system of the invention, in the printing system in which the printer and the print server are connected so that they can mutually communicate and the print server and the distributed printing management server to manage the print server are connected so that they can mutually communicate: the printer includes means for communicating with the print server connected and means for storing the specification information of the printer; the print server includes means for communicating with the printer connected and the distributed printing management server; the distributed printing management server includes input means for specifying the print server and the printer which are connected and means for storing the specification information of the printer connected to the printing system; the printer stores the printer specification information into the means for storing the specification information of the printer; the distributed printing management server generates a printer specification query command to the specified print server when there is an input to specify the print server and the printer; the print server which received the printer specification query command generates the printer specification query command to the specified printer; the printer which received the printer specification information query command transmits the printer specification information to the print server which generated the printer specification information query command; the print server which received the printer specification information transmits the printer specification information to the distributed printing management server which generated the printer specification query command; and the distributed printing management server which received the printer specification information stores the received printer specification information into the means for storing the specification information of the printer connected to the printing system.

BRIEF DESCRIPTION OF THE DRAWINGS

FIG. 10 is a diagram showing a network printer control command in the invention;

FIG. 13 is a diagram showing a method of instructing the logical specification level printing in the invention;

FIGS. 14A to 14D are diagrams showing printer configuration management tables in the invention;

FIG. 15 is a diagram showing logical specifications and step-like supporting levels of an algorithm for selecting the printers adequate to the specifications in the invention;

FIG. 18 is a diagram showing whole contents of error classification and error processes in the invention;

FIG. 25 is a diagram showing an example of an error recovery system in the invention;

FIG. 29 is a diagram showing a print server system corresponding to different kinds of clients in the invention;

FIG. 34 is a diagram showing a print service command for the user in the invention;

FIG. 35 is a diagram showing functions for print services which are provided for the clients in the invention;

FIG. 36 is a diagram showing functions for a distributed printing management in the invention;

FIG. 38 is a diagram showing various kinds of interfaces in the invention;

FIGS. 39A to 39E are diagrams showing examples of specification information in the invention;

FIGS. 40A and 40B are diagrams showing examples of printer management tables in the invention;

FIG. 41 is a diagram showing an example of a spooler management table in the invention;

FIG. 42 is a diagram showing an example of a job history management table in the invention;

FIGS. 46A and 46B are diagrams showing examples of target host name description tables in the invention;

FIG. 47 is a diagram showing an example of a printcap for the client in the invention;

FIG. 48 is a diagram showing an example of a printcap for a printer/spooler control server in the invention;

FIG. 49 is a diagram showing an example of the printcap for the printer/spooler control server in the invention;

FIG. 53 is a diagram showing a comparison result of a host distribution system of a printer configuration management table in the invention;

FIG. 54 is a diagram showing a flow of the configuration management in the invention;

FIG. 55 is a diagram showing effects of a logical specification level print instruction system in the invention;

FIG. 60 is a diagram showing an example of a printer management table according to the invention;

FIG. 61 is a diagram showing an example of a printer specification management table according to the invention;

FIG. 62 is a diagram showing an example of printer specification information according to the invention;

FIGS. 63 and 64A to 64C are diagrams showing procedures for obtaining the specification information of the printer;

FIG. 66 is a diagram showing an example of the printer configuration management table according to the invention;

FIG. 78 is a diagram showing an example of a printer sort table according to the invention;

DESCRIPTION OF THE INVENTION

Figure 1:
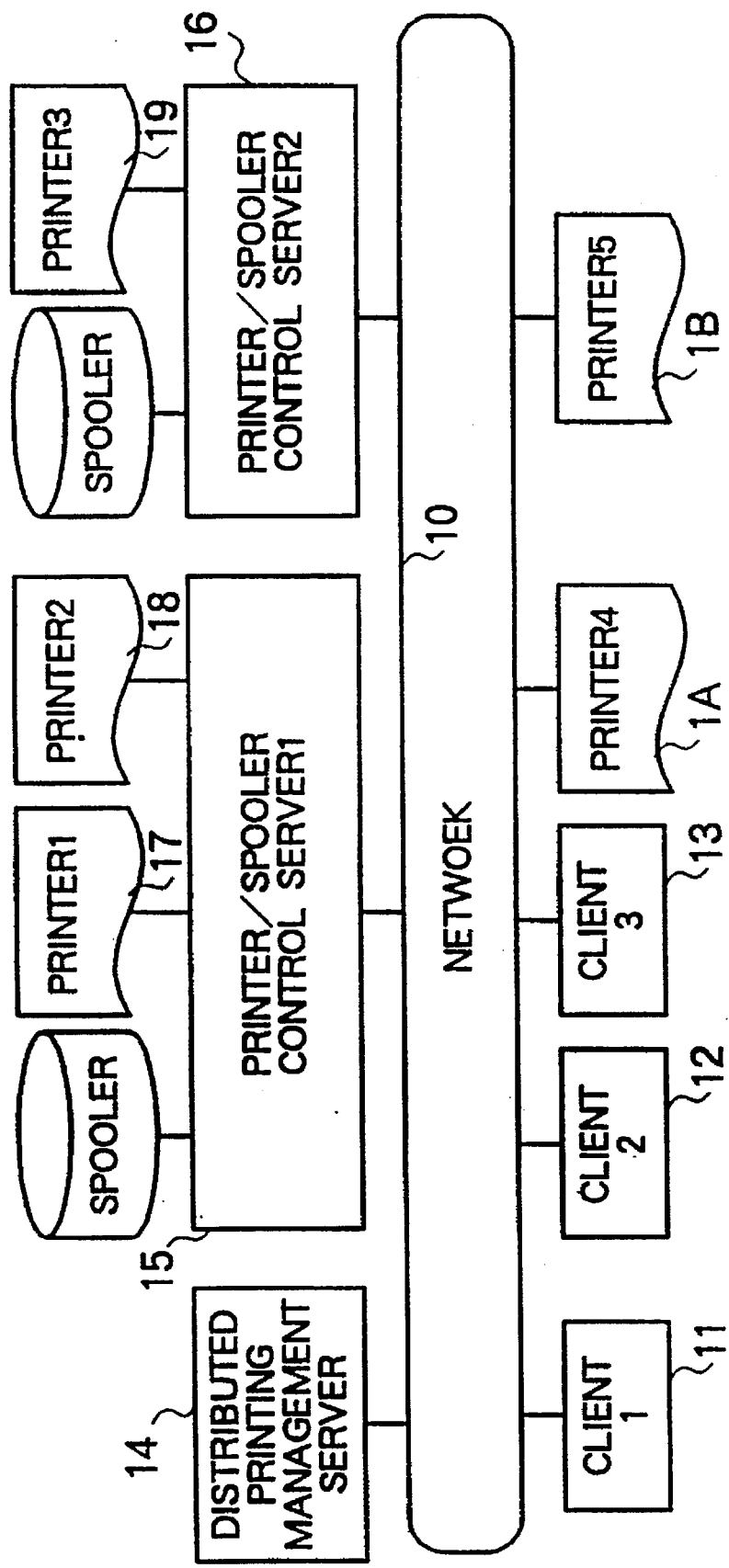
FIG. 1 is a diagram showing a system construction of the present invention.
Figure 2:
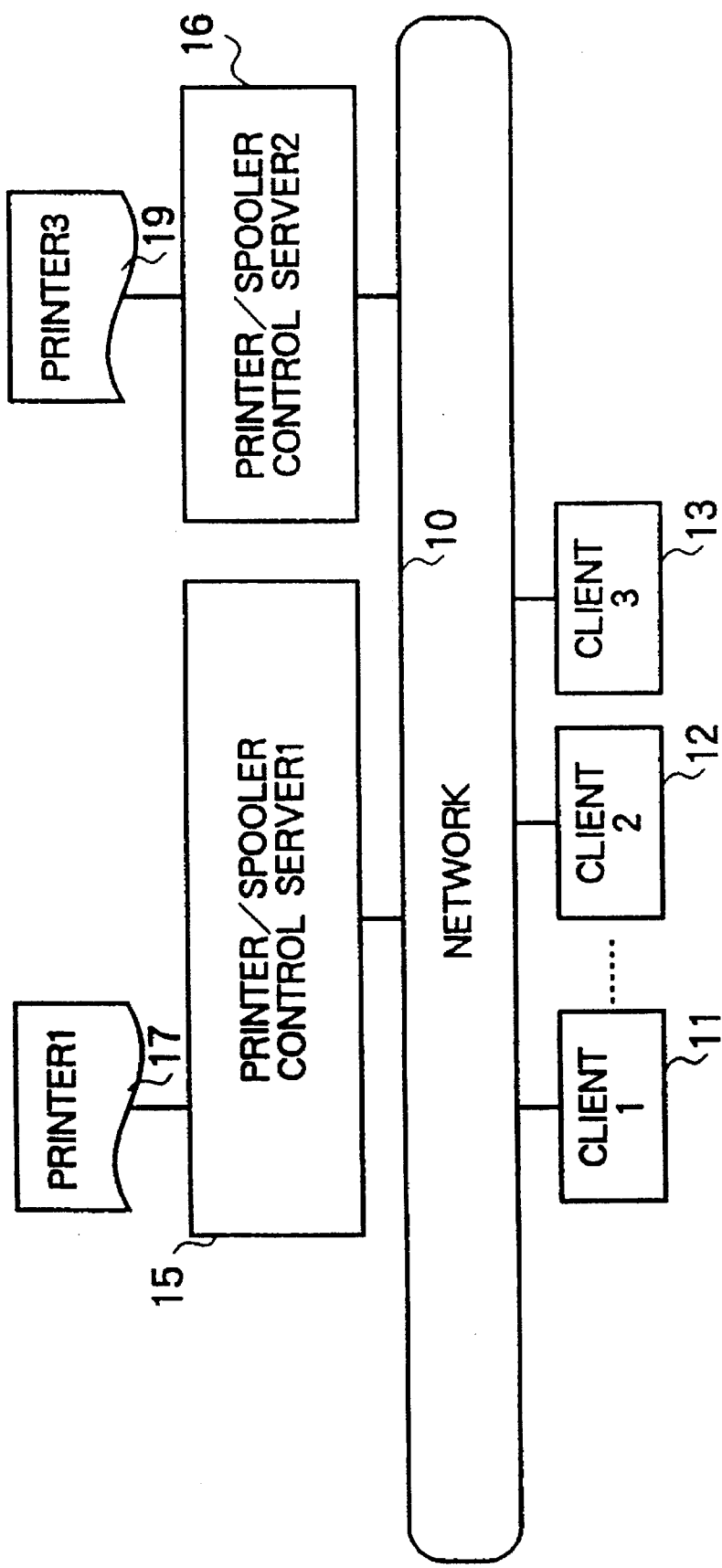
FIG. 2 is a diagram showing a construction of a conventional system.

FIG. 1 shows a construction of a printing system in the invention. The printing system comprises: terminal equipment (11, 12, 13; hereinafter, they are generally referred to as clients) such as workstation, personal computer, word processor, and the like for requesting a printing; a plurality of printers (1A, 1B, 17, 18, 19, etc.) which can be shared by the clients; one or more printer/spooler control servers (15, 16) for controlling the printing by the printers; and a distributed printing management server 14.

<<Hardware of each apparatus constructing the present printing system>>

Figure 5:
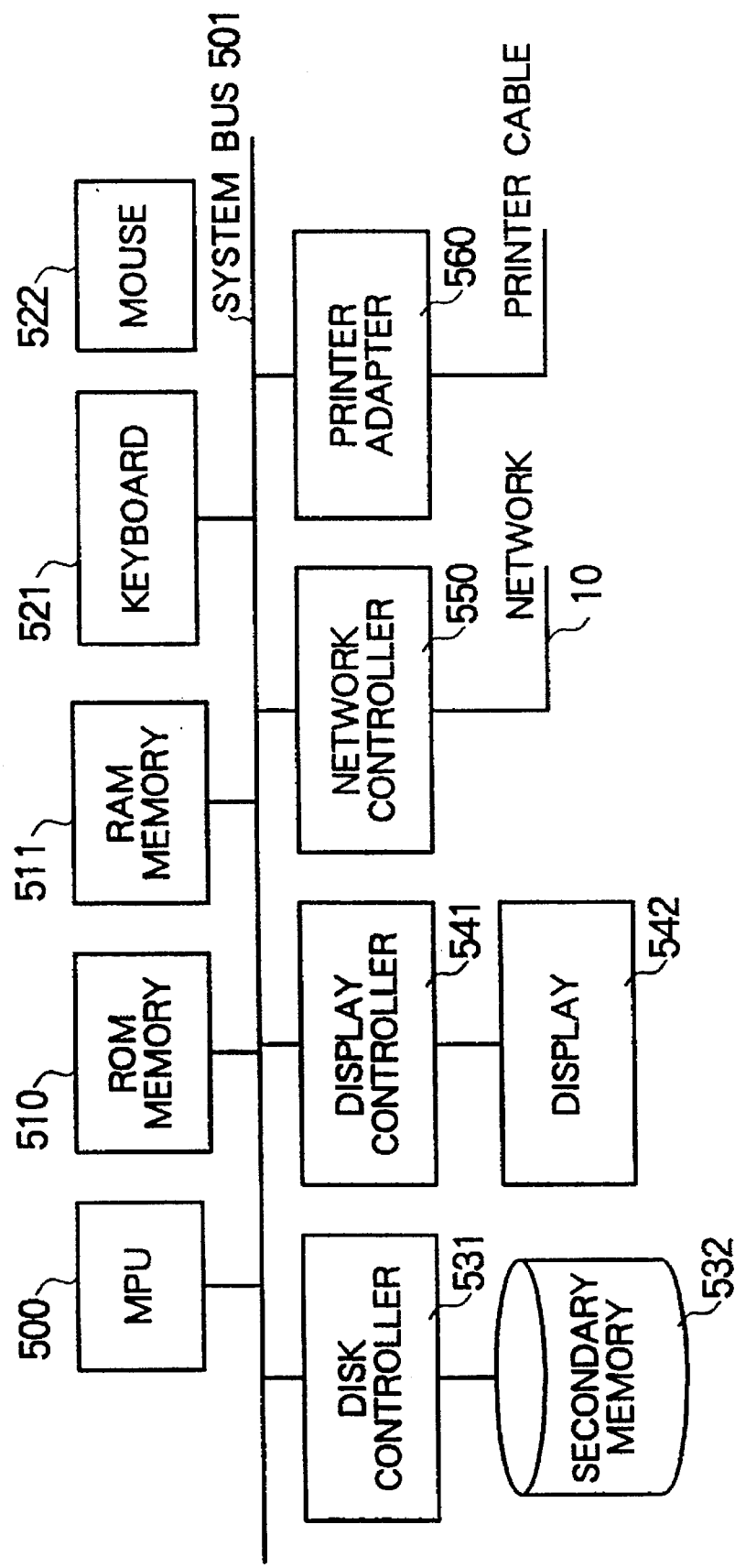
FIG. 5 is a diagram showing a hardware construction of clients, print servers, and a distributed printing management server in the invention.
Figure 6:
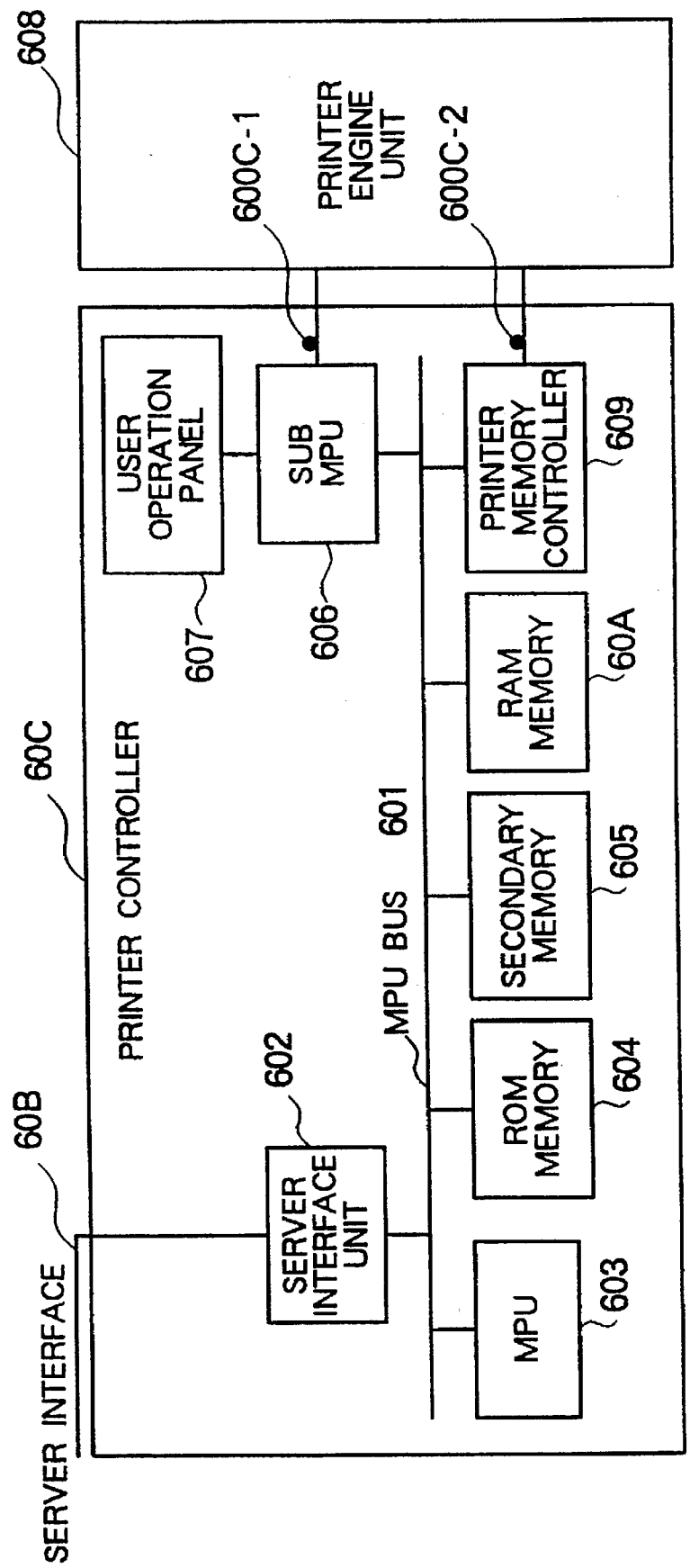
FIG. 6 is a diagram showing a hardware construction of a printer according to the invention.

FIGS. 5 and 6 show a hardware configuration of each apparatus constructing the printing system.

As shown in FIG. 5, each of the clients (11, 12, 13), printer/spooler control servers (1, 2), and distributed printing management server 14 is an apparatus comprising: an MPU 500; a system bus 501; an ROM memory 510; an RAM memory 511; a keyboard 521; a mouse 522; a disk controller 531; a secondary memory 532; a display controller 541; a display 542; a network controller 550; and a printer adapter 560.

The MPU 500 executes an input and an output with the peripheral apparatuses such as keyboard 521, secondary memory 532, display 542, network 10, printer, and the like and the memories such as ROM memory 510, RAM memory 511, and the like through the system bus 501.

The keyboard 521 is an input apparatus comprising a plurality of keys for inputting. A mouse as a kind of a pointing device is connected to the keyboard. The secondary memory 532 is connected to the system bus 501 through the disk controller 531. The display 542 is connected to the system bus 501 through the display controller 541. The printer is connected to the system bus 501 through the printer adapter 560. The system bus 501 of the present apparatus is connected to the network 10 such as LAN, WAN, or the like through the network controller 550.

In case of the apparatuses such as printer/spooler control server and distributed printing management server in which the number of opportunities such that the input and output with the user are executed is small, the keyboard 521, mouse 522, and display 542 can be simplified and a user operation panel can be also constructed. In such a case, although the function of a man-machine interface deteriorates, the costs can be reduced.

FIG. 6 shows a hardware configuration of the printer (17, 18, 19, 1A, 1B, etc.). The printer comprises: an MPU bus 601; a server interface unit 602; an MPU 603; an ROM memory 604; a secondary memory 605; a user operation panel 607; a sub MPU 606; a printer memory controller 609; an RAM memory 60A; and a printer engine unit 608. In the printer, the portions other than the printer engine unit 608 are particularly called a printer controller 60C.

The server interface unit 602 (hereinafter, the interface is abbreviated to "I/F") is a controller for allowing the printer to communicate with a printer/spooler control server of an upper apparatus in accordance with a server interface. As a physical interface of the present communication (server I/F), a physical I/F that is suitable as a hardware logic of the controller 602 is installed in accordance with the kind of physical I/F to be used by using the SCSI (Small Computer System Interface), RS232C, RS422, GP-IB (General Purpose Interface Bus), Centronics, HDLC (High-Level Data Link Control), Ethernet, Token-Ring, FDDI (Fiber Distributed Data Interface), ISDN (Integrated Services Digital Network), or the like. Like the printer 1 (17), printer 2 (18), and printer 3 (19), in case of directly connecting to a local bus of the printer/spooler control server (15, 16), the SCSI, RS232C, RS422, GP-IB, Centronics, etc. is used. Like the printer 4 (1A) and printer 5 (1B), in case of directly connecting to the network 10, the Ethernet, Token-Ring, FDDI, HDLC, ISDN, etc. is used.

The ROM memory 604 stores an IPL (Initial Program Loading) program of the printer controller 60C and character fonts.

The RAM memory 60A stores (a) a control program of the printer controller, (b) remaining character fonts, (c) a command buffer unit memory, (d) a page buffer unit memory, (e) various management tables such as page buffer management table, printer management table, etc., and the others. Among them, (a) and (b) are stored by downloading from either one of the print servers by the IPL program. (a) and (b) can be also previously stored in the ROM memory 604 without storing into the RAM memory 60A. On the contrary, no character font is stored into the ROM memory 604 but all of the character fonts can be also stored into the RAM memory 60A.

The sub MPU 606 executes inputting and outputting processes with the user operation panel 607 and printer engine unit 608 in accordance with an instruction of the MPU 603.

The printer memory controller 609 executes a process for reading out the contents (ordinarily, the contents of the page buffer unit) in the RAM memory 60A to the printer engine unit 608. In the case where the RAM memory 60A is a DRAM, the printer memory controller 609 performs the control (refreshing or the like) of the DRAM memory. The reading process is executed by using a built-in DMA (Direct Memory Access) function. At a time point when the reading operation of the data of one page of the paper from the page buffer unit is finished, the printer memory controller 609 asserts an interruption signal (a part of the signals in the MPU bus 601) for the MPU 603 and starts a page buffer reading end interrupting process by the MPU.

The printer controller allows the sub MPU 606 to communicate with the printer engine unit 608 through a signal line 600C-1 and also allows the printer memory controller 609 to communicate with the printer engine unit 608 through a signal line 600C-2 in accordance with the printer engine I/F.

In the case where the printer engine unit is a shuttle printer, the printer memory controller 609 format converts the contents of the page buffer unit and outputs to the printer engine unit. In the case where the printer engine unit is a laser printer, the printer memory controller 609 parallel-serial converts the contents of the page buffer unit and, after that, outputs them to the printer engine unit.

In the case where the printer engine unit is a shuttle printer, the signal line 600C-1 is used to receive a signal to indicate the head position of the page from the printer engine unit or the like. In the case where the printer engine unit is a laser printer, the signal line 600C-1 is used to convey: a command transmission signal for allowing the sub MPU 606 to transmit a command for a query or instruction to the printer engine unit 608; a status reception signal for allowing the sub MPU 606 to receive a response status corresponding to the command from the printer engine unit 608 and a control signal for controlling a reading procedure to read out the contents of the page buffer unit to the printer engine unit.

<<Product image and features of the printing system>>

Figure 3:
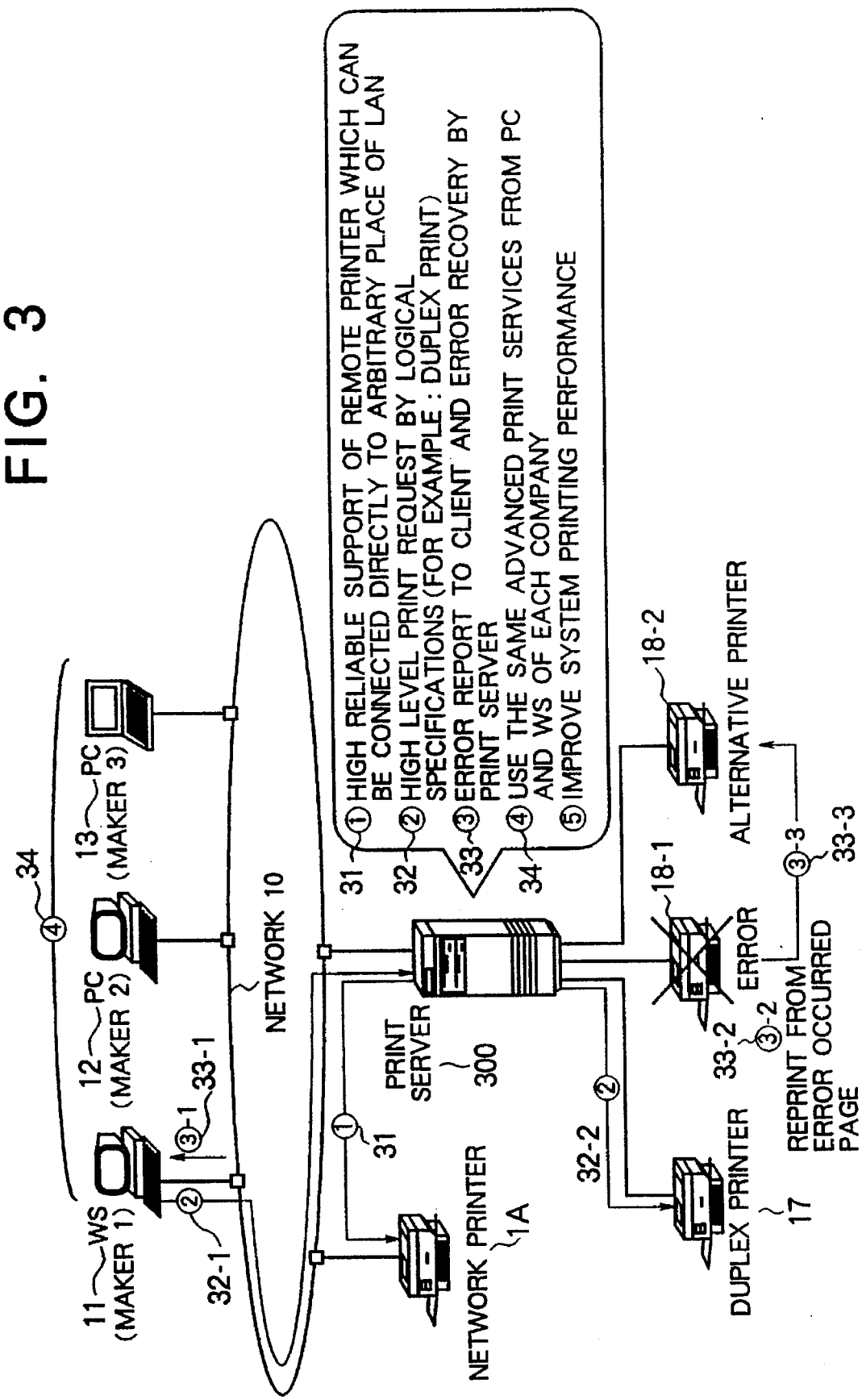
FIG. 3 is a diagram showing an outline of a printing system according to the invention.

FIG. 3 shows an actual product image of the present printing system and five features of the printing system.

The printing system comprises: the WS (11) and PCs (12 and 13) provided as clients; a print server 300 having therein the print/spooler control servers (15, 16) and distributed printing management server 14 shown in FIG. 1; the network printer 1A which is directly connected to the LAN; printers 17, 18-1, and 18-2 which are connected to the print server 300; and the network 10.

It is the first feature of the printing system that the print server 300 supports the network printer 1A which is directly connected to the network 10, thereby improving the reliability of the whole printing system including the network printer. Namely, the printer/spooler control server which is built in the print server 300 controls the network printer 1A. Specifically speaking, the printing system newly supports a report of a detailed printer status from the network printer 1A to the upper print server 300 and a printer error recovery instructing function from the upper print server 300 to the network printer 1A which could not be executed hitherto (31).

It is the second feature of the printing system to execute a print instruction at a high level by the logical specifications. Specifically speaking, when the client 11 indicates logical print specifications (hereinafter, abbreviated to logical specifications) such as a double side printing or the like to the print server 300 (32-1), the printers adequate to the logical specifications are selected from the printers which are unitarily managed by the print server 300, an information list of the adequate printers is shown to the client 11, and the client 11 selects the proper printer from the list shown, thereby starting the printing (32-2). Namely, since the printing system provides a unitary and easy-to-use configuration management of the printers and printer/spooler control servers which are connected to the network, the user doesn't need to grasp configurations, specifications, and statuses of all of the printers on the network. By inputting only desired logical specifications, the user can automatically know the printer which satisfies the desired logical specifications. Thus, the printing system can not only reduce a burden on the user but also effectively use all of the printers on the network. The system performance, reliability, availability, and serviceability of the printing system are improved.

It is the third feature of the printing system that an error is reported to the client when a printer error occurs (33-1). The user, consequently, doesn't need to go to the printer and to examine the detailed error contents and the burden on the user is reduced.

According to the printing system, when a paper jam error occurs in the printer, a reprinting without an overlap from the error occurred page using the error occurred printer is realized and an error recovery time of the printer is reduced (33-2). According to the printing system, when a fatal error occurs in the printer, an error recovery using another alternative printer (18-2) on the network is newly provided (33-3). Thus, the troublesomeness such that the user restarts an application program on the client and instructs the reprinting is made unnecessary and the burden on the user is decreased.

It is the fourth feature of the printing system that in a printing system of an open environment such that various kinds of machines mixedly exist as clients and print servers, even in the case where the kind of client and the kind of print server differ, the client can obtain adequate print services from the print server.

<<Function of each apparatus constructing the printing system>>

Figure 4:
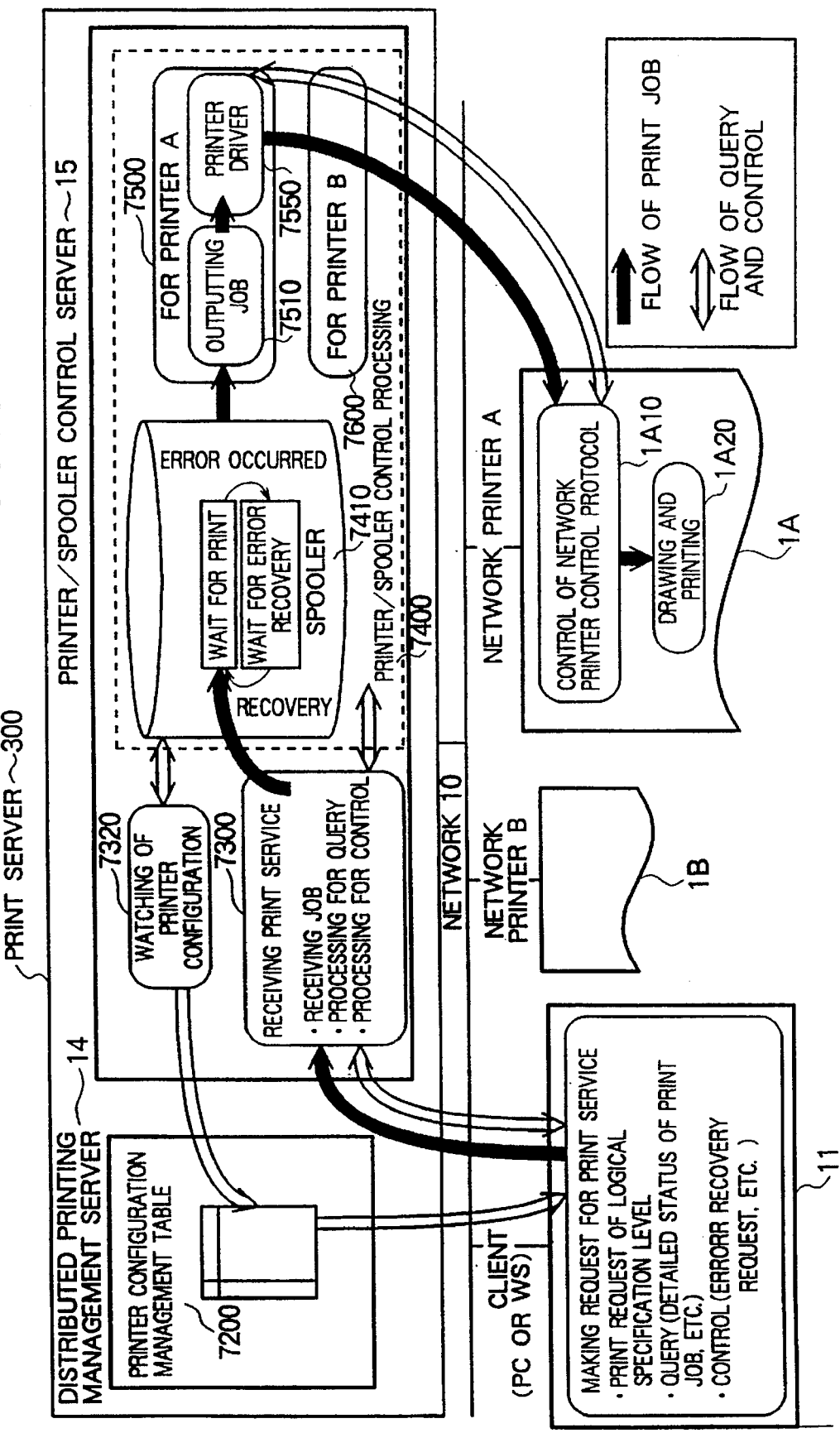
FIG. 4 is a diagram showing a whole system of the present printing system.

FIG. 4 shows functions of the client 11, print server 300 (distributed printing management server 14, printer/spooler control server 15), and network printer 1A to realize the foregoing four features.

1. Client

The client 11 controls (1) a printing instruction by the logical specifications, (2) a query of the print job detailed status including the printer error, (3) an error recovery instruction, and the like as a print service requesting function.

2. Distributed printing management server

The distributed printing management server 14 includes a printer configuration management table 7200 to manage configurations of all of the printers on the network.

3. Printer/spooler control server

The printer/spooler control server 15 includes a print service receiving unit 7300, a printer/spooler control processing unit 7400, and a printer configuration watching unit 7320.

The print service receiving unit 7300 receives print service requests such as (1) printing instruction by the logical specifications, (2) query of the print job detailed status including the printer error, (3) error recovery instruction mentioned above, and the like from the client 11.

The printer/spooler control processing unit 7400 controls the printers and spoolers in accordance with an instruction from the print service receiving unit 7300 and executes substantial processes such as execution, query, control, and the like of the print job. Further, the printer/spooler control processing unit 7400 comprises: a spooler 7410 to store the print jobs; a job outputting unit 7510 of each printer; and a printer driver 7550. The job outputting unit 7510 reads out each print job in the spooler and writes into the printer driver 7550, thereby instructing the printing execution of each print job. The printer driver 7500 provides fundamental functions (open, close, write, ioctl, etc.) to control each printer (1A, 1B, etc.). As foregoing job outputting unit 7510 and printer driver 7550, different job outputting unit and printer driver are provided for each printer (1A, 1B, etc.). With respect to the printer of the type directly connected to the server, the job outputting unit 7510 and printer driver 7550 are also similarly provided for every printer.

The printer configuration watching unit 7320 watches the connecting states to the server 7400 of all of the printers (1A, 1B, etc.) which are controlled by the printer/spooler control server 7400, specifications, statuses, and the like on the basis of an instruction from the distributed printing management server 14 and reports to the distributed printing management server 14.

4. Network printer

The network printers 1A and 1B includes: a control unit of a network printer control protocol 1A10 for accepting the printer control from the printer/spooler control server 15; and a drawing and printing unit 1A20 for drawing, developing, and printing the print data received from the printer/spooler control server 15.

<<Specific means of each apparatus constructing the printing system>>

Figure 7A:
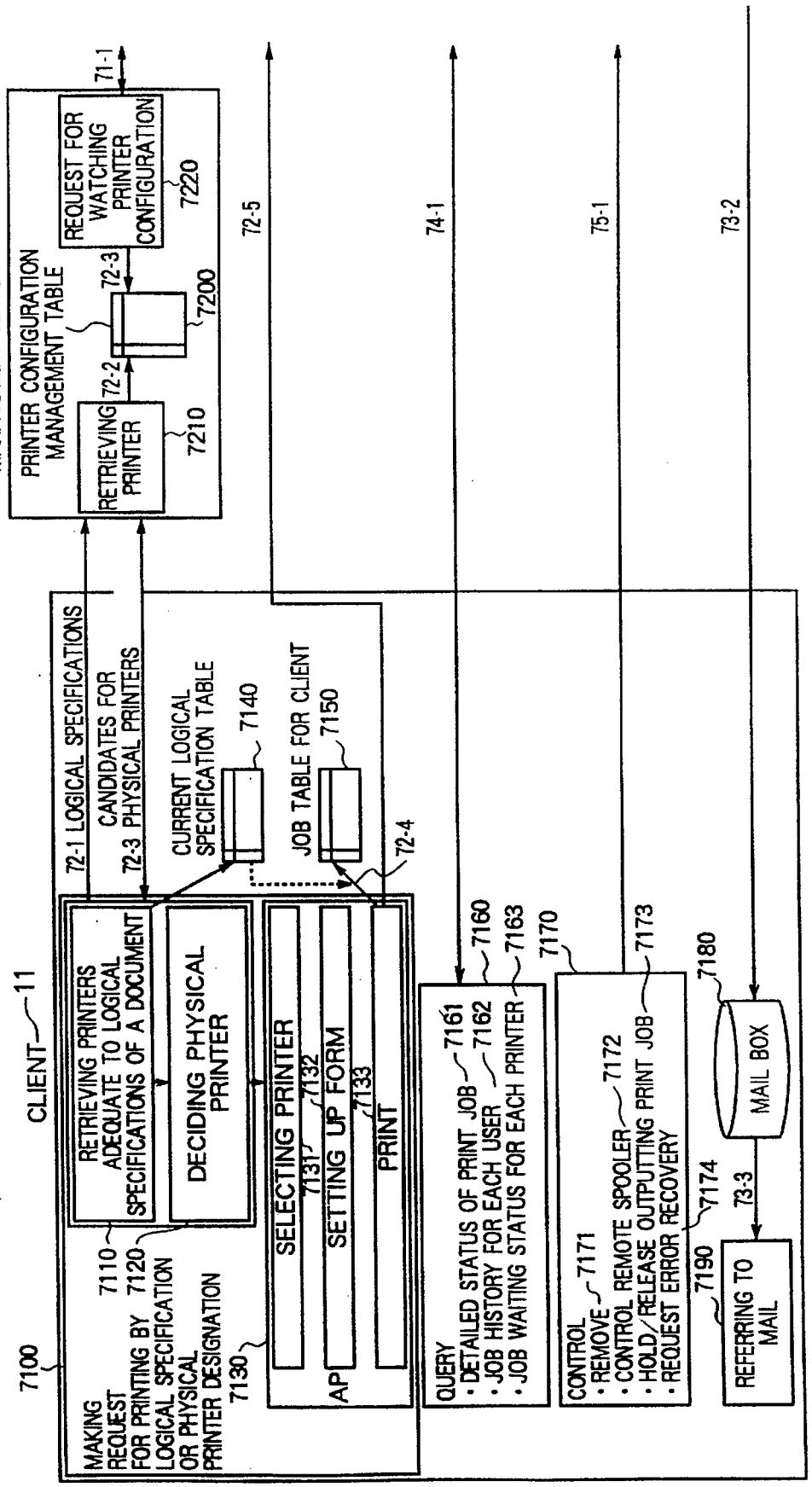
FIG. 7 is a diagram showing in detail a whole system of the present printing system.
Figure 7B:
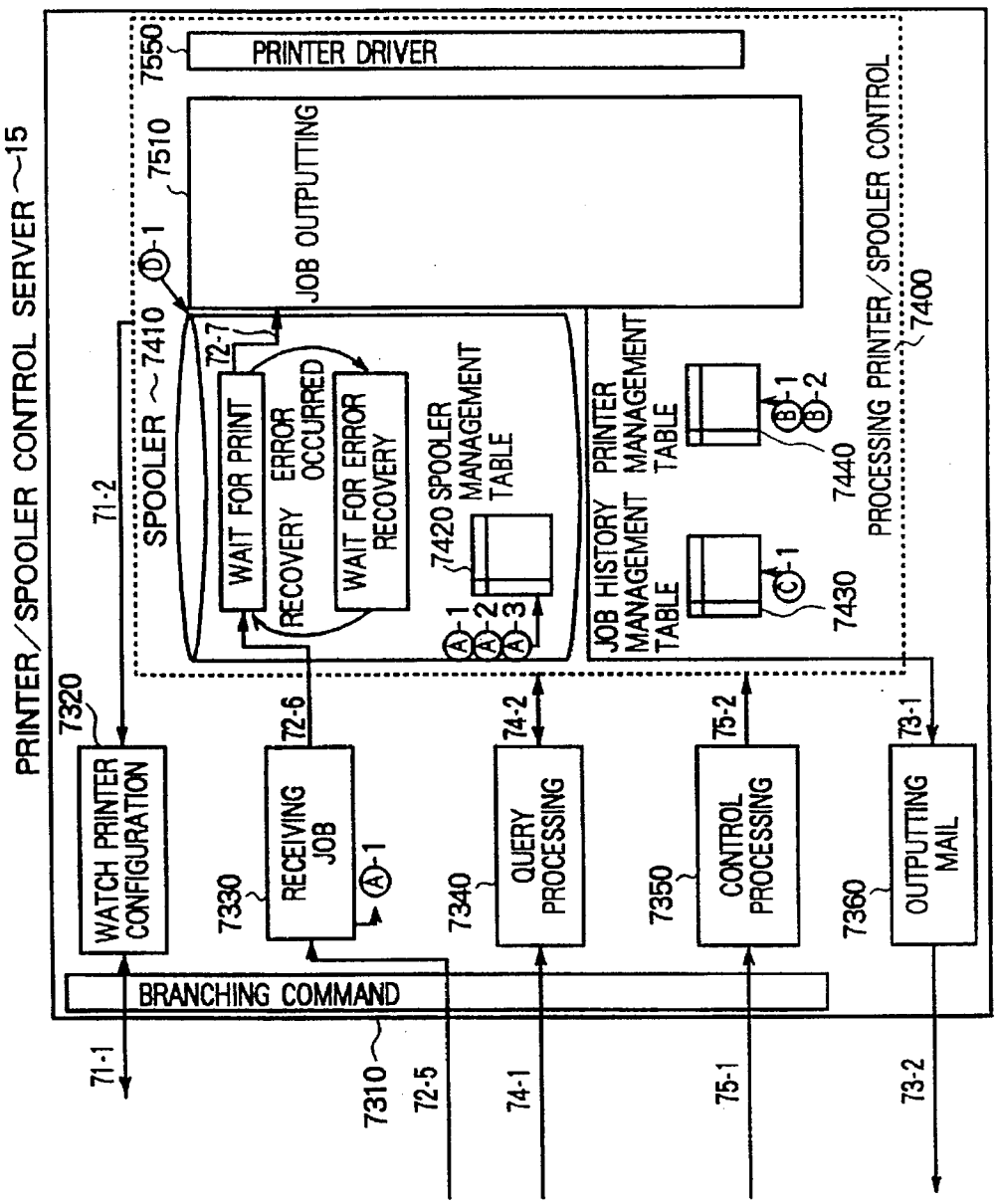

FIG. 7 shows specific means for realizing the function which each of the client 11, distributed printing management server 14, and printer/spooler control server 15 shown in FIG. 4 has.

1. Client

To realize the functions (1) to (3) mentioned above, the client 11 comprises: a logical specification & physical printer designation print instructing unit 7100; a query unit 7160; a control unit 7170; a current logical specification table 7140; and a job table 7150 for client.

The logical specification & physical printer designation print instructing unit 7100 executes both of the printing instruction by the foregoing logical specifications which is newly supported in the invention and the conventional printing instruction by specifying the physical printer name. The execution of either one of them is realized by a method of dividing the command or function (shown in FIGS. 34 and 35) corresponding to the relevant function. Integrated command or function to support both of them is also prepared. In this case, the use of either one of them is selected by an input parameter of such a command or function. The physical printer denotes printers [printers 1 to 5 (17, 18, 19, 1A, 1B)] corresponding to the physical apparatuses. The name of physical printer denotes a denomination of each physical printer.

The query unit 7160 performs a query regarding a print job detailed status 7161, a job history 7162 for each user, a job waiting status 7163 for each printer, or the like to the printer/spooler control server 15. The details about the query unit will be described hereinlater by using FIG. 16.

The control unit 7170 executes a removal 7171 of the print job, a control 7172 of a remote spooler on the printer/spooler control server, a holding/release 7173 of outputting of the print job, (d) an error recovery request 7174, and the like to the printer/ spooler control server 15.

A mail box 7180 is a file to receive a mail from the printer/spooler control server 15 and is referred by the user by using a mail referring unit 7190.

2. Distributed printing management server

The distributed printing management server 14 includes a printer retrieval executing unit 7210 and a printer configuration watching requesting unit 7220 in addition to the foregoing printer configuration management table 7200.

The functions of the printer retrieval executing unit 7210 and printer configuration watching requesting unit 7220 will be described later by using FIG. 13.

3. Printer/spooler control server

In the printer/spooler control server 15, the foregoing print service receiving unit 7300 comprises a command distributing unit 7310, a job receiving unit 7330, a query processing unit 7340, and a control processing unit 7350.

Figure 28:
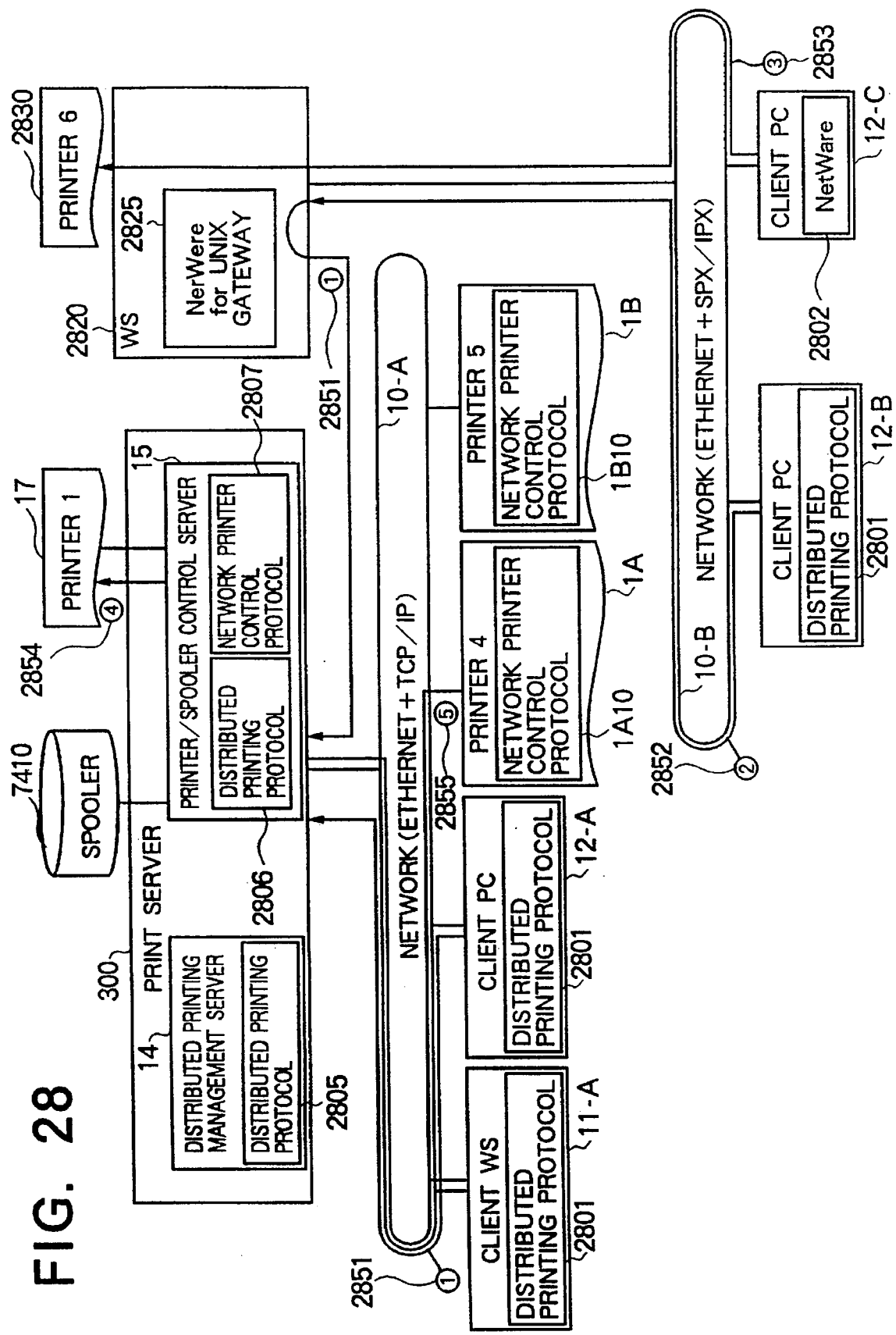
FIG. 28 is a diagram showing a print server system corresponding to different kinds of clients in the invention.

The command distributing unit 7310 distributes a printing protocol command received from the client 11 to each print service function such as print instruction, query, control, or the like. As shown in FIG. 38, the printing protocol is a protocol to execute a communication for a print control with respect to arbitrary two elements among the client, distributed printing management server, and printer/spooler control server. The printing protocol is also called a distributed printing protocol. As an example of the printing protocol, a protocol as shown in FIG. 29 is used in accordance with the division of the bus as shown in FIG. 28.

The job receiving unit 7330 stores the print jobs into the foregoing spooler 7410 in the case where a print instruction command is received.

In the case where a query command regarding the detailed print job status 7161, job history 7162 for each user, job waiting status 7163 for each printer, or the like is received from the client, the query processing unit 7340 responds to each of the query commands of 7161 to 7163 with reference to various kinds of tables in the printer/spooler control processing unit 7400. As such tables, there are a spooler management table 7420 to manage the status of each print job in the spooler, a job history management table 7430 to manage the history of the print job regarding each user, a printer management table 7440 to manage all of the printers which are controlled by each printer/spooler control server 15, and the like.

In the case where the control commands regarding the removal 7171 of the print job, control 7172 of the remote spooler on the printer/spooler control server, holding/release 7173 of the print job, error recovery instruction 7174, and the like are received from the client, the control processing unit 7350 instructs the printer/spooler control processing unit 7400 to execute the control process corresponding to each control command. The control process updates the spooler management table 7420, job history management table 7430, and printer management table 7440 as necessary.

In FIG. 7, the printer driver 7550 executes a function similar to that in case of FIG. 4.

Similarly, in FIG. 7, the mail outputting unit 7360 transmits information (normal end/abnormal end or the like) with respect to each print job as a mail to the client in response to a request from the printer/spooler control processing unit 7400.

The printing system realizes the foregoing four features of the invention by executing predetermined processing operations in the constructions of the client 11, distributed printing management server 14, and printer/spooler control server 15 mentioned above.

[Embodiment 1]

An embodiment 1 describes in detail "the error report to the client" as a feature of the printing system.

In this case, particularly, it is realized by using the printer/spooler control processing unit 7400 and mail outputting unit 7360 provided for the printer/spooler control server 15.

Figure 37:
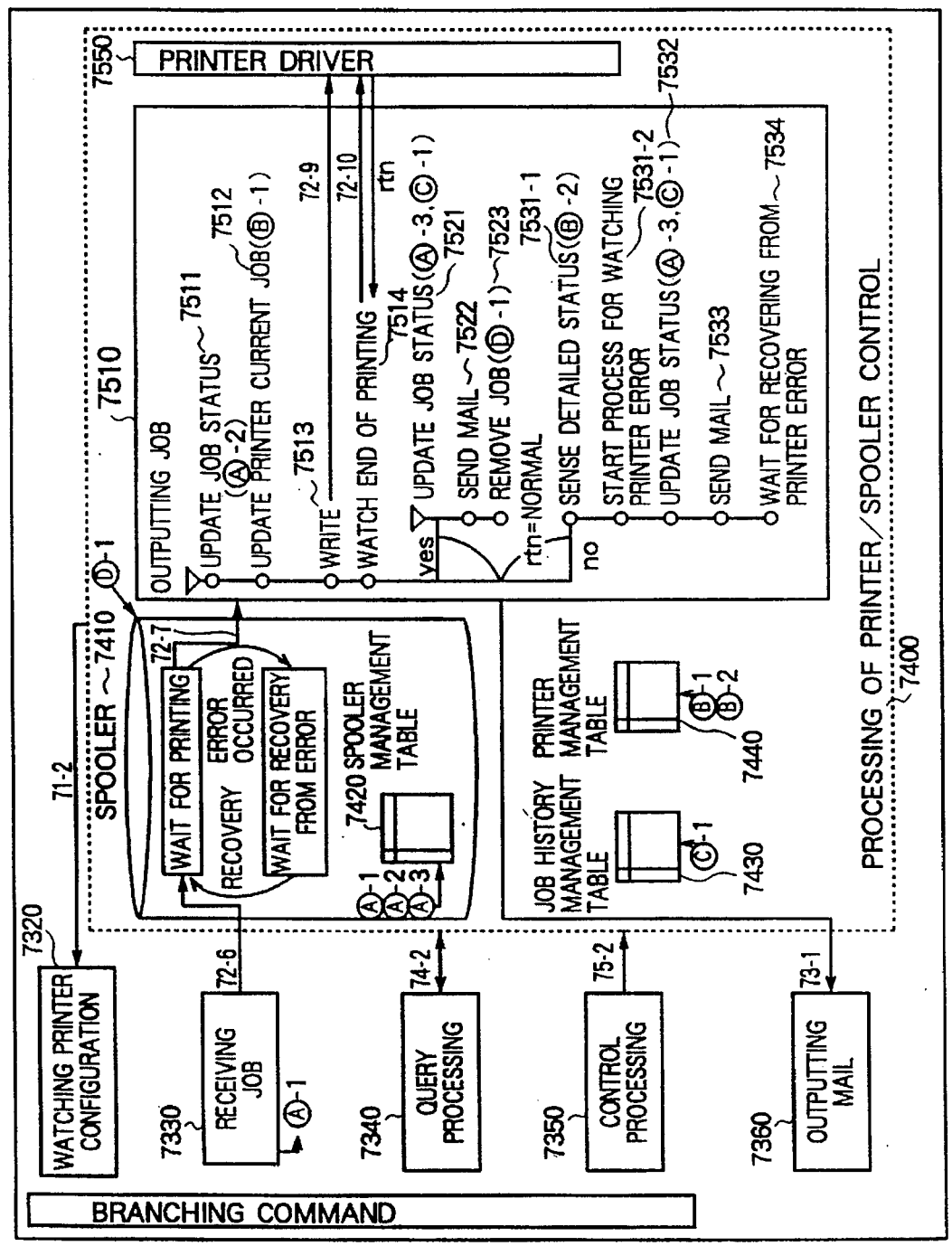
FIG. 37 is a diagram showing a processing system of a printer/spooler control server in the invention.

FIG. 37 shows the processing operation of the job outputting unit 7510 provided for the printer/spooler control processing unit 7400 to report the error to the client.

(1) First, the job receiving unit 7330 which received arbitrary information from the client transmits the received arbitrary information to the job outputting unit 7510 through the spooler 7410. The job outputting unit 7510 which received the arbitrary information updates the job status during the printing. Specifically speaking, the relevant item in the spooler management table 7420 is updated (step 7511).

(2) The job outputting unit 7510 subsequently updates a printer current job indicative of the job number during the use of the printer. Specifically speaking, the relevant item in the printer management table 7440 is updated. The above updating is executed with respect to the printer corresponding to the print job (step 7512).

(3) The job outputting unit 7510 subsequently generates a write system call to the printer driver in order to write the print data constructing the print job. A plurality of write system calls are generated as necessary (step 7513).

(4) The job outputting unit 7510 subsequently generates a print end watching system call to the printer driver 7550 in order to watch the end of the print job which requested the printing in step 7513 (step 7514).

(5) The job outputting unit 7510 subsequently checks a return value (written as "rtn" in FIG. 37) of the foregoing print end watching system call (step 7515).

(6) The job outputting unit 7510 subsequently executes the following processes when the return value in step 7515 is normal.

(6-1) The job outputting unit 7510 updates the job status to the normal end of the print job. Specifically speaking, the relevant items in the spooler management table 7420 and job history management table 7430 are updated (step 7521).

(6-2) The job outputting unit 7510 subsequently informs the normal end of the print job to the client on the generating side of the print job by using the mail outputting unit 7360 (step 7522).

(6-3) The job outputting unit 7510 subsequently removes the print job from the spooler 7410. Specifically speaking, the relevant item of the print job is also removed from the spooler management table 7420 (step 7523).

(7) The job outputting unit 7510, on the other hand, executes the following processes when the return value in step 7515 is abnormal.

(7-1) The job outputting unit 7510 generates a detailed status sense system call to the printer driver and obtains an error code of the detailed printer as an output (step 7531-1).

(7-2) The job outputting unit 7510 subsequently starts a process (printer error release watching process) to watch the release of the printer error (step 7531-2).

(7-3) The job outputting unit 7510 subsequently updates the print job status to a print job abnormal end and the detailed printer error code obtained in step 7531 is recorded. The practical updating and recording are executed with respect to the relevant items in the spooler management table 7420 and job history management table 7430 (step 7532).

(7-4) The job outputting unit 7510 subsequently reports the abnormal end of the print job to the client on the generating side of the print job by using the mail outputting unit 7360 (step 7533).

(7-5) The job outputting unit 7510 subsequently shifts the print job outputting unit 7510 to a printer error recovery waiting status (step 7534).

By executing the above processing operations by the job outputting unit 7510, "an error report to the client" using the printing system can be realized.

[Embodiment 2]

The embodiment 2 describes in detail with respect to "the reliable support by the printer server of the network printer directly connected to the LAN" as a feature of the printing system.

Figures 11, 12:
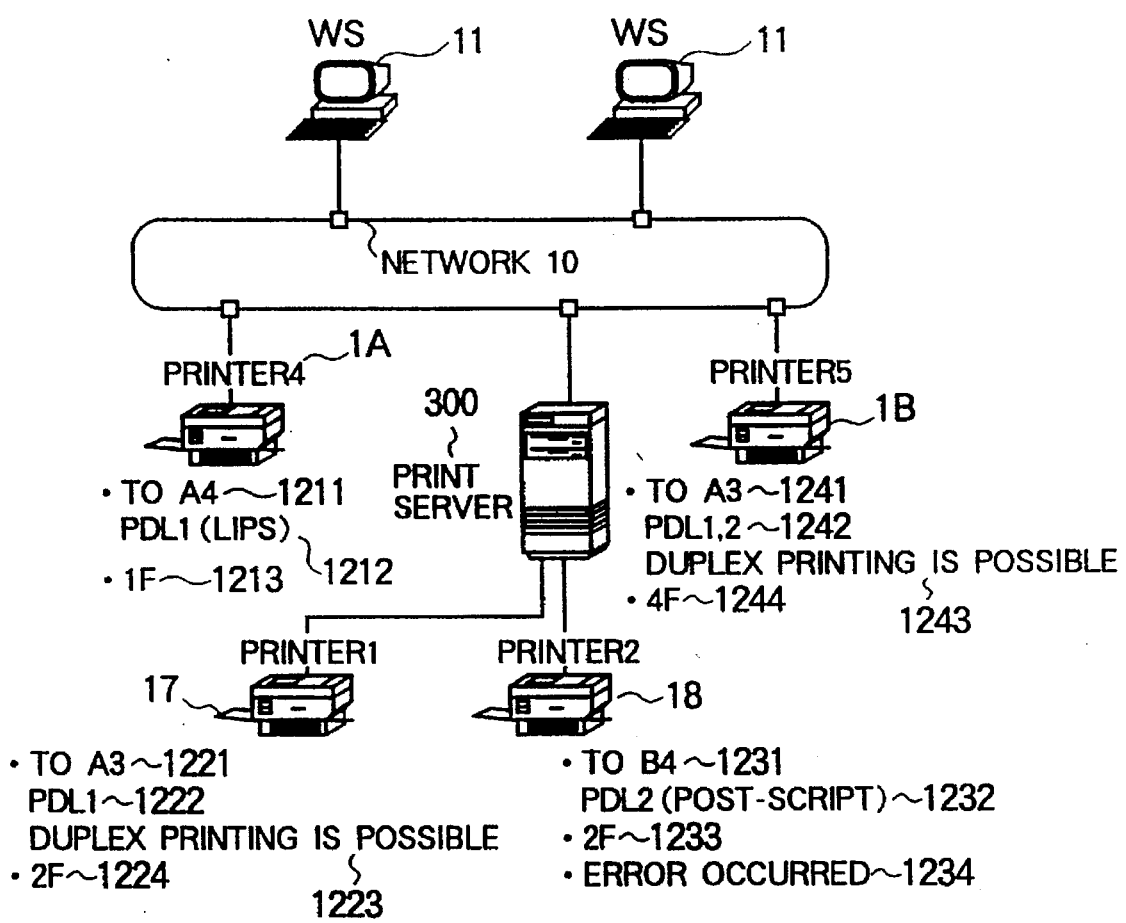
FIG. 11 is a diagram showing an asynchronous report message from the network printer to the print server in the invention.
FIG. 12 is a diagram showing problems in the conventional printing system and services which are provided according to the invention.

In this case, the printing system uses "polling" and "query of the printer controller status" shown in FIG. 10 and "asynchronous report message" shown in FIG. 11. The printing system further uses commands "stop", "cancel", and "restart" shown in FIG. 10.

FIGS. 8 to 11 show a reliable a reliable connection protocol system between the network printer and the printer server. In the embodiment 2, an explanation of the print server 300 actually shows functions of the printer/spooler control server 15 constructing it.

Figure 8:
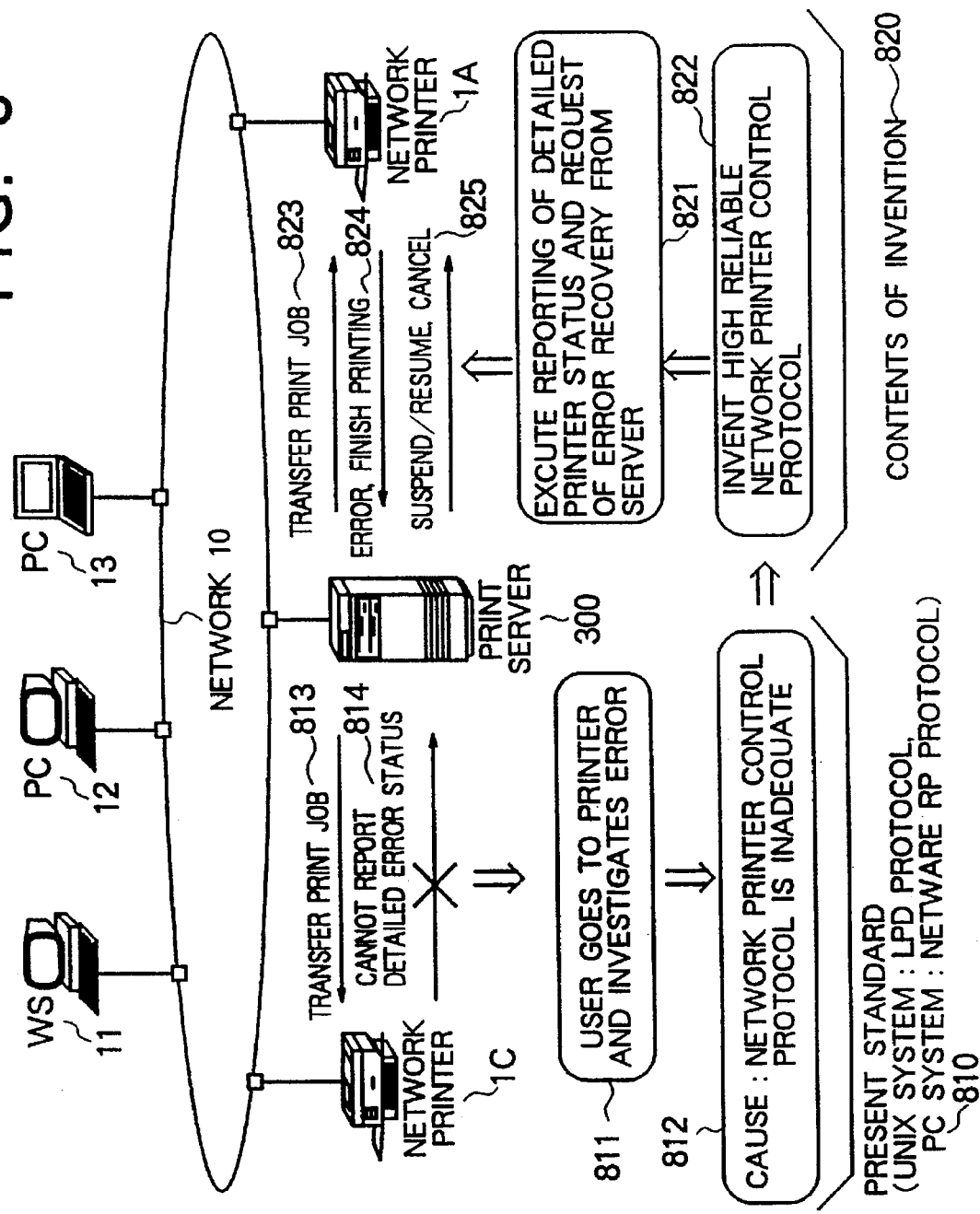
FIG. 8 is a diagram showing problem points in the present situation with respect to a network printer and the contents of the invention.

FIG. 8 shows problems in the present situation and the contents of the invention. As a connection protocol of the network printer, at present, there are an lpd (line printer daemon) protocol in the UNIX system and a NetWare RP protocol in the personal computer system (810). According to those protocols, although the print data can be transferred from the print server 300 to the network printer 1C (813), a detailed error report from the network printer 1C to the print server 300 cannot be performed (814). Therefore, the user needs to go to the printer and to examine the detailed contents of the printer error. This is because the network printer control protocol is insufficient (812).

Therefore, according to the printing system, in order to realize "the reliable support by the printer server of the network printer directly connected to the LAN", the detailed error status and the detailed printer status regarding the network printer at the end of the printing or the like are transferred from the network printer 1A to the printer server 15 (824). The printing system, consequently, displays (a) the normal end/abnormal end of the print job in the network printer to the client 11. Further, in case of (b) abnormal end, an error code indicative of the detailed error contents can be also transferred.

In order to realize "the reliable support by the printer server of the network printer directly connected to the LAN", the printing system has a function to instruct the printer error recovery from the printer/spooler control server 300 to the network printer 1A.

Figure 9:
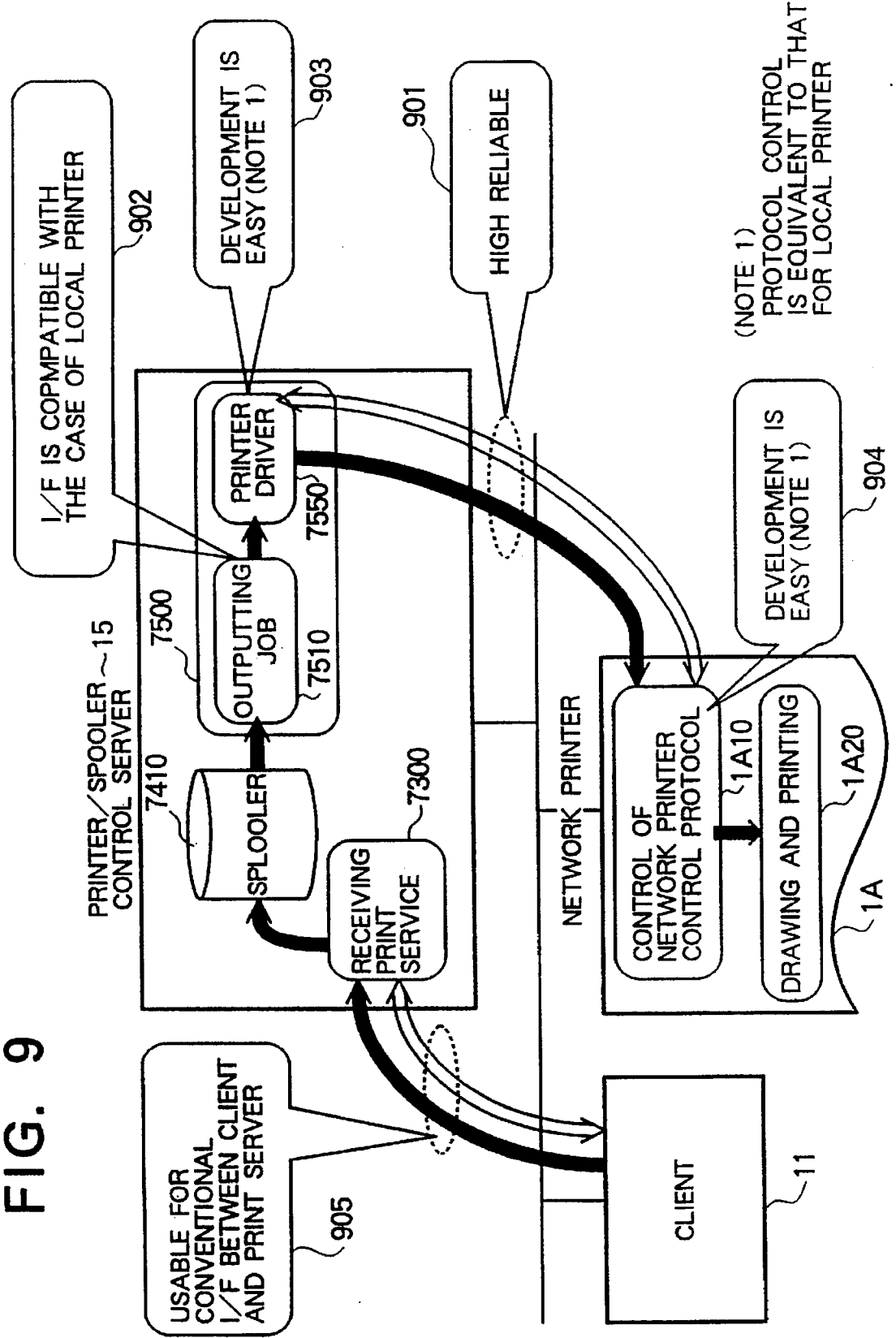
FIG. 9 is a diagram showing a reliable network printer control protocol in the invention.

FIG. 9 shows a construction and effects of the network printer control protocol of the printing system. Specifically speaking, the printing system newly supports network printer control commands shown in FIG. 10 and an asynchronous report message of the network printer status shown in FIG. 11 on a communication protocol such as TCP/IP (transmission control protocol/internet protocol), SPX/IPX (sequenced packet exchange/internetworking packet exchange), or the like. The commands of FIG. 10 indicate the commands which are sent from the print server 15 (function of the printer/spooler control server) to the network printer. The message of FIG. 11 indicates the asynchronous report message which is sent from the network printer to the print server 15 (function of the printer/spooler control server).

Among the commands of FIG. 10, "end session" is provided to instruct a disconnection of the communication connection such as TCP/IP or the like and a release of a socket. "reset the serial page number" is provided to explicitly and intentionally reset the serial page number. The printing system ordinarily generates those commands at the head of each print job and resets the serial page number of the head page of each print job to 0. Even if the relevant commands are reset to 1 or another value instead of 0, no problem will occur. The serial page number is provided for reporting the print situation from the printer to the printer/spooler control server and for a print control from the printer/spooler control server to the printer. The details of the contents are disclosed in JP-A-3-192463, JP-A-3-224778, JP-A-2-60781, and JP-A-2-166511 as the inventions which have already been filed by the present applicant et al.

The printing system uses the foregoing reliable network printer control protocol, so that the following effects shown in FIG. 9 can be obtained.

(1) The reliable support between the network printer and the printer/spooler control server (901).

(2) In the interface between the job output and the printer driver, an upper compatibility with the case for the local printer which has already been developed by the present inventors can be easily performed (902).

(3) The printer driver 7550 of the printer/spooler control server 15 (903) and the network printer control protocol control unit 1A10 of the network printer 1A (904) can be easily developed.

(4) The network printer can be used in the conventional interface between the client and the print server (905).

[Embodiment 3]

The embodiment 3 describes in detail "logical specification level printing instruction" as a feature of the printing system.

In this case, particularly, it is realized by using the printer configuration management table provided for the distributed printing management server 14.

FIGS. 12 to 15 show the logical specification level printing instruction. Explanation will now be made mainly with respect to the relation between the client 11 and the print server 15, specifically speaking, the relation between the distributed printing management server 14 which receives a print request or the like from the client 11 and the printer/spooler control server 15 which receives the information from the distributed printing management server.

FIG. 12 shows the conventional problems and an outline of services which are provided. The conventional printing system executes the printing process by designating the printer name (accurately speaking, physical printer name). Therefore, in case of using the printer, the user must grasp the specifications, places, and statuses of all of the printers connected to the network. For example, as specifications of the printer, there are a paper size supported by the printer, PDL (sort of printing command), permission and inhibition of the double side printing, and the like. In this case, the user must select the necessary printer after he grasped that the printers having PDL1 are the printer 4 (1A) and printer 1 (17) and printer 5 (1B) and that the printers which can perform the double side printing are the printer 1 (17) and printer 5 (1B).

In the case where the user insufficiently grasps the printers, all of the printers on the network are not adequately used or the user requests the contents which don't satisfy the specifications of the selected printer and a printer error frequently occurs.

To solve the above problems, the printing system newly provides a print service to select the printers adequate to the logical specifications. Namely, according to the present printing system, for the logical specifications which are required from the client such that the paper size is set to A3 and PDL is set to PDL1 and the double side printing can be executed, the distributed printing management server selects the printer 1 (17) and printer 5 (1B) which satisfy the above specifications and notifies to the client and the user selects the printer 1 (17) from those printers. That is, according to the printing system, the distributed printing management server selects the printers which satisfy the logical specifications and the installing place of the printer is informed to the user, so that the printer which is preferable for the user can be selected.

FIG. 13 shows in detail the logical specification level printing instruction system. The diagram shows further in detail FIG. 7 mentioned above with respect to the printing instruction at the logical specification levels. It is the first point of the present system that the printer configuration management table 7200 is provided for the distributed printing management server 14. The printer configuration management table 7200 unitarily manages all of the printers and printer/spooler control servers on the network as a target of the management of the print services. The second point is that the client 11 instructs the logical specifications to the distributed printing management server 14, the distributed printing management server 14 executes the printer retrieval executing unit 7210 on the basis of such an instruction, the printers adequate to the logical specifications are retrieved, and the candidates for the printers which can be used in the client are proposed. The printing system can also install the function of the printer retrieval executing unit 7210 on each client (11, 12, etc.). In this case, a program capacity in each client increases. However, as compared with the case where the printer retrieval executing unit 7210 is installed in the distributed printing management server, the processing time as a whole system can be reduced.

This is because the process of the printer retrieval executing unit 7210 which had commonly been executed in the distributed printing management server was distributed to each client. A comparison table of the above two systems is shown in FIG. 55. As for a communication amount 552 between the client and the distributed printing management server and a printer retrieval program amount 553, the number of places 551 to search for the printers adequate to the specifications in case of the distributed printing management server 14 is smaller. However, as for a processing amount 554 of the distributed printing management server, the number of places 551 to search for the printers adequate to the specifications in case of the client 11 is smaller. A user I/F 555 is the same in both of them.

FIG. 13 shows a processing procedure of the logical specification level printing instruction system. FIG. 13 shows an example in which the user prints the result of the edition by an application program (abbreviated as an AP) such as word processor, table calculation, data base, or the like.

(1) The printer configuration watching requesting unit 7220 in the distributed printing management server 14 requests the watching of the following specifications and statuses to the printer configuration watching executing unit 7320 in the printer/spooler control server 15.

① The specifications and status of the printer/spooler control server 15

② The type number and status of the printer which is controlled by the printer/spooler control server 15.

Each printer/spooler control server 15 executes the foregoing watching operation and informs the result of the watching to the distributed printing management server 14. The printer/spooler control server executes an asynchronous report (corresponding to the printer status transmission shown in FIG. 36) to the distributed printing management server, so that a communication overhead between the distributed printing management server and the printer/spooler control server is reduced (71-1).

(2) The distributed printing management server 14 updates the printer configuration management table 7200 on the basis of the watching result, thereby setting the table 7200 into the newest state (71-3).

(3) A specification adequate printer retrieving unit 7110 in the client 11 receives the logical specifications and requests the retrieval of the printers adequate to the logical specifications to the printer retrieval executing unit 7210 in the distributed printing management server 14 (72-1).

(4) The printer retrieval executing unit 7210 executes the (72-2) retrieval with reference to the printer configuration management table 7200 which holds the newest states of the printers and printer/spooler control servers and informs the candidates for physical printers adequate to the logical specification to the specification adequate printer retrieving unit 7110 (72-3).

(5) The specification adequate printer retrieving unit 7110 stores the logical specifications (hereinafter, referred to as current logical specifications) as a retrieval result and the adequate physical printers into the current logical specification tables 7140.

(6) The client displays the candidates for the physical printers adequate to the logical specifications onto a picture plane and the user selects one proper printer from those printers (7120). The printer selected by the user is called a decided printer.

In this instance, when there are a plurality of decided physical printers, the specification adequate printer retrieving unit adds the orders to those printers in accordance with the print speed of the printer and display. When the print speeds are equal, the printers are displayed in accordance with the registration order. It is also possible to add the orders in consideration of an amount of jobs which are outputted to each printer or a distance from the user to each printer in addition to the print speeds. In such a case, the user can easily select the desired printer.

(7) The user instructs the printing of the edition result by the above application program by the decided printer as follows.

(7-1) The user instructs the decided printer for the application program by using a printer selecting unit 7131 in the application program unit.

(7-2) The user instructs form information such as paper size, paper printing direction (instruction of portrait/landscape), upper/lower/left/right margins, the number of characters per line, the number of lines per page, the number of print copies, and the like to the application program by using a form setting-up unit 7132 in the application program unit 7131.

(7-3) The user uses a print start page and a print end page as input parameters and instructs the printing to the application program.

(7-4) A printing unit 7134 in the application program converts the above edition result to PDL as a print command train by using a PDL generating unit 7134.

(7-5) The application program records the following contents regarding each print job into the job table 7150 for client by using a physical printer designation print instructing unit 7135.

Name of the decided printer

Job number

Logical specifications (7-6) The physical printer designation print instructing unit 7135 transmits PDL generated in (9-4) to the decided printer (72-5).

In this instance, in the case where the decided printer is included in the adequate printers in the current logical specification table, the logical specifications in the current logical specification table are added to the jobs.

(8) The job receiving unit 7330 in the printer/spooler control server 15 receives the foregoing PDL and logical specifications as a print job and stores into the spooler 7410.

(9) The printer/spooler control process 7400 in the printer/spooler control server 15 reads out the foregoing print job from the printer spooler control process 7410 and first sets the printer into the mode designated by the logical specifications and executes the printing.

After that, the logical specifications in the current logical specification table 7140, printer name, and job number are registered into the job table 7150 for client. The current logical specification table 7140 can be also deleted by an exclusive-use command or can be also deleted every execution of the physical printer designation print instructing unit 7135.

According to the above system, in order to allow the user to select the decided printer, the specification adequate printer retrieval 7110 and the physical printer designation print instruction 7120 have independently been executed. However, they are combined as one command and the selection of the optimum printer and the print instruction to the printer can be also automatically performed.

In this case, the portion corresponding to the specification adequate printer retrieval 7120 automatically selects the decided printer having the first order mentioned in the above paragraph (6).

By adding the contents in the current logical specification table to the job by the physical printer designation print instructing unit 7135, the function of the printer which is not supported by the application program can be utilized.

For example, as a function of the printer, it is also possible to construct in a manner such that a combination of arbitrary ones of a sort of PDL 431, a distinction between portrait/landscape 432, a paper size 433, a distinction between the single/double side printing 434, a dot density 435, and a zoom-in/out ratio 436 as items in the current logical specification table 7140 is designated and the printer is made operative in the mode of the designated specifications.

Figures 14B, 14C:
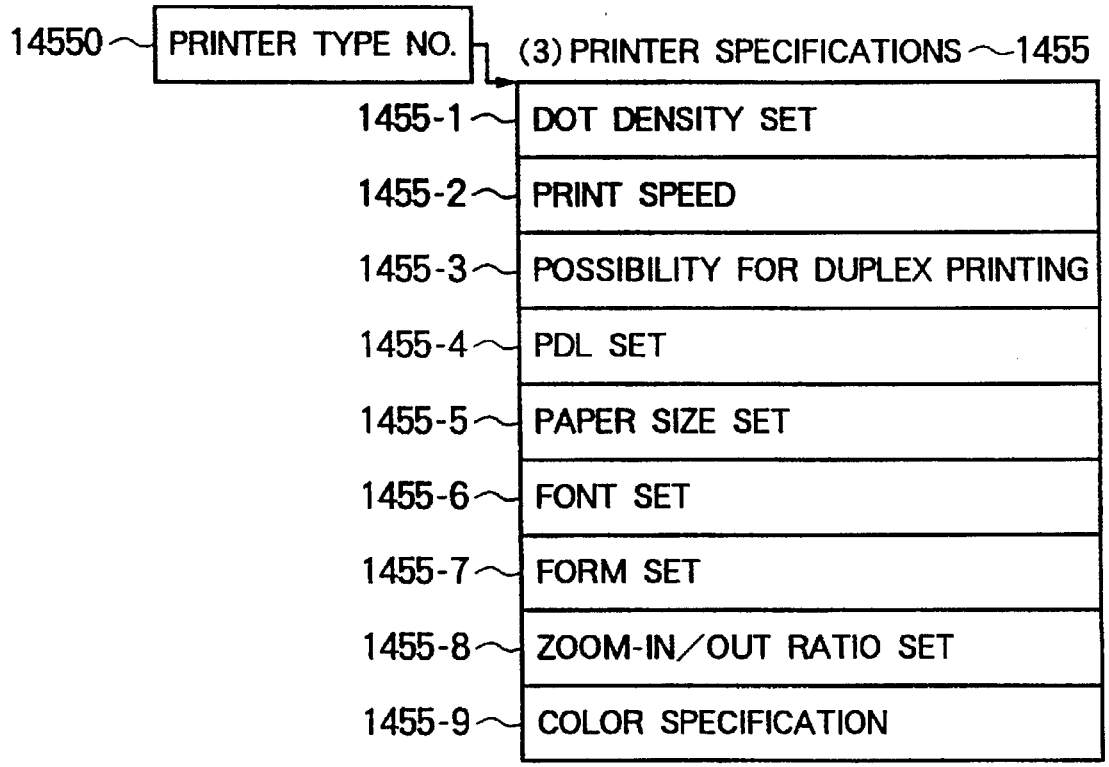

FIGS. 14A to 14C show the contents of the printer configuration management table 7200. As shown in FIG. 14A, the printer configuration management table 7200 describes date 1410 of making of such a management table, host names (1421, . . . , 1431) regarding the printer/spooler control servers, alive (active) aflags (1422, . . . , 1432), print cap making dates (1423, . . . , 1433), printer/spooler control server specifications (1424, . . . , 1434), and printer/spooler control server statuses (1425, . . . , 1435). The host names (1421, . . . , 1431) show the names of the printer/spooler control servers. The alive flag indicates in which one of the alive, stop, and fatal error each of the printer/spooler control servers is. The "stop" corresponds to either one of the cases of power shut-off, disconnection, and response impossible in terms of a hardware. The "fatal error" denotes the case where although the apparatus is connected and operates as a hardware, it cannot respond as a software or another fatal error occurs. The "printcap" shows the name of physical printer, the name of corresponding printer/spooler control server host, the name of spooler, and the like with respect to each printer which is controlled by each printer/spooler control server. The "printcap making date" shows the date of making of the printcap for each printer/spooler control server. The details of the printcap have been disclosed in the technical manual, Hitachi CSMA/CD network 105 (TCP/IP) (manual No. 3050-3-200-30) for Hitachi Creative Workstation 3050. The invention can be also similarly realized with respect to the case of using the same kind of target file other than the printcap.

Further, with respect to all of the printers which are controlled by each printer/spooler control server, a physical printer name 1451, an alive flag 1452, a printer connecting method 1453, a place 1454, a printer type number 1455, a printer status 1456, a job amount 1457, and remarks 1458. The physical printer name 1451 denotes the name of each physical printer. As shown in FIG. 14B, the alive flag 1452 shows either one of the statuses of alive, stop, and fatal error in a manner similar to the case of the printer/spooler control server. The printer connecting method 1453 shows whether each printer is directly connected to each printer/spooler control server (referred to as a server direct coupling) or whether it is connected via the network like a network printer (referred to as a network direct coupling). The place 1454 shows the installing place of each printer, namely, a name of business place, a name of building, a name of floor, a name of area, and the like. The job amount shows a total print amount of the print job corresponding to each printer. The remarks are used to describe the comment and the like regarding each printer.

The type number of the printer is written in the printer type number 14550. Printer specifications 1455 of the type number are obtained from the printer type number 14550. The printer type number 14550 can be also realized as a set of a product type name and a hardware revision number.

The printer type number 1455 shown in FIG. 14C describes a dot density set 1455-1, a print speed 1455-2, permission or inhibition 1455-3 of the double side printing, a PDL set 1455-4, a paper size set 1455-5, a font set 1455-6, a form set 1455-7, a zoom-in/out ratio set 1455-8, and color specifications 1455-9.

The dot density set 1455-1, PDL set 1455-4, paper size set 1455-5, font set 1455-6, form set 1455-7, and zoom-in/out ratio set 1455-8 show a set of the dot density, PDL, paper size, font, form, and zoom-in/out ratio. At each time point during the use of the printer, all of the PDL, paper size, font, form, and the like which belong to the set are not always installed. In the set of the dot density and zoom-in/out ratio, it is presumed that the printer can switch and use each dot density and zoom-in/out ratio from one or more of them.

The print speed 1455-2 shows the print speed of a printer engine and its speed is expressed by a proper unit in accordance with a mechanism of the printer engine. A page printer uses a unit of pages/minute, a line printer uses a unit of lines/minute, and a serial printer uses a unit of characters/minute. The permission or inhibition of the double side printing describes whether the double side printing can be performed by each printer or not. The color specifications describe a distinction among monochromatic, multi-color, and full color as color print specifications of the printer.

As an example of the PDL (page description language), there are PostScript made by Adobe Co. Ltd., InterPress made by Xerox Co., Ltd., SPDL made by ISO, ESC/P made by Epson Corporation, LIPS made by Canon Inc., and the like in order to perform an advanced printing.

In the printer status shown in FIG. 14D, an error status 1456A of the printer, a resource loading status 1456B, and a resource selection status 1456C are described.

Among them, an error type 1456A-1 and an error code 1 1456A-2 and an error code 2 1456A-3 in the case where there is an error are described in the error status 1456A.

As an error type 1456A-1, there is shown either one of (a) no error, (b) an error which can be recovered and doesn't need the reprinting, (c) an error which can be recovered and needs the reprinting, and (d) an error which cannot be recovered (also called a fatal error). As a typical example of (b) the error which doesn't need the reprinting and can be recovered is a paper empty error. As a typical example of (c) the error which can be recovered and needs the reprinting, there is a paper jam error or a printer door open error. As a typical example of (d) the error which cannot be recovered, there is a printer engine failure or a printer controller failure.

By combining both of the printer error code 1456A-2 and the printer error code 1456A-3, they describe the detailed code of the error detected by the printer driver. For example, the printer error code 1 and the printer error code 2 can be also made correspond to the error code of the technical manual, Printer Driver Programmer's Guide (manual No. 3050-3-026-30) for the Hitachi Creative Station 3050 and the error detailed code (disclosed in the error code of paragraph 2.1.3 of this manual), respectively.

The resource loading status 1456B describes a loading status 1456B-1 of the PDL in each printer, a loading status 1456B-2 of a paper supply unit, a loading status 1456B-3 of a paper eject unit, a loading status 1456B-4 of a font, and a loading status 1456B-5 of a form. FIG. 39 shows them in detail. (1) denotes the PDL loading status 1456B-1 including the number of loaded PDLs 3911 and loaded PDL names 39121 to 3921n. (2) denotes the paper supply unit loading status 1456B-2 including statuses 3921 to 392n of the paper supply units. The status 3921 of the paper supply unit 1 further includes presence or absence of the paper 39211, a cassette shape (vertically long/laterally long) 39212, and a paper size 39213. The other paper supply units also have constructions similar to those mentioned above. (3) denotes the paper eject unit loading status 1456B-3 including presence or absence of the paper 3931 to 393n and full of the paper. (4) denotes the font loading status 1456B-4 including the number of fonts 3941 and font names 39421 to 3942n of the fonts.

A font type (a distinction of a dot font/outline font, the number of dots of the dot font, and the like) 394211 and a storage location (built-in, cartridge expansion, volatile download, nonvolatile download, and the like) 394212 are further associated with the font name 39421.

The other font names also have constructions similar to those mentioned above. (5) denotes the form selection status 1456B-5 comprising the number of registered forms 3951 and form names 39521 to 3952n of the forms. A form type 395211 and a volatile/non-volatile 395212 are further associated with the form name 39521. The other form names also have constructions similar to those mentioned above.

Finally, the resource selection status 1456C describes a dot density 1456C-1 selected at present in each printer, a single/double side 1456C-2, a PDL 1456C-3, a paper size 1456C-4, a paper supply unit number 1456C-5, a paper supply unit type 1456C-6, a paper eject unit number 1456C-7, a portrait/landscape 1456C-8, a font 1456C-9, a form 1456C-A, and a zoom-in/out ratio 1456C-B.

Figure 56:
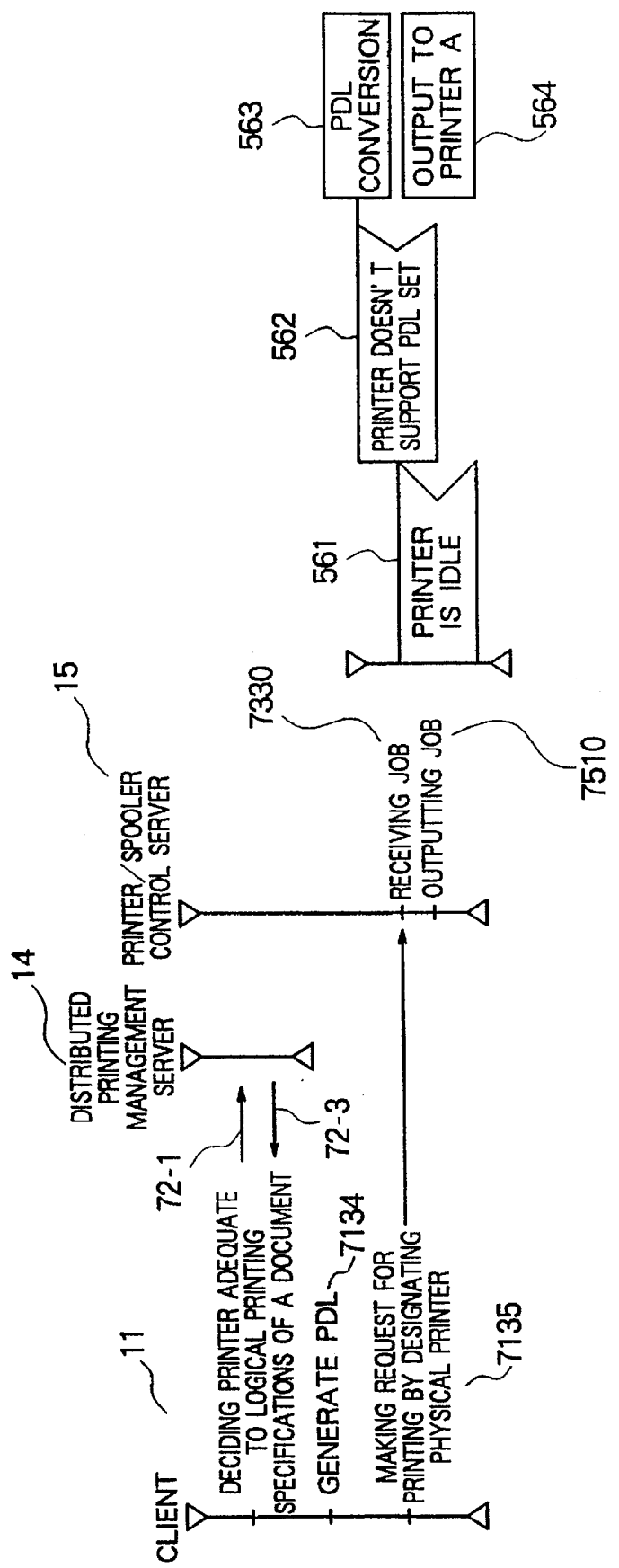
FIG. 56 is a diagram showing a PDL conversion system in a job output unit in the invention.

Although there is a printer which satisfies the remaining logical specifications other than the PDL sort, even in the case where there is no printer which satisfies all of the logical specifications so long as up to the PDL sort is included, the PDL conversion is executed to the document, thereby also enabling to print. A processing chart is shown in FIG. 56. Processes within a range from a step of sending the logical specifications to the distributed printing management server 14 (72-1) to a step of performing the job reception 7330 in the printer/spooler control server 15 are similar to those in FIG. 13. However, the processes of the job output 7510 are slightly different. First, a check is made in step 561 to see if the printer is empty or not. If it is empty, a check is made in step 562 to see if the printer supports the PDL or not. If the printer doesn't yet support, the PDL conversion is executed in step 563 and the PDL is outputted to the printer in step 564.

The use efficiency for the user by the print instruction at the logical specification levels mentioned above is determined by (1) the logical specifications which provide the printing system and (2) a selection algorithm of the printers adequate to the specifications by the specification adequate printer retrieving unit 7110 and printer retrieval executing unit 7210. To improve the use efficiency, the logical specifications of three levels shown in FIG. 15 and the selection algorithm of the printers adequate to the specifications are installed step by step. The level 2 includes the contents of the level 1. The level 3 includes the contents of the levels 1 and 2.

The foregoing printing instruction at the logical specification levels reduces a burden on the user in the printing system and can improve the use degree of the printer, system printing performance, and reliability.

In I/F commands usr_lpr and usr_lgc for user and I/F functions cl_lpr and cl_lgc for client shown in FIGS. 34 and 35, the print specifications of a plurality of items can be simultaneously instructed as input parameters. In the usr_lgc and cl_lgc, the adequate printers and adequate print servers which simultaneously satisfy a plurality of print specifications can be obtained as outputs of the commands or functions.

In case of using the commands or functions which can simultaneously input only the print specifications of one item, the following surplus processes need to be executed by (a) the user or (b) the application program or user program other than a print service program. However, in the above commands usr_lpr and usr_lgc or functions cl_lpr and cl_lgc, those surplus processes are unnecessary.

(i) The commands or functions of the number as many as only the number of items with respect to the print specifications of each item are issued.

(ii) The AND logic is applied to the group of sets of the adequate printers which satisfy the print specifications of each item.

By doing the above processes, it is necessary to search a set of adequate printers which simultaneously satisfy all of the items.

In the above I/F commands usr_lpr and usr_lgc for user and the I/F functions cl_lpr and cl_lgc for client, it is also possible to construct in a manner such that the print specifications of a plurality of items are simultaneously used as input parameters and a logic in which the AND and OR are combined is applied to those items and the adequate printers are searched.

All of the names of the I/F commands for user mentioned above can be also set to lpr, lpq, lprm, lpc, pac, lgc, jobq, hold, rcvry, atlprn_disp, jobhst, prnconf_disp, and prnspc_qry by omitting the portion of usr_. In the case where the commands such as lpr, lpq, lprm, lpc, pac, and the like have already existed, it is assumed that those existing commands are deleted or changed to other names and are refuged. Consequently, the upper compatible functions of the conventional lpd protocol can be used by the user or application/user program in the conventional upper compatible I/F.

In the I/F commands usr_lpr and usr_lgc for user and the I/F functions cl_lpr and cl_lgc for client mentioned above, other specifications regarding the printing such as font specifications, color print specifications, or the like can be also added to the parameters. In such a case as well, the printing system can be also realized.

In the usr_lpr command, the present command automatically selects the adequate printers which satisfy the print specifications. Now, "automatically" denotes that the processing program of the present command evaluates (a) an adaptivity of the print specifications, (b) a distance from the client, and (c) a print queue job amount with respect to each printer as mentioned above and selects one of the set of one or more adequate printers which satisfy the print specifications without obtaining a judgment of the user.

Different from the above automatic selection, it is also possible to provide another command (called usr_lpr2) for performing a semiautomatic selection while obtaining a judgment of the user as follows.

(1) In the usr_lpr2 command, the user first inputs the same input parameter as the usr_lpr command.

(2) The present command displays the adequate printers which satisfy the inputted print specifications onto the screen. In this instance, together with the name of the printer, (a) a distance from the client, (b) a print queue job amount, and (c) an installing location are also displayed with respect to each printer. With regard to the above two items (a) and (b), the order is added to the set of adequate printers and they are displayed. In this instance, the ordering process is performed by setting (a) to the first key and by setting (b) to the second key.

(3) The user selects the most preferable printer (called selected printer) from the set of adequate printers displayed and instructs to the present command.

(4) The present command uses the instructed selected printer as an input and transfers the print job to the print server corresponding to the selected printer in a manner similar to the case of 1513.

In the foregoing semiautomatic selection, when the selected printer is selected from a plurality of adequate printers, the judgment of the user is requested, so that there is an effect such that the printer which is most preferable for the user can be selected.

The above semiautomatic selection can be also realized by using (a) both of the usr_lgc command and the usr_lpr command, (b) both of the usr_lgc command and the cl_lpr function, (c) both of the cl_gc function and the usr_lpr command, and (d) both of the cl_lgc function and the cl_lpr function. In this case, on the basis of the display on the screen of the set of printers adequate to the print specifications using the usr_lgc command or cl_lgc function, the user selects the most preferable printer (selected printer) from those printers in his head.

The selected printer is subsequently instructed as an input parameter of usr_lpr or lpr as an I/F command for user or cl_lpr as an I/F function for client. In case of using the lpr command, there is an effect such that the semiautomatic selection can be realized without changing the application/user program using the existing lpr command.

[Embodiment 4]

Figure 16A:
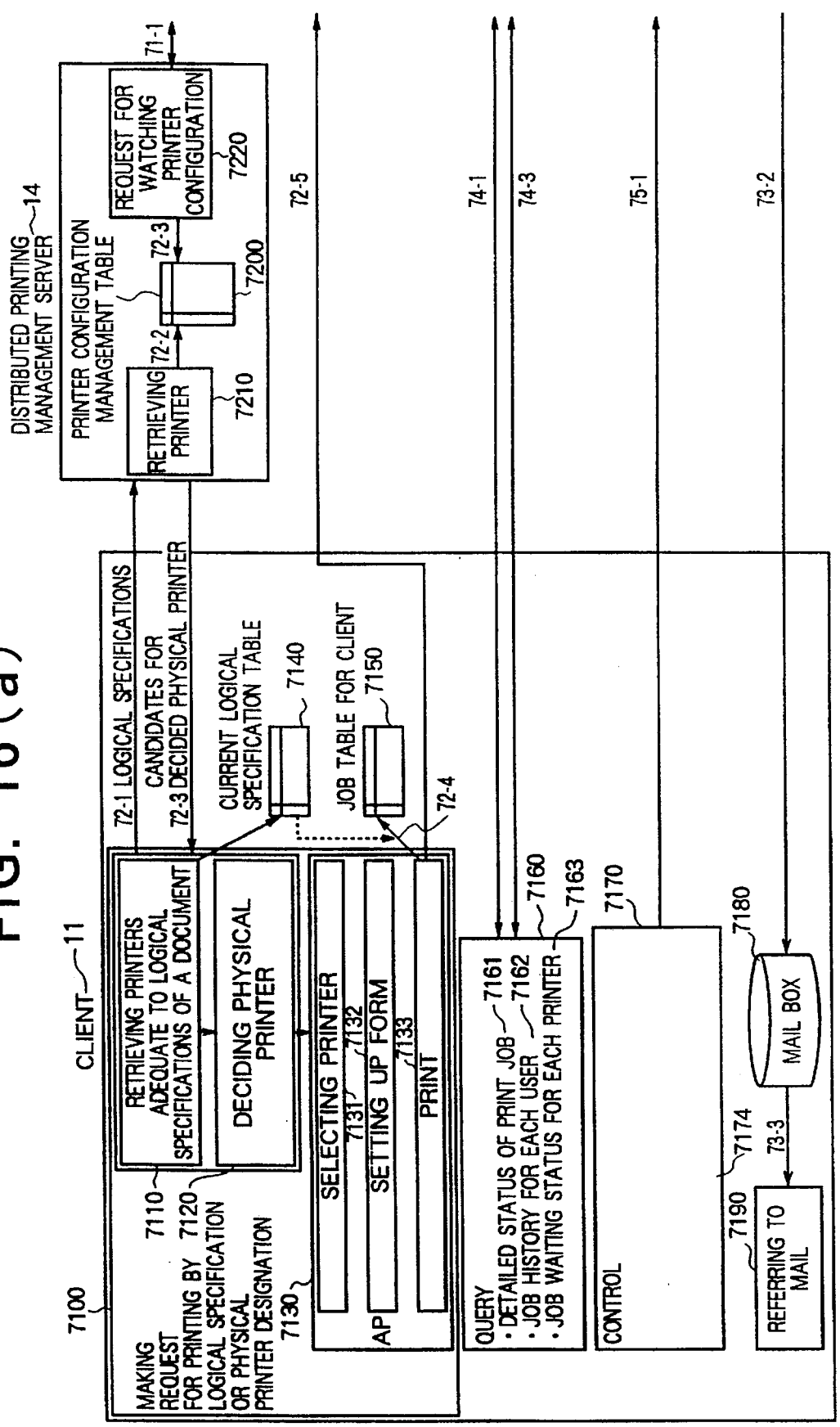
FIG. 16 is a diagram showing a query system from the client to the print server in the invention.
Figure 16B:
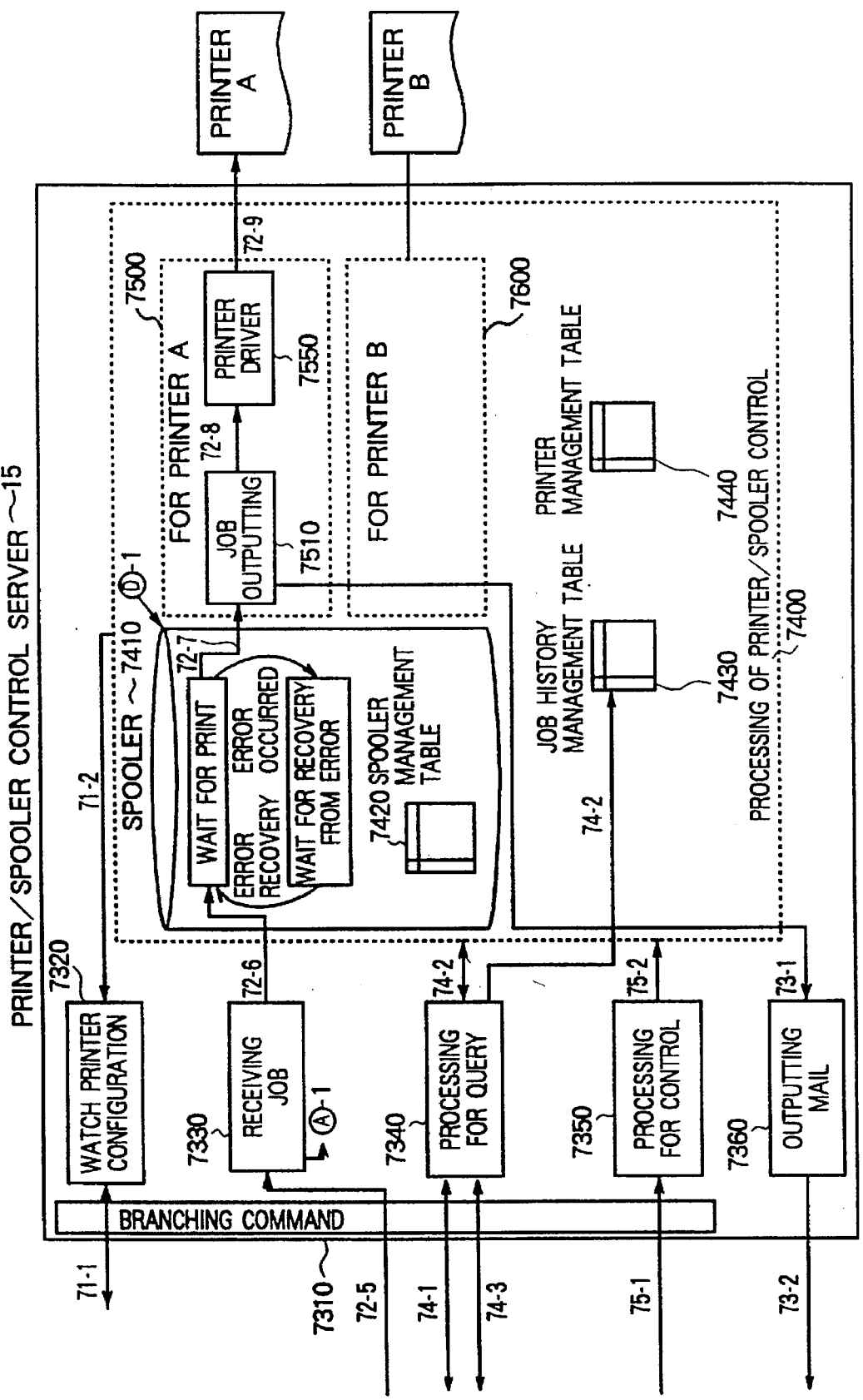

The embodiment 4 shows a query system from the client to the print server as a feature of the present printing system. FIG. 16 mainly shows a query of the detailed print job status, job history for each individual user, and the like from the client to the printer/spooler control server.

(1) The query unit 7160 provided for the client 11 performs a query to the printer/spooler control server 15 with respect to the detailed print job status 7161, job history 7162 for each user, a job waiting status 7163 for each printer, and the like (step 74-1).

(2) The command distributing unit 7310 provided for the printer/spooler control server 15 receives a query request in the above step 74-1 and instructs the query processing unit 7340 to execute the processes.

(3) In response to each query request, the query processing unit 7340 forms a response data with reference to a proper table. The spooler management table 7420 is referred with respect to the query of the detailed print job status 7161 or job waiting status 7163 for each printer. The job history management table 7430 is referred with respect to the query of the spooler management table 7420 or job history 7162 for each user.

(4) The query processing unit 7340 transmits the response data formed to each query requesting unit (7161, 7162, 7163, etc.) in the client (step 74-3).

By the above query system, the query of the detailed print job status, job history for each user, and the like from the client to the print server which cannot be performed hitherto can be executed. The functions, use efficiency, reliability, and serviceability of the printing system can be improved.

Figure 17B:
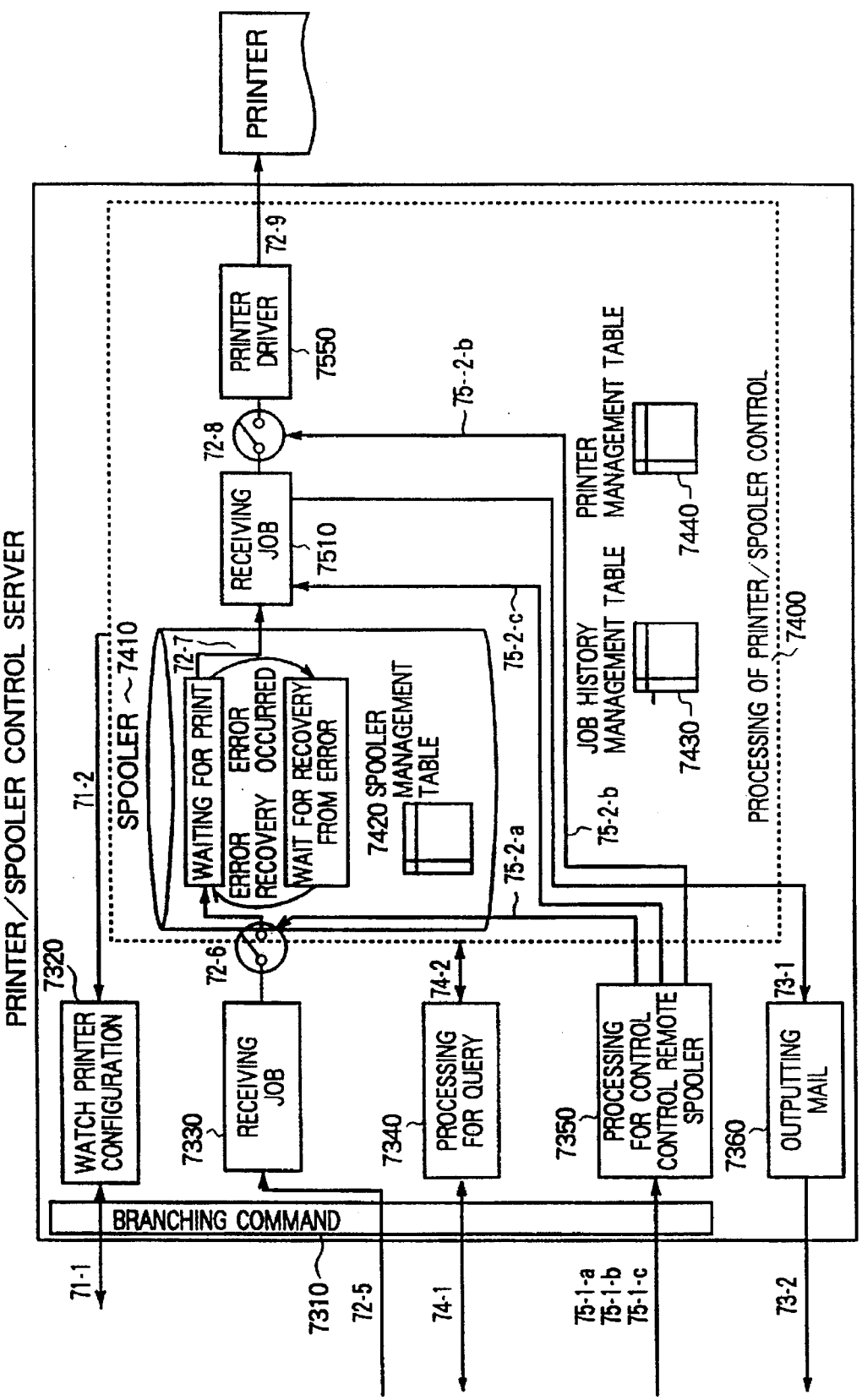
FIG. 17 is a diagram showing a print control system from the client to the print server in the invention.

FIG. 17 shows a control system from the client to the print server in the embodiment 4.

(1) The control unit 7170 provided for the client 11 executes the controls regarding the removal 7171 of the print job, a control 7172 of the remote spooler on the printer/spooler control server, the hold/release 7173 of the print job output, the error recovery instruction 7174, and the like to the printer/spooler control server 15 (step 74-1).

(2) The command distributing unit 7310 provided for the printer/spooler control server 15 receives the above control request and instructs the control processing unit 7350 to execute the processes.

(3) The control processing unit 7350 executes the control process corresponding to each of the control commands 7171 to 7174 for the printer/spooler control processing unit 7400. In the control process, the foregoing various tables, namely, the spooler management table 7420, job history management table 7430, and printer management table 7440 are updated as necessary.

(4) The printer/spooler control processing unit 7400 responds to each of the control requesting units (7171, 7172, 7173, 7174, etc.) in the client as necessary (step 74-3).

For example, in the remote spooler control, the processes are executed as follows.

Now, "remote spooler control" denotes that the client is controlled by the printer/spooler control server through the network.

(1) The control requesting unit 7172 of the remote spooler in the client executes control requests such as stop/restart of inputting to the spooler (7172-a), stop/restart of outputting from the spooler (7172-b), start/stop/restart of the spooler (7172-c), and the like to the printer/spooler control server 15 (steps 75-1-a, 75-1-b, 75-1-c).

(2) The command distributing unit 7310 in the printer/spooler control server receives the above control request and instructs the remote spooler control processing unit in the control processing unit to execute the processes.

(3) The remote spooler control processing unit in the control processing unit 7350 executes the stop/restart of the inputting to the spooler as shown in 75-2-a for the spooler inputting stop/restart request (7172-a, 75-1-a), performs the stop/restart of the outputting from the spooler as shown in 75-2-b for the spooler outputting stop/restart request (7172-b, 75-1-b), and also executes the start/stop/restart of the spooler as shown in 75-2-c for the spooler start/stop/restart request (7172-c, 75-1-c).

By the above control system, the instructions of the remote spooler control, print job outputting hold/release, error recovery, and the like from the client to the print server which cannot be performed hitherto can be realized. The functions, use efficiency, reliability, and serviceability of the printing system can be improved.

[Embodiment 5]

The embodiment 5 will now be described with respect to error processes in the present printing system.

FIGS. 18 to 27 show an error processing system. All of the component elements constructing the printing system, namely, the clients, print servers (distributed printing management server and printer/spooler control server), and printers will now be described.

First, FIG. 18 shows whole specifications of the error classification and error processes in the printing system. In the printing system, errors are classified to a printer error 18100, a printer/spooler control server error 18200, and a distributed printing management server error 18300 in accordance with the apparatus on the generating side of the errors (18000). In the printing system, further, the errors are classified to an error 18110 such that the printer error 18100 can be ignored, an error 18120 which can be automatically recovered, an error 1813A which can be recovered although the user intervenes, and a fatal error 18150 which needs a repair or exchange of the printer apparatus. As for the error 1813A which can be recovered although the user intervenes, the error 1813A is further classified to an error 18130 which doesn't need the reprinting by the printer and an error 18140 which needs the reprinting. The errors are also classified into an error 18210 such that the printer/spooler control server error 18200 can be ignored, an error 18220 which can be automatically recovered by the printer/spooler control server, and a fatal error 18230 which needs a repair or exchange of the printer/spooler control server. The errors are further classified to an error 18310 such that the distributed printing management server error 18300 can be ignored, an error 18320 which can be automatically recovered by the distributed printing management server, and a fatal error 18330 which needs a repair or exchange of the distributed printing management server.

FIG. 18 shows the specifications of an error process (18010) executed for each of the above errors 18110 to 18150, 18210 to 18230, and 18310 to 18330 with respect to an error detecting apparatus 18011, report specifications 18012, an error processing apparatus 18013, and processing contents 18014.

<<Processes of printer error>>

(1) Processes for the ignorable printer error 18110 handle a printer 18111 as an error detecting apparatus, nothing 18112 as report specifications, nothing 18113 as an error processing apparatus, and ignore 18114 as processing contents.

(2) Processes for the error 18120 which can be automatically recovered by the printer handle a printer 18121 as an error detecting apparatus, nothing 18122 as report specifications, a printer 18123 as an error processing apparatus, and a recovery 18124 by error processes built in the printer as processing contents.

(3) Processes for the error 18130 which doesn't need the reprinting by the printer although there is a user intervention handle a printer 18131 as an error detecting apparatus, a report 18132 from the printer to the client via the printer/spooler control server as report specifications, printer and printer/spooler control server and client 18133 as error processing apparatuses, and the following contents as processing contents (18144).

(3-1) Report from the printer to the client via the printer/spooler control server.

(3-2) The user processes if necessary. For example, the user supplies papers or toner to the printer for a paper empty error or a toner empty error. The user cleans a discharge toner bottle for a discharge toner bottle full error.

(4) Processes for the error 18140 which needs the reprinting by the printer and also needs the user intervention handle a printer 18141 as an error detecting apparatus, a report 18142 from the printer to the client via the printer/spooler control server as report specifications, printer and printer/spooler control server and client 18143 as error processing apparatuses, and the following contents as processing contents (18144).

(4-1) The processing contents are reported from the printer to the client via the printer/spooler control server.

(4-2) The user processes if necessary. For example, the user removes the jammed paper from the printer or closes a printer door for a paper jam error or a printer door open error.

(4-3) The print job is retransmitted from the printer/spooler control server to the printer if necessary.

(4-4) The printer reprints.

(5) Processes for the fatal error 18150 of the printer handle a printer 18151 as an error detecting apparatus, a report 18152 from the printer to the client via the printer/spooler control server as report specifications, printer and printer/spooler control server and distributed printing management server and client 18153 as error processing apparatuses, and a process 18154 for printing by the alternative printer as processing contents. In the process 18154 to print by the alternative printer, the printing is executed by using another printer in place of the printer in which the fatal error occurred. In this instance, the processes such that the application program is restarted and the reprinting is executed by using the program as in the conventional apparatus are unnecessary. The details of the alternative printer printing process will be described later by using FIGS. 25 to 27.

<<Processes of the printer/spooler control server error>>

(1) Processes for the ignorable printer/spooler control server 18210 handle a printer/spooler control server 18211 as an error detecting apparatus, nothing 18212 as report specifications, nothing 18213 as an error processing apparatus, and ignore 18214 as processing contents.

(2) Processes for the error 18220 which can be automatically recovered by the printer/spooler control server handle a printer/spooler control server 18221 as an error detecting apparatus, nothing 18222 as report specifications, a printer/spooler control server 18223 as an error processing apparatus, and a recovery 18224 by error processes built in the printer/spooler control server as processing contents.

(3) Processes for the fatal error 18230 of the printer/spooler control server handle a distributed printing management server or client 18231 as an error detecting apparatus, a report 18232 from the printer/spooler control server to the distributed printing management server and client as report specifications, printer/spooler control server and distributed printing management server and the like 18233 as error processing apparatuses, and a process 18234 for printing by using the alternative printer/spooler control server as processing contents. In the process 18234 for printing by using the alternative printer/spooler control server, the printing is executed by using another printer/spooler control server in place of the printer/spooler control server in which the fatal error occurred.

<<Processes of the distributed printing management server error>>

(1) Processes for the ignorable distributed printing management server error 18310 handle a distributed printing management server 18311 as an error detecting apparatus, nothing 18312 as report specifications, nothing 18313 as an error processing apparatus, and ignore 18314 as processing contents.

(2) Processes for the error 18320 which can be automatically recovered by the distributed printing management server handle a distributed printing management server 18321 as an error detecting apparatus, nothing 18322 as report specifications, a distributed printing management server 18323 as an error processing apparatus, and a recovery 18324 by error processes built in the distributed printing management server as processing contents.

(3) Processes for the fatal error 18330 of the distributed printing management server handle a printer/spooler control server or client 18331 as an error detecting apparatus, nothing 18332 as report specifications, a printer/spooler control server or the like 18333 as an error processing apparatus, and a process 18334 for printing by the alternative distributed printing management server as processing contents. In the case where the fatal error occurs in the distributed printing management server, in the process 18334 for printing by the alternative distributed printing management server, the distributed printing management server function is newly allocated onto a proper one of the printer/spooler control servers, a program for such a distributed printing management server function is transferred therein and is activated, thereby continuing the printing.

[Embodiment 6]

The embodiment 6 shows an example of the foregoing printer error processes using the features of the printing systems disclosed in the embodiments 1 to 5.

Figure 19B:
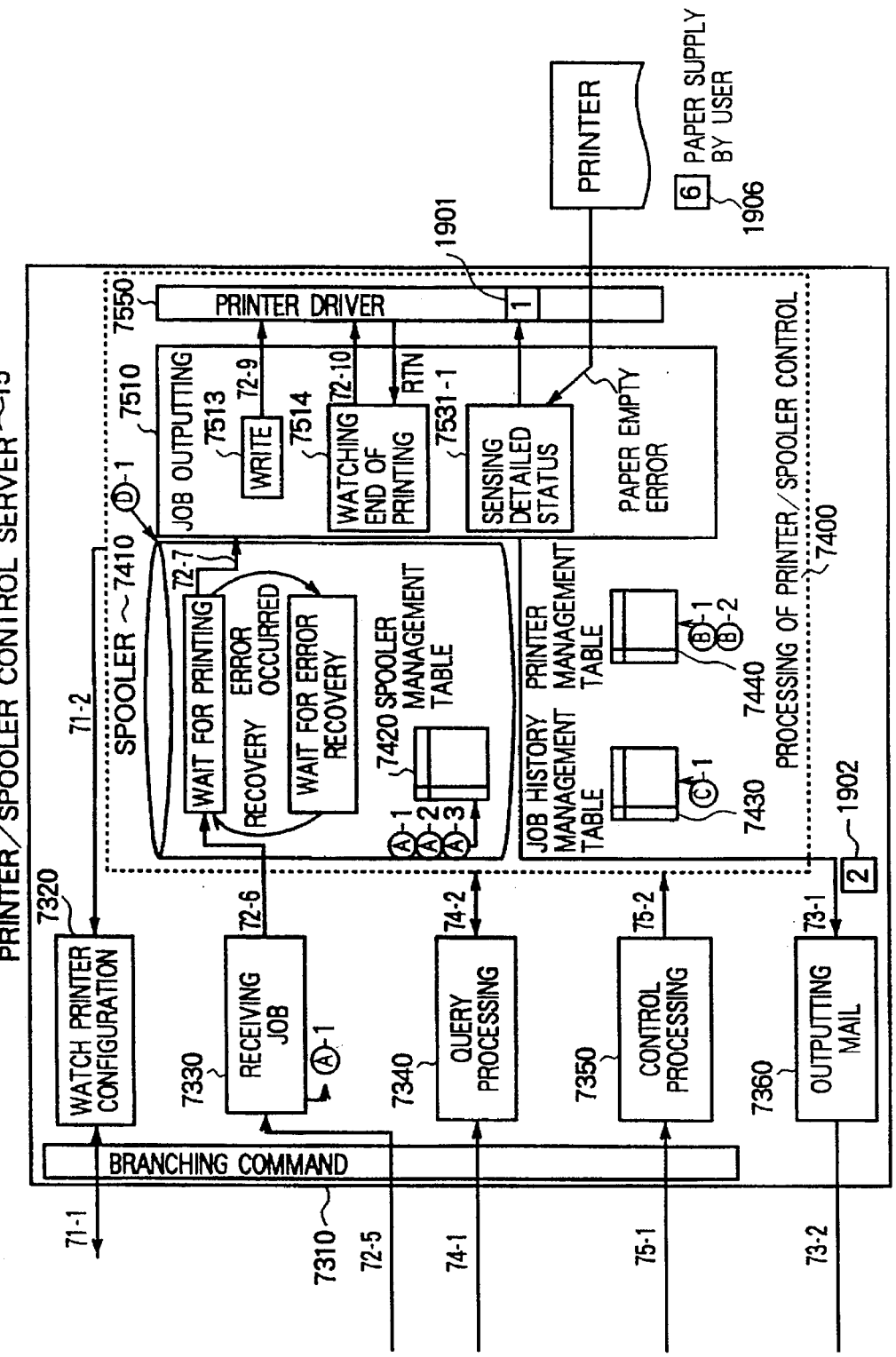
FIG. 19 is a diagram showing an example of an error recovery system in the invention.
Figure 20:
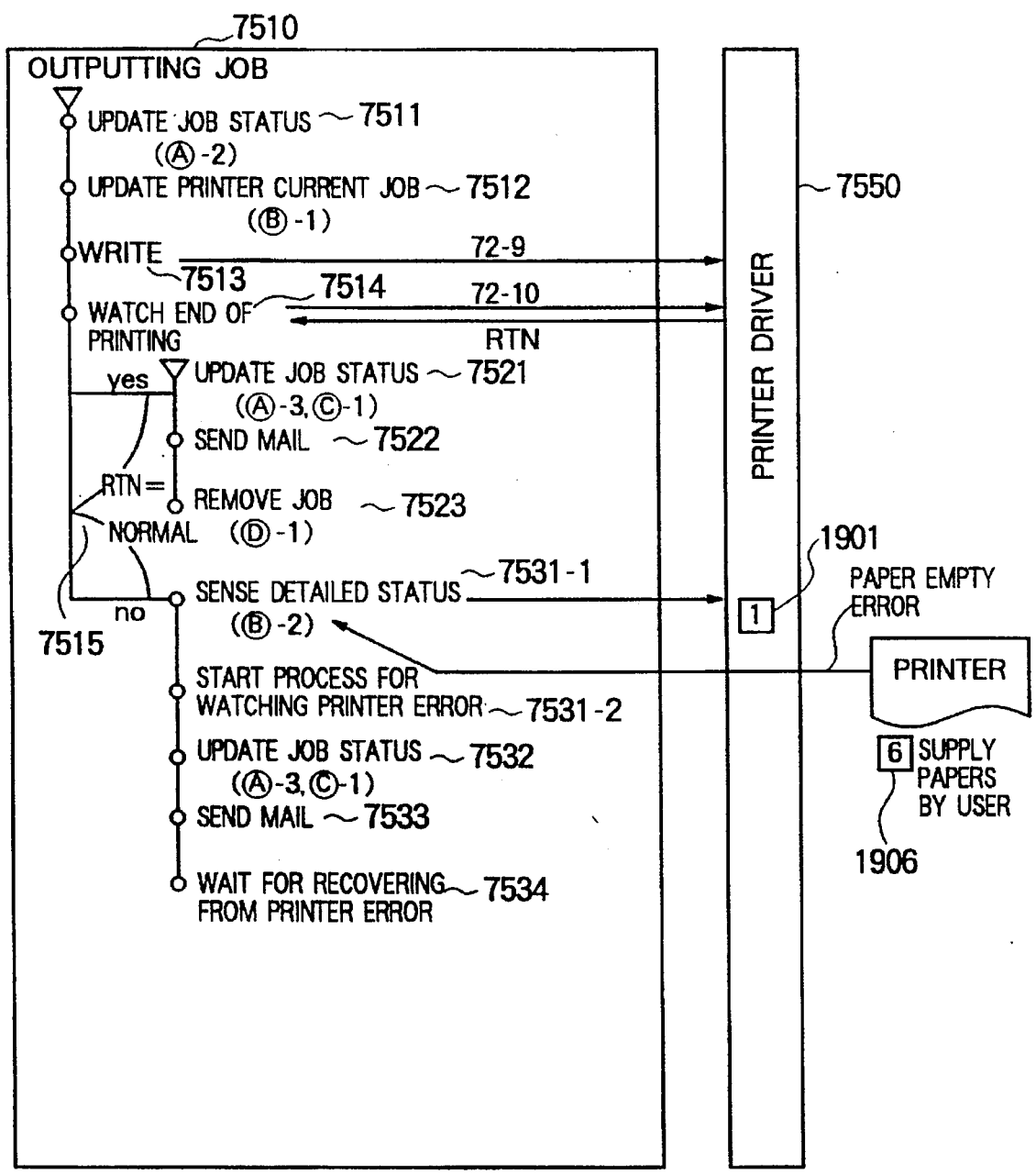
FIG. 20 is a diagram showing an example of an error recovery system in the invention.

FIGS. 19 and 20 show a recovery procedure from the paper empty error as a process of the error which doesn't need the reprinting although an intervention of the user is necessary. Specifically speaking, the printing system disclosed in the embodiment 6 uses the error reporting function to the client disclosed in the embodiment 1, the query function to the print server disclosed in the embodiment 4, and the error processes disclosed in the embodiment 5. The printing system also handles the network printer by the method disclosed in the embodiment 2.

FIG. 20 shows a processing procedure of the job outputting unit 7510 of the printer/spooler control server 15 when performing the recovery processes from the paper empty error. The present processing procedure is almost similar to that described in FIG. 37 in the embodiment 1.

(1) The job outputting unit 7510 updates the job status during the printing. Specifically speaking, the relevant items in the spooler management table 7420 are updated (step 7511).

(2) The job outputting unit 7510 updates the printer current job indicative of the number of the job which is using the printer. Specifically speaking, the relevant items in the printer management table 7440 are updated (step 7512).

(3) The job outputting unit 7510 generates a write system call to the printer driver in order to write print data constructing the print job. The write system call is generated a plurality of number of times as necessary (step 7513).

(4) The job outputting unit 7510 generates a print end watching system call to the printer driver in order to watch the end of the print job which requested the printing in step 7513 (step 7514).

(5) The job outputting unit 7510 checks a return value (written as "rtn" in FIG. 20) of the foregoing print end watching system call (step 7515).

(6) The job outputting unit 7510 executes the following processes when the return value in step 7515 is normal.

(6-1) The job outputting unit 7510 updates the job status to the print job normal end. Specifically speaking, the relevant items in the spooler management table 7420 and job history management table 7430 are updated (step 7521).

(6-2) The job outputting unit 7510 informs the normal end of the print job to the client on the generating side of such a print job by using a mail outputting unit 7360 (step 7522).

(6-3) The job outputting unit 7510 deletes the print job from the spooler 7410. The relevant items of the print job are also deleted from the spooler management table 7420 (step 7523).

(7) The job outputting unit 7510 executes the following processes when the return value in step 7515 is abnormal.

(7-1) The job outputting unit 7510 generates a detailed status sense system call to the printer driver and a detailed error code of the printer is obtained as an output (step 7531-1).

(7-2) The job outputting unit 7510 starts a process (called a printer error watching process) to watch the release of the printer error (step 7531-2).

(7-3) The job outputting unit 7510 updates the job status to the print job abnormal end and the detailed printer error code obtained in step 7531-1 is recorded. The practical updating and recording are executed with respect to the relevant items in the spooler management table 7420 and job history management table 7430 (step 7532).

(7-4) The job outputting unit 7510 informs the abnormal end of the print job to the client on the generating side of such a print job by using the mail outputting unit 7360 (step 7533).

(7-5) The job outputting unit 7510 sets the job outputting unit 7510 to a printer error recovery waiting state (step 7534).

The above description regarding the job outputting unit has been made with respect to the case where the write system call of (3) is normally executed and the errors which occurred in the subsequent actual printing by the printer are detected by the print end watching system call. When the write system call of (3) is abnormally finished, processes similar to those shown in (7-1) to (7-5) are executed after that and the error processes can be performed.

In the above processing procedure, the printer error has been watched by using another process called a printer error watching process different from the job outputting unit. However, the job outputting unit itself can also periodically (for example, once a second) watch the printer error by using the process.

The present printing system executes paper empty error recovery processes in the following manner by using the processing procedure of the job outputting unit 7510 mentioned above as a base.

FIG. 19 shows the paper empty error recovery processes in the printing system.

(1) The job outputting unit 7510 knows the occurrence of the paper empty error and the requested paper size from an error code as an output of the detailed status sense system call in the foregoing step 7531-1 (step 1901).

(2) The job outputting unit 7510 instructs the abnormal end of the print job to the mail outputting unit 7360 by a mail output in the foregoing step 7533 (step 1902).

(3) The mail outputting unit 7360 stores a mail indicative of the contents in step 1902 into the mail box 7180 of the client 11 on the requesting side of the print job (step 1903).

(4) The user of the client 11 refers the mail about the print job from the mail box 7180 by using the mail referring unit 7190, thereby knowing that the print job is abnormally finished (step 1904).

(5) The user of the client 11 inquires the detailed status of the abnormally finished print job to the printer/spooler control server 15 on the transferring side of the print job by using the query function 7161 of the detailed print job status (query function disclosed in the embodiment 4) in the query unit 7160. As a response, the user knows the occurrence of the paper empty error and the requested paper size (step 1905). In place of such a response, although the user can know the same contents from the display to the user operation panel 607, the user in this case needs to go to the printer.

(6) The user who knew the occurrence of the paper empty error and the requested paper size supplies the papers of the requested paper size to the error occurred printer in order to cope with such a situation (step 1906).

(7) When the user supplies the papers of the requested paper size to the relevant printer, the job outputting unit detects the release of the paper empty error due to the supply of the papers to the printer and releases the job outputting unit 7510 from the printer error recovery waiting status.

(8) The job outputting unit 7510 restarts the printing process by using the printer in which the error status was released.

Although the intervention of the user such as a paper empty error or the like is necessary as mentioned above, the recovery from the error which doesn't need the reprinting can be realized. In the printer/spooler control server in which the existing UNIX and the foregoing lpd are installed, there are problems such that even in the case where the paper empty error occurs, it is necessary to perform the reprinting from the head of the print job, the vain overlapping reprinting occurs, and the recovery time is long.

The problems can be solved by the above recovery system.

[Embodiment 7]

The embodiment 7 shows an example of the foregoing printer error in a manner similar to the embodiment 6.

Figure 21A:
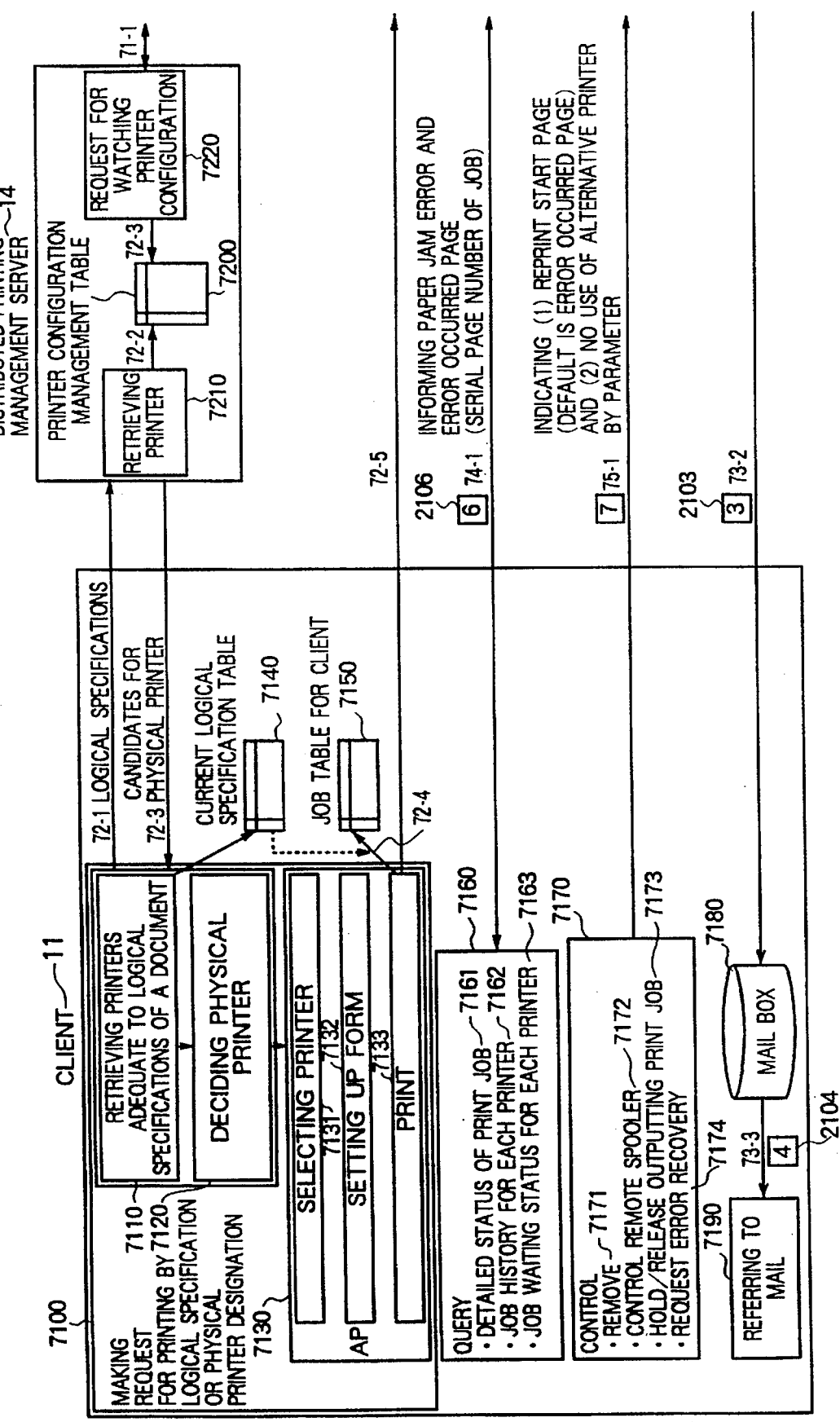
FIG. 21 is a diagram showing an example of an error recovery system in the invention.
Figure 21B:
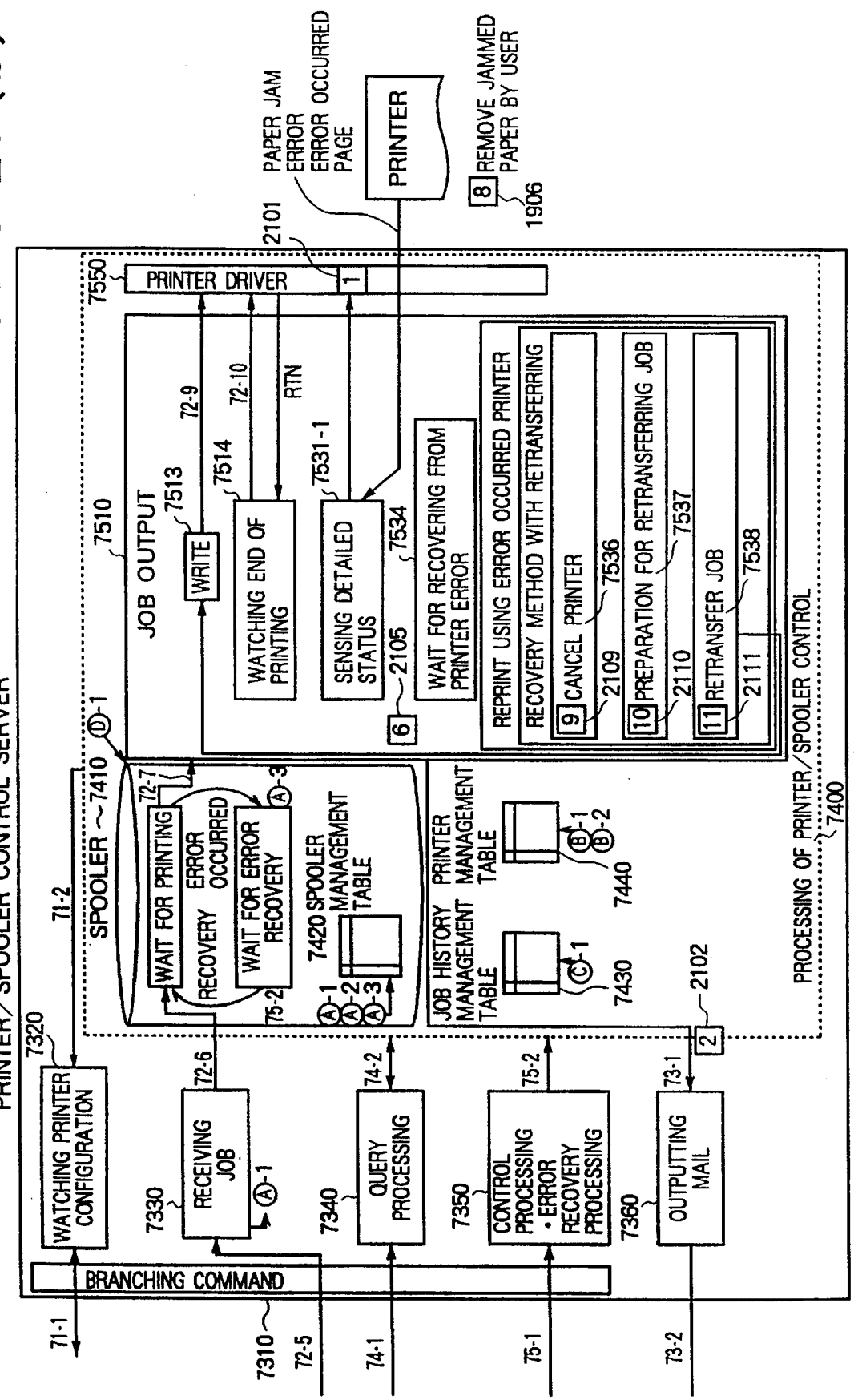
Figure 22:
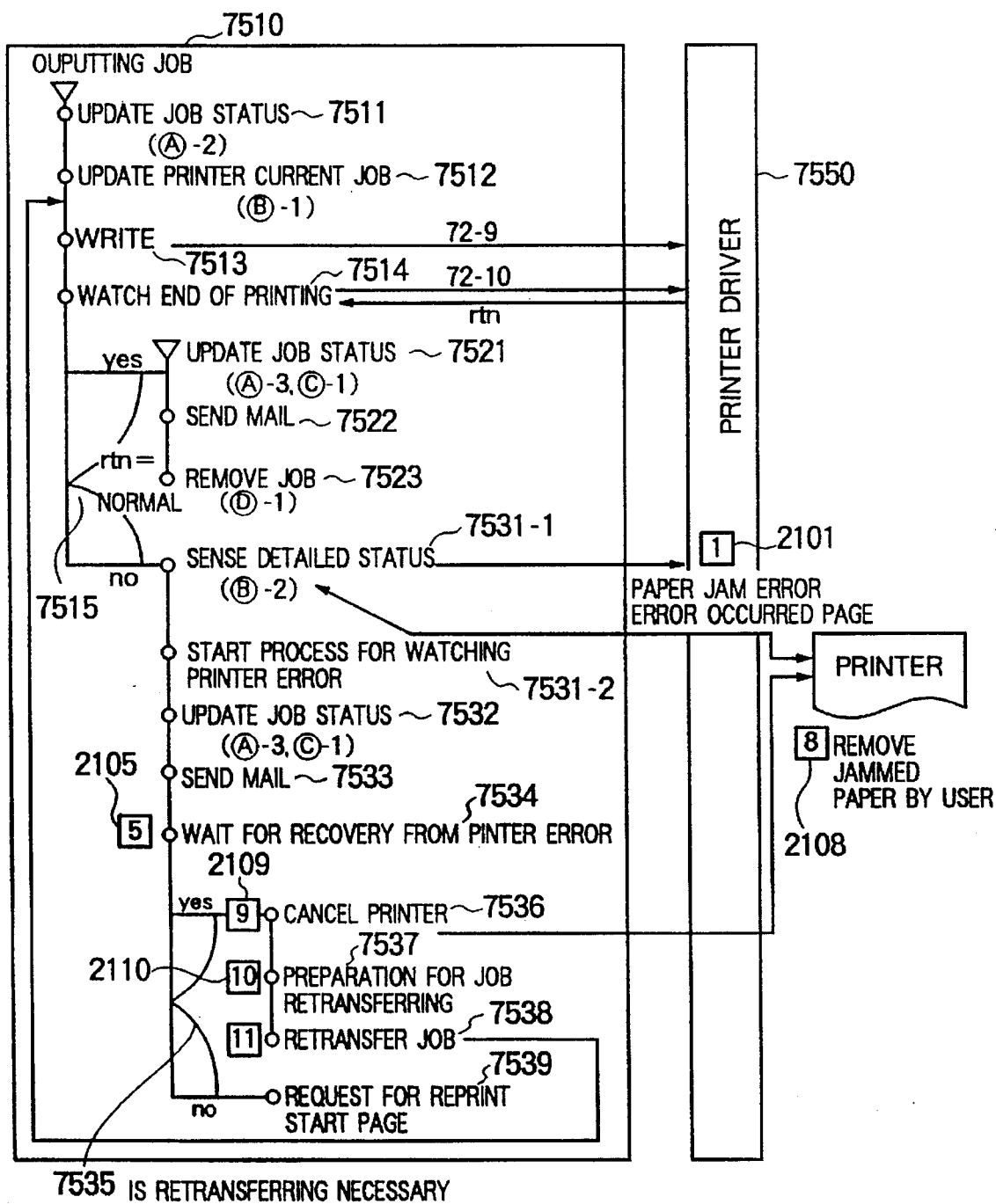
FIG. 22 is a diagram showing an example of an error recovery system in the invention.

FIGS. 21 and 22 shows a recovery system from the paper jam error as a process of the error which needs the intervention of the user and the reprinting.

FIG. 22 shows a processing procedure of the job outputting unit 7510 of the printer/spooler control server 15 in the recovery system from the paper jam error.

A processing procedure which is executed until the (7-5) job outputting unit 7510 is shifted to the printer error recovery waiting status after (1) the job outputting unit 7510 updated the relevant items in the spooler management table 7420 in the embodiment 7 is similar to the processes in steps 7511 to 7534 in the embodiment 6.

The embodiment 7 differs from the embodiment 6 with respect to a point that the embodiment 7 further includes the following processing procedure.

(7-6) The job outputting unit 7510 is released at a time point when a fact that both of the following two phenomena occurred is detected from the printer error recovery waiting status.

The printer error watching process detects the release of the printer error and informs to the job outputting unit 7510.

The user of the client 11 instructs the reprinting of the relevant print job by using the error recovery instructing function 7174.

(7-7) The job outputting unit 7510 judges whether the error is an error which needs the retransmission or not (step 7535).

(7-8) When the job outputting unit 7510 judges that the retransmission is necessary in step 7535, the following processes are executed.

(7-8-1) The job outputting unit 7510 instructs the cancellation to the printer. Thus, the cancellation of the printing process in the printer and the initialization of the printer status are executed (step 7536).

(7-8-2) The job outputting unit 7510 prepares for retransmission of the print job. Specifically speaking, a process called a page extracting edition is executed with respect to the print job. The page extraction editing process is a process such that the relevant print job in which the error which needs the reprinting occurred is edited in a manner such that the edited job starts from the reprinting start page and a drawing attribute parameter for such a reprinting start page is equalized to that in the case where the relevant print job was printed from the head. The processing contents are disclosed in JP-A-3-192463 as an invention which has already been filed by the present applicant (step 7537).

(7-8-3) The job outputting unit 7510 retransmits the print job edited by the above page extraction editing process to the printer. Such a job retransmission is realized by returning to step 7513 disclosed in the embodiment 6 and by again generating the write system call (step 7538).

The above description about the job outputting unit 7510 has been made with respect to the case where the write system call in step 7513 had normally been executed and the error occurred in the subsequent actual printing by the printer was detected by the print end watching system call. When the write system call in step 7513 is abnormally finished, similar processes shown in subsequent steps 7531-1 to 7537 are executed and the error process can be performed.

FIG. 21 shows a paper jam error recovery process of the printing system based on the processing procedure of the job outputting unit 7510 mentioned above.

(1) The job outputting unit 7510 knows the occurrence of the paper jam error and the serial number of the error occurred page by the error code as an output of a detailed status sense system call in step 7531-1. The serial number of the error occurred page denotes a serial page number of the page in which an error such as a paper jam or the like which needs the reprinting occurred in the relevant print job that is being printed by the printer in the case where the page number is counted from the head of the print job (step 2101).

(2) The job outputting unit 7510 instructs the abnormal end of the print job to the mail outputting unit 7360 by a mail output in step 7533 (step 2102).

(3) The mail outputting unit 7360 stores a mail indicative of the contents in step 2102 into the mail box 7180 of the client 11 as a requesting side of the print job (step 2103).

(4) The user of the client 11 knows that the relevant print job was abnormally finished with reference to the mail about the print job from the main box 7180 by using the mail referring unit 7190 (step 2104).

(5) The job outputting unit 7510 is shifted to the printer error recovery waiting state by the foregoing step 7534 (step 2105).

(6) The user of the client 11 inquires the detailed status of the relevant print job which was abnormally finished to the printer/spooler control server 15 on the transfer destination side of the print job by using the query function 7161 of the detailed print job status in the query unit 7160. As a response, the user knows the occurrence of the error such as a paper jam error or the like which needs the reprinting and the serial number of the error occurred page (step 2006). Although the user can know the same contents from the display to the user operation panel 607 in place of the above response, in such a case, the user needs to go to the printer.

(7) When the user knows the occurrence of the paper jam error, in order to cope with it, the user instructs the reprinting of the print job by using the error recovery instructing function 7174. In this instance, the user can instruct the following operations as a start page of the reprinting by a parameter called a start mode of the command (step 2107).

The reprinting from the page designated by the user as an input parameter of the error recovery instructing function.

The reprinting from the head of the print job.

The reprinting from the paper jam occurred page detected by the printer.

(8) The user who knew the occurrence of the paper jam error eliminates the jammed paper from the printer (step 2108).

(9) The printer error watching process detects the release of the paper jam error by the removal of the paper jammed paper from the printer in step 2108 and informs to the job outputting unit 7510.

(10) The job outputting unit 7510 is released at a time point when a report indicating that both of the following two phenomena occurred is received from the printer error recovery waiting state.

The report of the release of the printer error by the printer error watching process [corresponding to the above item (9)].

The report of the reprinting instruction of the print job using the error recovery instructing function 7174 from the user of the client (corresponding to the above step 2107).

(11) In the above step 7535, the job outputting unit 7510 judges whether the error is an error which needs the retransmission or not. When it is judged that the retransmission is necessary, the following processes are executed.

(12) The job outputting unit 7510 instructs the cancellation to the printer as shown in step 7536 (step 2109).

(13) As shown in 7537 in FIG. 21, the job outputting unit 7510 edits the print job as a preparation for retransmission of the print job (step 2110).

(14) The job outputting unit 7510 retransmits the print job edited by the foregoing page extraction editing process to the printer (step 2111).

In the above description, in the case where the error such as a paper jam or the like which needs the reprinting simultaneously occurs in a plurality of pages in the print job, the above error processes are executed with respect to the first page among them. The recovery from the error such as a paper jam error or the like which needs the intervention of the user and the reprinting can be realized.

The error recovery processing system with respect to the error which needs the reprinting by the job outputting unit 7510 shown in FIGS. 21 and 22 can be also changed as follows.

(1) The job outputting unit 7510 doesn't execute the page extraction editing process in the preparation 7537 for the foregoing retransfer of the print job.

(2) In the above job retransfer 7538, the job outputting unit 7510 retransfers the relevant print job itself in which the error which needs the reprinting occurred to the printer.

(3) The printer which received the print job executes a process corresponding to the page extracting edition. Thus, the reprinting from the error occurred page or the page designated by the user is realized. The processing contents of the above change processing system have been disclosed in JP-A-3-224778 by the present applicant.

According to the error recovery processing system described by using FIGS. 21 and 22 mentioned above, the reprinting from the error occurred page or the page designated by the user can be realized. In this instance, by using the error occurred page as a reprinting start page, the vain overlap reprinting which caused the problem hitherto can be eliminated and the error recovery time can be reduced.

[Embodiment 8]

The embodiment 8 shows an example of the foregoing printer errors similar to the embodiments 6 and 7.

Figure 23A:
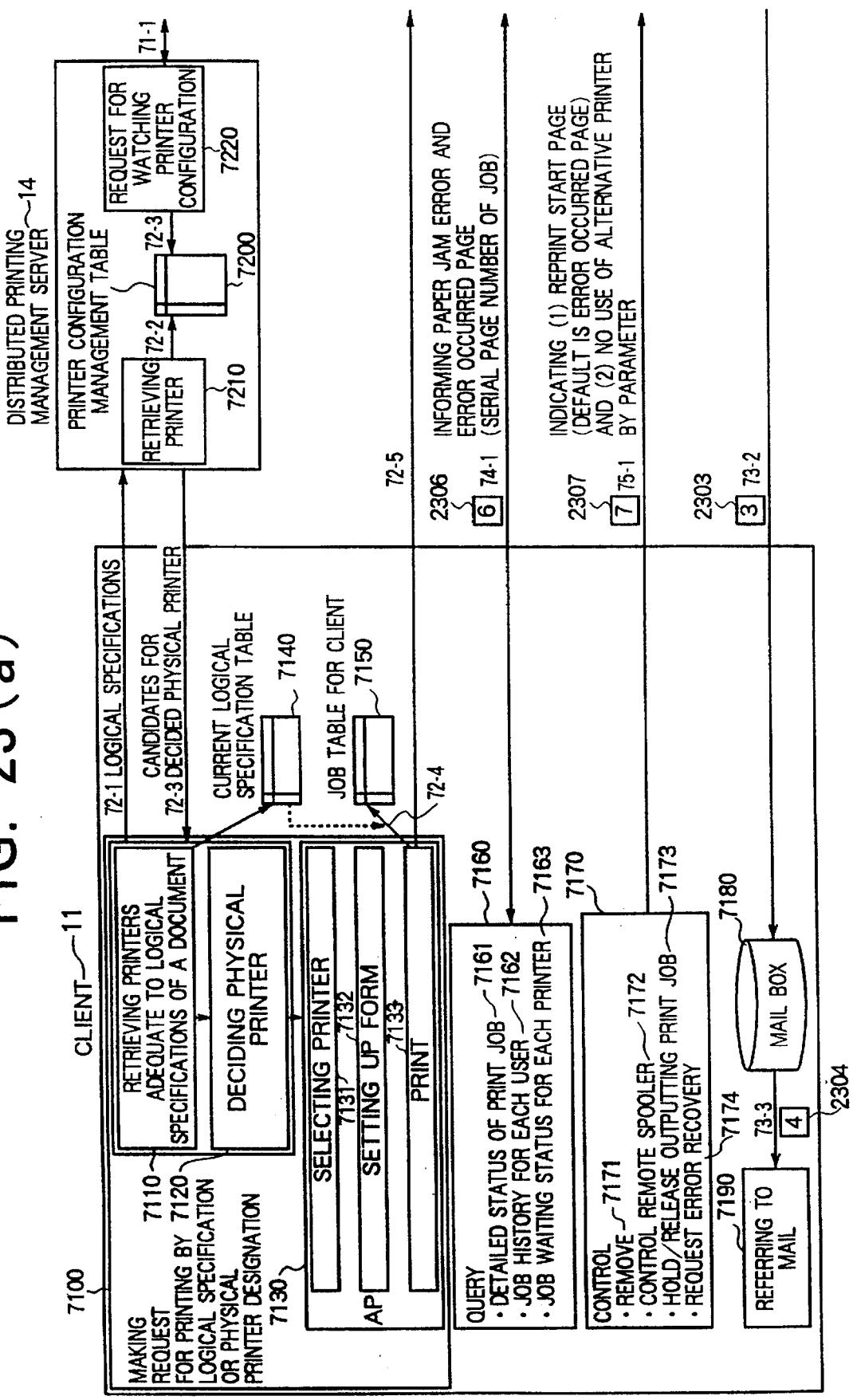
FIG. 23 is a diagram showing an example of an error recovery system in the invention.
Figure 23B:
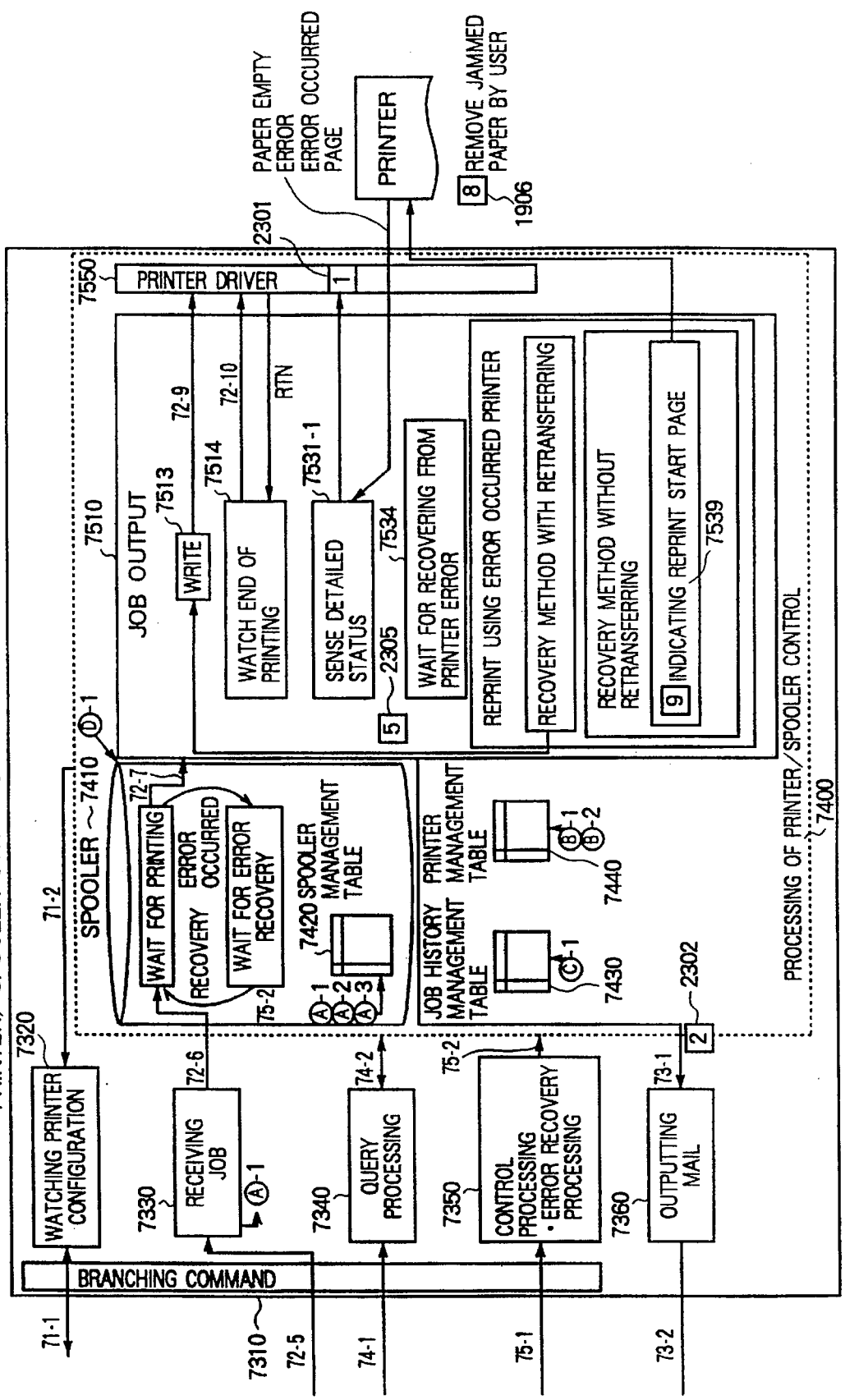

FIGS. 22 and 23 show a recovery system of the paper jam error as processes of the error which needs the intervention of the user and the reprinting.

FIG. 22 shows a processing procedure of the job outputting unit 7510 of the printer/spooler control server 15 in the recovery system from the paper jam error.

The recovery system different from the embodiment 7 has a feature such that the printer has an automatic error recovery function and that the printer/spooler control server doesn't need to retransmit the print job. The printer/spooler control server executes an instruction 7539 of the reprinting start page in place of the job retransmission 7538 in the system of FIGS. 21 and 22.

Figure 24:
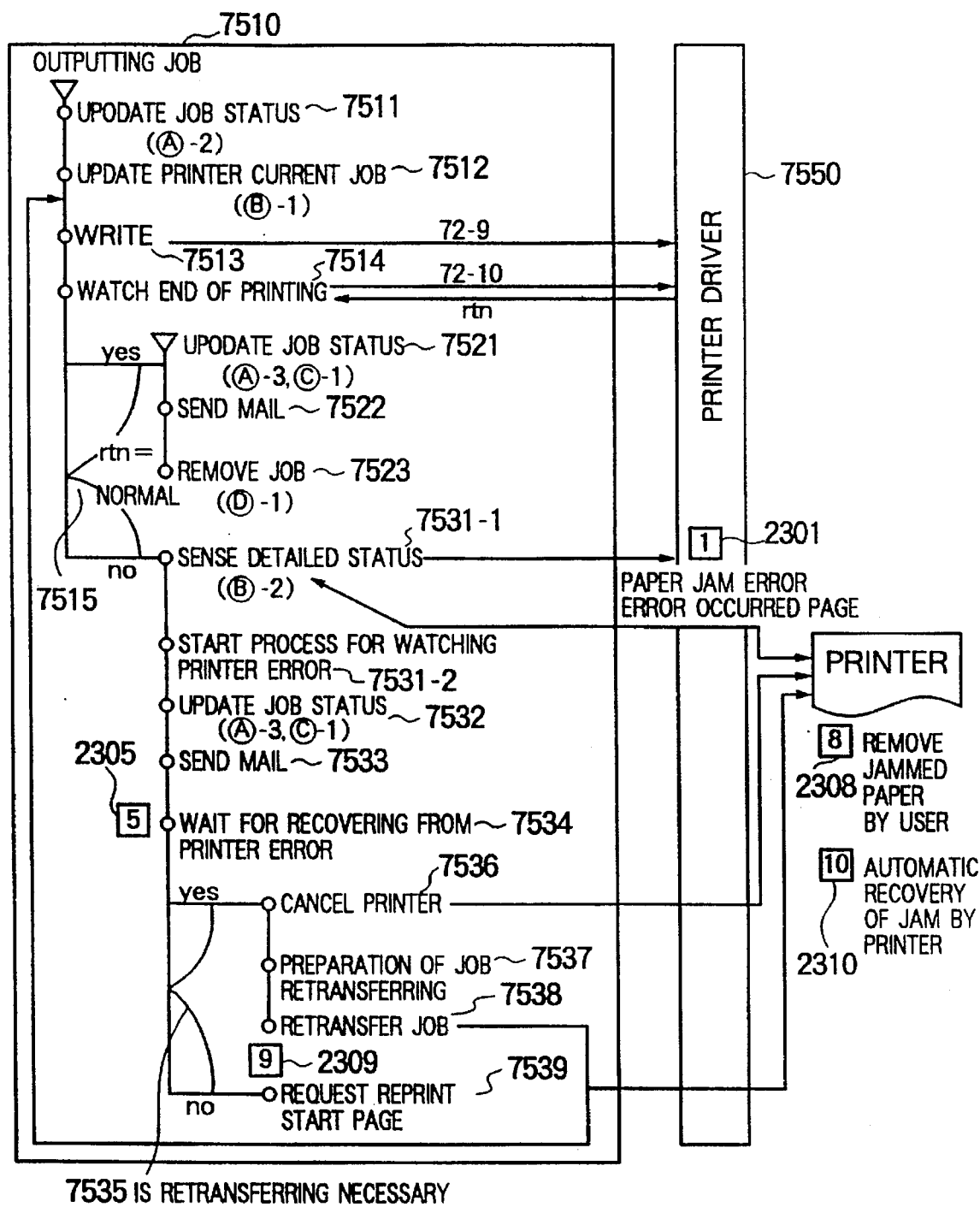
FIG. 24 is a diagram showing an example of an error recovery system in the invention.

FIG. 24 shows a processing procedure of the job outputting unit 7510 of the printer/spooler control server 15 in the embodiment. A part of the processing procedure in the embodiment 8 is similar to the processing procedure of (1) to (7-6) disclosed in the embodiment 7.

In the embodiment, the procedure in step (7-7) and subsequent steps different from the embodiment 7 will now be described.

(7-7) The job outputting unit 7510 judges whether the error is an error which needs the retransmission or not (step 7535). Since the recovery system shown in FIG. 24 doesn't need the retransmission because of the automatic error recovery function, the processes in the following step (7-9) and subsequent steps are executed. In the case where the retransmission is necessary, the foregoing process in (7-8) shown in the embodiment 7 is executed.

(7-9) In the case where the retransmission is unnecessary, the job outputting unit 7510 instructs the reprinting start page to the printer (step 7539). The reprinting start page will be described later.

(7-10) The printer which received the instruction of the reprinting start page executes the reprinting by using the automatic error recovery function provided in the printer. Namely, the printer executes the reprinting from the reprinting start page by using the print data refuged in the printer with regard to the print job. The automatic error recovery system by the printer has been disclosed in JP-A-5-301429 by the present applicant.

The above explanation about the job outputting unit 7510 has been made with respect to the case where the write system call in (3) had normally been executed and the error occurring in the subsequent actual printing by the printer was detected by the print end watching system call. In the case where the write system call in (3) was abnormally finished, processes similar to steps shown in (7-1) to (7-10) are executed after that and the error processes are performed.

FIG. 23 shows error recovery processes of the printing system based on the above processing procedure of the job outputting unit 7510.

(1) The job outputting unit 7510 knows the occurrence of the paper jam error and the serial number of the error occurred page from the error code as an output of the detailed status sense system call in step 7531-1. The serial number of the error occurred page denotes the serial page number counted from the head of the print job of the page in which the error such as a paper jam or the like which needs the reprinting occurred in the relevant print job that is being printed by the printer (step 2301).

(2) The job outputting unit 7510 instructs the abnormal end of the print job to the mail outputting unit 7360 by the mail output in step 7533 (step 2302).

(3) The mail outputting unit 7360 stores the mail in 2102 into the mail box 7180 of the client on the requesting side of the print job (step 2303).

(4) The user of the client 11 knows that the relevant print job was abnormally finished with reference to the mail regarding the print job from the mail box 7180 by using the mail referring unit 7190 (step 2304).

(5) The job outputting unit 7510 is shifted to the printer error recovery waiting state by the foregoing step 7534 (step 2305).

(6) The user of the client 11 inquires the detailed status of the relevant print job which was abnormally finished to the printer/spooler control server 15 on the transfer destination side of the print job by using the query function 7161 of the detailed print job status in the query unit 7160. As a response, the user knows the occurrence of the error such as a paper jam error or the like which needs the reprinting and the serial number of the error occurred page (step 2306). Although the user can know the same contents from the display to the user operation panel 607 in place of such a response, in this case, the user needs to go to the printer.

(7) In order to cope with it, the user who knew the occurrence of the paper jam error instructs the reprinting of the relevant print job by using the error recovery instructing function 7174. In this instance, the user can instructs the following operations as a start page of the reprinting by a parameter called a start mode of the command (step 2307).

The reprinting from the page designated by the user as an input parameter of the error recovery instructing function.

The reprinting from the head of the print job.

The reprint from the paper jam occurred page detected by the printer.

(8) The user who knew the occurrence of the paper jam error removes the jammed paper from the printer (step 2308).

(9) The printer error watching process detects the release of the paper jam error by the removal of the paper jammed paper from the printer by step 2308 and reports to the job outputting unit 7510.

(10) The job outputting unit 7510 is released at a time point when a report indicating that both of the following two phenomena occurred is received from the printer error recovery waiting state.

The report of the release of the printer error by the printer error watching process [corresponding to the above (9)].

The report of the instruction of the reprinting of the print job by using the error recovery instructing function 7174 from the user of the client (corresponding to the above step 2307).

(11) The job outputting unit 7510 judges whether the error is the error which needs the retransmission or not by the above step 7535. Since the retransmission is unnecessary in this case, the following processes are executed.

(12) The job outputting unit 7510 instructs the reprinting start page to the printer as shown in step 7539. The job outputting unit 7510 uses the start page of the reprinting instructed by the foregoing error recovery instructing function as a reprinting start page (step 2109).

(13) The printer which received the instruction of the reprinting start page executes the reprinting from the reprinting start page by using the foregoing automatic error recovery function provided in the printer (step 2310).

According to the error recovery processing system described by using FIGS. 23 and 24 mentioned above, the following effects can be obtained.

The reprinting from the error occurred page or the page designated by the user similar to the system described in FIGS. 21 and 22. In this instance, by using the error occurred page as a reprinting start page, the vain overlap reprinting which caused the problem hitherto can be eliminated and the recovery time can be reduced.

Since there is no need to retransmit the job from the printer/spooler control server as compared with the system of FIGS. 21 and 22, the recovery time can be further reduced.

[Embodiment 9]

The embodiment 9 shows an example of the foregoing printer error processes in a manner similar to the embodiments 6 to 8. In the embodiment, the method disclosed in the embodiment 2 is used.

Figure 26B:
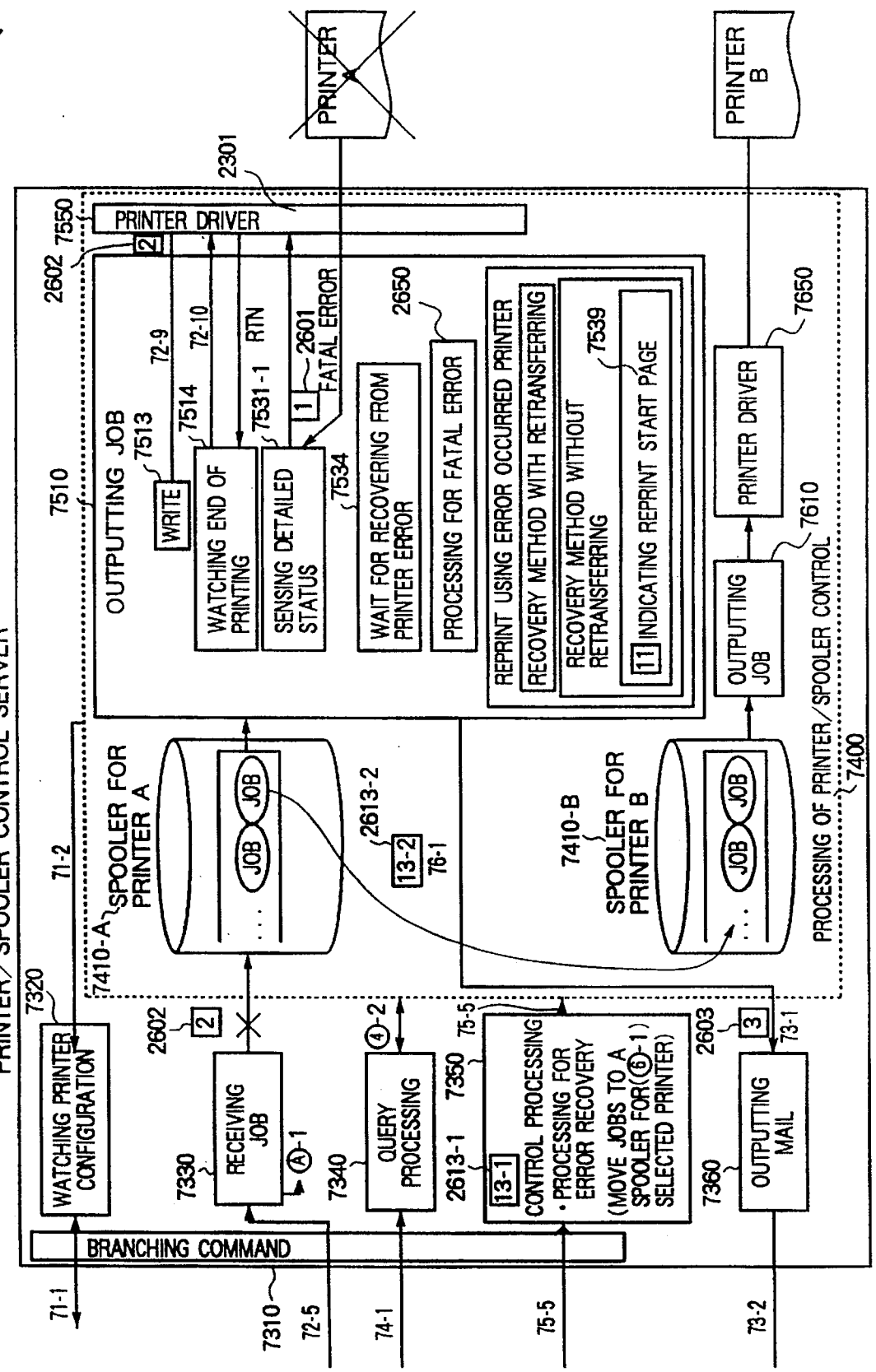
FIG. 26 is a diagram showing an example of an error recovery system in the invention.
Figure 27:
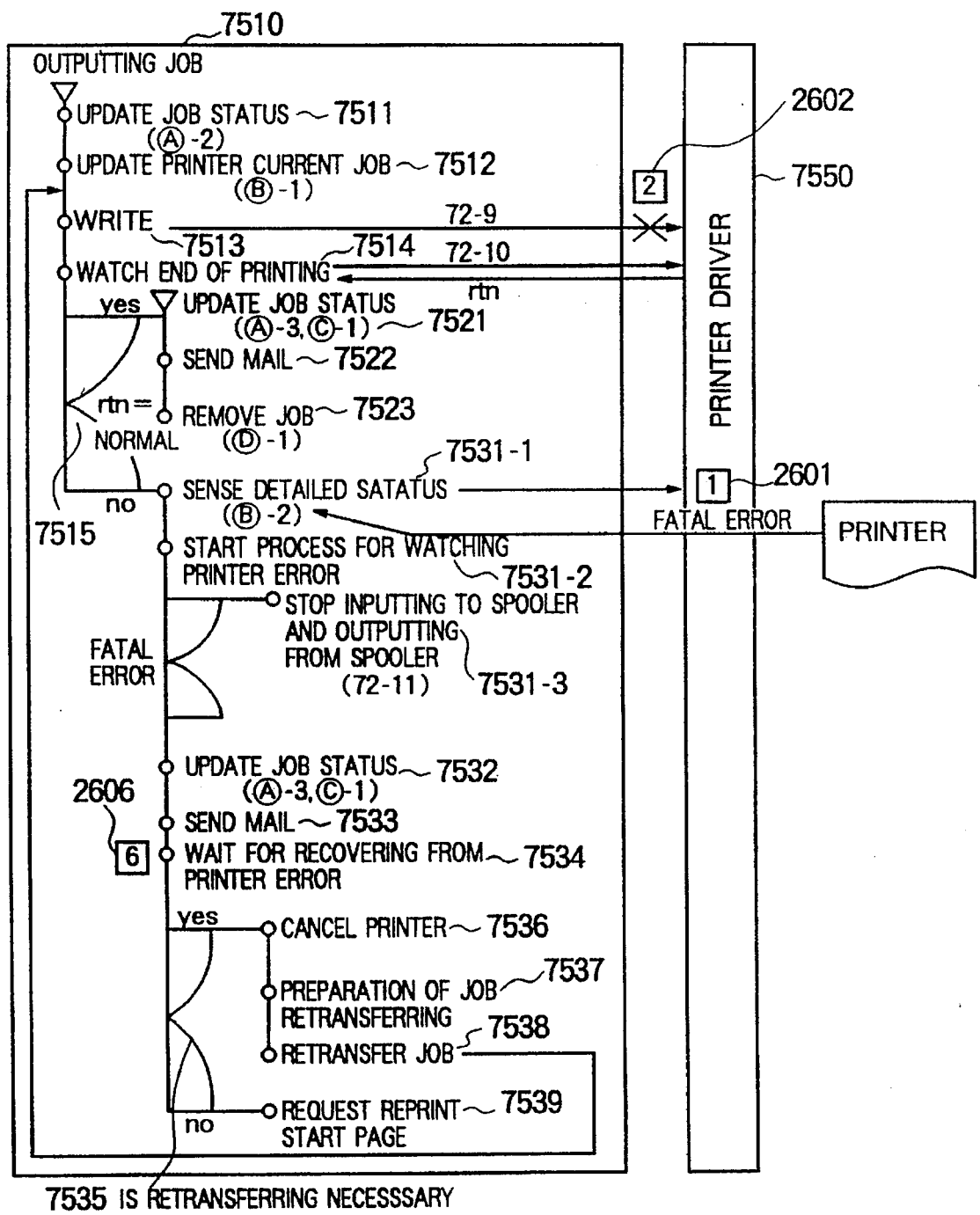
FIG. 27 is a diagram showing an example of an error recovery system in the invention.

FIGS. 25 to 27 show an error recovery processing system using the alternative printer of the printing system for the fatal printer error 18150. FIG. 25 shows a processing system in the case where a fatal error of the printer is detected at a time point when the print job is generated from the client 11. FIG. 25 is fundamentally similar to FIG. 13 and shows the error recovery processing system using the effects of the foregoing logical specifications level print instructing system. In the case where the printing at the logical specification levels is not instructed, it is difficult to detect the fatal error of the printer at a time point when the print job is generated to the printer.

Processing procedures in (1) to (3) and (7) to (9) in the embodiment are similar to those in the case of FIG. 13. The embodiment differs from FIG. 13 with respect to a point that the processing procedure of (3) to (6) is expanded as follows. A printing protocol which is exchanged between the client 11 and the distributed printing management server 14 is expanded as shown in (step 72-1) and (step 72-3), which will be explained hereinbelow.

The processing procedure in (3) to (6) will now be described hereinbelow.

(3) The retrieving unit 7110 of the printers adequate to the specifications of the client 11 retrieves the printers adequate to the logical specifications as physical printers of the first priority and requests to the printer retrieval executing unit 7210 of the distributed printing management server 14 (step 72-1).

(4) With reference to the printer configuration management table 7200 in which the latest statuses of the printers and printer/spooler control servers have been held (step 72-2), the printer retrieval executing unit 7210 executes the retrieval and reports a fact that the fatal error occurred in the physical printer of the first priority (step 72-3-A) and the candidates for the physical printers which are adequate to the logical specifications and can be alternated (step 72-3-B) to the specifications adequate printer retrieving unit 7110 (step 72-3).

(5) The specification adequate printer retrieving unit 7110 stores the current logical specifications as a foregoing retrieval result, the name of the physical printer of the first priority, the occurrence of the fatal error in the physical printer of the first priority, and the candidate physical printers which are adequate to the logical specifications and can be alternated into the current logical specification table 7140.

(6) The client 11 displays on the screen the occurrence of the fatal error in the physical printer of the first priority and the candidate physical printers which are adequate to the logical specifications and can be alternated. The user determines one of the proper printers among them as foregoing determined printer (step 7120).

According to the printing system as mentioned above, in the case where the fatal error of the printer is detected at a time point when the print job is generated from the client 11, the printing can be executed by using the alternative printer. Therefore, the reliability, availability, and serviceability of the printing system can be improved.

FIGS. 26 and 27 show an error recovery processing system in the case where the fatal error of the printer is detected with respect to the print job stored in the printer/spooler control server 14. FIG. 27 shows a processing procedure of the job outputting unit 7510 in the embodiment. A processing procedure in (1) to (6-3) is similar to that in case of FIG. 22.

(7) The job outputting unit 7510 executes the following processes if the return value is abnormal.

(7-1) The job outputting unit 7510 generates the detailed status sense system call to the printer driver and obtains a detailed error code of the printer as an output (step 7531-1).

(7-2) The job outputting unit 7510 starts a process (printer error watching process) to watch a release of the printer error (step 7531-2).

(7-3) The job outputting unit 7510 judges whether the error is the fatal error or not. In the case where the error is the fatal error, the job outputting unit 7510 stops an outputting process from the spooler corresponding to the printer in which the fatal error was detected to the job outputting unit (step 7410-A) and an inputting process from the job receiving unit 7330 to the spooler (step 7410-A) (step 7531-3).

(7-4) The job outputting unit 7510 updates the job status to a print job abnormal end and records the detailed printer error code obtained in step 7531-1. The specific updating and recording are executed with respect to the relevant items in the spooler management table 7420 and job history management table 7430 (step 7532).

(7-5) The job outputting unit 7510 reports that the print job was abnormally finished to the client on the generating side of the print job by using the mail outputting unit 7360 (step 7533).

(7-6) The job outputting unit 7510 shifts the job outputting unit 7510 itself to the printer error recovery waiting state (step 7534).

FIG. 26 shows an error recovery process using the alternative printer of the printing system based on the processing procedure of the job outputting unit 7510 mentioned above.

(1) A fact that the fatal error occurred in the printer during the printing about a certain print job is known by an error code as an output of the detailed status sense system call in step 7531-1 (step 2601).

(2) Since the error is the fatal error due to the process in step 7531-3 mentioned above, the job outputting unit 7510 stops the outputting process from the spooler corresponding to the printer in which the fatal error was detected to the job outputting unit and the inputting process from the job receiving unit to the spooler (step 2602).

(3) The job outputting unit 7510 instructs the abnormal end of the print job to the mail outputting unit 7360 by the mail output in step 7533 (step 2603).

(4) The mail outputting unit 7360 stores the mail in step 2303 into the mail box 7180 of the client 11 as a requesting side of the print job (step 2604).

(5) The user of the client 11 knows that the print job was abnormally finished with reference to the mail regarding the print job from the mail box 7180 by using the mail referring unit 7190 (step 2605).

(6) The job output unit 7510 is shifted to the printer error recovery waiting state in step 7534 mentioned above (step 2606).

(7) The user of the client 11 inquires the detailed status of the print job which was abnormally finished to the printer/spooler control server 15 on the transfer destination side of the print job by using the query function 7161 of the detailed print job status in the query unit 7160. As a response of it, the user knows that the fatal error such as failure of the fixing device, defective printer controller, or the like occurred (step 2607). The user can also know the same contents from the display to the user operation panel 607 in place of the above response. In such a case, however, the user needs to go to the printer.

The user who knew the occurrence of the fatal error in the printer progresses the processes as follows in order to cope with such a fatal error. In the case where the print instructing system at the logical specification levels has been installed in the printing system, the processes up to (15) are sequentially executed in accordance with the following order from (8). In the case where the print instructing system at the logical specification levels is not installed in the printing system, the following processes (8) to (11) are omitted and the processes up to (15) are sequentially executed in accordance with the following order from (12).

(8) A unit 7175 for searching the candidates for the alternative printers is provided for the control unit 7170 of the client 11. The client uses the present function by generating a command or function to search the candidates for the alternative printers. The alternative candidate printer searching unit 7175 reads out the logical specifications (corresponding to 1300 in FIG. 13) stored by the physical printer designation print instructing unit 7135 every print job from the job table 7150 for client (step 2608).

(9) After that, the alternative candidate printer searching unit 7175 uses the read-out logical specifications as an input and requests the search of the printers adequate to the logical specifications to printer retrieval executing unit 7210 in the distributed printing management server 14 (step 2609).

(10) The printer retrieval executing unit 7210 executes the retrieval with reference to the printer configuration management table 7200 in which the latest statuses of the printers and printer/spooler control servers have been held (step 72-2) and reports the alternative candidate printers (accurately, candidates for alternative physical printers) adequate to the logical specifications to the alternative candidate printer searching unit 7175 (step 2610).

(11) The alternative candidate printer searching unit 7175 stores the logical specifications (corresponding to the current logical specifications) as the above retrieval result and the candidate alternative printers into the current logical specification table 7140.

(12) The client 11 displays the alternative candidate printers to the screen and the user determines a proper one of those printers. Such a printer is called a determined alternative printer (step 7176).

(13) The user now instructs the printing by the above determined alternative printer of the print job corresponding to the fatal error which has been stored in the spooler by using the foregoing error recovery instructing unit 7174. In this instance, the error recovery instructing unit 7174 executes the following two items.

The command or function to instruct the error recovery is started by setting the input parameters as follows. The job recovery mode is set to the alternative printer mode and the name of the alternative printer is set to the foregoing determined alternative printer. In this instance, "the printer/spooler control server which received the command or function (shown in FIGS. 34 and 35" for instruction of the error recovery returns the new job number for alternative printing to the client 11 (step 2611). An expression "the printer/spooler control server receives the command or function in FIGS. 34 and 35" accurately denotes that, as shown in FIG. 38, "the printer/spooler control server receives a printing protocol corresponding to the command or function generated by the command or function used by the client".

The command or function for instruction of the error recovery stores the printer name (name of the alternative determined printer), job number (new job number obtained in step 2611), and logical specifications (current logical specifications) into the job table 7150 for client (step 2612).

(14) As for the printer/spooler control server which received the command or function for instruction of the error recovery, the error recovery executing unit in the control processing unit 7350 moves the job from the spooler for the original printer (step 7410-A) to the spooler for the alternative determined printer (step 7410-B) (steps 2613-1 and 2613-2).

(15) The job outputting unit 7610 for the new alternative printer in the printer/spooler control processing unit 7400 reads out the moved print job from the spooler 7410-B and executes the printing.

With respect to the print jobs (ordinarily, the second and subsequent jobs in the spooler; hereinafter, referred to as non-printing start jobs) stored in the spooler 7410-A for the printer in which the fatal error occurred, the error recovery processes are executed as follows.

(a) The processes in steps 7532 and 7533 are sequentially executed with respect to not only the print job in which the fatal error was detected but also the non-printing start job in the spooler 7410-A.

(b) The processing procedures in (3) to (15) mentioned above are also sequentially executed with respect to the non-print start job. It is assumed that the processing contents of (5) and (6) are changed as follows and are executed.

(5) The user of the client 11 knows that the print job was abnormally finished with reference to the mail regarding the print job by using the mail referring unit 7190. In this case, however, although the actual printing is not yet performed, with respect to the non-printing start job as well, it is regarded that the same fatal error occurred, so that the processes are executed (step 2605).

(6) The job outputting unit 7510 is not shifted to the printer error recovery waiting state. This is because such a shift has already been completed with respect to the print job in which the fatal error had occurred.

A process 2650 for the fatal error in FIG. 26 is a process such that the processes about the fatal error of the printer among the functions of the job outputting unit 7510 shown in FIG. 27 are collected.

In the above description, the alternative candidate printer searching function 7175 has been set to one of the functions of the control unit 7170. Since such a function is also regarded as a query process, it can be also regarded as a function of the query unit 7160. Even when classifying into either one of the query unit and the control unit, the actual function is the same.

According to the error recovery processing system described by using FIG. 26 mentioned above, even in the case where the fatal error of the printer is detected with respect to the print job stored in the printer/spooler control server 14, the printing can be executed by using the alternative printer. Therefore, the functions, use efficiency, reliability, availability, and serviceability of the printing system can be improved. In this instance, the error recovery can be performed by using the print job which has been stored and preserved in the spooler in the printer/spooler control server. It is unnecessary to execute the operations such that the user restarts the application program from the terminal equipment and instructs the printing by the printer/spooler control server as in the conventional apparatus. Therefore, the troublesomeness of the user can be decreased and the recovery time can be reduced.

[Embodiment 10]

The embodiment 10 shows that the printing system can execute processes similar to those mentioned above even for a client whose classification differs from that of the print server.

FIGS. 28 to 33 show a print server system corresponding to the clients of different classifications in order to allow a client whose classification differs from that of a print server to obtain enough print services from the print server.

A system image will be first described by using FIG. 28. The system comprises: networks 10-A and 10-B; the print server 300; a client WS (11-A); clients PC (12-A, 12-B, 12-C); a client WS (2820); the printer 1 (17); a printer 4 (1A); a printer 5 (1B); and a printer 6 (2830). The print server 300 is constructed by two functions of the distributed printing management server 14 and printer/spooler control server 15 in a manner similar to the foregoing printing system. The printer 1 (17) and printer 6 (2430) are the printers of the type which are directly connected to the server. The printer 4 (1A) and printer 5 (1B) are the network printers. In the network 10-A, the physical protocol is set to Ethernet and the communication protocol is set to TCP/IP. In the network 10-B, the physical protocol is set to Ethernet and the communication protocol is set to SPX/IPX.

In the printing system, the UNIX is installed as a fundamental software of the print server 300, client WS (11-A), and client WS (2820). The MS-DOS and Windows are installed as a fundamental software of the clients PC (12-A, 12-B, 12-C). Therefore, in the printing system, all of (a) the reliable support of the network printers, (b) the instruction of the printing at the logical specification levels, and (c) the error report to the client and the error recovery by the print server which have been described so far can be realized from the client WS to the print server 300 in which the same kind of fundamental software has been installed.

However, in such a state, there is a problem such that (i) the query of the printing situation, (ii) the control of the printing process of the print server, and the functions (a) to (c) which were described by using FIG. 3 cannot be used from the clients PC (12-A, 12-B, 12-C) to the print server 300. A method of solving such a problem will now be described hereinbelow.

The case where the UNIX is installed as a fundamental software of the print server will now be described. However, in the case where the MS-DOS and Windows are installed in the print server, the above problem occurs from the client WS to the print server. With respect to such a case as well, it can be solved by a method similar to a solving method, which will be explained hereinbelow.

FIG. 28 shows printing paths 2851 to 2855 among the apparatuses. FIG. 29 shows a printing protocol, a communication protocol, services to be provided, and an interface to obtain the print job data from the application program which are used in each of the printing paths 2851 to 2855.

Figure 30:
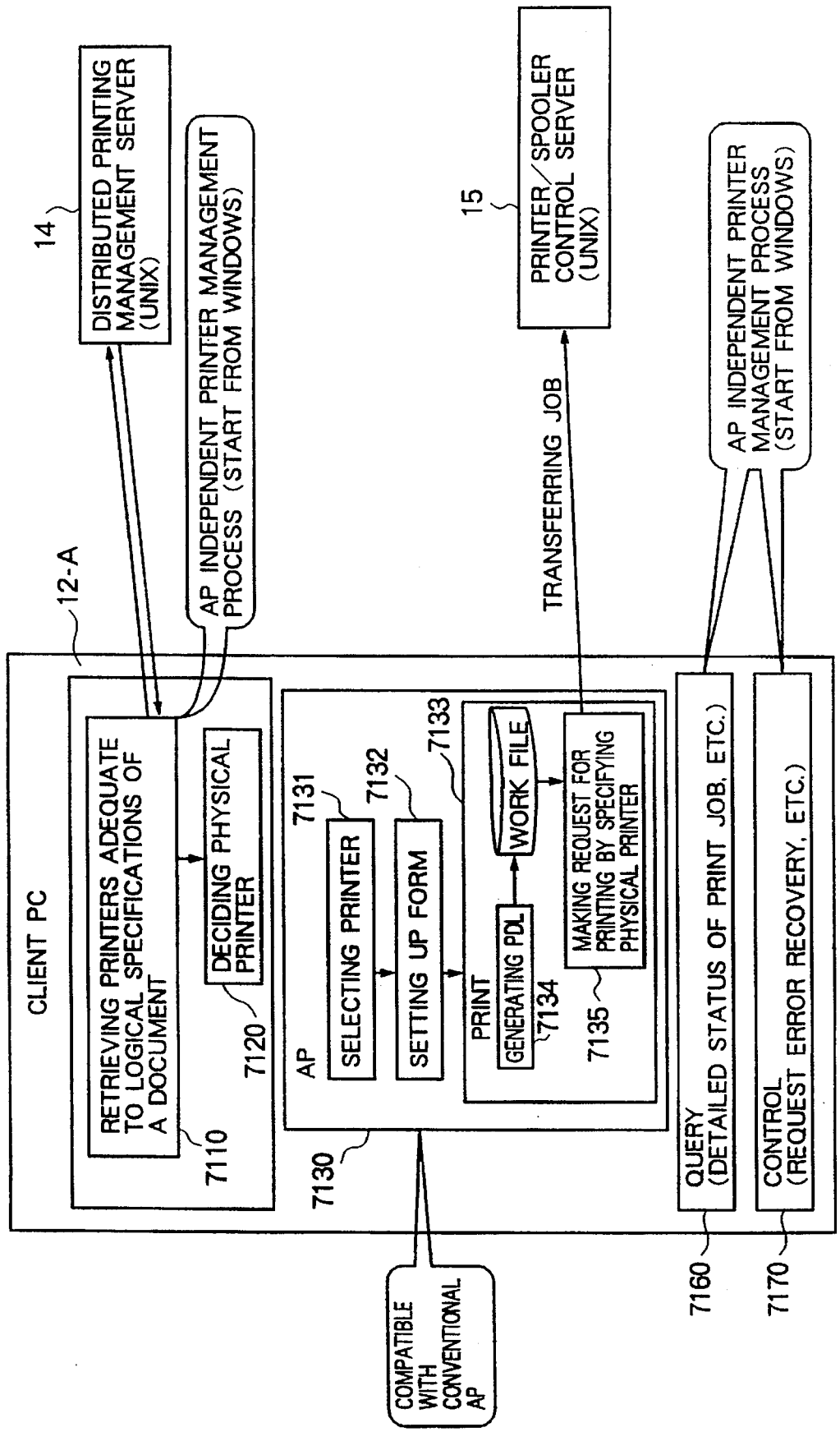
FIG. 30 is a diagram showing a print server system corresponding to different kinds of clients in the invention.

FIG. 30 shows a method of performing the printing, query, and control from the PC clients (12-A, 12-B, 12-C) by using the distributed printing management server 14 and printer/spooler control server 15. Explanation will now be made on the assumption that the fundamental software of the PC client is the Windows. However, the same shall also apply to the case of the MS-DOS.

First, in order to realize the printing instruction by the logical specifications, the specification adequate printer retrieving unit 7110 and physical printer determining unit 7120 are newly provided as printer management processes that are independent to the application program. They are realized as processes on the Windows here. The user can decide the printers adequate to the logical specifications by using the specification adequate printer retrieving unit 7110 and physical printer determining unit 7120 in a manner similar to the case of FIG. 13.

In the printing system, the printer selecting unit 7131, a form setting unit 7132, and a printing unit 7133 are provided for the application program. The PDL generating unit 7134 and the print instructing unit 7135 by designating the physical printer are provided for the printing unit 7133. Each function of 7131 to 7134 is realized by using the function of the Windows as it is. A method of realizing the physical printer designation print instructing unit 7135 will be described hereinlater by using FIGS. 31 to 33. According to the printing system, by using the above functions 7131 to 7135, the printing about the decided printer is realized in a manner similar to the case of FIG. 13.

The query unit 7160 and control unit 7170 are newly provided as printer managing processes on the Windows which are independent of the application program. The printing system, consequently, can realize the query and control similar to those in case of FIGS. 16 and 17 from the PC client to the print server.

The system such that each client forms the print data described by different PDL and prints it by the same print server (printer/spooler control server) is realized by the technique disclosed in JP-A-4-227524 as an invention which has already been filed by the same applicant.

Figure 31:
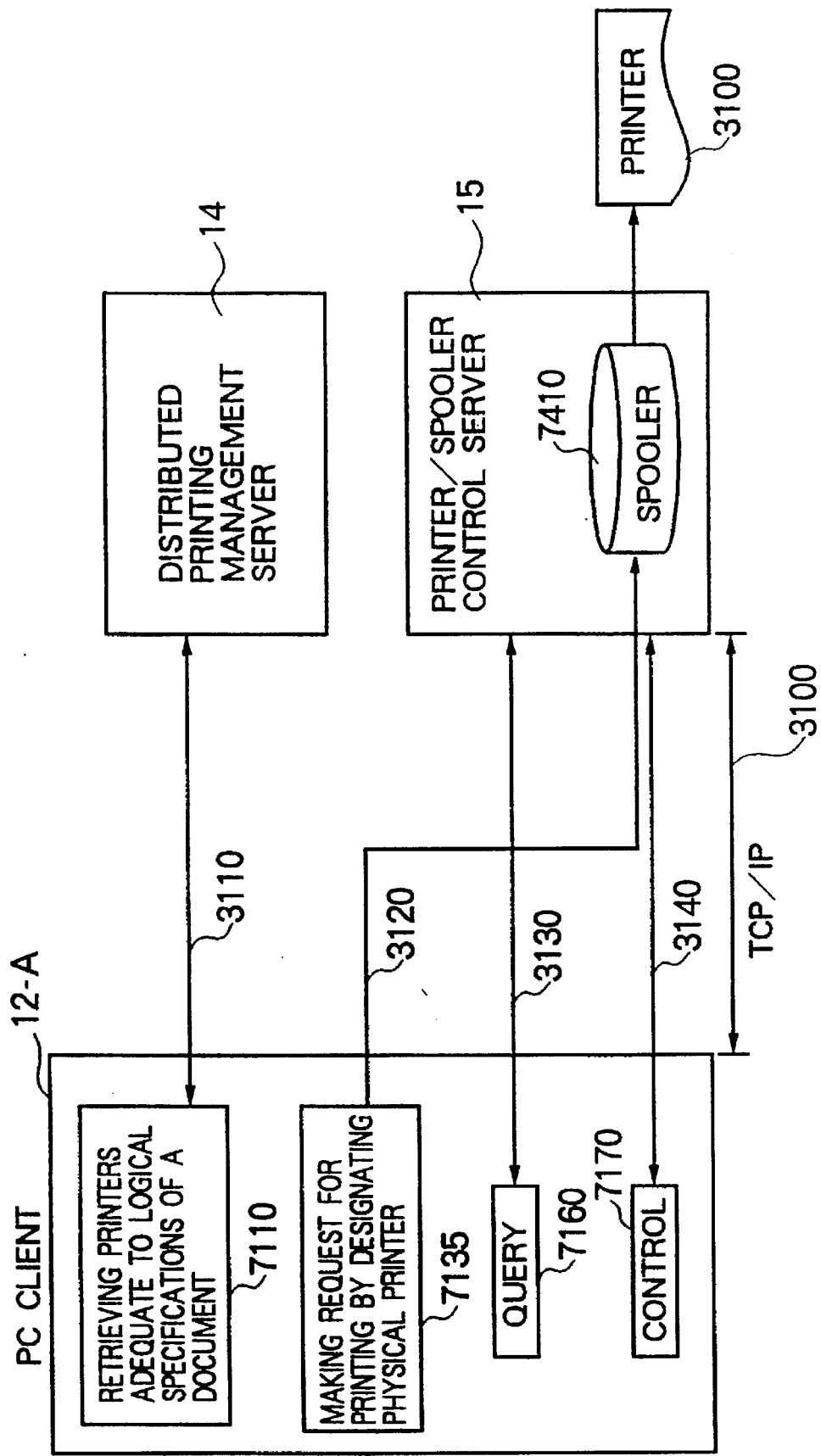
FIG. 31 is a diagram showing a print server system corresponding to different kinds of clients in the invention.
Figure 32:
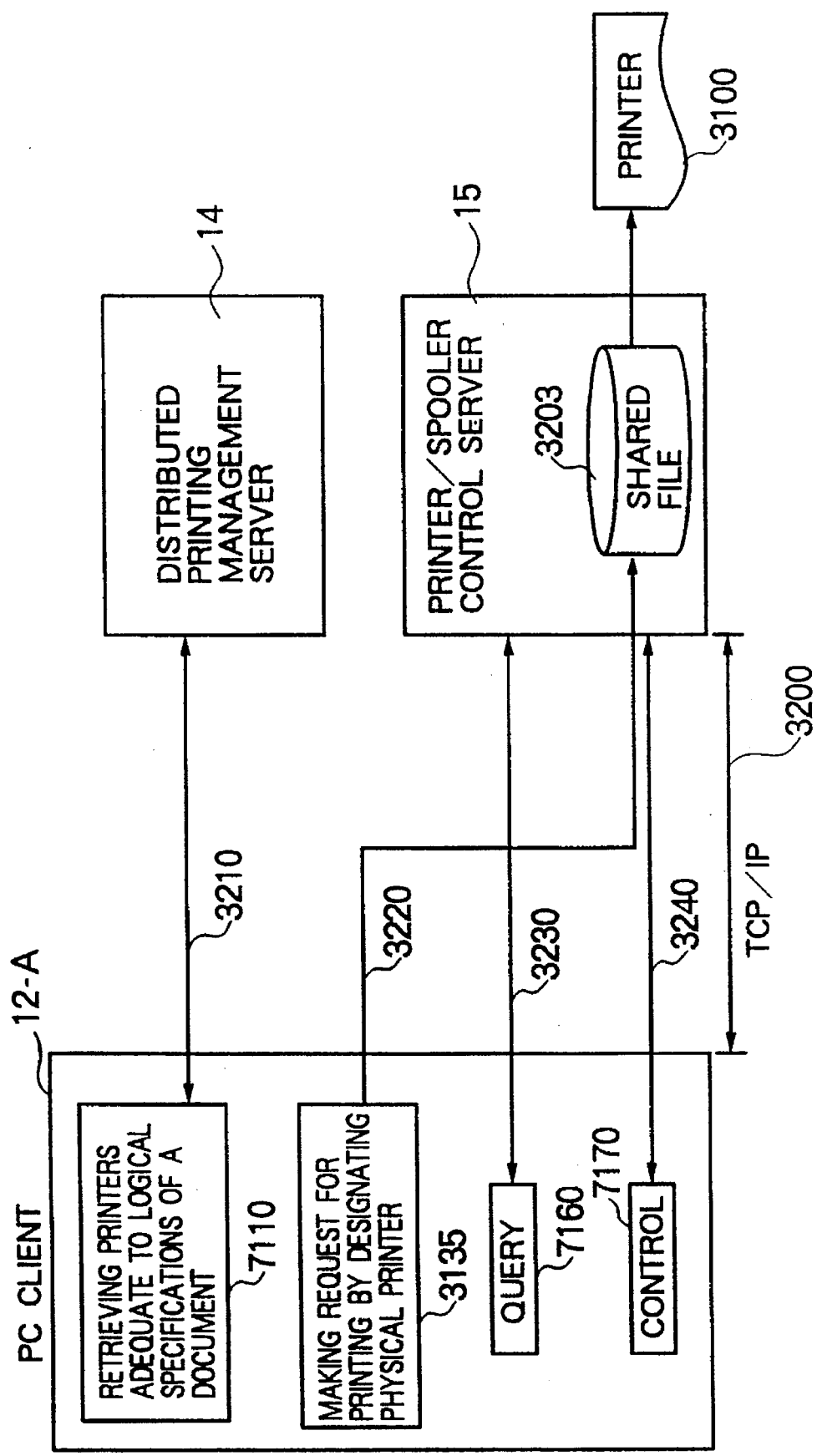
FIG. 32 is a diagram showing a print server system corresponding to different kinds of clients in the invention.

FIGS. 31 and 32 show processing systems in case of connecting the PC client 12-A and print server 300 by using TCP/IP (3100 and 3200) for a communication protocol. The case where the distributed printing management server 14 and printer/spooler control server 15 which construct the print server 300 are installed in different apparatuses is shown here. However, a case of installing them on the same apparatus can be also similarly realized. In FIGS. 31 and 32, in a manner similar to the case of FIG. 30, the PC client 12-A includes the specification adequate printer retrieving unit 7110, printing unit 7133, physical printer designation print instructing unit 7135, query unit 7160, and control unit 7170, thereby allowing the functions similar to those in case of FIG. 30 to be provided. The physical printer designation print instructing unit 7135 is constructed as follows in FIGS. 31 and 32.

(1) In case of FIG. 31, a print job registering function from the client to the spooler 7410 of the printer/spooler control server in the lpd protocol is installed in the physical printer designation print instructing unit 7135 (3120). The lpd protocol is a printing protocol for requesting the print services from the client to the printer/spooler control server on the communication protocol TCP/IP and is disclosed in "Request for Comments 1179" and Stevens, "UNIX NETWORK PROGRAMMING", Chapter 13, published by PRENTICE HALL. Such a printing protocol can be also similarly realized by using a printing protocol other than the lpd protocol.

(2) In case of FIG. 32, a shared file 3203 is provided on the printer/spooler control server, thereby enabling the client 12-A to access the shared file 3203 by a method similar to the file on the client. For this purpose, a file shared protocol 3220 is provided between the client 12-A and the printer/spooler control server 15. The physical printer designation print instructing unit 7135 registers the print job from the client 12 to a shared file 2803 of the printer/spooler control server by using the file shared protocol. The file shared protocol mentioned above can be realized by using any one of a novel protocol and the existing protocol (for PC-NFS or the like).

In FIGS. 31 and 32, the printing protocols corresponding to 3110, 3130, 3140, 3210, 3230, and 3240 are realized by expanding the lpd protocol and the like on the communication protocol TCP/IP. The expansion has been performed to realize the following functions which are not supported by the lpd protocol. Even in the embodiments described in FIGS. 1 to 27, the lpd protocol is similarly expanded and used. The printing protocols (3110 and 3210), (3130 and 3230), and (3140 and 3240) can be made identical, respectively.

Retrieval of the printers adequate to the specifications (corresponding to 7110).

Storage of the job information into the job table for client in the physical printer designation printing instruction (corresponding to 72-4).

Query of the detailed print job status and the job history for each user (corresponding to 7160).

Controls of the remote spooler control, holding/release of outputting of the print job, error recovery instruction, and the like (corresponding to 7170).

Retrieval of the candidates for alternative printers (corresponding to 7175).

Display of printer configuration (shown in FIGS. 34 and 35).

Query of the printer specifications (shown in FIGS. 34 and 35).

Figure 33:
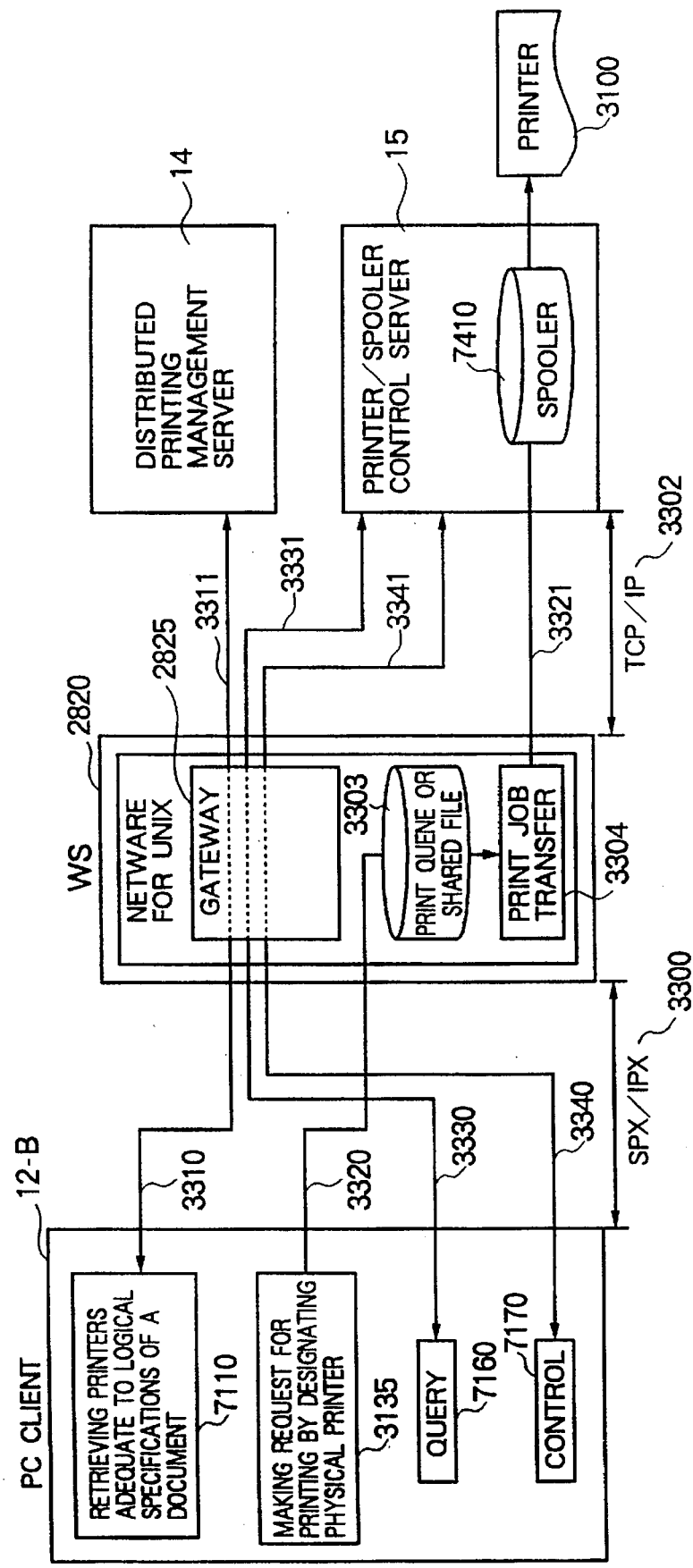
FIG. 33 is a diagram showing a print server system corresponding to different kinds of clients in the invention.

FIG. 33 shows a processing system in case of connecting the PC client 12-B and print server 300 to the communication protocol by using an SPX/IPX (3300) and TCP/IP (3302). The diagram also shows the case where the distributed printing management server 14 and printer/spooler control server 15 constructing the print server 300 are installed in different apparatuses. However, the apparatus can be also similarly realized even in case of installing them in the same apparatus. In FIG. 33, in a manner similar to the case of FIG. 30, the specification adequate printer retrieving unit 7110, printing unit 7133, physical printer designation print instructing unit 7135, query unit 7160, and control unit 7170 are provided for the PC client 12-B, thereby providing functions similar to the case of FIG. 30. The physical printer designation print instructing unit 7135 is constructed as follows in FIG. 33.

First, a print queue or shared file (3303) is provided on the printer/spooler control server. In case of the shared file, it is constructed so as to enable the client 12-B to access the shared file by a method similar to the file on the client. For this purpose, a file shared protocol shown at 3320 is provided between the client 12 and the printer/spooler control server 15. The physical printer designation print instructing unit 7135 registers the print job from the client 12 to the shared file 3303 of the printer/spooler control server by using the file shared protocol. The file shared protocol can be realized by using any one of a novel protocol and the existing protocol (function for the NetWare file server or the like).

In case of the print queue, the registering function of the print job from the client to the print queue 3303 of the printer/spooler control server is installed. To realize such a function, the print queue registration protocol shown at 3320 is provided between the client 12 and the printer/spooler control server 15. The print queue registration protocol can be also realized by using any one of a novel protocol and the existing protocol.

A print job transferring unit 3304 in the client WS 2820 reads out each print job registered in the print queue or shared file 3303 and transfers to the spooler 7410 in the printer/spooler control server 15 and registers. The print job transferring unit 3304 uses a printing protocol 3321. As a printing protocol 3321, a print job registering function from the client to the spooler 7410 of the printer/spooler control server in the foregoing lpd protocol is used and installed. Such a protocol can be also similarly realized by using a printing protocol other than the lpd protocol.

In FIG. 33, printing protocols corresponding to 3310, 3330, and 3340 are newly provided on the communication protocol SPX/IPX. A gateway unit 2825 in the WS 2820 receives each of the printing protocols 3310, 3330, and 3340 and converts to printing protocols 3311, 3331, and 3341 and communicates between the distributed printing management server 14 and the printer/spooler control server 15. The printing protocols 3110 (3210), 3130 (3230), and 3140 (3240) described in FIGS. 31 and 32 have been used as printing protocols 3311, 3331, and 3341.

By the print server system corresponding to the clients of different sorts described above by using FIGS. 28 to 33, the client of the sort different from the print server can obtain enough print services from the print server. Such enough printservices could not be performed hitherto. Specifically speaking, the following print services can be obtained.

The network printer can be supported at a high reliability.

The printing can be instructed at the logical specification levels.

The error report to the client and the error recovery by the print server can be performed.

The printing process of the query print server of the print situation can be easily controlled.

In the above various kinds of processing procedures described in the above embodiments, the order of each process can be exchanged within a range so long as it is logically and physically permitted.

The tables which are not yet described among the various kinds of tables installed in the printing system will now be described with reference to FIGS. 40A to 44.

First, the printer management table will be described by using FIGS. 40A to 40D. FIG. 40A shows a whole construction comprising: a printer name 401; a corresponding print server name 402; a printer specification number 403; and a printer status 404. FIG. 40B shows the details of the printer status 404. Each item of the printer status 404 is the same as the printer status 1456 in FIG. 14D. Although explanation will be also made in a configuration management system, which will be described later, the status of the printer is periodically read out by using both of the printer status watching demon and the job output 7510. If even only one item doesn't coincide with the printer status 404, such a fact is reported to the distributed printing management server 14 and is reflected to the printer configuration management table 7200.

The spool management table will now be described by using FIG. 41.

The spool management table is a table describing the detailed status of the job. By referring such a table, the detailed status of the job can be grasped. When the printing is requested, the job is stored into the spool and the detailed information of the job is registered into the table. When the job is deleted from the spool, the detailed information of the job is deleted from the table.

The table comprises: a record size 41-1; a job number 41-2; a user name 41-3; a host name 41-4; a printer name 41-5; a job registration time 41-6; a print start time 41-7; new/old of services 41-8; a job status 41-9; an error type 41-10; an error code 1 41-11; an error code 2 41-12; a requested paper size code 41-13; a serial number 41-14 of the error occurred page; the number of printing files 41-15; and printing file names 41-16.

The new/old of the services denotes information to discriminate whether the client who generated the job is the client of the new advanced print services or the client of the conventional printing services.

The job status describes either one of (a) the occurrence of the recoverable error, (b) the holding status, (c) the printer empty waiting status, and (d) during the printing.

The holding status denotes the job status which can be shifted by usr__hold command of the user I/F commands shown in FIG. 34 or cl__hold function for the client shown in FIG. 35.

The requested paper size code denotes the size of paper to be supplied by the user in case of the occurrence of a paper empty error. The error occurred page serial number indicates the serial page number within a range from the head of the print job to the error (error which needs the reprinting and can be recovered) occurred page.

When adding an expansion parameter to the job, the detailed information of the job is described, in this case it is also possible not to use the above table.

A job history management table will now be described by using FIG. 42.

The job history management table is a table describing the result of the printed job. By referring to this table, the history information of the job after completion of the printing can be grasped by the user.

When the printing is normally finished, such a table is used to describe the information regarding the print result of the job.

The table comprises: a record size 42-1; a job number 42-2; a user name 42-3; a host name 42-4; a printer name 42-5; an alternative printer name 42-6; a job registration time 42-7; a print start time 42-8; a print end time 42-9; a print result 42-10; the number of retry times 42-11; the number of printing files 42-12; and printing file names 42-13.

The alternative printer name denotes the name of printer used for error recovery by the alternative printer.

Figures 43, 44:
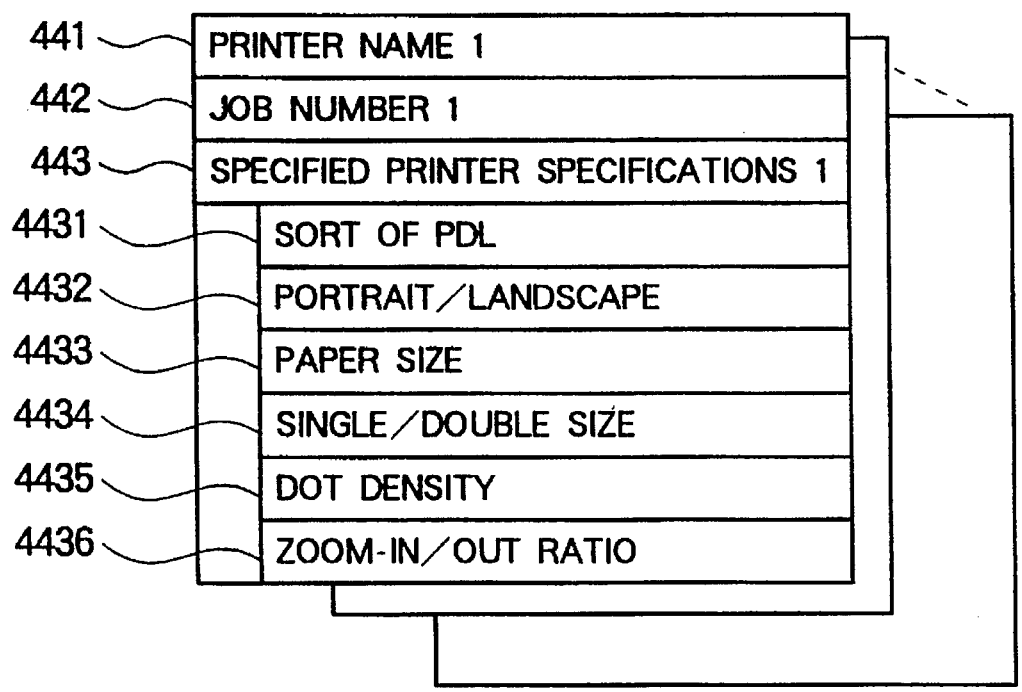
FIG. 43 is a diagram showing an example of a current logical specification table in the invention.
FIG. 44 is a diagram showing a job table for the client in the invention.

A current logical specification table will now be described by using FIG. 43. The current logical specification table 7140 comprises: the sort of PDL 431; the portrait/landscape 432; the paper size 433; the single/double side 434; the dot density 435; the zoom-in/out (reduction) ratio 436; the number of adequate printers 437; and adequate printers 4371 to 437n. Logical specifications 72-1 within a range from the PDL sort 431 to the zoom-in/out ratio 436 in the table 7140 is the item in which the parameters, that has been designated as inputs when the specification adequate printer retrieval 7110 is executed have been written. The number of adequate printers 437 and the adequate printer names 4371 to 437n are the items in which candidates 72-3 for physical printers, that is a response from the distributed printing management server 14 for the specification adequate printer retrieval 7110, have been written. Logical specifications, number of adequate printers, and adequate printer names are stored into the table 7140 as a result of the execution of the specification adequate printer retrieval 7110. The physical printer designation printing instruction 7135 refers to the table 7140 upon execution. If the designated physical printers of the physical printer designation printing instruction 7135 are included in the adequate printers 4371 to 437n, the logical specifications from the PDL sort 431 to the zoom-in/out ratio 436 are added to the job and are transferred to the printer/spooler control server.

The job table for client will now be described by using FIG. 44. One record of the job table 7150 for client comprises: a printer name 441; a job number 442; and designated printer specifications 443. The designated printer specifications 443 further comprise: a PDL sort 4431; a portrait/landscape 4432; a paper size 4433; a single/double side 4434; a dot density 4435; and a zoom-in/out ratio 4436. The job number and the designated physical printers of the job formed by the execution of the physical printer designation printing instruction 7135 and the logical specifications within a range from the PDL sort 431 to the zoom-in/out ratio 436 in the current logical specification table 7140 upon execution of the physical printer designation printing instruction 7135 are registered in the job table for client. When the job fails later, such a table is referred to obtain the logical specifications from the printer name and the job number when the alternative printers which can print this job are searched.

A configuration management system of the installation, initialization, or the like to construct the printing system by using a plurality of printers, printer/spooler control servers, and clients will now be described by using FIGS. 45 to 54.

Figure 45:
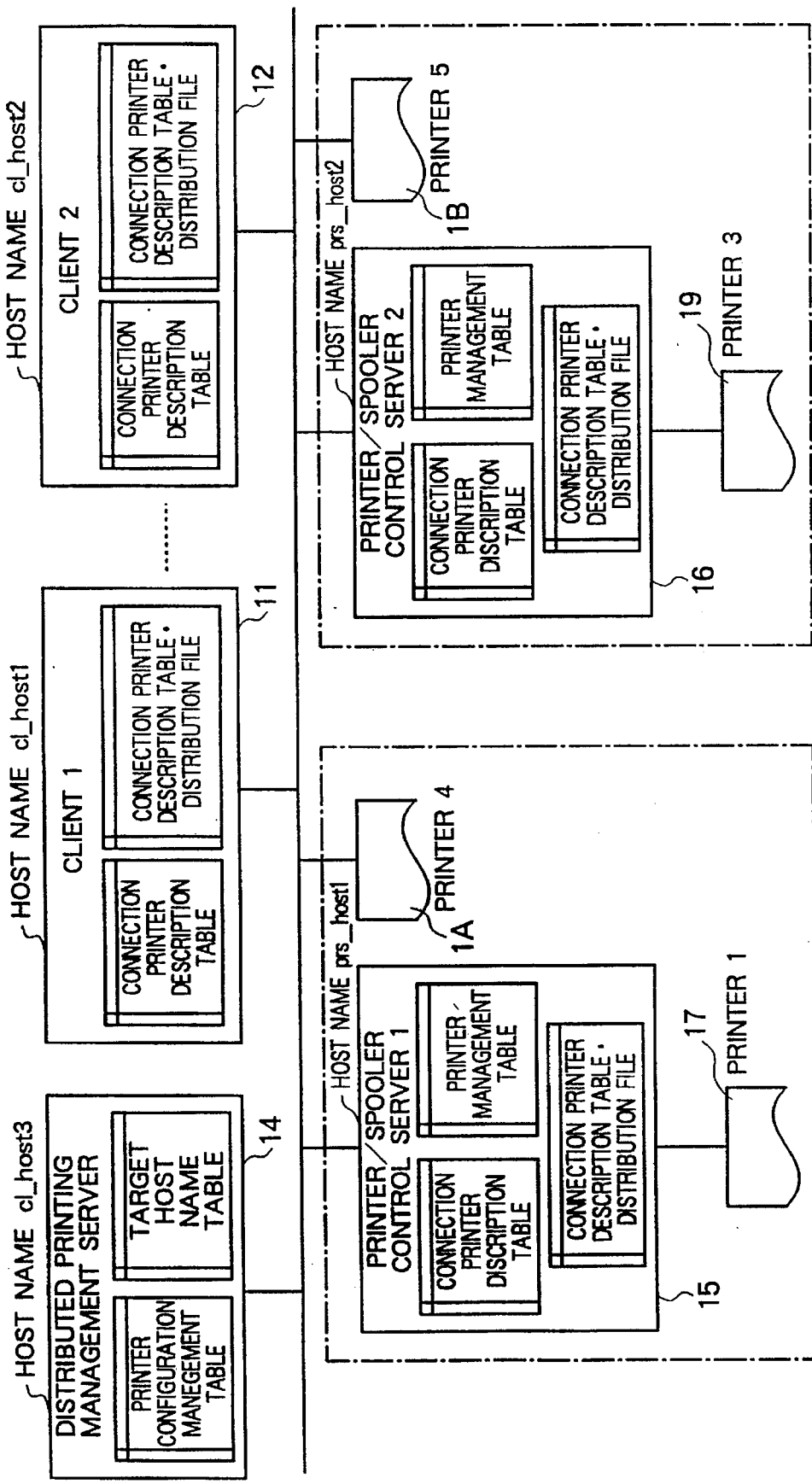
FIG. 45 is a diagram showing an example of a system configuration in the invention.

First, tables which are used in the configuration management system will be explained by using the printing system of FIG. 45. The printing system comprises a part of the system of FIG. 1. As computers, the printing system includes: the client 1 (11); the client 2 (12); the printer/spooler control server 1 (15); the printer/spooler control server 2 (16); and the distributed printing management server 14. As printers, the system includes: the printer 1 (17); the printer 4 (1A); the printer 3 (19); and the printer 5 (1B). Among them, the printer/spooler control server 1 (15) controls the printer 1 (17) of the server direct coupling type and the printer 4 (1A) of the network direct coupling type. The printer/spooler control server 2 (16) controls the printer 3 (19) of the server direct coupling type and the printer 5 (1B) of the network direct coupling type. The client 1 (11), client 2 (12), printer/spooler control server 1 (15), printer/spooler control server 2 (16), and distributed printing management server 14 have cl_host1, cl_host2, prs_host1, prs_host2, and cl_host3 as host names serving as names of the computers.

The case where the distributed printing management server doesn't have the functions of the client and printer/spooler control server will now be described. In the case where the distributed printing management server has the functions of both of them, the printing system can be also similarly realized.

In the above printing system, each of the client and the printer/spooler control server has a connection printer description table and a connection printer description table Å distribution file. Each printer/spooler control server further has a printer management table. The distributed printing management server 14 has the foregoing printer configuration management table and a target host name description table.

The contents of the printer configuration management table and printer management table have already been described by using FIGS. 14A to 14D, FIGS. 39A to 39E, and FIGS. 40A and 40B.

The target host name description table shows a list of the names of all of the hosts to which the printing system provides the print services as shown in FIG. 46A. In case of the printing system of FIG. 45, such host names are as shown in FIG. 46B. The print services which are provided by the printing system are hereinafter also referred to as advanced print services.

With respect to each printer which can be accessed by each host, the connection printer description table describes the host name, physical printer name, spooler name, device driver name, and the like of the printer/spooler control server to control such a printer. The foregoing printcap is an example of them. An example of the printcap in case of the printing system of FIG. 45 is shown in FIGS. 47 to 49. FIG. 47 shows the printcap for the client 1 (11) and client 2 (12). FIG. 48 shows the printcap for the printer/spooler control server 1. FIG. 49 shows the printcap for the printer/spooler control server 2.

Figure 50:
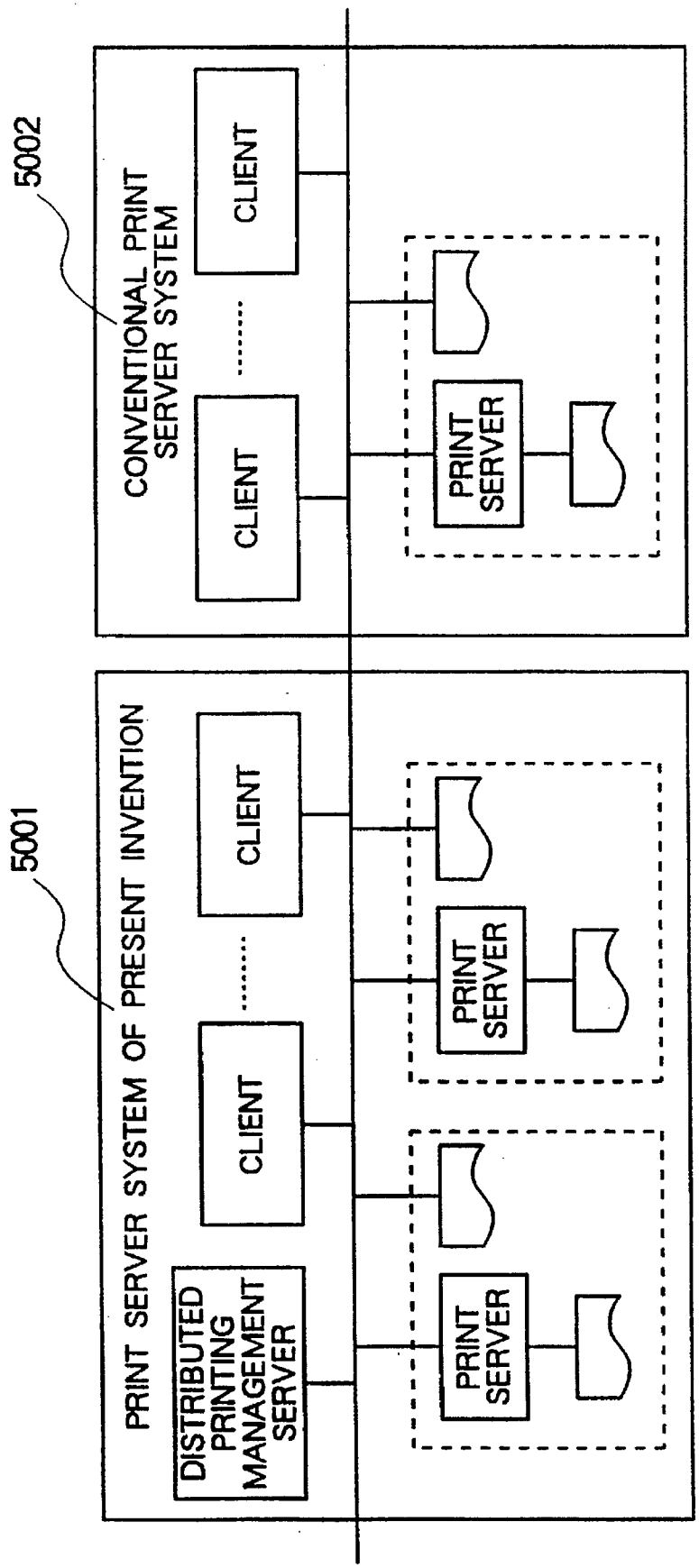
FIG. 50 is a diagram showing the concept of a configuration management in the invention.
Figure 51:
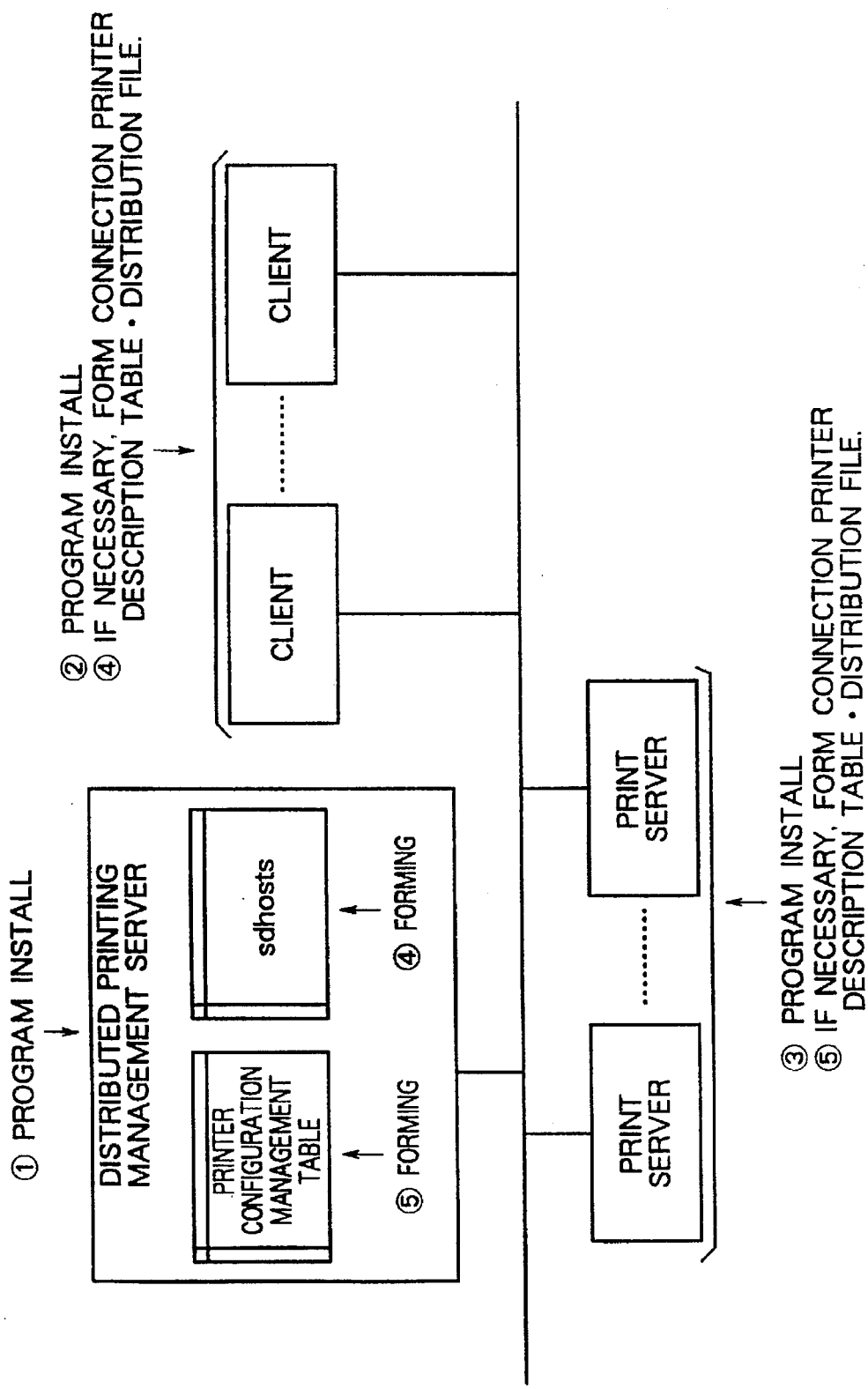
FIG. 51 is a diagram showing a flow of the configuration management in the invention.

An idea as a prerequisite of the configuration management is now shown with reference to FIG. 50.

(1) Definition of the client and printer/spooler control server

Generally, as shown in FIG. 50, the system comprises: a set 5001 of the computers (hosts) and printers as targets of the advanced print services according to the invention; and a set 5002 of the computers and printers as targets of the conventional print services. Although the two sets 5001 and 5002 are not overlapped, there is also a case where they are overlapped.

The clients and printer/spooler control servers as targets of the advanced print services are decided as follows.

The clients are set to all of the hosts belonging to the target host name table mentioned above. The printer/spooler control servers are set to all of the hosts which belong to the target host name table and control the printers. In place of belonging to the target host name table, the judgment can be also performed by using the presence or absence of the connection printer description table ● distribution file.

(2) Security

When the host names of the client belongs to a predetermined access permission file of the printer/spooler control server, the client accesses to such a printer/spooler control server and can execute various printing requests. Each printer/spooler control server can certainly become the client of the self server even if the self host name doesn't belong to the access permission file in the self server. In case of constructing the clients and printer/spooler control servers by using the foregoing lpd protocol, /etc/hosts.equiv or /etc/hosts.lpd is used for the access permission file.

The concentrated management of the security information can be also performed by the printing system as a target of the advanced print services. The printing system as a target of the advanced print services will be also simply referred to as a printing system hereinlater.

(3) Conditions

The conditions to construct the printing system will now be shown.

(a) Only one printer configuration management table exists in the printing system. The table is provided in the distributed printing management server and only such a server updates.

(b) It is assumed that the printer name to refer to the same printer is set to the same name for any host and is unique in the printing system. The printer name of such a same name is also referred to as an absolute printer name.

(c) The connection printer description tables for the printer/spooler control servers which provide the advanced print services and for the clients who use such a printer/spooler control server are formed by either one of the following two modes.

(i) Mode in which the distributed printing management server forms them and distributes to each host.

(ii) Mode in which the user or program of each host forms them in a manner similar to the conventional forming method of the printcap.

In the printing system, both of the above modes are supported. Both of them are switched in accordance with the presence or absence of the connection printer description table ● distribution file. When the file exists in each host, the mode of (i) is selected. If such a file doesn't exist, the mode of (ii) is selected.

The above methods of forming and distributing the connection printer description table are shown in an initialization procedure, which will be explained hereinlater.

In the distributing mode of (i), it is inhibited that the user or program forms the connection printer description table.

(d) In the printing system, the power-on operations are sequentially executed in accordance with the order of the distributed printing management server, the printer/spooler control server, and the client. The power-off operations are sequentially performed in accordance with the order of the client, the printer/spooler control server, and finally the distributed printing management server.

The configuration managing method of the printer will now be sequentially explained in accordance with the order of the installation, initialization, change detection, end, and configuration change.

1. Installation (1) The system manager installs the program for server into the distributed printing management server (Note 2).

(2) (i) The system manager installs the program for client and the program for printer/spooler control server into each client and each printer/spooler control server (Note 2). The system manager installs the printer driver and forms the printer management table when installing the program for the printer/spooler control server.

(ii) After the above programs were installed into each host (client or printer/spooler control server), if the system manager wants to distribute the connection printer description table to the host, the connection printer description table ● distribution file onto the host. If the system manager doesn't want to distribute the connection printer description table, the connection printer description table ● distribution file is not formed on the host. If the connection printer description table ● distribution file has already existed, it is deleted.

(3) The management table on the distributed printing management server is formed.

(a) Target host name table

The printing system registers all of the computers to which the advanced print services are provided, namely, registers all of the host names of the clients and the printer/spooler control servers into the target host name table.

(b) Printer configuration management table

The following items in the table are set by using the "printer configuration management tool" having the GUI (Graphical User Interface).

Host names of the target printer/spooler control servers.

Connection relation between the target printer/spooler control servers and the printers.

Distinction regarding the server direct coupling/network direct coupling of each printer and its place.

The printer type number and the printer specifications are made correspond. When the new printer type number is registered into the printing system, the contents of the printer specifications 1455 are set.

(Note 1)

(i) The foregoing absolute printer name is added to the printer name.

(ii) The specifications (1424, 1434, etc.) and the statuses (1425, 1435, etc.) of each printer/spooler control server and a printer type number (14550) and the printer status (1456) of each printer are written at the time of initialization by generating a printer specification query command and a printer status query command from the distributed printing management server to each printer/spooler control server (refer to FIG. 36).

(iii) The alive flags (1422, 1432, 1452, etc.) of each printer/spooler control server and each printer are updated by periodically generating a query command (refer to FIG. 36) of the alive statuses of the print servers and printers by the distributed printing management server to each printer/spooler control server.

(iv) When each printer/spooler control server detects a self status change or a status change of the printer connected to the server, the printer/spooler control server transfers a printer status transmission command (refer to FIG. 36) to the distributed printing management server, thereby reporting such a status change. On the basis of such a report, the distributed printing management server updates the status of the printer/spooler control server or printer in the printer configuration management table.

(Note 2)

A demon program regarding the printing system and included in an installation program is registered into an initialization program (/etc/brc.ipc in the case where the fundamental software is the UNIX) of each host, thereby allowing such a demon program to be automatically activated upon initialization.

2. Initialization (1) The power of the distributed printing management server is first turned on in the target host of the widespread-type print server.

(2) The powers of the clients and the printer/spooler control servers are sequentially turned on in accordance with an arbitrary order.

(3) When the powers are turned on, each client and each printer/spooler control server (hereinafter, simply referred to as hosts) execute the following processes in accordance with the presence or absence of the foregoing connection printer description table ● distribution file.

Figure 52:
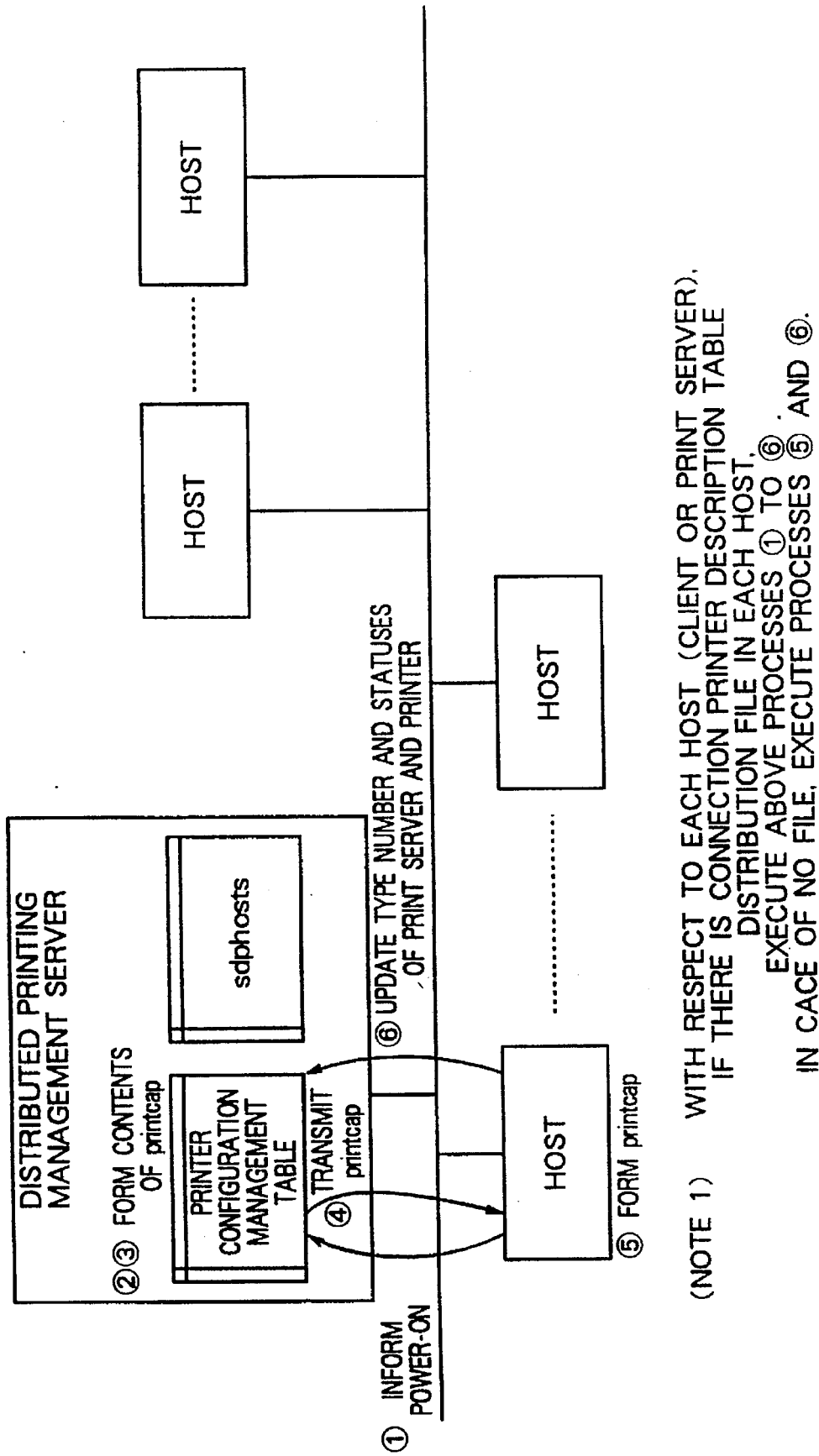
FIG. 52 is a diagram showing a flow of the configuration management in the invention.

(a) In the case where the above connection printer description table ● distribution file exists, the processes are executed in the following manner (refer to FIG. 52).

(i) The host names and the completion of the power-on are reported from the host to the distributed printing management server. In the case where the completion of the power-on is received from a plurality of hosts, the distributed printing management server executes the initializing process to all of the hosts which received such a reception without any omission by using a parallel server system.

(ii) With reference to the printer configuration management table, a check is made to see if the forming date and time of the connection printer description table (for example, printcap) for each host is older than the forming date and time of the printer configuration management table or not.

If YES, processes (iii) to (v) are executed and the connection printer description table is formed and distributed. When the connection printer description table for a certain host is not formed yet, −1 is written to the forming date and time of the connection printer description table for the host in the above table.

(iii) The distributed printing management server forms the connection printer description table for such a host on the basis of the connection information in the printer configuration management table. In this instance, the forming date and time of the connection printer description table for such a host in the file are updated.

(iv) The contents of the connection printer description table formed are transmitted from the distributed printing management server to the host.

(v) The host forms the connection printer description table on the basis of the received contents.

(vi) If necessary, the printer is registered by a printer registration tool for AP (application program).

(α) In case of the AP which can become a target of the advanced print services

① A record in the connection printer description table corresponding to the printer to be added for the AP is deleted. If a special command is prepared for such a deletion to thereby prevent that an erroneous operation other than the deletion to be performed to such a table, the reliability of the printing system can be improved.

② The printer is registered by the printer registration tool for AP. For example, there are the following printer registration tools.

Prinstall command in the application software "Publiss" made by Bridge Co., Ltd. (disclosed in "The Setting of the Print Environment", in "Publiss 3.3, Publiss 1.1, Installation Guide & Option Installation Guide", PA-RISC/HP-UX edition, Vol. 1, paragraph 4.4.3, Nov. 29, 1993).

③ In the case where it is necessary to change the contents (filter name, device driver name) of the printer record in the connection printer description table, the system manager of the host changes by a change tool or editor. When a special tool for such a change is prepared to thereby prevent that an erroneous operation other than the change is executed to the table, the reliability of the printing system can be improved. An example of the connection printer description table formed with respect to the printing system of FIG. 45 is as shown in FIGS. 47 to 49.

(β) In case of the AP which cannot become the target of the advanced printing services ① An attention is paid so as not to use the same printer name in the advanced print services and the AP.

② The printer for the above AP which is not included in the distributed connection printer description table is added into the table. The addition is performed by a desired method of the system manager of each host.

For example, in case of the HI-UX/WE2 of Hitachi, the printer is added by the tool to set-up for a remote printer. Such a tool has been disclosed in "Management introduction and maintenance edition of the Technical Manual System for HI-UX/WE2 of Hitachi" (manual No. 3000-9-106-20), Chapter 5. If the above tool has already been used before the connection printer description table is distributed to the host, by merely again activating the host, the above addition can be executed.

(b) In the case where the connection printer description table ● distribution file doesn't exist, the processes are executed as follows.

(i) The system manager of each host forms the connection printer description table by the conventional method. In this instance, the foregoing absolute printer name is added to the printer name.

(ii) If necessary, the printer is registered into the above table by using the printer registration tool for AP.

In the AP which can become a target of the advanced print services, in case of adding the printer which needs to change the contents (filter name, device driver name) of the printer record in the connection printer description table, the system manager of the host changes them by a change tool or editor. When a special tool is prepared for such a change to thereby prevent that an erroneous operation other than the change is executed for the table, the reliability of the printing system can be improved. An example of the connection printer description table formed with respect to the printing system of FIG. 45 is also as shown in FIGS. 47 to 49 even in case of (b) and is substantially the same as that in case of (a).

(4) The specifications and statuses (1424, 1434, 1425, 1435, etc.) of each printer/spooler control server and the printer type numbers and printer statuses (14550, 1456, etc.) of each printer are written by generating the printer specification query command and printer status query command, which will be explained hereinlater, shown in FIG. 36 by the distributed printing management server to each printer/spooler control server.

(5) In the connection printer description table for the target host (belonging to the foregoing target host name table) of the advanced print services, such a fact of belonging is shown by a comment. In the embodiment, "#host using the advanced print services" is written. Thus, by also referring to the connection printer description table, the system manager can also easily judge whether each host is the target host of the advanced print services or not.

(6) The following alternative ideas can be also used.

(i) "host distributing system of the printer configuration management table"

As a forming method of the connection printer description table, there is also a method (method 2) whereby the printer configuration management table is distributed to each host and each host forms the connection printer description table from such a table. Such a method can be also used. However, as compared with the above method (method 1) described in the above item (3) or the like, the method 2 is inferior as shown in FIG. 53.

(ii) "system such that the copies of the connection printer description tables of all of the hosts are held in the distributed printing management server"

According to such a system, in the case where the number of hosts is remarkably large, the installation is performed by paying an attention to a point that the table capacity in the distributed printing management server increases.

3. Change detection (1) The alive flags and statuses (1422, 1432, 1425, 1435, 1452, 1456, etc.) of a printer/spooler control server 542 on a printer configuration table 5411 are updated by a method shown in FIG. 54.

(2) The alive flags (1422, 1432, 1452, etc.) of each printer/spooler control server 542 and each printer are updated by periodically generating a query command ①-1 (5410-1) of the alive statuses of the print servers and printers shown in FIG. 36 by the distributed printing management server 541 to each printer/spooler control server 542 (refer to Note 3).

Each printer/spooler control server watches the printers controlled by the server by using a printer configuration specifications watch executing unit 5421. The printer configuration specifications watch executing unit 5421 watches by using both the printer status watching processing unit (not shown) and the job outputting unit 7510. Specifically speaking, when the job outputting unit 7510 stops, the watching by the printer status watching processing unit is executed. When the job outputting unit 7510 is alive, the watching using the job outputting unit 7510 is performed.

(3) When each printer/spooler control server detects a self status change or a status change of the printer connected to the server, the printer/spooler control server transfers a printer status transmission command ③ (5430) shown in FIG. 36 to the distributed printing management server, thereby reporting such a fact. On the basis of such a report, the distributed printing management server 541 updates the status of the printer configuration management table 5411.

In case of the network printer, the printer status change is detected by using an asynchronous report ② (5420). In case of the server direct coupling printer, such a detection is executed by using a periodic watching [also referred to as a polling; ①-2 (5410-2) and ②-3 (5410-3)].

(4) It is now assumed that the above updating of the printer configuration management table is executed after the printers adequate to the specifications were retrieved and the job was registered in the printer/spooler control server in a state in which the updated contents don't coincide with the real state of the printer. Therefore, there is a case where an error based on the above dissidence occurs at the time of the execution of the job by the printer/spooler control server. In this case, the error processes are performed as follows.

(a) Stop of the printer/spooler control server or detection of a fatal error
  (i) The user of the client detects the stop or disconnection of the printer/spooler control server.
  (ii) If necessary, the user executes the power-on or reconnection of the printer/spooler control server.
(b) Detection of stop or a fatal error of the printer
  (i) On the error detection route described by using FIGS. 16 to 27, the printer/spooler control server detects the above error (stop of the printer or fatal error) and reports to the client.
  (ii) The user instructs the error recovery by using an error recovery instructing command. If necessary, the user instructs the recovery using the alternative printer.
(c) Detection of an error such as paper empty, paper jam, or the like of the printer On the error detection route described by using FIGS. 16 to 27, the printer/spooler control server detects the error (paper empty, paper jam, or the like) and reports to the client. The user takes a procedure on the basis of the result of the report.

The error processes in the above items (a) to (c) can be processed by the error processes shown in FIG. 18.

(5) In case of the printer connected by a unidirectional I/F (printer connected by centronics, lpd, NetWare RPrinter, etc.), changes of the alive flags or statuses cannot be detected.

4. End (1) The powers of the clients and the printer/spooler control servers are sequentially turned off in accordance with an arbitrary order.

(2) The power of the distributed printing management server is finally turned off.

(3) When the power of the printer/spooler control server is turned off in the halfway, the processes shown in the change detection in the above item 3. are executed.

5. Configuration change (1) In case of adding the client and printer/spooler control server, the program for the client and the program for the printer/spooler control server are installed. When the program for the printer/spooler control server is installed, a printer driver and a printer management table are installed.

In case of removing the client and print server, the programs for them are deleted from the host.

(2) In case of adding the printer, if the printer driver for such a printer doesn't exist in the printer/spooler control server, it is installed. In case of the network printer, even when two or more printers are connected to one printer/spooler control server, it is sufficient to merely install one printer driver.

In case of removing the printer, the printer driver for such a printer is not temporarily used.

(3) All of the hosts other than the distributed printing management server which belong to the target host name table are sequentially stopped in accordance with the order in the end of the above item 4.

(4) The client, printer/spooler control server, printer, etc. are added or removed.

(5) In the case where the client or printer/spooler control server is added or removed, the target host name table is updated in correspondence to it.

(6) The system manager of the printing system inputs the connection information corresponding to the configuration change of the above items (1) to (5) and updates the printer configuration management table by using the "printer configuration registration tool" having the foregoing GUI. In this instance, the same items as those shown in (3) (b) in the install of the foregoing item 1. are updated.

(7) The power of the distributed printing management server is turned off.

(8) Subsequently, the procedure shown in the initialization of the above item 2. is executed.

Even if the above configuration managing procedure is changed as follows, the invention can be also similarly realized.

The power of only the distributed printing management server is turned off.

The printing system automatically detects the addition and removal of the client or printer/spooler control server and all of the processes similar to the above procedure other than the processes such as connection, removal, and the like which need the manual operations are automatically executed.

An attention is paid as follows when the printer registration tool for AP is used.

(1) In the case where the distributed printing management server distributes the connection printer description table, the printer that is registered by the printer registration tool for AP has to be the printer which has already been registered in the connection printer description table.

(2) Prior to the registration, the record of the registered printers is deleted from the table by a deletion command.

(3) The contents registered by the printer registration tool for AP are set so as not to be contradictory with the contents of the deleted record.

The following constrained items are provided with respect to the forming and change of the connection printer description table.

(1) Only the system manager of each host can form and change the connection printer description table.

(2) In the case where the distributed printing management server distributes the connection printer description table, the forming and change of the table can be performed by only the distribution and deletion commands by the distributed printing management server or the printer registration tool for AP. The processes such that the table is directly changed by the editor and the like cannot be performed.

(3) In the case where the distributed printing management server doesn't distribute the connection printer description table, in addition to the above case of (2), the system manager of each host can form and change the table by the editor.

The specifications of each function for the distributed printing management shown in FIG. 36 are shown below.

(1) Printer specifications query

```
Format:
    int dm_prchrq(server,printer,prnspc_lng,prn_spc_str)
```

Function:

The distributed printing management server inquires the printer type number to the printer of the printer/spooler control server designated by input parameters.

```
Input parameters:
    char *server           Name of printer/spooler control
                           server
    char *printer          Name of printer
Output parameters:
    Function return value =    0 : Normal end
                               1 or more : Abnormal end
```

(2) Query of alive statuses of print server and printer

```
Format:
    int dm_prsactq(server,prn_sts_set)
```

Function:

To the printer/spooler control server designated by the distributed printing management server by the input parameter, the alive flag of such a printer/spooler control server and the alive flags of all of the printers which are controlled by the printer/spooler control server are inquired.

```
Input parameter:
    char *server Printer/spooler control server name
Output parameters:
    struct PSVR_PR_STTS{
        int srv_act; Alive flag of the
            printer/spooler control server
        int nprn; The number of printers
        PRSTTS *pr_act; Array of the alive flags of
            the printers
    } prn_stts_set;
    struct PRSTTS{
        char *printer; Printer name
        int actflag; Alive flags of the printers
    }
    Function return value =    0 : Normal end
                               1 or more : Abnormal end
```

(Note) In the present command, only the polling watching of the alive flag is executed. Status changes other than the alive flags of the printer/spooler control server and the printers which are controlled by this server are asynchronously reported from the printer/spooler control server to the distributed printing management server by using the printer status transmission command.

(3) Printer status transmission

```
Format:
    int dm_prstssnd(prchsts_str)
```

Function:

The printer/spooler control server transmits the status changes other than the alive flags of (a) the server itself or (b) the connected printers which are controlled by the server to the distributed printing management server.

```
Input parameters:
    struct PRCHSTS{
        char *pssvr_name;      Printer/spooler control server
                               name
        char pssvr_sts;        Printer/spooler control server
                               status
        short prn_num;         The number of printers with
                               status changes
        char *prn_name1[];     Name of printer whose status
                               has changed
        prn_sts_str prn_sts[]; Status of each printer,
                               the state of which is
                               changed
        short prn_jobvd[];     Job amount of each printer,
                               the state of which is changed
    } *prchsts_str;            Printer change status structure
    struct prn_sts_str{        Printer status structure
        short err_exst;        Type of error
        short err_class;       Error code 1
        short err_code;        Error code 2
        short res;             Dot density
        short pdl;             PDL
        short psize;           Paper size
        short *font;           Font
        short lo;              Form
        short zoom;            Zoom-in/out ratio
    };
    Function return value =    0: Normal end
                               1 or more; Abnormal end
```

(4) Message transmission

```
Format: int dm_msgbrd(host,msg)
```

Function:

The distributed printing management server broadcasts messages to all of the hosts (which belong to the target host name table).

```
Input parameters:
    char *host; Host name
    char *msg; Message character train
    Function return value =    0 : Normal end
                               1 or more : Abnormal end
(5) Printer status query:
Format: dm_prstsq
```

Function:

To the printer/spooler control server designated by the distributed printing management server by the input parameter, the distributed printing management server inquires the names and statuses of all of the printers which are controlled by the printer/spooler control server.

```
Input parameter:
    pssvr_name: Name of printer/spooler control
        server
Output parameters:
    struct PSSVR_PRN_STS*prn_sts_set
    Pointer to the printer status structure.
        This structure is constructed by the
following items.
    (1) The number of printers which are controlled by
        the printer/spooler control server
    (2) The name of printer 1
    (3) The status of printer 1
            :
            :
    (4) The name of printer n
    (5) The status of printer n
```

-continued

| Function return value = | 0 : Normal end |
| --- | --- |
| | 1 or more : Abnormal end |

By using the foregoing configuration management system, there is an effect such that the system manager can easily perform the installation, initialization, and the like to construct the printing system. Further, according to the present system, it is possible to construct without a contradiction. Consequently, there is also an effect such that the reliability and availability of the printing system can be improved.

In the foregoing embodiments, the distributed printing management server generalizes the printers on the network.

Therefore, means for forming a printer configuration management table which is necessary for the distributed printing management server to control the printers on the network will now be described in detail.

In the following embodiments, an apparatus which can control the printers of the distributed printing management server or the like assumes the host computer.

[Embodiment 11]

An embodiment according to the invention will now be described hereinbelow by using FIGS. 57 to 64C.

Figure 57:
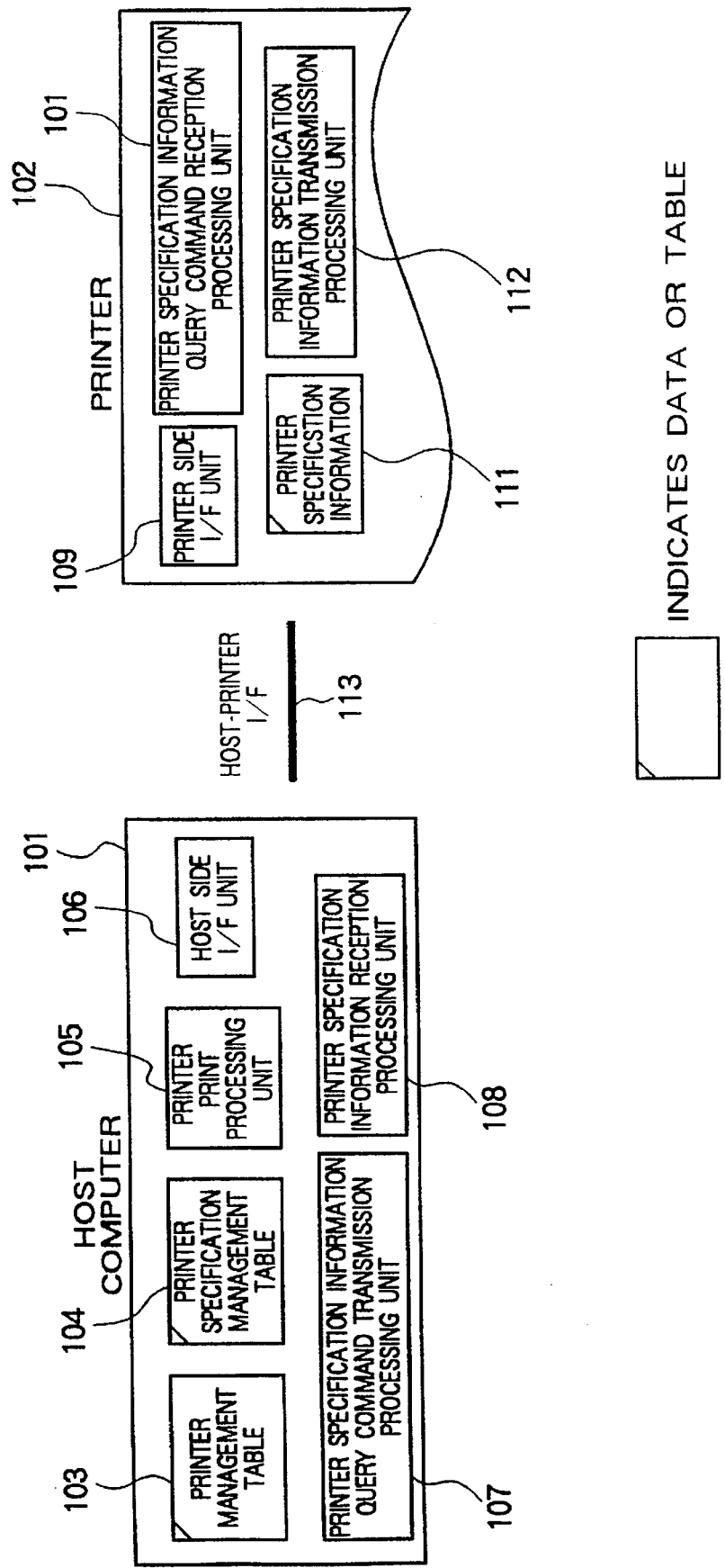
FIG. 57 is a diagram showing an example of a functional block diagram for obtaining specification information of a printer in the printing system.

A function configuration of an embodiment according to the invention will be first described by using FIG. 57.

FIG. 57 is a block diagram for explaining the function configuration of the embodiment 11.

FIG. 57 shows a state in which a host computer 101 and a printer 102 are connected by an interface 113 between the host and the printer (hereinafter, "interface" is also abbreviated to "I/F").

The host computer 101 has a printer management table 103 and a printer specification management table 104 as a table in a memory device. As a function unit, the host computer 101 has a printer print processing unit 105, a host side I/F unit 106, a printer specification information query command transmission processing unit 107, and a printer specification information reception processing unit 108.

The printer management table 103, which will be explained in detail hereinlater, is constructed by the items such as printer name, printer type number, and printer status. The printer specification management table 104, which will be explained in detail hereinlater, is constructed by various specification information of the printer 102, for example, the items such as dot density set, print speed, paper size, and the like.

The printer print processing unit 105 forms data which is printed by the printer 102.

The host side I/F unit 106 executes necessary processes on the host side to communicate with the printer 102 via the host-printer I/F unit 113. The printer specification information query command transmission processing unit 107 generates a printer specification information query command when the printer name or the like is inputted to the host computer 101. The printer specification information reception processing unit 108 processes printer specification information 111 which is received from the printer 102 and registers into the printer management table 103 and printer specification management table 104.

The printer 102 is constructed by the printer specification information 111 as data in a memory device. As function units, the printer 102 is constructed by a printer side I/F unit 109, a printer specification information query command reception processing unit 110, and a printer specification information transmission processing unit 112.

The printer specification information 111, which will be explained in detail hereinbelow, is the same as the specification information of the printer that is set in the printer specification management table.

The printer side I/F unit 109 executes necessary processes on the printer side to communicate with the printer 102 via the host-printer I/F unit 113. The printer specification information query command reception processing unit 110 receives the printer specification information query command from the host computer 101 and prepares for the subsequent processes. The printer specification information transmission processing unit 112 transmits the printer specification information 111 to the host computer 101.

The host computer 101 and printer 102 are connected by the host-printer I/F 113 at the positions of the host side I/F unit 106 and printer side I/F unit 109. As a protocol of such an interface, an interface which can perform a two-way communication such as SCSI (Small Computer System Interface), RS232C, RS422, GP-IB (General Purpose Interface Bus), two-way Centronics, HDLC (High-Level Data Link Control), Ethernet, Fast Ethernet, Token-Ring, FDDI (Fiber Distributed Data Interface), ISDN (Integrated Services Digital Network), or the like.

A hardware configuration of the embodiment according to the invention will now be described by using FIGS. 58 to 59.

Figure 58:
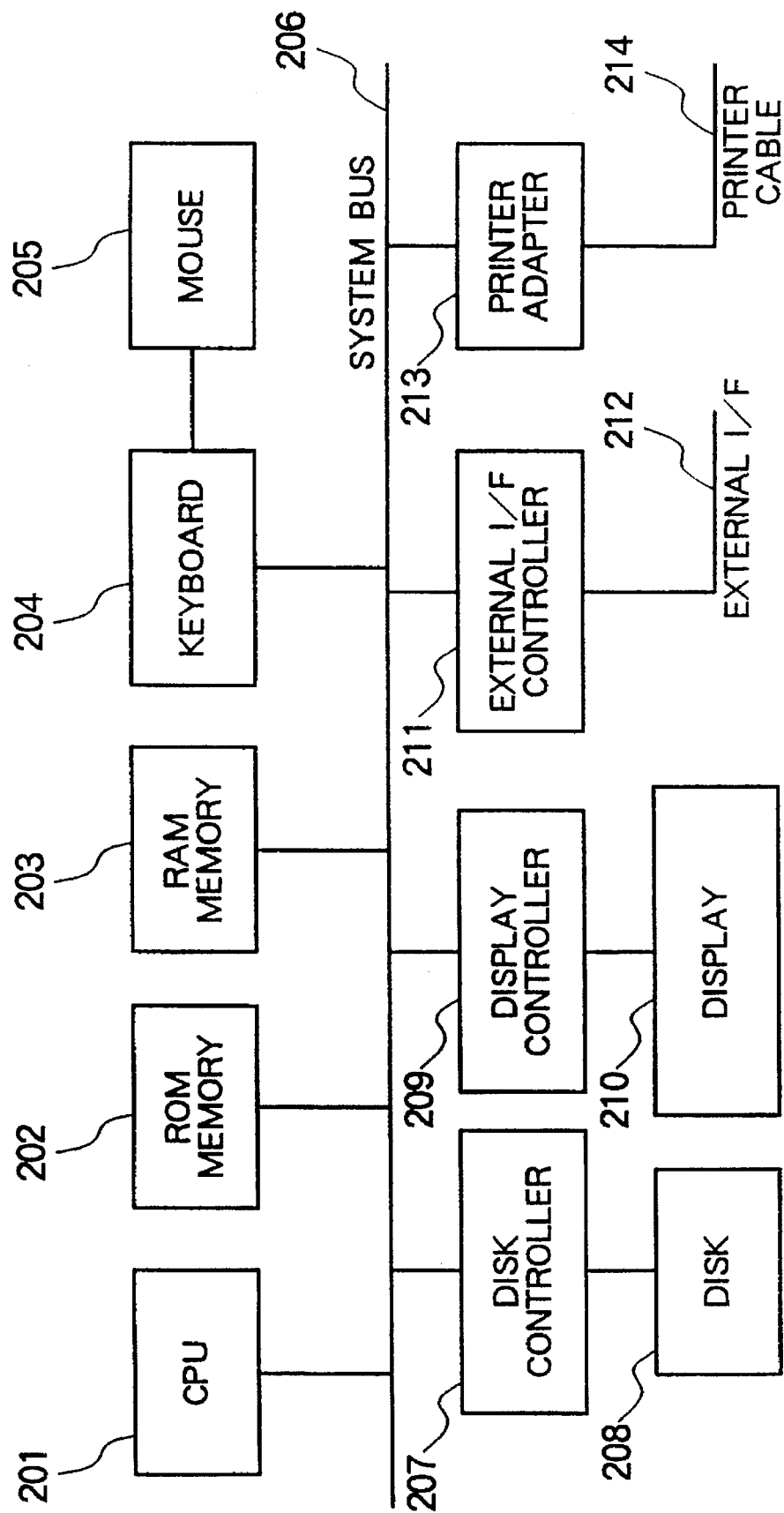
FIG. 58 is a diagram showing an example of a hardware configuration of a host computer according to the printing system.

FIG. 58 is a hardware configuration diagram of a host computer according to the embodiment.

Figure 59:
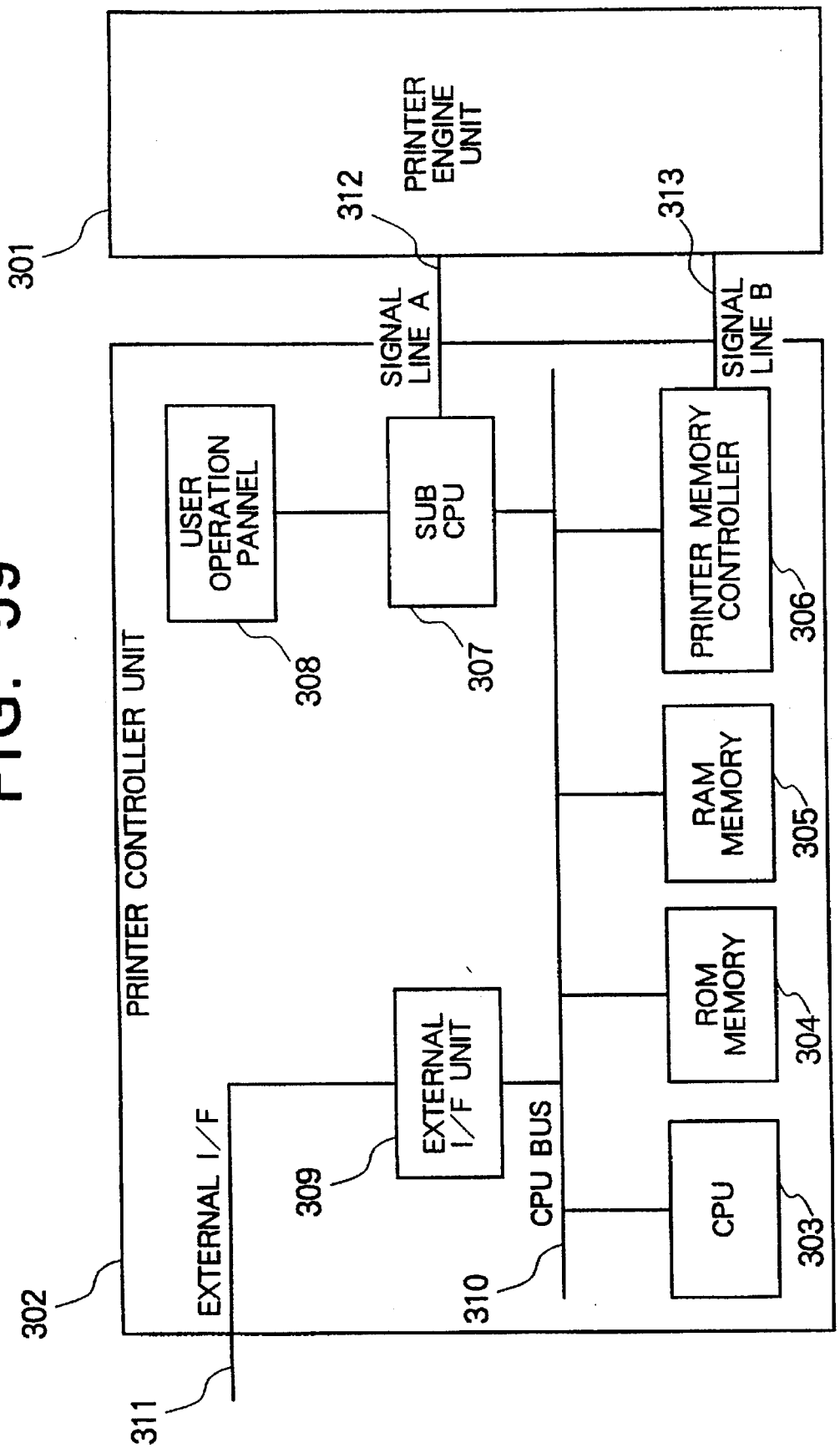
FIG. 59 is a diagram showing an example of the hardware configuration of the printer according to the printing system.

FIG. 59 is a hardware configuration diagram of a printer according to the embodiment.

The host computer 101 comprises: a CPU 201; an ROM memory 202; an RAM memory 203; a keyboard 204; a mouse 205; a system bus 206; a disk controller 207; a disk 208; a display controller 209; a display 210; an external I/F controller 211; an external I/F 212; a printer adapter 213; and a printer cable 214.

The system bus 206 is a communication path of various input/output signals (an address signal, a data signal, and other control signals) of the CPU 201.

The CPU 201 executes input and output with peripheral apparatuses such as keyboard 204, disk 208, display 210, printer 102, and the like, the ROM memory 202, the RAM memory 203, and the like through the system bus 206 and also executes arithmetic operating processes of data and a program control.

It is assumed that the printer management table 103 and printer specification management table 104 are stored in the RAM memory 203.

The keyboard 204 is an input apparatus comprising a plurality of keys for inputting. The mouse 205 as a kind of pointing device is connected to the keyboard 204. The disk 208 is used as an auxiliary memory device and is controlled by the disk controller 207.

The printer 102 is connected to the system bus 206 through the printer adapter 213 and transmits and receives print data by such a path. A communication of the printer specification information or the like with the other host computer or printer is executed by the external I/F controller 211 through the external I/F 212.

The printer 102 comprises a printer engine unit 301 and a printer controller 302 as shown in FIG. 59.

A CPU 303 executes input and output with an ROM memory 304, an RAM memory 305, a printer memory controller 306, a sub CPU 307, an external I/F unit 309, and the like through a CPU bus 310 and also executes necessary data arithmetic operations and program control. The ROM memory 304 holds fixed information such as initial loading program of the printer controller 302, a part of fonts, printer specification information 111, and the like. The RAM memory 305 stores the control program of the printer controller 302, remaining fonts, a printer status, print data, and the like.

The sub CPU 307 executes input/output processes with a user operation panel 308 and the printer engine unit 301 in accordance with instructions of the CPU 303. More specifically speaking, the sub CPU 307 transmits a command for query or instruction to the printer engine unit 301, receives a response status from the printer engine unit 301, and transfers a control signal to control a reading procedure.

The printer memory controller 306 transmits the print data in the RAM memory 305 to the printer engine unit 301 by using a signal line B 313.

A signal line A 312 receives and transmits the data and control signal which are transmitted and received between the sub CPU 307 and the printer engine unit 301.

The external I/F unit 309 communicates with the host computer 101 through an external I/F 311.

Tables and data structure regarding the embodiment will now be described by using FIGS. 60 to 62.

FIG. 60 is an explanatory diagram of a printer management table according to the invention.

FIG. 61 is an explanatory diagram of a printer specification management table according to the invention.

FIG. 62 is an explanatory diagram of printer specification information according to the invention.

The printer management table is put in the host computer is used to manage the printers existing in the system. The printer management table is used to retrieve the printer type number 402 from the printer name 401 or a process opposite to it or to refer to the printer status 403 of the printer.

The printer name 401 denotes the name of the printer and describes, for example, like "printer001" by using alphabetical characters or numerals. The printer type number 402 is a code to identify various printers of different specifications and is expressed by using symbols such as characters, numerals, and the like. For example, like "p001–003". Since the printer type number 402 becomes a key to identify the printer, an attention should be paid to that it has to be unique in the system. Although the printer name 401 is also unique, it is assumed that it is permitted that a plurality of printer names 401 correspond to one printer type number 402.

The printer status 403 indicates the present printer status of the printer such as presence or absence of an error, error code, error class (class which was made correspond in accordance with a magnitude of the error), dot density selected by the printer, PDL (abbreviation of "Page Description Language"), paper size, font, form, or the like.

The printer specification management table is provided in the host computer and stores the printer specification information received from each printer and is provided for use on the host computer. Namely, the user prints or refers to those printer information, thereby making it possible to select and use the printer of the desired printer specifications.

For example, as shown in FIG. 61, the contents of each item are a printer type number 501, a dot density set 502, a print speed 503, a specification code 504, a paper size set 505, a PDL set 506, a font set 507, and a form set 508.

The printer type number 501 denotes a key indicating with which printer the printer specification information is concerned. As shown in 1, since the printer type number 402 in FIG. 60 and the printer type number 501 in FIG. 61 are the same printer number, a process for making correspond to the printer specification management table from the printer management table is performed.

The dot density set 502 denotes a set of dot densities which can be supported by the printer. As a unit of the dot density, dpi (dots per inch) is used.

As a dot density code, for example, one or more codes are selected from among 1: 180 dpi, 1: 240 dpi, 2: 300 dpi, 3: 400 dpi, 4: 480 dpi, 5: 600 dpi, and 6: 800 dpi. However, such a code can be expanded in accordance with the function of the printer.

The print speed 503 is the maximum print speed of the printer engine in case of the paper of the A4 size. The print speed is shown by numerals and its unit is expressed by alphabetical characters. As a unit, for example, an either proper one of (ppm: pages per minute), (cps: characters per second), and (lpm: lines per minute) can be used.

The specification code 504 comprises: permission or inhibition of the double side print 509 [one of the code (0: only the single side print is permitted) and the code (1: both of the single/double side prints can be performed) is selected]; and color specifications 510 [one of the code (0: monochrome), (1: multicolor), and (2: full color) is selected].

The paper size set 505 denotes a set of paper sizes at which the printer can print. As a paper size code, the specifications of A column and B column of the Japanese Industrial Standards are used and, for example, one or more codes are selected from among 0:A3, 1:A4, 2:A5, 3:A6, 4:B4, 5:B5, 6:B6, 7:letter, 8:leisure, 9:mini, and 10:regal.

The PDL set 506 denotes a set of page description languages which can be supported by the printer. As a PDL code, for instance, one or more codes are selected from among 0: LIPS H, 1: LIPSI, 2: LIPSII, 3: LIPSIII, 4: ESC/P, 5: ESC/PAGE, 6: PostScript level 1, 7: PostScript level 2, and 8: PC-PR201.

The font set 507 denotes a set of fonts which can be used by the printer. As a font code, for example, one or more codes is selected from among (0: Gothic style), (1: Ming style), . . .

The form set 508 indicates a set of forms which can be used by the printer. "form" denotes a regular format which has been predetermined so that the user can use. As a form code, for example, one or more codes are selected from among (0: form 1), (1: form 2), . . .

The printer specification information is information which each printer has and becomes a source of the printer specification management table and its contents are the same as the printer specification management table.

An operation procedure regarding the embodiment 11 will now be described by using FIG. 63.

FIG. 63 is a procedure diagram in which the host computer and the printer are arranged and a procedure to be executed therein is shown by a PAD (abbreviation of "Program Analysis Diagram").

In the present procedure, after the user executed the input of (a), the processes after (b) are automatically executed in accordance with control programs of the host computer and the printer.

(a) The user inputs the printer name and the printer type number to the host computer. The host computer registers the printer name and printer type number into the printer management table (701).

(b) The printer specification information query command transmission processing unit of the host computer generates a printer specification information query command to the printer (702).

(c) The printer specification information query command reception processing unit of the printer receives the printer specification information query command from the host (704).

(d) The printer specification information transmission processing unit of the printer transmits the printer specification information to the host (705).

(e) The printer specification information reception processing unit of the host computer receives the printer specification information from the printer and stores the printer specification information into the printer specification management table. The printer type number included in the printer specification information is stored into the printer specification management table (703).

FIG. 64A shows in detail processes in steps 701 to 705 mentioned above.

(a) The user registers the printer name and the printer device name into the printer table.

(Since the printer table is a file of the text type, it is edited by using an editor.)

(b) The user inputs "setprn_printer name_printer type number" from the keyboard of the host computer.

(c) The CPU of the host computer searches the inputted printer name from the printer table stored in the disk (2001).

If there is no corresponding printer name, an error is displayed and the processing routine is finished (2002).

(d) The CPU extracts the printer device name from the printer name in the printer table (2003).

(e) The CPU opens the printer device and transmits a communication request command (2004).

(f) The CPU of the printer is in a loop (2005).

The CPU waits for reception of a communication request command through the external I/F unit.

When such a command is received, the CPU breaks and exits from the loop (2006).

(g) The CPU transmits a communication preparation completion command to the host (2007).

(h) The CPU of the host is in a loop for a predetermined time. When some command is received, the CPU breaks (2008).

(i) The CPU receives the communication preparation completion command. If no command is received or another command is received, an error is displayed and the processing routine is finished (2009).

(j) The CPU transmits a printer specification query command to the printer (2010).

(k) The CPU of the printer is in the loop for a predetermined time. When some command is received, the CPU breaks (2011).

(l) The CPU classifies the received command and recognizes it as a printer specification query command (2012). If the received command cannot be classified, the communication is disconnected in case of the command (2013).

(m) The CPU reads the printer specification information from the ROM memory and transmits the printer specification information through the external I/F unit (2014).

(n) The CPU of the host is in the loop for a predetermined time and waits for the reception of the printer specification information.

When it is received, the CPU breaks and exits from the loop (2015).

(o) The CPU writes the received printer specification information into the printer specification management table of the disk.

When it is not normally written in the printer specification management table or the information is not received, an error is displayed and the processing routine is finished (2016).

(p) The CPU transmits a communication disconnection command to the printer and closes the printer device (2017).

(q) The CPU of the printer is in the loop for a predetermined time. When some command is received, the CPU breaks (2018).

(r) The CPU classifies the received command. When it is the communication disconnection command or is the command which cannot be classified, the communication is disconnected (2019).

Examples of the foregoing input command specifications and a construction of the printer table are shown in FIGS. 64B and 64C.

The input command shown in FIG. 64B includes "set prn" as an identifier to inquire the printer specifications and the designated printer name and printer type number. The printer device corresponding to the above printer name, namely, the connecting place information of the printer have been stored in the printer table shown in FIG. 64C to be referred.

According to the embodiment, when the printer is connected to the host computer and the printer name and printer type number are inputted into the host computer, the detailed printer specification information is stored in the host computer by the above procedure. Therefore, there is an effect such that the troublesomeness to register the printer specification information to the host computer can be eliminated.

[Embodiment 12]

The twelfth embodiment according to the invention will now be described by using FIGS. 65 to 69B.

Terminologies will be first noted.

In the whole specification, the commands which are generated from the host computer to the printer and the command which are generated from the print server to the printer are called "printer specification information query commands", the commands which are generated from the distributed printing management server to the print server are called "printer specification query command", and both of them are distinguished and used.

A system configuration according to the embodiment will now be described by using FIG. 65.

Figure 65:
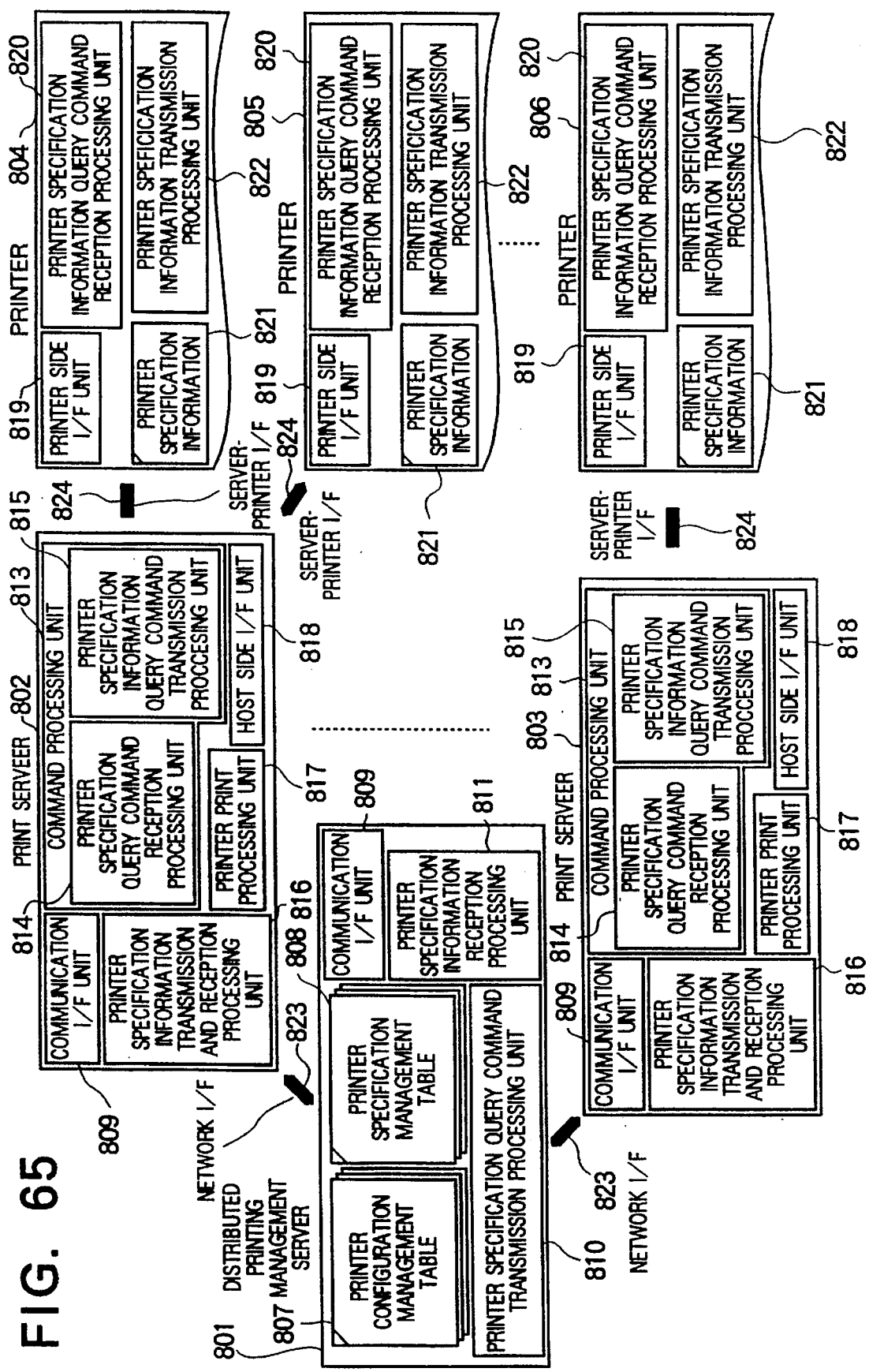
FIG. 65 is a diagram showing an example of a functional block diagram for obtaining the specification information of the printer in the printing system.

FIG. 65 is a block diagram for explaining a function construction of the embodiment 12.

It is a feature of the embodiment that the print server is arranged for the printer and the distributed printing management server is provided as a further upper apparatus of the print server, thereby unitarily managing the printer and the printer specification information.

A distributed printing management server 801 is an upper apparatus of the print server as mentioned above and is used to unitarily manage the configurations of all of the print servers and printers on the network, the status of each equipment, and the printer specifications. As shown in FIG. 65, the distributed printing management server 801 is connected to one or more print servers through a network I/F 823. The one print server can also function as a distributed printing management server by bearing the role of the distributed printing management server.

The network I/F 823 is an interface for connecting the distributed printing management server 801 and print servers 802 and 803 at positions of a communication I/F unit 809 of the distributed printing management server 801 and the communication I/F unit 809 of the print servers 802 and 803. As a protocol of the interface, the FDDI (Fiber Distributed Data Interface), Ethernet, Fast Ethernet, Token-Ring, ISDN (Integrated Services Digital Network), or the like can be used. As a configuration of the network, the LAN (Local Area Network), WAN (Wide Area Network), or the like is used.

The print servers 802 and 803 have almost the same functions as those of the host computer 101 of the embodiment 11. The print servers 802 and 803 also have a function to relay flows of data and control between the distributed printing management server and the printer. The print server and the printer are connected by a server-printer I/F. A protocol of such an interface is similar to the host-printer I/F in the embodiment 11.

Although the distributed printing management server 801 has almost the same function as that of the host computer 101 of the embodiment 1, in place of the host side I/F unit 106, there is the communication I/F unit 809 to communicate with the print servers 802 and 803. The server 801 doesn't have the function of the printer print processing unit 105. Further, it is necessary to note that there is a printer specification query command processing unit 810 in place of the printer specification information query command processing unit 107. Therefore, the configuration has a printer configuration management table 807 and a printer specification management table 808 as tables and has the communication I/F unit 809, printer specification query command transmission processing unit 810, and a printer specification information reception processing unit 811 as function units.

The printer configuration management table 807, which will be explained in detail hereinlater, is a table to manage the print servers and printers in the system and their configurations and statuses. The printer specification management table 808 is the same as the printer specification management table 104 in FIG. 57. The communication I/F unit 809 executes the processes on the distributed printing management server side to communicate between the distributed printing management server 801 and the print servers 802 and 803.

When the user inputs the printer name, printer type number, and the like to the distributed printing management server 801, the printer specification query command transmission processing unit 810 retrieves whether the same printer type number as the inputted printer type number exists in the printer specification management table 808 or not. If the same printer type number doesn't exist, the processing unit 810 has a function to transmit the printer specification query command to the print servers 802 and 803.

The printer specification information reception processing unit 811 is used to receive printer specification information 821 which is transmitted from the print servers 802 and 803. The received printer specification information 821 stores into the printer specification management table 808.

Each of the print servers 802 and 803 comprises: the communication I/F unit 809; a command processing unit 813; a printer specification information transmission and reception processing unit 816; a printer print processing unit 817; and a server side I/F unit 818.

The command processing unit 813 comprises a printer specification query command reception processing unit 814 and a printer specification information query command transmission processing unit 815.

The printer specification query command reception processing unit 814 receives the printer specification query command transmitted from the distributed printing management server 801. The printer specification information query command transmission processing unit 815 transmits the printer specification information query command to the printer 804.

The printer specification information transmission and reception processing unit 816 receives the printer specification information 821 from printers 804, 805, and 806 and transmits it to the distributed printing management server 801.

The printer print processing unit 817 forms data to be printed by the printers 804, 805, and 806.

The server side I/F unit 818 executes the processes on the server side to communicate with the printer 804 by a server-printer I/F 824.

Each of the printers 804, 805, and 806 has the same configuration as that of the printer 102 in FIG. 57.

Tables and a data structure according to the embodiment will now be described by using FIGS. 66 and 67.

FIG. 66 is an explanatory diagram of a printer configuration management table according to the invention.

Figure 67:
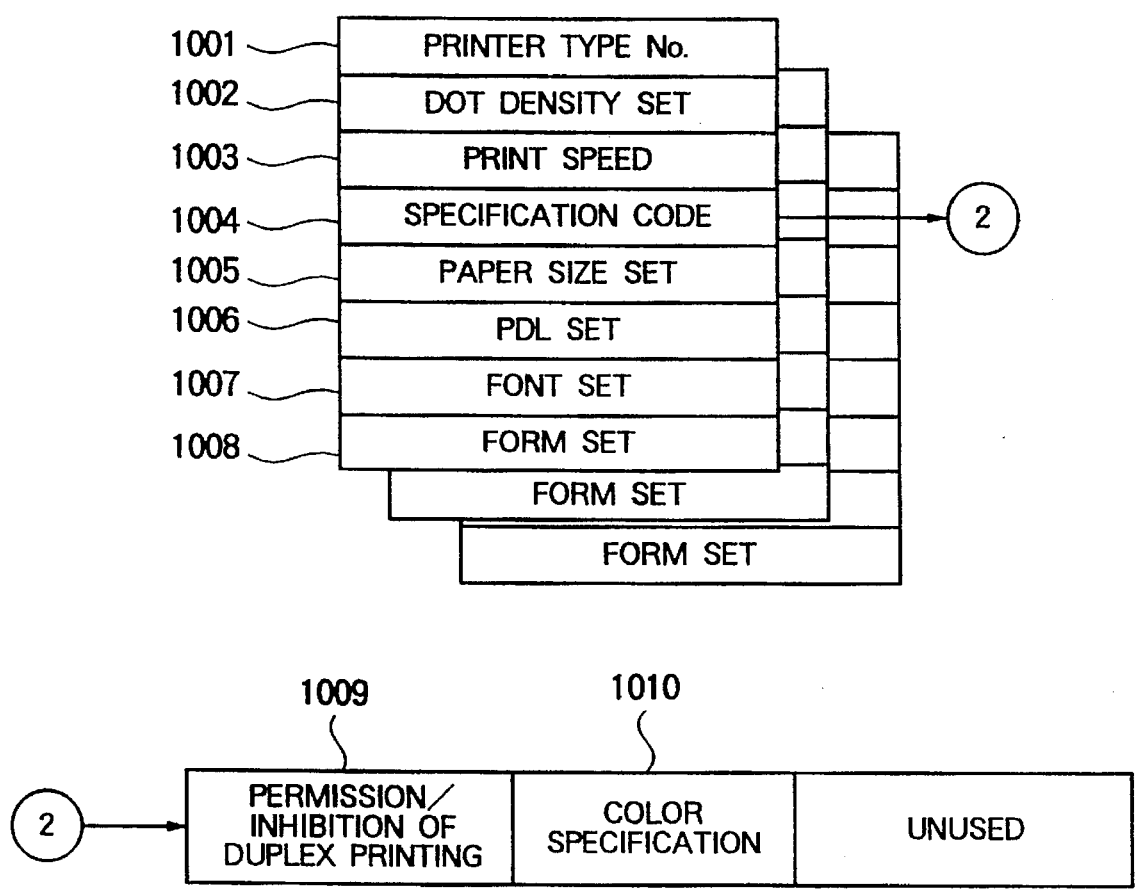
FIG. 67 is a diagram showing an example of the printer specification management table according to the invention.

FIG. 67 is an explanatory diagram of a printer specification management table according to another embodiment of the invention.

The distributed printing management server 801 holds the printer configuration management table and manages the configurations of the print servers and printers in the system and the statuses of their equipment. As shown in FIG. 66, the printer configuration management table comprises the items such as print server name, print server status, printer name, printer type number, and printer status.

The print server name and printer name express the denomination of the print server and the denomination of the printer and are described by using alphabetic characters and numerals, respectively. The print server status describes the present status of the print server such as ON/OFF of the power source, fatal error, or the like. As described in the embodiment 11, the printer type number is a code to identify the printer. In a manner similar to the embodiment 11, the printer status indicates the present printer status such as presence or absence of the error, error code, error class, or dot density, PDL, paper size, font, form, etc. selected at present.

It is now assumed that (p) printers are connected to the print server 1.

First, there are a print server 1 name 902 and a print server 1 status 903 as self information of the print server 1.

As information of the printers connected to it, tables are sequentially constructed such that from [a printer 11 name 904, a printer 11 type number 905, and a printer 11 status 906] of the first printer 11 to [a printer 1p name 907, a printer 1p type number 908, and a printer 1p status 909] of the p-th printer 1p.

Similarly, it is assumed that (q) printers are connected to the print server 2 and (r) printers are connected to the print server (i) and (s) printers are connected to the print server (n). By a similar idea, a printer configuration management table 901 has the structure shown in FIG. 66.

In the case where (n) print servers are connected to the distributed printing management server as mentioned above, the printer configuration management table 901 manages the print server names, print server statuses, printer names, printer type numbers, and printer statuses by the structure shown in FIG. 66 with respect to all of the print servers and printers connected.

As shown in FIG. 67, the contents of the printer specification management table 808 are substantially the same as those shown in the embodiment 1. When a plurality of printers are connected to the print server, there is the printer specification management table having the printer type number corresponding to each printer.

An operation procedure about the embodiment 12 will now be described by using FIG. 68.

Figure 68:
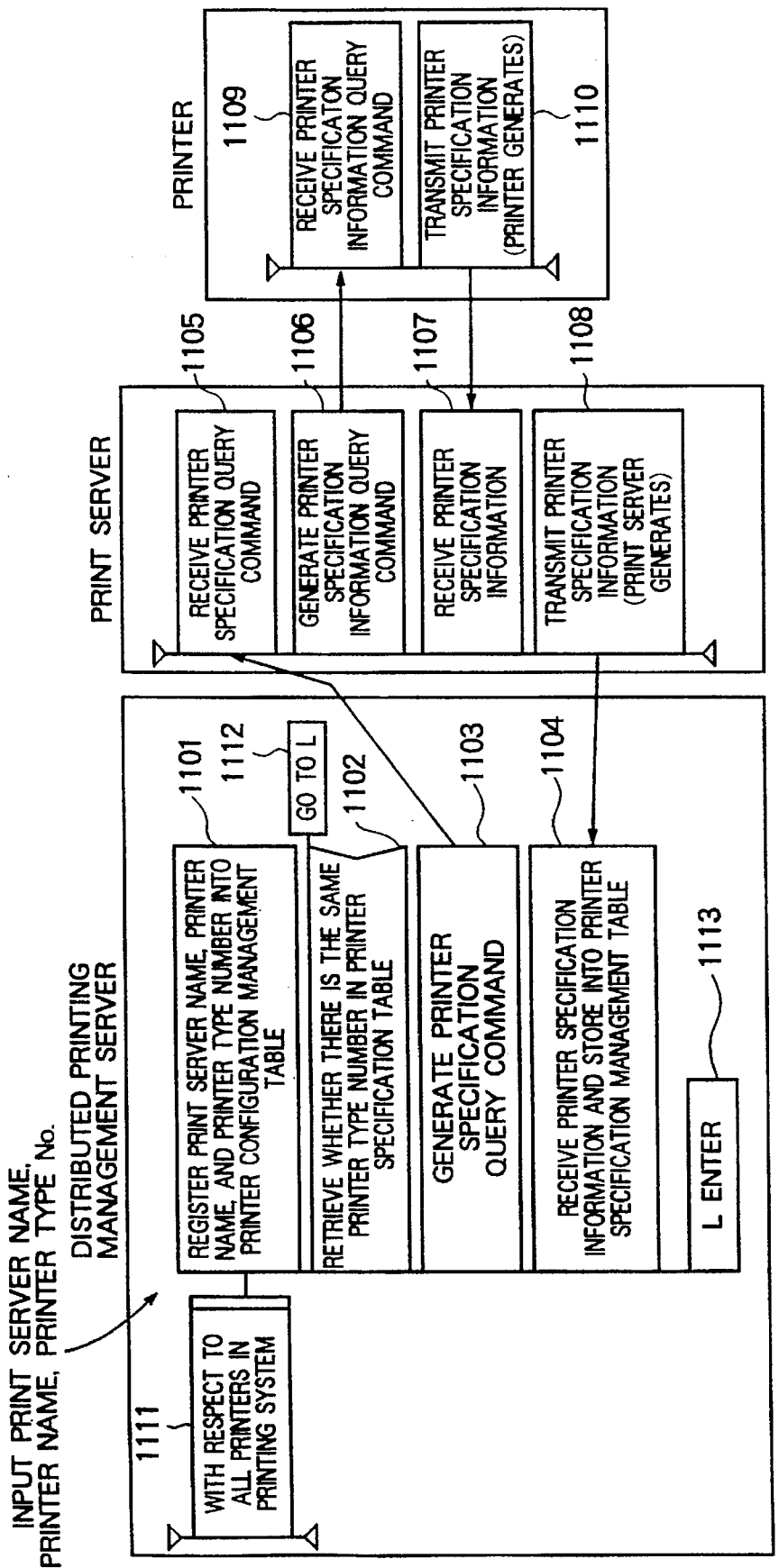
FIGS. 68, 69A, and 69B are diagrams showing procedures for obtaining the specification information of the printer.

FIG. 68 is a procedure diagram in the case where the distributed printing management server, print server, and printer are arranged and a procedure to be executed among them is shown by a PAD.

In the procedure, after the user performed the input of (b), the processes after (c) are executed in accordance with control programs of the distributed printing management server, print server, and printer.

(a) With respect to all of the printers in the printing system, the following loop from (b) to (k) are repeated (1111).

(b) The user inputs the print server names, printer names, and printer type numbers to the distributed printing management server (1101). The distributed printing management server registers the inputted print server names, printer names, and printer type numbers into the printer configuration management table (1101).

(c) The distributed printing management server retrieves whether there is the same printer type number in the printer specification management table (1102).

If there is the same printer type number, since this means that the printer specification information has already been registered, "go to L (1112)" is executed and the control is shifted to a portion written as "L enter" (1113).

If the same printer type number doesn't exist, a process (d) and subsequent processes are continued in order to obtain the printer specification information.

(d) The distributed printing management server transmits the printer specification query command to the print server (1103).

(e) The print server receives the printer specification query command from the distributed printing management server (1105).

(f) The print server generates the printer specification information query command to the printer (1106).

(g) The printer receives the printer specification information query command from the print server (1109).

(h) The printer transmits the printer specification information to the print server (1110).

(i) The print server receives the printer specification information from the printer (1107).

(j) The print server transmits the printer specification information to the distributed printing management server (1108).

Figure 69A:
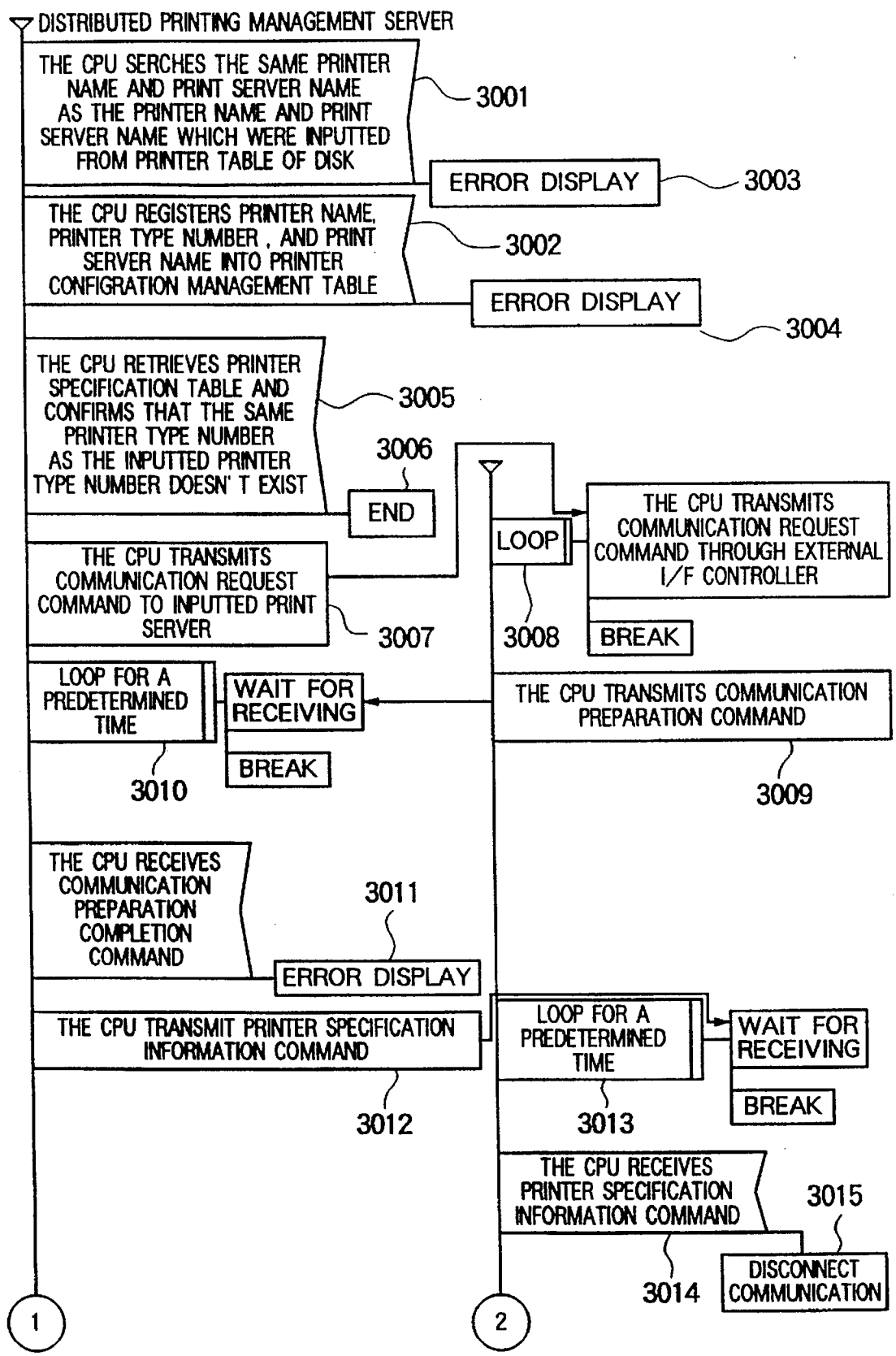
Figure 69B:
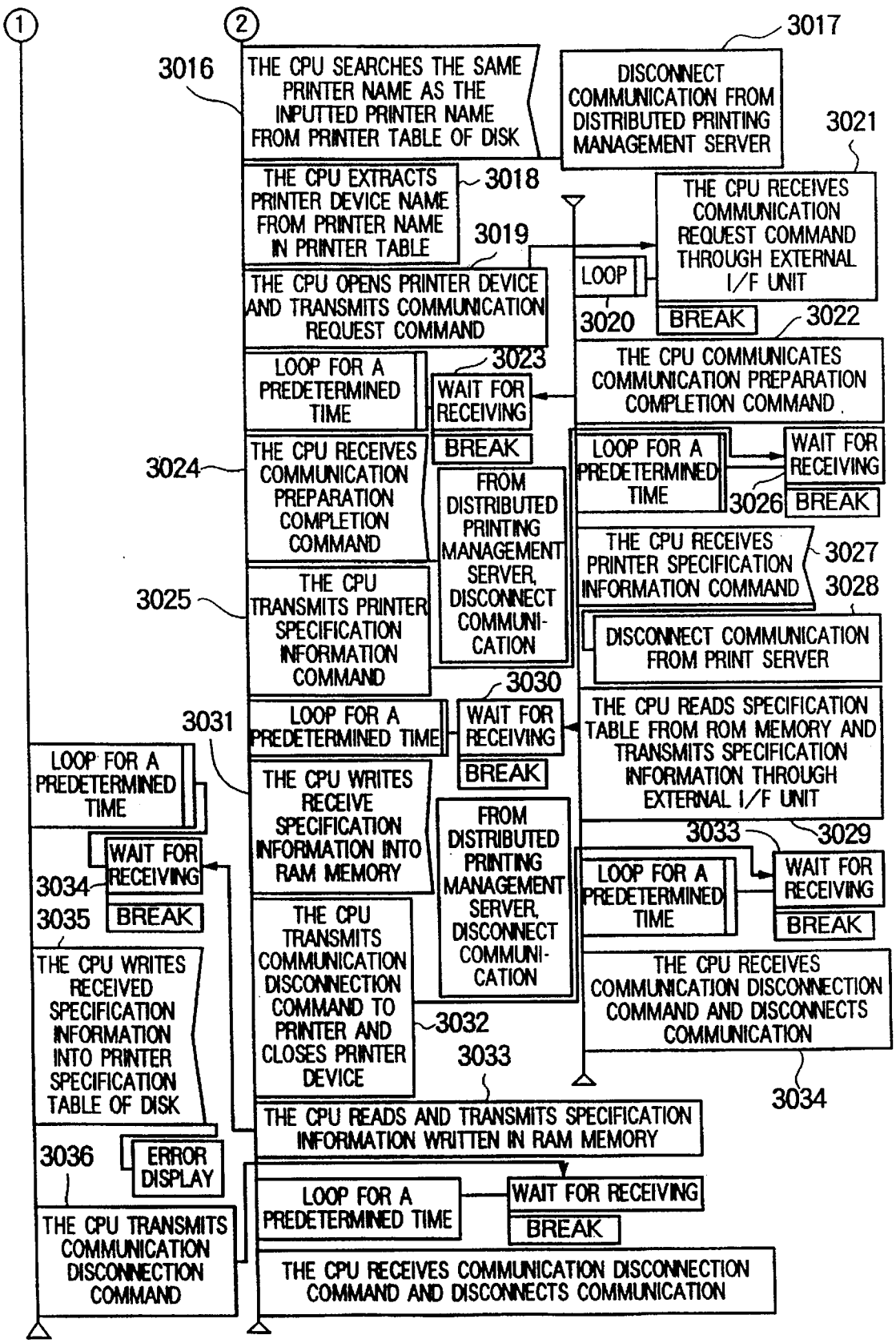

(k) The distributed printing management server receives the printer specification information. The printer specification information is stored into the printer specification management table (1104). FIGS. 69A and 69B show the above processing procedure in detail.

According to the embodiment, there is an effect such that the detailed printer specification information of not only the printers connected to one host computer but also all of the printers connected to the network can be automatically obtained.

[Embodiment 13]

The thirteenth embodiment according to the invention will now be described by using FIGS. 70 and 71.

An idea of the type of printer will be first explained. The printer type is conveniently classified in accordance with the information which the printer has.

The printer of the type 1 is a printer in which the printer specification information has been stored in its memory device.

The printer of the type 2 is a printer in which although it doesn't hold the printer specification information, the self printer type number has been held in its memory device.

The printer of the type 3 is a printer having none of the printer specification information and the printer type number.

In the embodiment 11, only the printers of the type 1 are connected to the host computer. In the embodiment 13, the printer specification information when the printers of the types 2 and 3 are connected in addition to the printer of the type 1 can be obtained.

(1) The user registers the printer name and print server name into the printer table of the distributed printing management server. The user registers the printer name and printer device name into the printer table of the print server.

(2) The user inputs "setprn_printer name_printer server name_printer type number" from the keyboard of the distributed printing management server.

(3) The CPU of the distributed printing management server searches the inputted printer name and print server name from the printer table stored in the disk (step 3001).

When the corresponding printer name and print server name don't exist, an error is displayed (step 3003).

(4) The CPU registers the printer name, printer type number, and print server name into the printer configuration management table (step 3002).

If the CPU fails the registration, an error is displayed (step 3004).

(5) The CPU retrieves the printer specification table and confirms that there is the same printer type number as the inputted printer type number (step 3005).

When there is the same printer type number as the inputted printer type number, the processing routine is finished (step 3006).

(6) The CPU transmits the communication request command to the inputted print server (step 3007).

(7) The CPU of the print server is in a loop (step 3008).

The CPU waits for reception of the communication request command through the external I/F controller. When such a command is received, the CPU breaks and exits from the loop.

(8) The CPU transmits the communication preparation command to the distributed printing management server (step 3009). (9) The CPU of the distributed printing management server is in a loop for a predetermined time. When some command is received, the CPU breaks. (step 3010)

(10) The CPU receives the communication preparation completion command. When no command is received or another command is received, an error is displayed and the processing routine is finished. (step 3011)

(11) The CPU transmits the printer specification query command to the print server (step 3012).

(12) The CPU of the print server is in a loop for a predetermined time. When some command is received, the CPU breaks. (step 3013).

(13) The CPU classifies the received command and recognizes it as a printer specification query command (step 3014).

In case of the command which cannot be classified, the communication is disconnected (step 3015).

(14) Steps 3016 to 3030 are processes similar to steps 2001 to 2010 mentioned above.

(25) The CPU writes the received specification information into the RAM memory (step 3031).

(26) Steps 3032 to 3034 are processes similar to steps 2017 to 2019 mentioned above.

(29) The CPU of the print server reads the specification information written in the RAM memory and transmits to the distributed printing specification server (step 3034).

(30) The CPU of the distributed printing management server writes the received specification information into the printer specification table of the disk (step 3035).

(31) After completion of the writing, the distributed printing management server disconnects the communication to the print server and transmits the command. The processing routine is finished. (step 3036).

First, a function construction of the third embodiment according to the invention will be described by using FIG. 70.

Figure 70:
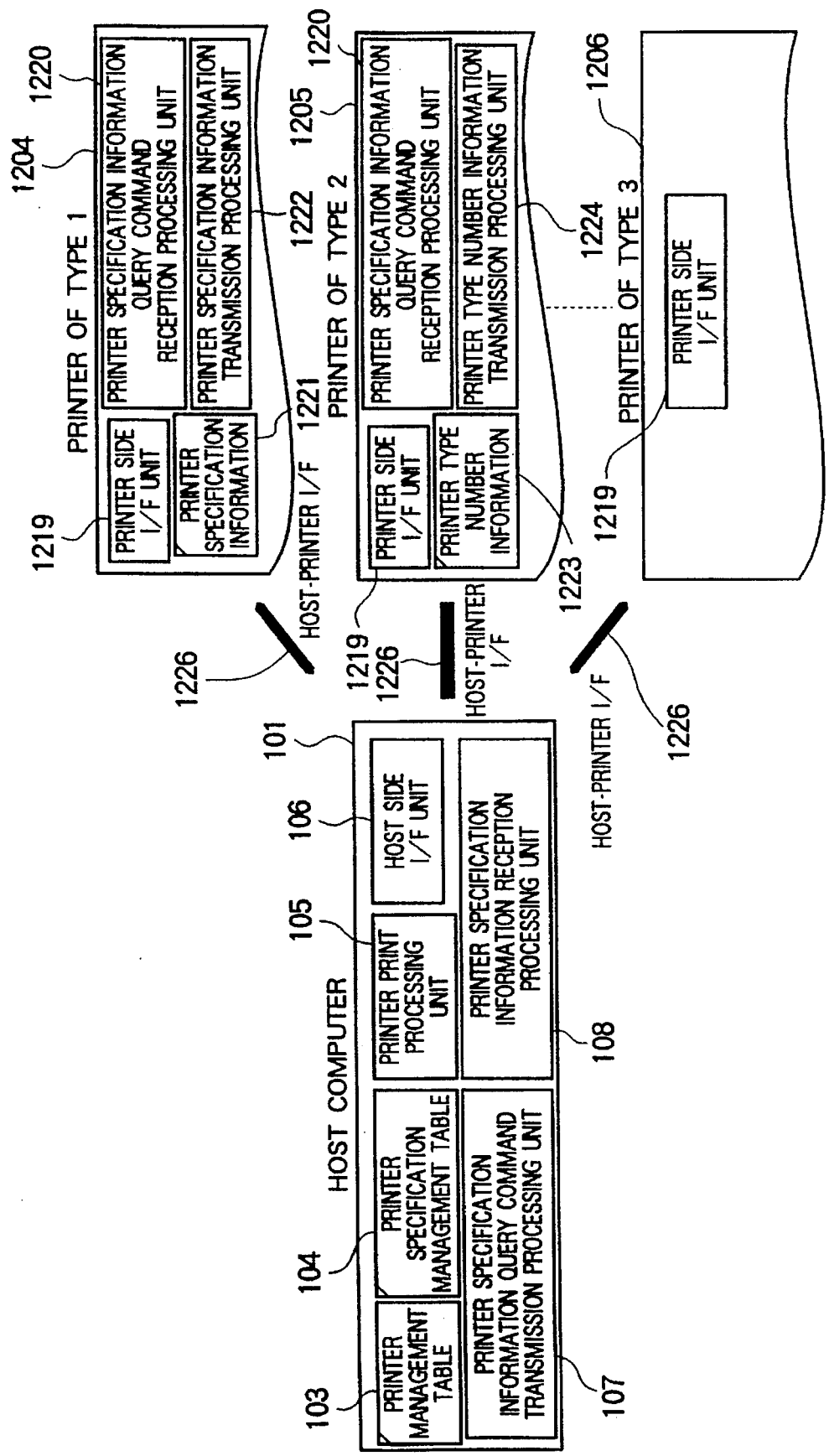
FIG. 70 is a diagram showing an example of a functional block diagram for obtaining the specification information of the printer in the printing system.

FIG. 70 is a block diagram for explaining the function construction of the embodiment 13.

Although the system configuration of the embodiment 13 is based on the configuration of the embodiment 11, it differs with respect to a point that in addition to the printer of the type 1, the printers of the types 2 and 3 are connected to the host computer 101 as printers to be connected. Since a plurality of printers are connected, it should be noted that there are also a plurality of printer management tables and printer specification management tables.

Further, in the configuration of a printer 1205 of the type 2, although printer specification information 1221 has been used in the printer of the type 1, it is replaced to printer type number information 1223. A printer 1206 of the type 3 doesn't hold the printer specification information 1221 and printer type number information 1223 and also doesn't have the portion regarding the commands from the host computer 101.

An operation procedure diagram about the embodiment 13 will now be described by using FIG. 71.

Figure 71:
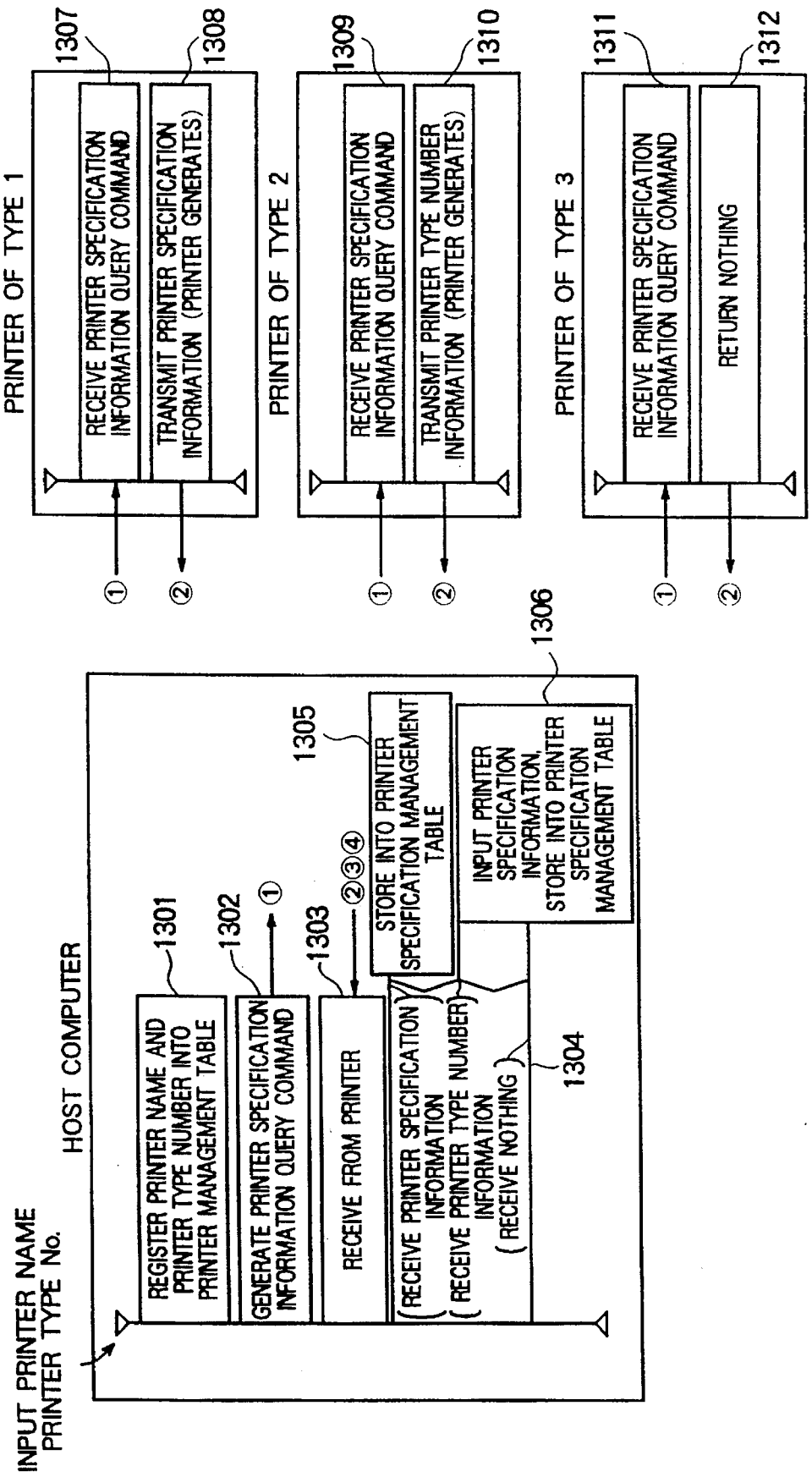
FIGS. 71 and 72 are diagrams showing procedures for obtaining the specification information of the printer.

FIG. 71 is a procedure diagram in the case where the host computer and the printers of the types 1, 2, and 3 are arranged and a procedure to be executed among them is shown by a PAD.

Although the procedure is based on that of the embodiment 11, it differs with respect to a point that the type of the printer which communicated is discriminated in step 1304 and that, in case of the types 2 and 3, the user inputs the printer specification information by himself. Processes of the printers of the types 2 and 3 obviously differ from those of the type 1.

Explanation will now be sequentially made hereinbelow in accordance with the order in FIG. 71.

In the procedure, after the user performed the input of (a), a process (b) and subsequent processes are automatically executed in accordance with the control programs of the host computer and printer. Even in (e), the user also inputs.

(a) The user inputs the printer name and printer type number into the host computer. The host computer registers the printer name and printer type number into the printer management table (1301).

(b) The printer specification information query command transmission processing unit of the host computer generates the printer specification query command to the printer (1302).

(c) The printer receives the printer specification information query command (1307, 1308, 1309).

In the printers of the types 1 and 2, the printer specification information query command reception processing unit receives the printer specification information query command from the host computer (1307, 1309).

The printer of the type 1 transmits the printer specification information to the host computer (1308).

The printer of the type 2 transmits the printer type number information to the host computer (1310).

The printer of the type 3 returns nothing (1312) even when it receives the printer specification query command from the host computer (1311).

(d) The host computer receives the printer specification information from the printer of the type 1. In case of the printer of the type 2, the printer type number information is received (1303).

(e) When the printer specification information is received, it is stored into the printer specification management table (1305).

When the printer type number information is received or when nothing is received, the host computer promotes the user to input. When the user inputs the printer specification information, the host computer stores it into the printer specification management table (1306).

Figure 72:
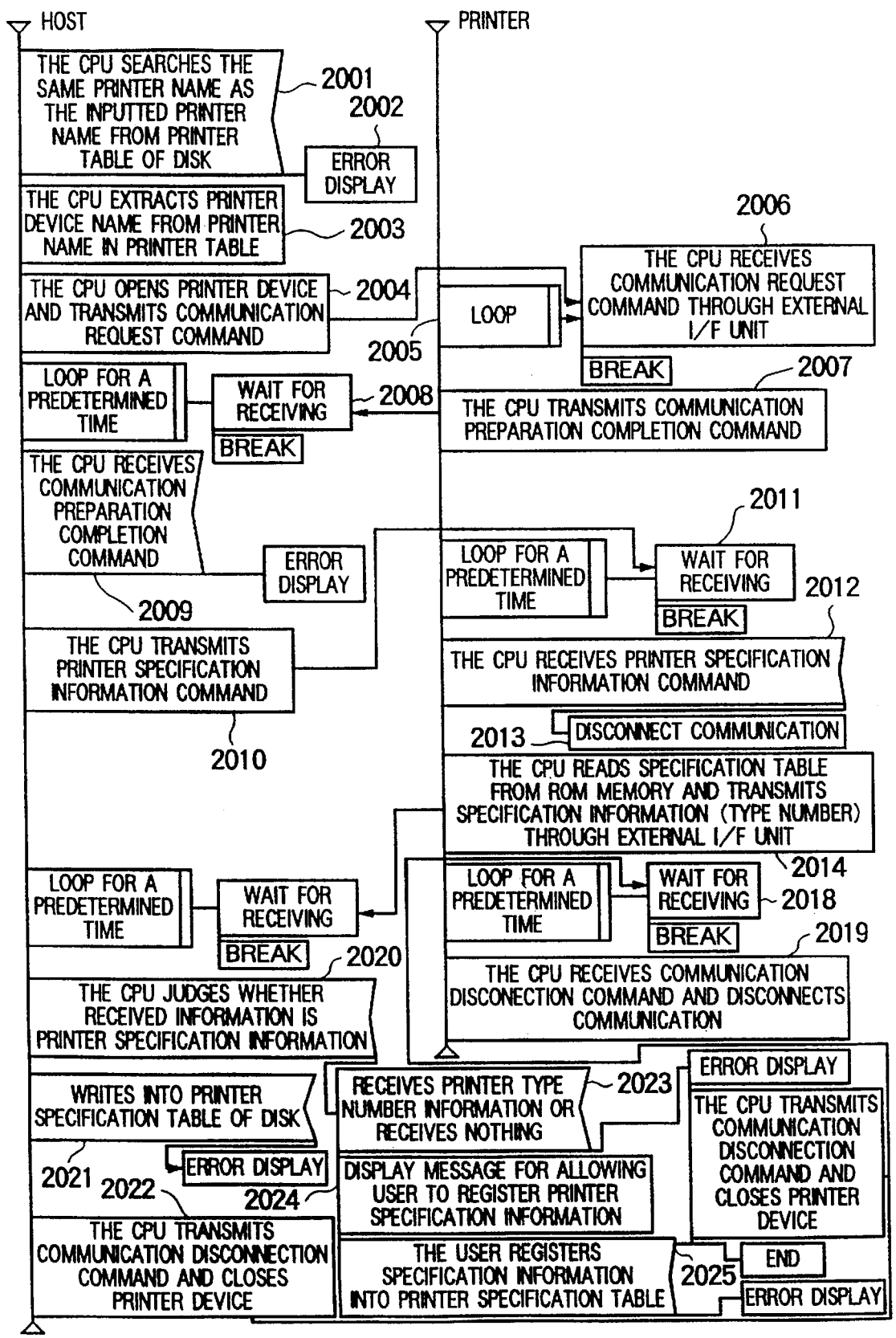

FIG. 72 shows the above processing procedure in detail.

Steps 2001 to 2019 shown in FIG. 72 are processes similar to the processing procedures shown in FIGS. 64A to 64C. Processing procedures different from FIGS. 64A to 64C will now be described.

(15) The CPU discriminates whether the received information is the printer specification information or not (step 2020).

(16) In step 2020, when it is judged that the received information is the printer specification information, the CPU writes it into the printer specification table stored in the disk (step 2021).

(17) The CPU transmits the communication disconnection command to the printer and closes the printer device (step 2022).

(18) When the communication disconnection command from the host computer is received, the printer executes the processes in steps 2018 to 2019 mentioned above.

(19) When it is judged that the information received in step 2020 is not the printer specification information, an error is displayed (step 2023).

In this case, it is also possible to construct in a manner such that a timer is provided for the host computer and, when there is no response for a predetermined time, it is judged that the printer specification information is not received.

(20) In the case where the received printer specification information is merely a partial information such as a printer type number or the like, the necessity to register the printer specification information is informed or displayed to the user (step 2024).

(21) When the user understands that it is necessary to register the printer specification information in step 2024, the user registers the relevant printer specification information by using the keyboard (step 2025).

According to the embodiment, by making the procedure different in accordance with the type of printer, the printer specifications of the printers of all types can be smoothly obtained. Namely, by discriminating a response from the printer, the printer specification information is automatically registered into the printer specification management table of the host computer in case of the printer of the type 1 in a manner similar to the embodiment 1. Or, in case of the printers of the types 2 and 3, by inputting the printer specification information by the user, the printer specification information is registered into the printer specification management table of the host computer.

[Embodiment 14]

The fourteenth embodiment according to the invention will now be described by using FIGS. 73 and 74.

The embodiment 13 relates to the system in which the printers of the types 1, 2, and 3 are connected to the host computer. On the other hand, the embodiment 14 relates to a system configuration comprising the distributed printing management server, print servers, and printers shown in the embodiment 12, in which the printers of the types 1, 2, and 3 are used.

Figure 73:
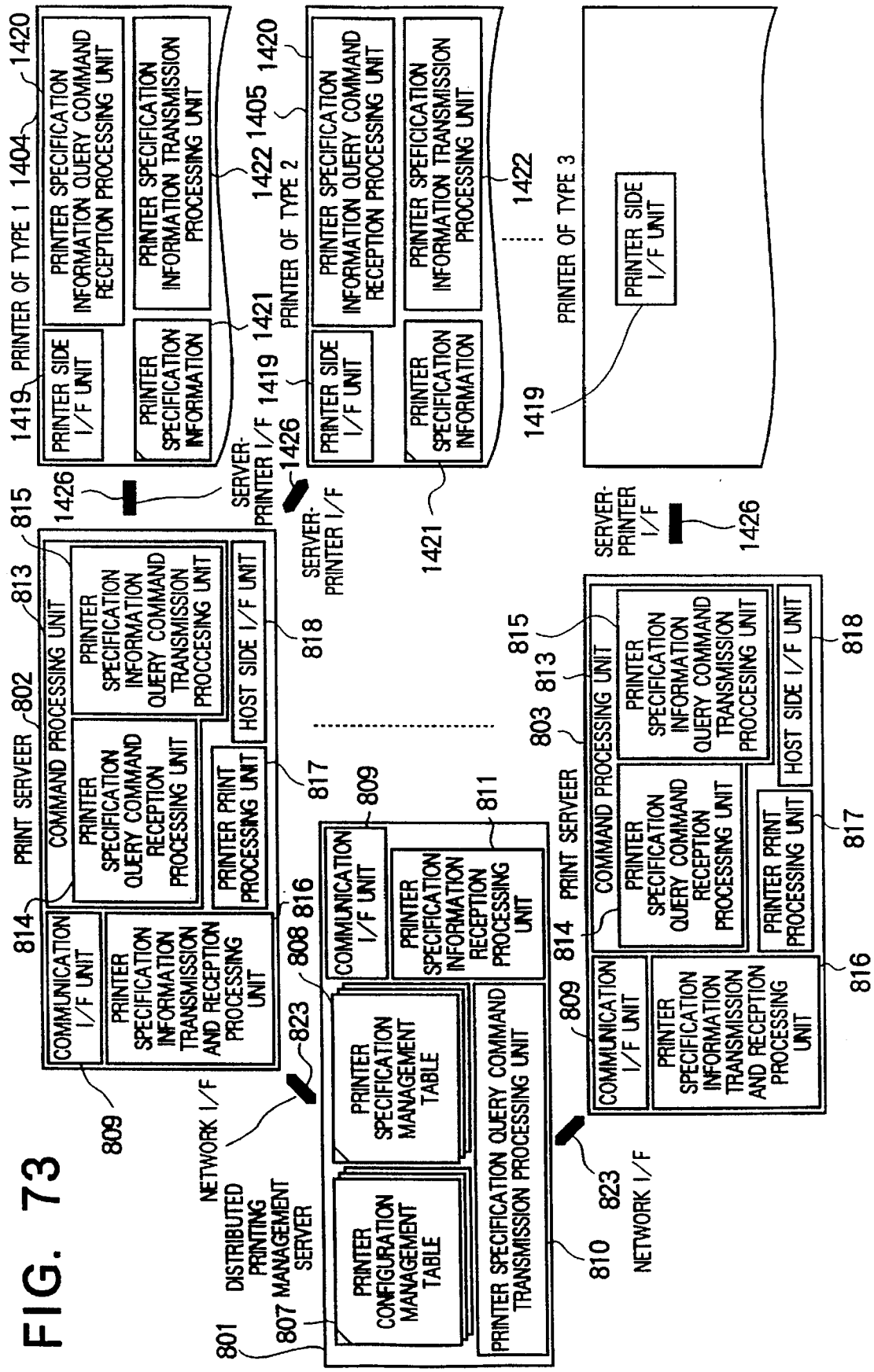
FIG. 73 is a diagram showing an example of a functional block diagram for obtaining the specification information of the printer in the printing system.

A function construction of the 14th embodiment according to the invention will be first described by using FIG. 73.

FIG. 73 is a block diagram for explaining the function construction of the embodiment 14.

Although a system configuration of the embodiment 14 is based on the configuration of the embodiment 12, it differs with respect to a point that in addition to the printer of the type 1, the printers of the types 2 and 3 are connected as printers to be connected to the print server in the system. The configuration on the printer side is similar to the embodiment 3. Namely, in the configuration of a printer 1405 of the type 2, although printer specification information 1421 has been used for the printer of the type 1, it is replaced to the printer type number information 1423. A printer 1406 of the type 3 doesn't hold the printer specification information 1421 and printer type number information 1423 and also doesn't have the portion to process a command from a print server 1403.

An operation procedure diagram about the embodiment 14 will now be described by using FIG. 74.

Figure 74:
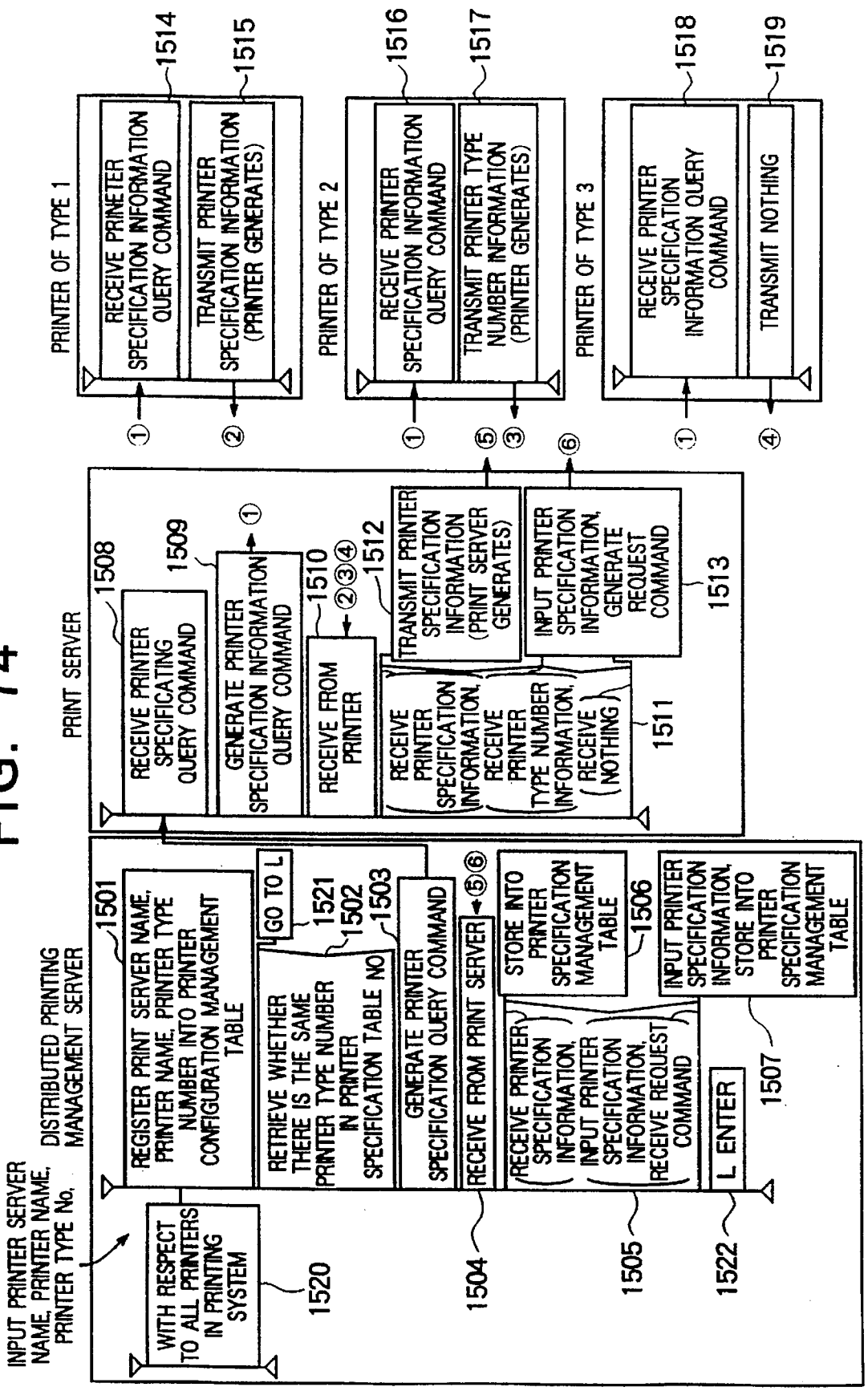
FIGS. 74, 75A, and 75B are diagrams showing procedures for obtaining the specification information of the printer.

FIG. 74 is a procedure diagram in the case where the distributed printing management server, print server, and printers of the types 1, 2, and 3 are arranged and a procedure to be executed among them is shown by a PAD.

Although the procedure is based on the embodiment 12, it differs with respect to a point that as executed in the embodiment 13, the type of the printer which communicated is discriminated in step 1511 and in case of the types 2 and 3, the user inputs the printer specification information by himself to the distributed printing management server. The processes of the printers of the types 2 and 3 obviously differ from those of the type 1.

Explanation will now be made hereinbelow in accordance with the order in FIG. 74.

In the procedure, after the user performed the input of (b), a process of (c) and subsequent processes are automatically executed in accordance with the control programs of the distributed printing management server, print server, and printers. The user also inputs in (k).

(a) With respect to all of the printers in the printing system, the following loop from (b) to (k) is repeated (1520).

(b) The user inputs the print server name, printer name, and printer type number to the distributed printing management server. The distributed printing management server registers the print server name, printer name, and printer type number into the printer configuration management table (1501).

(c) The distributed printing management server retrieves whether there is the same printer type number in the printer specification management table or not (1502).

When there is the same printer type number, since this means that the printer specification information has already been registered, "go to L (1520)" is executed and the control is shifted to the portion written as "L enter" (1522).

If there is not the same printer type number, in order to obtain the printer specification information, a process (d) and subsequent processes are continued.

(d) The distributed printing management server generates the printer specification query command to the print server (1503).

(e) The print server receives the printer specification query command from the distributed printing management server (1508).

(f) The print server generates the printer specification information query command to the printer (1509).

(g) The printer receives the printer specification information query command from the print server (1514, 1516, 1518).

In the printers of the types 1 and 2, the printer specification query command reception processing unit receives the printer specification query command from the print server (1514, 1516).

The printer of the type 1 transmits the printer specification information to the print server (1515).

The printer of the type 2 transmits the printer type number information to the print server (1517).

The printer of the type 3 returns nothing (1519) even if the printer specification query command is received from the host computer (1518).

(h) The print server receives the printer specification information from the printer of the type 1. In case of the printer of the type 2, the printer type number information is received (1510).

(i) When the printer specification information is received, the print server transmits the printer specification information to the distributed printing management server (1512).

When the printer type number information is received or when nothing is received, the print server generates the printer specification information input request command (1513).

(j) The distributed printing management server receives the printer specification information or the printer specification information input request command from the print server (1504).

(k) When the printer specification information is received, it is stored into the printer specification management table (1506).

When the printer specification information input request command is received, the distributed printing management server promotes the user to input. When the user inputs the printer specification information, the distributed printing management server stores it into the printer specification management table (1507).

A method of realizing a format of the printer specification query command that is transmitted and received between the distributed printing management server and the print server will now be described.

In (d) of the above procedure, the printer specification query command can be realized by the following two kinds of methods.

(i) The printer specification query commands which are generated to the printers of the types 1 and 2 are set to the commands of the same format.

(ii) The indication parameters of the command that is generated to the printer of the type 1 and the command that is generated to the printer of the type 2 are made different. The printer specification query command to the type 1 is allowed to have a meaning to request the transmission of the printer type number information and the printer specification information other than the printer type number information. The printer specification query command to the type 2 is allowed to have a meaning to request only the printer type number information.

The printer specification query command is handed over to the printer specification information query command from the print server to the printer by almost the same format.

In case of (ii), however, in the case where the target printers are the printers 1 and 2, it is necessary to form different commands as commands which are formed by the distributed printing management server. Therefore, it is necessary that the distributed printing management server previously knows which one of the types 1 and 2 the printer is.

In the embodiment, it is considered that it is desirable to use (i) because the distributed printing management server doesn't need to previously know the type of each printer.

Figure 75A:
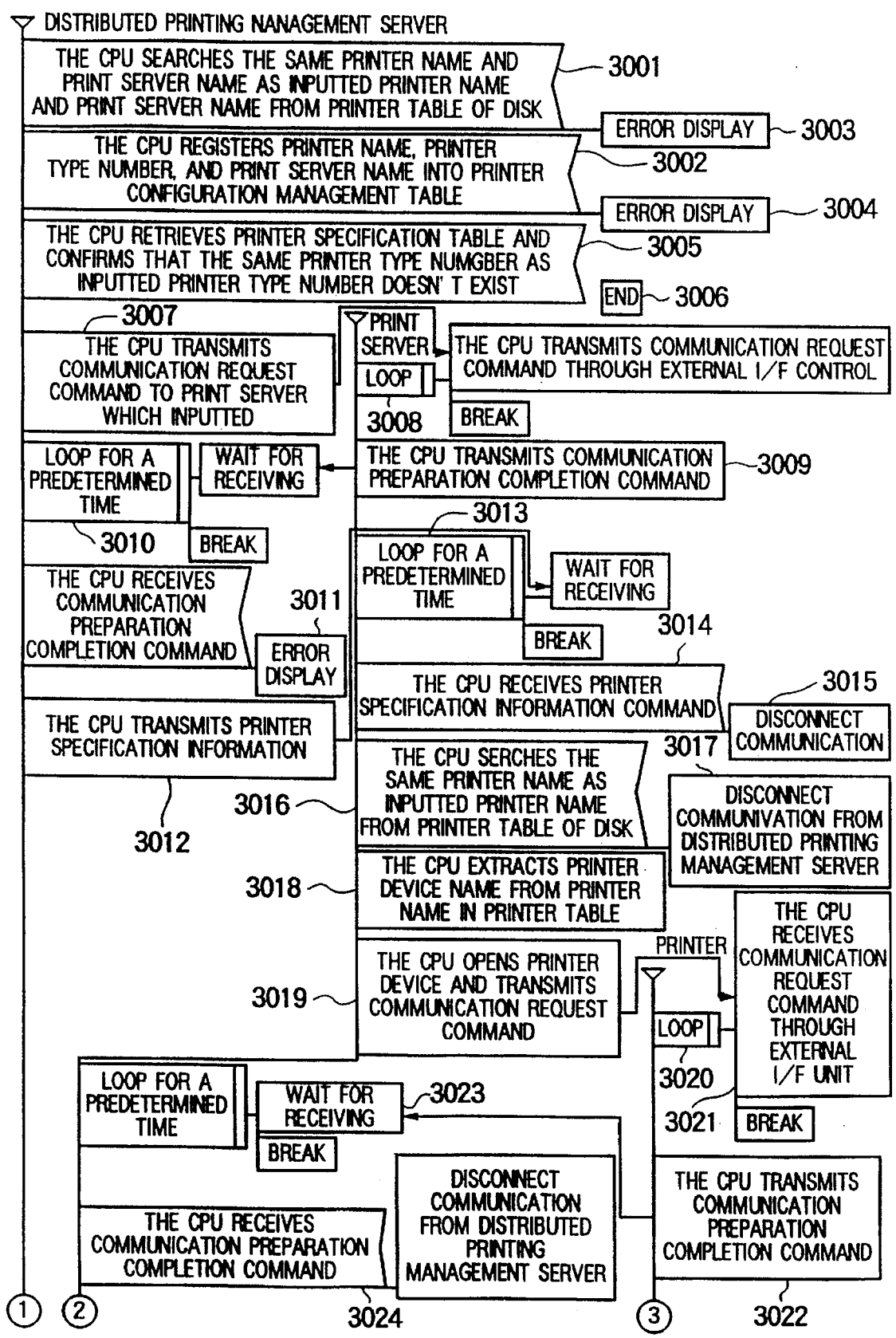
Figure 75B:
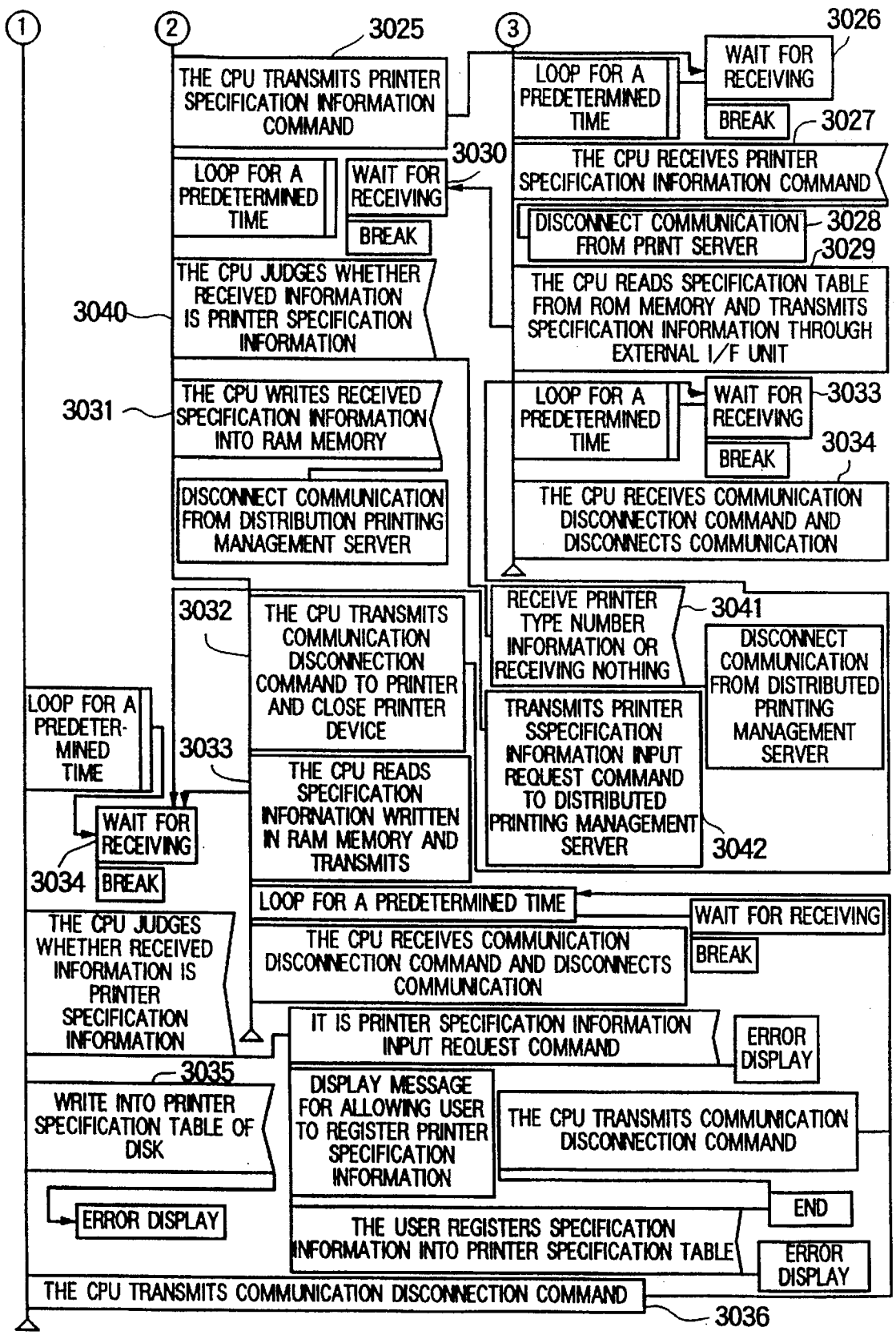

FIGS. 75A and 75B show the foregoing processing procedures in detail.

Processes shown in FIGS. 75A and 75B are almost similar to the processes of FIG. 72 mentioned above. Only different points are shown below.

Specifically speaking, the following steps are added between steps 3030 and 3031.

(1) The CPU judges whether the received information is printer specification information or not (step 3040).

(2) In step 3040, when it is judged that the printer specification information is not received or the received information is only a part of the printer specification information, the next step is processed (step 3041).

(3) The distributed printing management server transmits the input request command of the printer specification information (step 3042).

Further, processes shown in steps 2020 to 2025 shown in FIG. 72 are executed between the distributed printing management server and the print server.

According to the embodiment, even in the network configuration comprising the distributed printing management server, print server, and printers with a configuration similar to the embodiment 12, the printers of the types 1, 2, and 3 can be connected. By making the processes different in accordance with the type of the printer in a manner similar to the embodiment 13, the specifications of the printers can be smoothly obtained.

[Embodiment 15]

The fifteenth embodiment according to the invention will now be described by using FIGS. 73 and 76 to 80.

It is a feature of the embodiment 15 that in the case where there are the types 1, 2, and 3 as types of the printers in the network system comprising the distributed printing management server, print server, and printers as in the embodiment 14, the type of printer is previously judged and only in the necessary case, the printer specification query command is generated to the print server and the printer specification information query command is generated to the printer.

[Embodiment 15-1]

One of the configurations of the fifteenth embodiment according to the invention will now be described hereinbelow by using FIGS. 73 and 76.

A function configuration of the embodiment 15-1 is similar to that shown in FIG. 73 of the embodiment 14.

An operation procedure of the embodiment 15-1 will now be described by using FIG. 76.

Figure 76:
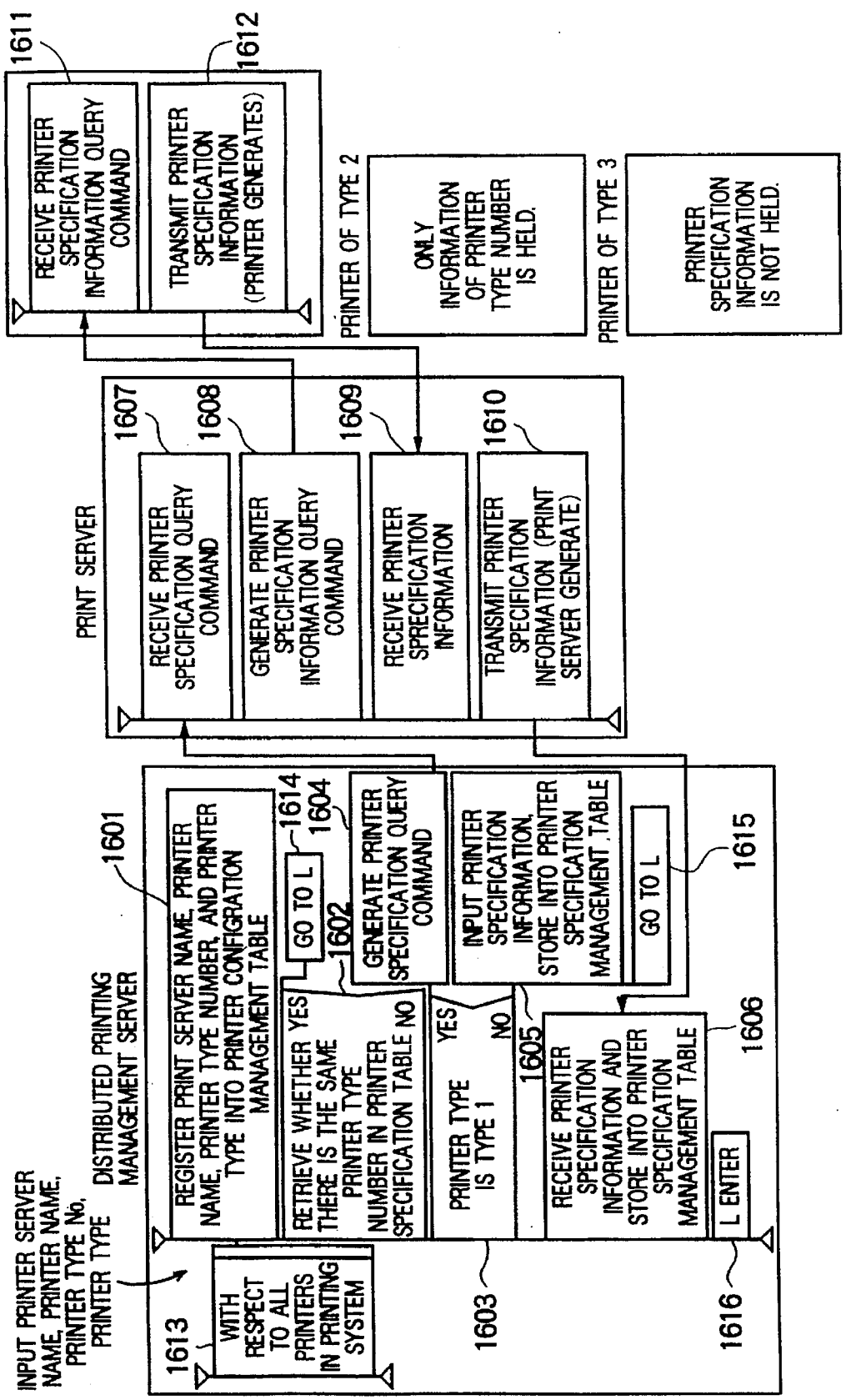
FIGS. 76 and 77 are diagrams showing examples of functional block diagrams for obtaining the specification information of the printer in the printing system.

FIG. 76 is a procedure diagram in the case where the distributed printing management server, print server, and printers of the types 1, 2, and 3 are arranged and a procedure to be executed among them is shown by a PAD.

An operation procedure of the embodiment 15-1 differs from the embodiment 14 with respect to a point that the user previously inputs the type of printer and the distributed printing management server generates the printer specification query command only in case of the type 1.

Explanation will now be made hereinbelow in accordance with the order of FIG. 76.

In the procedure, after the user performed the input of (b), a process of (c) and subsequent processes are automatically executed in accordance with the control programs of the distributed printing management server, print server, and printers. The user also inputs in (m).

(a) With respect to all of the printers in the printing system, the following loop of (b) to (m) is repeated (1613).

(b) The user inputs the print server name, printer name, printer type number, and printer type to the distributed printing management server. The distributed printing management server registers the print server name, printer name, and printer type number to the printer configuration management table (1601). The printer type is used to check whether the printer specification query command is generated or not in the following step (d).

(c) The distributed printing management server retrieves whether there is the same printer type number in the printer specification management table or not (1602).

If there is the same printer type number, since this means that the printer specification information has already been registered, "go to L (1614)" is executed and the control is shifted to the portion written as "L enter" (1616).

When there is not the same printer type number, a process (d) and subsequent processes are continued in order to obtain the printer specification information.

(d) When the printer type inputted in the process (b) is the type 1 (1603), the distributed printing management server generates the printer specification query command to the print server (1604).

When the printer type inputted in the process (b) is other than the type 1, namely, when it is the type 2 or 3 (1603), the following process (m) is executed.

(e) The print server receives the printer specification query command from the distributed printing management server (1607).

(f) The print server generates the printer specification information query command to the printer (1608).

(g) The printer receives the printer specification query command from the printer server (1611).

(h) The printer transmits the printer specification information to the print server (1612).

(i) The print server receives the printer specification information from the printer (1609).

(j) The print server transmits the printer specification information to the distributed printing management server (1610).

(k) The distributed printing management server receives the printer specification information from the print server (1604).

(l) The received printer specification information is stored into the printer specification management table (1606).

(m) The distributed printing management server promotes the user to input. When the user inputs the printer specification information, the distributed printing management server stores it into the printer specification management table (1607). "go to L (1615)" is executed and the control is shifted to the portion written as "L enter" (1616).

[Embodiment 15-2]

Another one of the configurations of the fifteenth embodiment according to the invention will now be described hereinbelow by using FIGS. 77 to 79.

Figure 77:
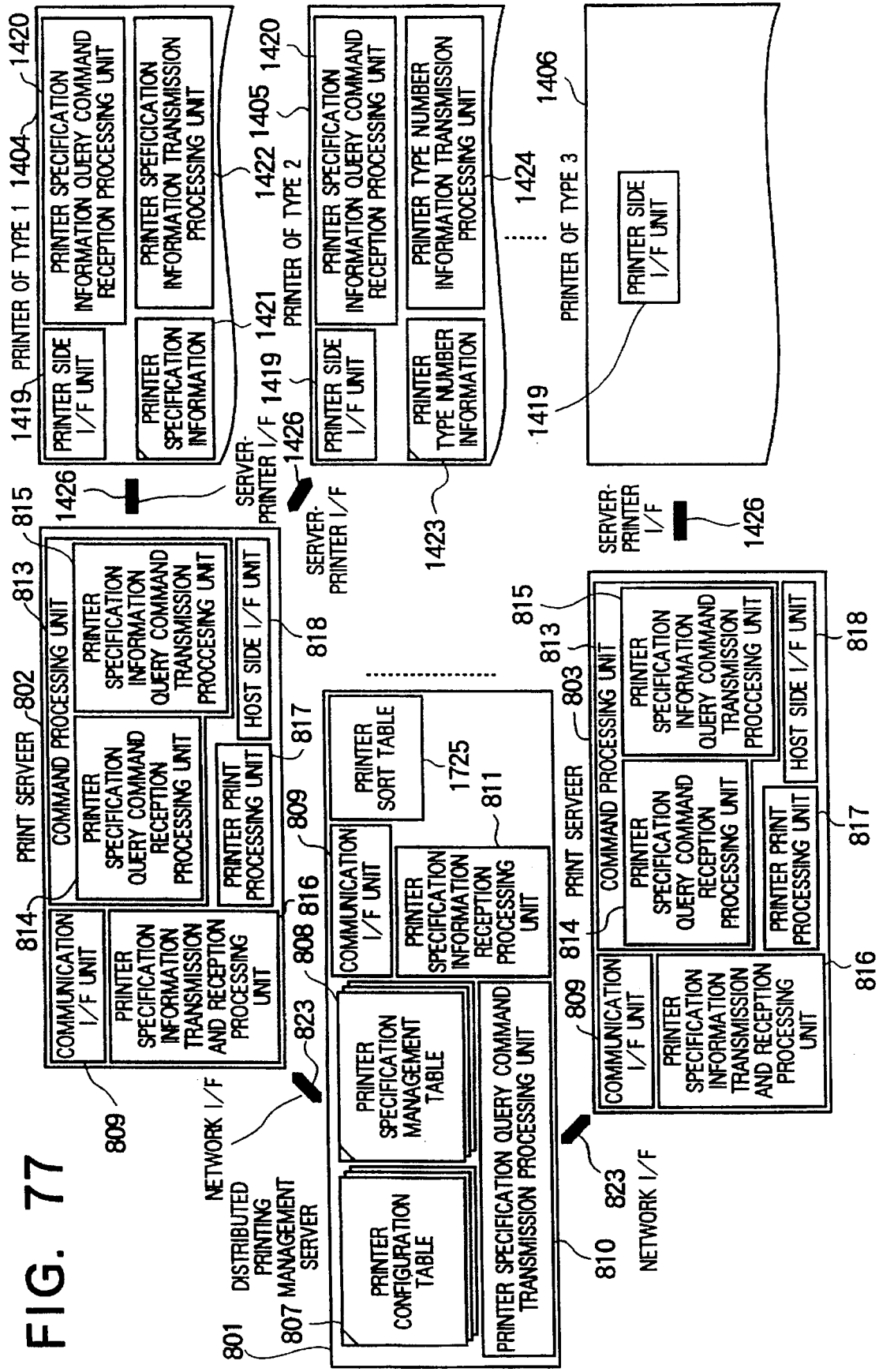

A function construction of an embodiment 15-2 will be first described by using FIG. 77.

FIG. 77 is a block diagram for explaining the embodiment 15-2.

Although the function construction of the embodiment 15-2 is almost the same as the embodiment 14, it differs with respect to a point that the distributed printing management server has a printer specification sort table 1725. That is, although the printer type has been inputted by the user in the embodiment 15-1, the sort of printer is obtained by retrieving the table in the embodiment 15-2.

FIG. 78 is an explanatory diagram of the printer sort table according to the invention.

As will be also obviously understood from the diagram, the printer type number is classified by the type of printer.

An operation procedure of the embodiment 15-2 will now be described by using FIG. 79.

Figure 79:
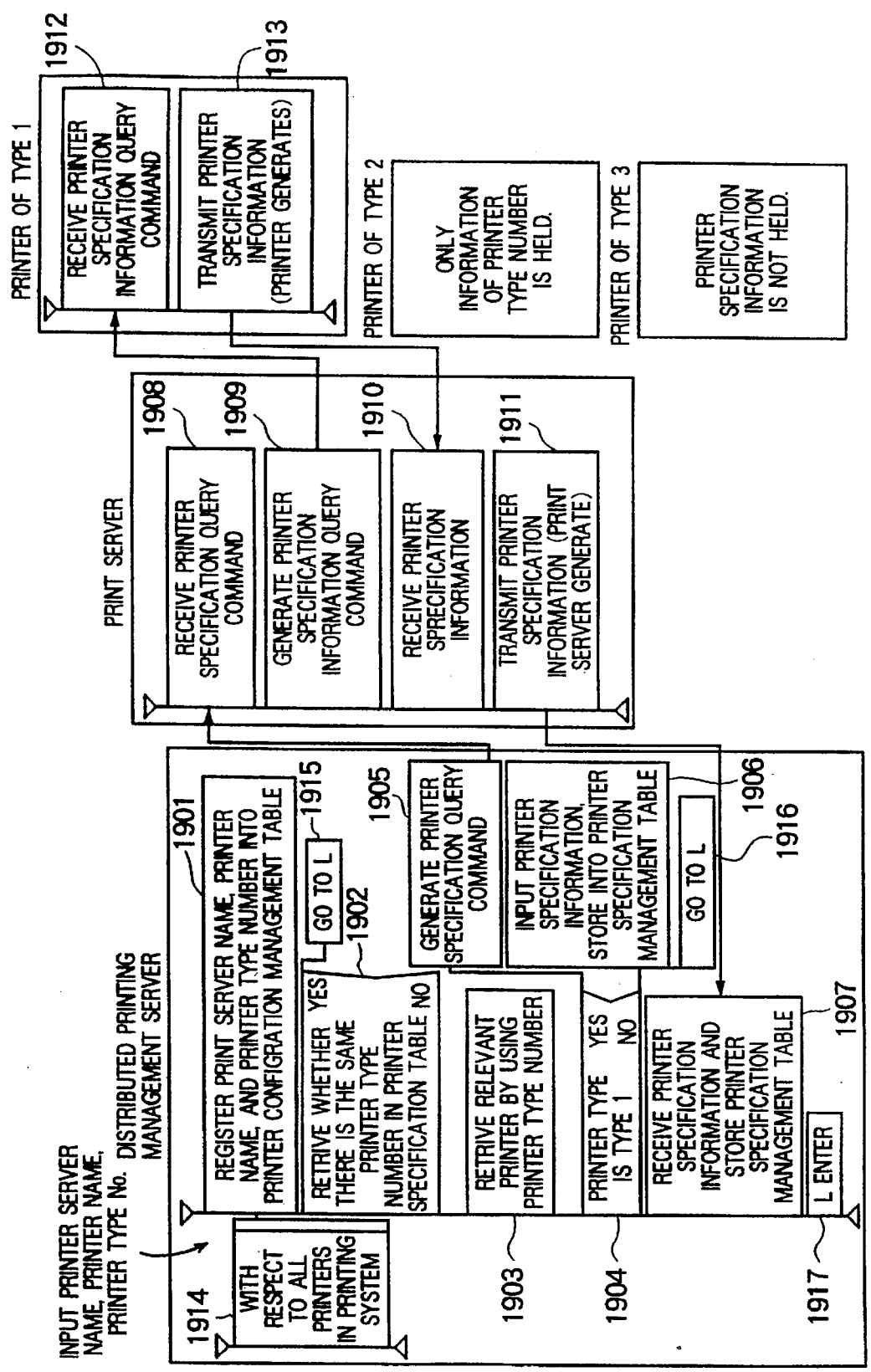
FIG. 79 is a diagram showing a procedure for obtaining the specification information of the printer.

FIG. 79 shows a procedure diagram in the case where the distributed printing management server, print server, and printers of the types 1, 2, and 3 and a procedure to be executed among them is shown by a PAD.

The operation procedure in the embodiment 15-2 differs from the embodiment 15-1 with respect to a point that the user doesn't previously input the type of printer but the distributed printing management server obtains the printer type by retrieving the printer sort table by using the inputted printer type number.

Explanation will now be sequentially made hereinbelow in accordance with the order in FIG. 79.

In the procedure, after the user performed the input of (b), a process (c) and subsequent processes are automatically executed in accordance with the control programs of the distributed printing management server, print server, and printers. The user also inputs even in (m).

(a) With respect to all of the printers in the printing system, the following loop of (b) to (m) is repeated (1914).

(b) The user inputs the print server name, printer name, and printer type number to the distributed printing management server. The distributed printing management server registers the print server name, printer name, and printer type number into the printer configuration management table (1901). The printer type is used to judge whether the printer specification query command is generated or not in the following step (e).

(c) The distributed printing management server retrieves whether there is the same printer type number in the printer specification management table or not (1902).

When there is the same printer type number, since this means that the printer specification information has already been registered, "go to L (1915)" is executed and the control is shifted to the portion written as "L enter" (1917).

When there is not the same printer type number, a process (d) and subsequent processes are continued in order to obtain the printer specification information .

(d) The printer sort table is retrieved by using the printer type number, thereby obtaining the printer type (1903). The printer type is used to judge whether the printer specification query command is generated or not in the following step (e).

(e) When the printer type obtained in the process (d) is the type 1 (1904), the distributed printing management server generates the printer specification query command to the print server (1905).

When the printer type obtained in the process (d) is other than the type 1, namely, when it is the type 2 or 3 (1903), a process (m) and subsequent processes are executed.

(f) The print server receives the printer specification query command from the distributed printing management server (1908).

(g) The print server generates the printer specification information query command to the printer (1909).

(h) The printer receives the printer specification information query command from the print server (1912).

(i) The printer transmits the printer specification information to the print server (1913).

(j) The print server receives the printer specification information from the printer (1910).

(k) The print server transmits the printer specification information to the distributed printing management server (1911).

(l) The distributed printing management server receives the printer specification information from the print server and the received printer specification information is stored into the printer specification management table (1907).

(m) The distributed printing management server promotes the user to input. When the user inputs the printer specification information, the distributed printing management server stores it into the printer specification management table (1906). "go to L (1916)" is executed and the control is shifted to the portion written as "L enter" (1917).

[Embodiment 15-3]

Still another configuration of the fifteenth embodiment according to the invention will be described hereinbelow by using FIGS. 80 and 81.

First, a function construction of the embodiment 15-3 will be described by using FIG. 80.

Figure 80:
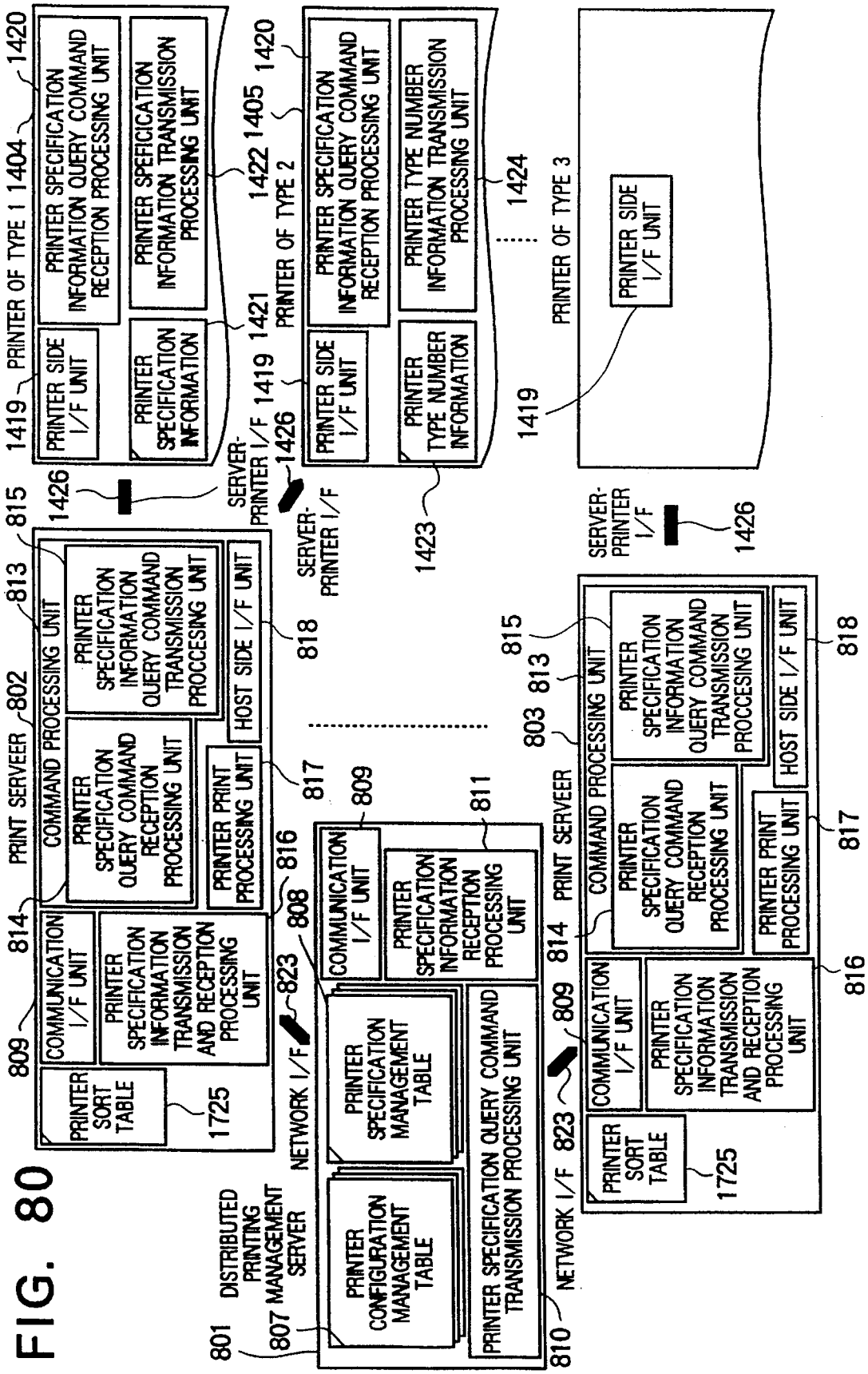
FIG. 80 is a diagram showing an example of a functional block diagram for obtaining the specification information of the printer in the printing system.

FIG. 80 is a block diagram for explaining the embodiment 15-3.

Although the function construction of the embodiment 15-3 is substantially the same as the embodiment 15-2, it differs with respect to a point that although the printer specification sort table 1725 has been provided in the distributed printing management server in the embodiment 15-2, it is provided in the print server in the embodiment 15-2. Namely, although the printer type has been obtained in the distributed printing management server in the embodiment 15-2, a similar process is executed in the print server in the embodiment 15-3.

An operation procedure of the embodiment 15-3 will now be described by using FIG. 81.

Figure 81:
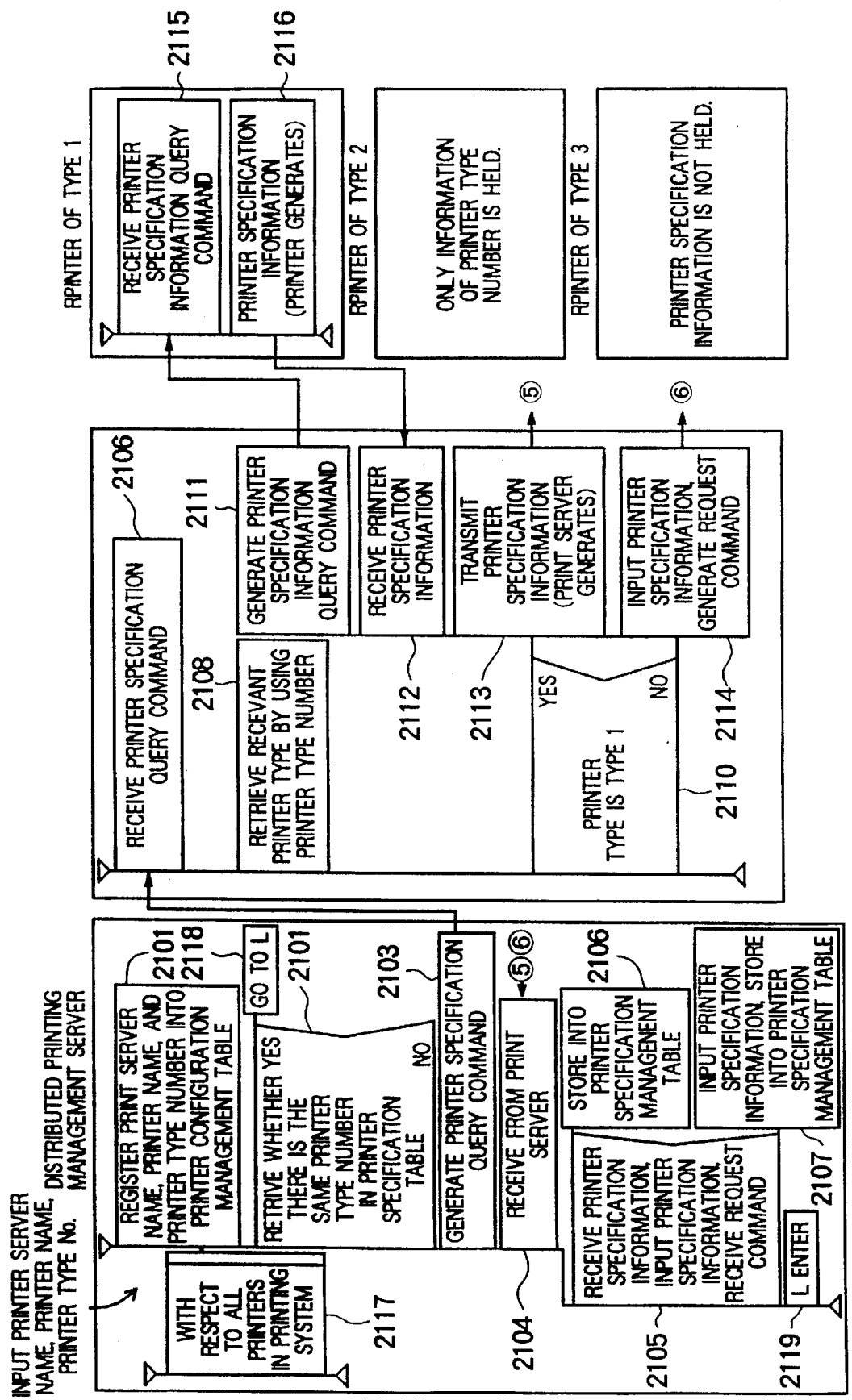
FIGS. 81, 82, and 83 are diagrams showing procedures for obtaining the specification information of the printer.

FIG. 81 shows the distributed printing management server, print server, and printers of the types 1, 2, and 3 and is a procedure diagram showing a procedure to be executed among them by a PAD.

An operation procedure of the embodiment 15-3 differs from the embodiment 15-2 with respect to a point that although the print type has been obtained in the distributed printing management server in the embodiment 15-2, the print type is obtained in the print server, thereby progressing the subsequent processes in the embodiment 15-3.

Explanation will now be sequentially made hereinbelow in accordance with the order in FIG. 81.

In the procedure, after the user performed the input of (b), a process of (c) and subsequent processes are automatically executed in accordance with control programs of the distributed printing management server, print server, and printers. The user also inputs even in (k).

(a) With respect to all of the printers in the printing system, the following loop of (b) to (k) is repeated (2117).

(b) The user inputs the print server name, printer name, and printer type number to the distributed printing management server. The distributed printing management server registers the print server name, printer name, and printer type number into the printer configuration management table (2101).

(c) The distributed printing management server retrieves whether there is the same printer type number in the printer specification management table or not (2102).

When there is the same printer type number, since this means that the printer specification information has already been registered, "go to L (2118)" is executed and the control is shifted to the portion written as "L enter" (2119).

When the same printer type number doesn't exist, a process (d) and subsequent processes are continued in order to obtain the printer specification information.

(d) The distributed printing management server generates the printer specification query command to the print server (2103).

(e) The print server receives the printer specification query command from the distributed printing management server (2115).

(f) The printer sort table is retrieved by using the printer type number, thereby obtaining the printer type (2116). The printer type is used for judgment about whether the printer specification information query command is generated or not in the following step (g).

(g) When the printer type obtained in the process (f) is the type 1 (2110), the print server generates the printer specification information query command to the printer (2111).

When the printer type obtained in the process (f) is other than the type 1, namely, when it is the type 2 or 3 (2110), the printer specification information registration request command is generated to the distributed printing management server (2114).

(h) The printer receives the printer specification information query command from the print server (2115).

(i) The printer transmits the printer specification information to the print server (2116).

(j) The print server receives the printer specification information from the printer (2112).

(k) The print server transmits the printer specification information to the distributed printing management server (2113).

(l) The distributed printing management server receives the printer specification information or printer specification information input request command from the print server (2105).

(k) When the printer specification information is received, it is stored into the printer specification management table. (2106).

When the printer specification information input request command is received, the distributed printing management server promotes the user to input. When the user inputs the printer specification information, the distributed printing management server stores it into the printer specification management table (2107).

According to the embodiment 15, the proper printer specification information can be obtained in accordance with the type of the printer connected onto the network in a manner similar to the embodiment 141. Further, in addition to it, to the printers which don't have the printer specification information, the distributed printing management server doesn't generate the printer specification query command or the print server doesn't need to generate the printer specification information query command. There is, consequently, an effect peculiar to the embodiment such that the communicating processes can be reduced and the communication traffics can be reduced.

[Embodiment 16]

The sixteenth embodiment according to the invention will now be described by using FIGS. 65 and 82.

It is a feature of the embodiment 16 that although the print server name, printer name, and printer type number have been inputted to the distributed printing management server in the embodiment 12, only the print server name and printer name are inputted to the distributed printing management server and the printer is accessed by using the printer name and the printer type number is obtained from the printer specification information from the printer.

A function construction of the embodiment 16 is substantially the same as that of the embodiment 2 shown in FIG. 65.

An operation procedure of the embodiment 16 will now be described by using FIG. 82.

Figure 82:
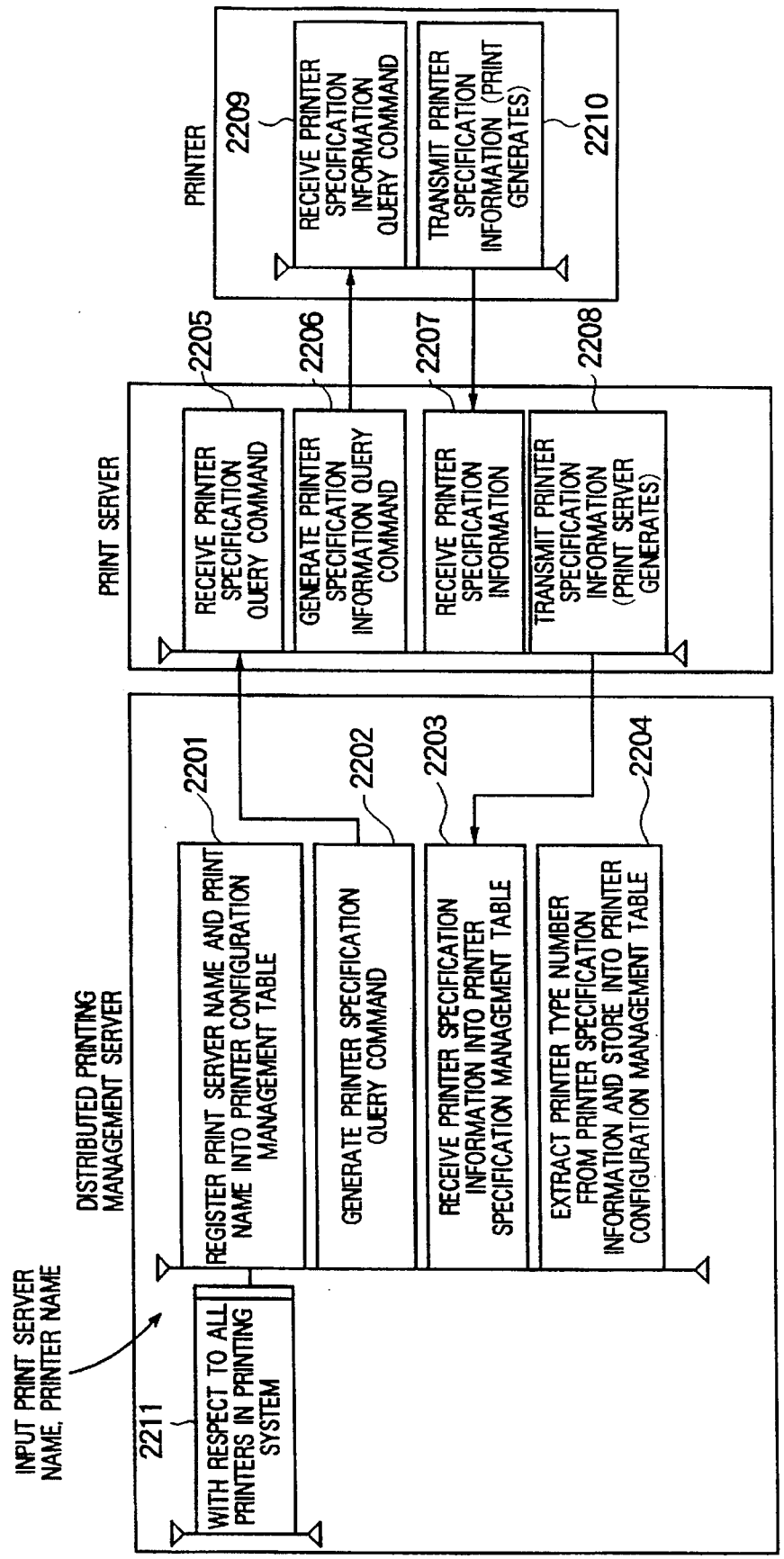

FIG. 82 is a procedure diagram in the case where the distributed printing management server, print server, and printer are arranged and a procedure to be executed among them is shown by a PAD.

As compared with the embodiment 12, the embodiment 16 differs with respect to a point that the process to input only the print server name and the printer name to the distributed printing management server and, as subsequent processes, processes for specifying the printer by using the printer name, for extracting the printer type number from the printer specification information, and for storing it into the printer configuration management table in the distributed printing management server are added.

Explanation will now be sequentially made hereinbelow in accordance with the order in FIG. 82.

In the procedure, after the user performed the input of (b), a process (c) and subsequent processes are executed in accordance with the control programs of the distributed printing management server, print server, and printers.

(a) With respect to all of the printers in the printing system, the following loop of (b) to (j) is repeated (2211).

(b) The user inputs the print server name and the printer name to the distributed printing management server (2201). The distributed printing management server registers the inputted print server name and printer name into the printer configuration management table (2201).

(c) The distributed printing management server transmits the printer specification query command to the print server (2202).

(d) The print server receives the printer specification query command from the distributed printing management server (2205).

(e) The print server generates the printer specification information query command to the printer (2206).

(f) The printer receives the printer specification information query command from the print server (2209).

(g) The printer transmits the printer specification information to the print server (2210).

(h) The print server transmits the printer specification information from the printer (2207).

(i) The print server transmits the printer specification information to the distributed printing management server (2208).

(j) The distributed printing management server receives the printer specification information from the printer. The printer specification information is stored into the printer specification management table (2203). The printer type number is extracted from the printer specification information and is stored into the printer configuration management table (2204).

According to the embodiment, in addition to the effect of the embodiment 12, there is an advantage such that even if the user doesn't know the printer type number at the time of the registration of the printer, he can obtain the printer specification information and a troublesomeness to input is also reduced.

Further, in the embodiments 11 to 15, there is a possibility such that a dissidence occurs between the printer type number inputted by the user and the printer type number held in the printer due to a mistake of the user. In the embodiment 16, however, since the printer type number is not registered to the distributed printing management server, such a dissidence doesn't occur and the reliability of the printing system can be improved.

[Embodiment 17]

The seventeenth embodiment according to the invention will now be described by using FIGS. 73 and 83.

It is a feature of the embodiment 17 that the idea shown in the embodiment 16 is applied to the system of the embodiment 14 shown in FIG. 73.

A function construction of the embodiment 17 is substantially the same as that of the embodiment 12 shown in FIG. 73.

An operation procedure of the embodiment 17 will now be described by using FIG. 83.

Figure 83:
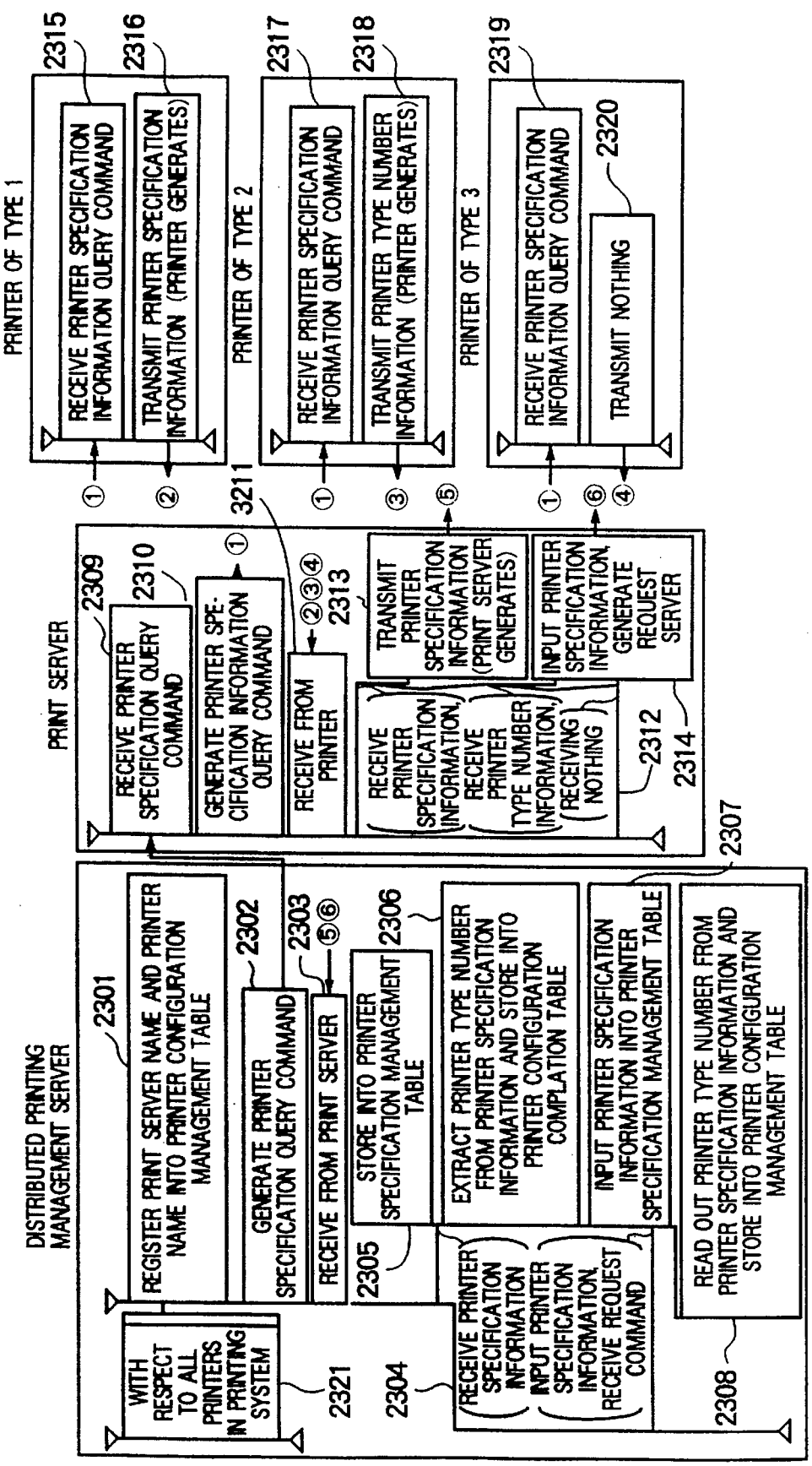

FIG. 83 is a procedure diagram in the case where the distributed printing management server, print server, and printers of the types 1, 2, and 3 are arranged and a procedure to be executed among them is shown by a PAD.

When comparing with the embodiment 14, the embodiment 17 differs with respect to a point that the process to input only the print server name and the printer names to the distributed printing management server and processes for specifying the printer by using the printer name, for extracting the printer type number from the printer specification information, and for storing it into the printer configuration management table in the distributed printing management server are added.

Explanation will now be sequentially made hereinbelow in accordance with the order in FIG. 83.

In the procedure, after the user performed the input of (b), a process (c) and subsequent processes are automatically executed in accordance with the control programs of the host computer and the printer. The user also inputs even in (j).

(a) With respect to all of the printers in the printing system, the following loop of (b) to (j) is repeated (2321).

(b) The user inputs the print server name and the printer name to the distributed printing management server. The distributed printing management server registers the print server name and the printer name into the printer configuration management table (2301).

(c) The distributed printing management server generates the printer specification query command to the print server (2302).

(d) The print server receives the printer specification query command from the distributed printing management server (2309).

(e) The print server generates the printer specification information query command to the printer (2310).

(f) The printer receives the printer specification information query command from the print server (2315, 2317, 2319).

In the printers of the types 1 and 2, the printer specification query command reception processing unit receives the printer specification query command from the print server (2315, 2317).

The printer of the type 1 transmits the printer specification information to the print server (2316).

The printer of the type 2 transmits the printer type number information to the print server (2318).

The printer of the type 3 returns nothing (2320) even if it receives the printer specification query command from the host computer (2319).

(g) The print server receives the printer specification information from the printer of the type 1. In case of the printer of the type 2, the printer type number information is received (2311).

(h) When the printer specification information is received, the print server transmits the printer specification information to the distributed printing management server (2313).

When the printer type number information is received or when nothing is received, the print server generates the printer specification information input request command (2314).

(i) The distributed printing management server receives the printer specification information or printer specification information input request command from the print server (2303).

(j) When the printer specification information is received (2304), it is stored into the printer specification management table (2305). The printer type number is extracted from the received printer specification information and is stored into the printer configuration management table (2306).

When the printer specification information input request command is received (2304), the distributed printing management server promotes the user to input. When the user inputs the printer specification information, the distributed printing management server stores it into the printer specification management table (2307). The printer type number is extracted from the inputted printer specification information and is stored into the printer configuration management table (2308).

According to the embodiment, in addition to the effect of the embodiment 16, the effect of the embodiment 14 such that the printer specification information of the printers of various types can be also obtained.

We claim:

1. A printing system comprising:

a terminal equipment including first transmitting means for transmitting a first print job to a print server;

printers each including printing means for executing a printing process based on the print job; and at least one print server including
first connecting means connected to said terminal equipment through a network,
second connecting means connected to said printers directly or through said network,
second transmitting means for transmitting said first print job that is transmitted from said terminal equipment to an arbitrary one of said printers to be connected,
printer management means for storing a relation between said terminal equipment and said one of said printers as a transmission destination side of said first print job,
printer status watching means for watching a status of said one of said printers as a transmission destination of said first print job,
printer information notifying means for notifying information regarding one of said printers as a transmission destination of said first print job to the terminal equipment as a transmitting origination of said first print job,
printer status recording means for recording a result of the watching by said printer status watching means, and
control means when an occurrence of an error in said one of said printers is detected by said printer status watching means, for stopping execution of said first print job and, for controlling said printer information notifying means so that both positional information of said one of said printers in which said error occurred that is obtained from said printer management means and a sort of said error which is one of information to be recorded into said printer status recording means are notified to said terminal equipment by said printer information notifying means, wherein said terminal equipment further comprises error recovery instructing means for instructing error recovery to said print server, and said print server further includes:
first shifting means for shifting said one of said printers from a print execution status to a printer error recovery waiting status;
second shifting means for shifting said one of said printers from the printer error recovery waiting status to the print execution status; and
said control means, when an occurrence of said error in said one of said printers is detected by said printer status watching means, for controlling said first shifting means in a manner that said one of said printers is shifted from the print execution status to the printer error recovery waiting status by said first shifting means, and after that, when a release of said error by said printer status watching means is detected and an error recovery instruction to said print server by said error recovery instructing means of said terminal equipment is detected, for controlling said second shifting means in a manner that said one of said printers is shifted from the printer error recovery waiting status to the print execution status by said second shifting means, thereby restarting said first print job.

2. A printing system according to claim 1, wherein said control means for restarting said first print job instructs a cancellation of said first print job to said one of said printers and retransmits said first print job, thereby reprinting.

3. A printing system according to claim 1, wherein:

said print server includes memory means for storing page information of an error occurred page in the case where said printer status watching means detects an error which needs a reprint in said one of said printers and error information notifying means for notifying a message indicative of the error which needs said reprint and said page information of said error occurred page to said terminal equipment:

said terminal equipment includes means for selecting either one of all pages of said first print job, an arbitrary designated page, and said error occurred page as means for instructing reexecution of said first print job in the case where the message indicative of said error which needs the reprint and said page information of said error occurred page are received from said print server; and said print server includes printer control means which is constructed in a manner such that in the case where a command to instruct said all pages of said first print job is received from said terminal equipment, said first print job is transmitted to said one of said printers, and in the case where a command to instruct said arbitrary designated page is received, information of subsequent pages starting from the arbitrary designation page in said first print job is transmitted, and in the case where a command to instruct said error occurred page is received, information of subsequent pages starting from the error occurred page is transmitted on the basis of the page information stored in said memory means.

4. A printing system according to claim 3, wherein in the case where the command to instruct said arbitrary designated page is received and in the case where the command to instruct said error occurred page is received, said print server edits said first print job to create an edited second print job comprising print data of a reprint start page that needs the reprint and subsequent pages and retransmits the edited second print job.

5. A printing system according to claim 3, wherein:

said print server includes means for transmitting said first print job and a reprint start page which needs the reprint in the case where the command to instruct said arbitrary designated page is received and in the case where the command to instruct said error occurred page is received; and said one of said printers includes means for receiving said first print job and said reprint start page and for reprinting with respect to only the pages of said reprint start page and subsequent pages.

6. A printing system according to claim 3, wherein said print server instructs a reprint start page to said one of said printers, and by using the print data held in said one of said printers with respect to said first print job, said one of said printers reprints said first print job with respect to the pages of said reprint start page and subsequent pages.

7. A printing system which comprises a terminal equipment, at least two print servers connected to said terminal equipment through a network, and printers which are controlled by said print servers and in which said terminal equipment instructs a print job as a unit of a print request to either of said print servers, wherein:

printer error detecting means and printer error recovery wait/release control means are provided for said print servers;

means for instructing an error recovery using an alternative printer to said print servers is provided for said terminal equipment; and a respective one of said print servers includes means for stopping inputting and outputting to or from a spooler corresponding to one of said printers in which a fatal error occurred in the case where the occurrence of the fatal error in said one of said printers is detected by said printer error detecting means and control means for shifting said one of said print servers to a printer error recovery waiting status by using said printer error recovery wait/release control means and for moving said print job to the spooler corresponding to a name of an alternative printer instructed by said terminal equipment in accordance with an error recovery instruction that is inputted from said terminal equipment, thereby printing the print job by said alternative printer, a distributed printing management server for managing configurations of all of said printers on the network is added to said printing system and alternative candidate printer detecting means is provided for said terminal equipment; and said terminal equipment includes means which is constructed in a manner such that after said print job was instructed by using arbitrary logical specifications, in the case where the occurrence of said fatal error in said one of said printers to execute said print job is known, said alternative candidate printer detecting means receives the logical specifications regarding said print job and a retrieval of said printers adequate to said logical specifications which were managed is requested to the distributed printing management server and means which is constructed in a manner such that in the case where said distributed printing management server returned alternative candidate printers adequate to the logical specifications to said terminal equipment, the alternative candidate printer is determined on the basis of said returned alternative candidate printers.

8. A method of obtaining specification information of a printer in a printing system in which the printer previously stores the specification information, a print server connected to said printer, and a distributed printing management server to manage said print server are connected so that they can communicate with one another, comprising the steps of:

accepting a designation of an arbitrary combination of a designated print server and a designated said printer by said distributed printing management server;

generating a first printer specification query command including information about said designated printer to said designated print server by said distributed printing management server;

generating a second printer specification query command to said printer included in said first printer specification query command by said print server in the case where said print server receives said printer specification query command;

transmitting said stored printer specification information to said print server which generated said second printer specification query command in the case where said printer receives said second printer specification query command;

transmitting the printer specification information to said distributed printing management server which generated said first printer specification query command in the case where said print server receives said printer specification information; and storing the specification information of said printer by said distributed printing management server, wherein when said printer can be any one of a printer of a type 1 which stores the printer specification information and a printer of a type other than the type 1 which doesn't store the printer specification information, said method further comprising the steps of:

discriminating the type of said designated printer by said print server;

generating at least one of said first and second printer specification query command by said print server only when a specified printer type is the type 1;

allowing printer specification information regarding a second printer to be inputted by input means provided for a host computer when the specified printer type is other than the type 1;

storing the printer specification information of said printer that is obtained through said print server by said distributed printing management server when said designated printer type is the type 1; and storing the printer specification information of said printer to which the printer specification information was inputted from a user by said distributed printing management server when said designated printer type is other than the type 1.

9. A method according to claim 8, further including the steps of:

inputting the printer type by said distributed printing management server; and discriminating the type of said designated printer by said inputted printer type.

10. A method according to claim 9, wherein said distributed printing management server has a table for judging the type of the printer, and said step of discriminating said designated printer type is a step of retrieving the type of the designated printer from a table for judging said printer type included in said distributed printing management server.

11. A method according to claim 9, wherein said print server has a table for judging the type of the printer, and said step of discriminating said designated printer type is a step of retrieving the designated printer type from said table for judging said printer type included in said distributed printing management server.

* * * * *